US012520714B2

(12) United States Patent
Shin et al.

(10) Patent No.: US 12,520,714 B2
(45) Date of Patent: Jan. 6, 2026

(54) ORGANOMETALLIC COMPOUND AND LIGHT-EMITTING DEVICE INCLUDING ORGANOMETALLIC COMPOUND

(71) Applicant: Samsung Display Co., Ltd., Yongin-si (KR)

(72) Inventors: Sujin Shin, Yongin-si (KR); Soobyung Ko, Yongin-si (KR); Sungbum Kim, Yongin-si (KR); Eunyoung Lee, Yongin-si (KR); Hyunjung Lee, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 911 days.

(21) Appl. No.: 17/693,590

(22) Filed: Mar. 14, 2022

(65) Prior Publication Data

US 2022/0328775 A1 Oct. 13, 2022

(30) Foreign Application Priority Data

Mar. 31, 2021 (KR) ........................ 10-2021-0042219

(51) Int. Cl.

*H01L 51/00* (2006.01)
*C07F 15/00* (2006.01)

(Continued)

(52) U.S. Cl.

CPC ....... *H10K 85/346* (2023.02); *C07F 15/0086* (2013.01); *C09K 11/06* (2013.01);

(Continued)

(58) Field of Classification Search

CPC .............. H10K 85/346; C07F 15/0086; C09K 11/06; H01L 51/0087

See application file for complete search history.

(56) References Cited

U.S. PATENT DOCUMENTS

| | | | |
|---|---|---|---|
| 7,381,479 | B2 | 6/2008 | Lamansky et al. |
| 7,393,599 | B2 | 7/2008 | Thompson et al. |

(Continued)

FOREIGN PATENT DOCUMENTS

| | | |
|---|---|---|
| CN | 104370974 | 2/2015 |
| JP | 2007-45742 | 2/2007 |

(Continued)

OTHER PUBLICATIONS

Notice of Allowance issued in corresponding KR Patent Application No. 10-2021-0042219 dated Oct. 14, 2025, 3pp.

*Primary Examiner* — Tae H Yoon

(74) *Attorney, Agent, or Firm* — Womble Bond Dickinson (US) LLP

(57) ABSTRACT

Provided are an organometallic compound represented by Formula 1, a light-emitting device including the organome- (Continued)

tallic compound represented by Formula 1, and an electronic apparatus including the light-emitting device:

[Formula 1]

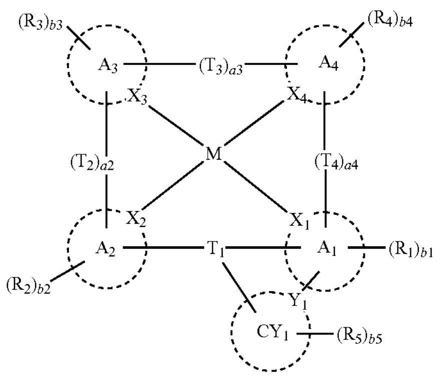

Formula 1 is understood by referring to the description of Formula 1 provided herein.

20 Claims, 3 Drawing Sheets

(51) Int. Cl.

| | |
|---|---|
| ***C09K 11/06*** | (2006.01) |
| ***H10K 85/30*** | (2023.01) |
| *H10K 50/11* | (2023.01) |
| *H10K 101/00* | (2023.01) |
| *H10K 101/10* | (2023.01) |
| *H10K 101/30* | (2023.01) |

(52) U.S. Cl.

CPC ................. *C09K 2211/1044* (2013.01); *C09K 2211/185* (2013.01); *H10K 50/11* (2023.02); *H10K 2101/10* (2023.02); *H10K 2101/30* (2023.02); *H10K 2101/90* (2023.02)

(56) References Cited

U.S. PATENT DOCUMENTS

| | | | |
|---|---|---|---|
| 7,585,573 | B2 | 9/2009 | Lee et al. |
| 7,776,458 | B2 | 8/2010 | Ragini et al. |
| 8,106,199 | B2 | 1/2012 | Jabbour et al. |
| 8,389,725 | B2 | 3/2013 | Li et al. |
| 8,669,364 | B2 | 3/2014 | Li et al. |
| 8,680,760 | B2 | 3/2014 | Cheng et al. |
| 8,816,080 | B2 | 8/2014 | Li et al. |
| 8,846,940 | B2 | 9/2014 | Li et al. |
| 8,946,417 | B2 | 2/2015 | Jian et al. |
| 9,051,344 | B2 | 6/2015 | Lin et al. |
| 9,076,974 | B2 | 7/2015 | Li et al. |
| 9,203,039 | B2 | 12/2015 | Li et al. |
| 9,221,857 | B2 | 12/2015 | Li et al. |
| 9,224,963 | B2 | 12/2015 | Li et al. |
| 9,238,668 | B2 | 1/2016 | Li et al. |
| 9,312,502 | B2 | 4/2016 | Li et al. |
| 9,318,725 | B2 | 4/2016 | Li |
| 9,324,957 | B2 | 4/2016 | Li et al. |
| 9,382,273 | B2 | 7/2016 | Li et al. |
| 9,425,415 | B2 | 8/2016 | Li et al. |
| 9,493,698 | B2 | 11/2016 | Beers et al. |
| 9,698,359 | B2 | 7/2017 | Li et al. |
| 9,899,614 | B2 | 2/2018 | Li et al. |
| 10,797,249 | B2 | 10/2020 | Lee et al. |
| 10,937,975 | B2 | 3/2021 | Kwak et al. |
| 11,124,533 | B2 | 9/2021 | Jeon et al. |
| 11,489,124 | B2 | 11/2022 | Lee et al. |
| 11,981,692 | B2 | 5/2024 | Hwang et al. |
| 2005/0287394 | A1 | 12/2005 | Yang et al. |
| 2008/0018221 | A1 | 1/2008 | Egen et al. |
| 2014/0309428 | A1 | 10/2014 | Egen et al. |
| 2018/0212165 | A1 | 7/2018 | Ji |
| 2020/0152891 | A1 | 5/2020 | Li et al. |
| 2021/0050530 | A1 | 2/2021 | Wu et al. |

FOREIGN PATENT DOCUMENTS

| | | | |
|---|---|---|---|
| KR | 10-0730115 | | 6/2007 |
| KR | 10-2013-0043460 | A | 4/2013 |
| KR | 10-2015-0043225 | | 4/2015 |
| KR | 10-2018-0128268 | A | 12/2018 |
| KR | 10-2018-0137311 | A | 12/2018 |
| KR | 10-2019-0027658 | A | 3/2019 |
| KR | 10-2076934 | | 2/2020 |
| KR | 10-2020-0118943 | A | 10/2020 |
| KR | 10-2021-0006554 | A | 1/2021 |
| WO | 2012/121936 | | 9/2012 |

ORGANOMETALLIC COMPOUND AND LIGHT-EMITTING DEVICE INCLUDING ORGANOMETALLIC COMPOUND

CROSS-REFERENCE TO RELATED APPLICATION(S)

This application claims priority to and benefits of Korean Patent Application No. 10-2021-0042219 under 35 U.S.C. § 119, filed on Mar. 31, 2021 in the Korean Intellectual Property Office, the entire contents of which are incorporated herein by reference.

BACKGROUND

1. Technical Field

Embodiments relate to an organometallic compound, a light-emitting device including the organometallic compound, and an electronic apparatus including the light-emitting device.

2. Description of the Related Art

Organic light-emitting devices (OLEDs) among light-emitting devices are self-emissive devices that, as compared with devices in the art, have wide viewing angles, high contrast ratios, short response times, and excellent characteristics in terms of brightness, driving voltage, and response speed.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state, thereby generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include an organometallic compound having a low driving voltage, excellent luminescence efficiency, long lifespan, and excellent colorimetric purity and a light-emitting device including the organometallic compound.

Additional aspects will be set forth in part in the description which follows and, in part, will be apparent from the description, or may be learned by practice of the embodiments of the disclosure.

According to an embodiment, an organometallic compound may be represented by Formula 1.

[Formula 1]

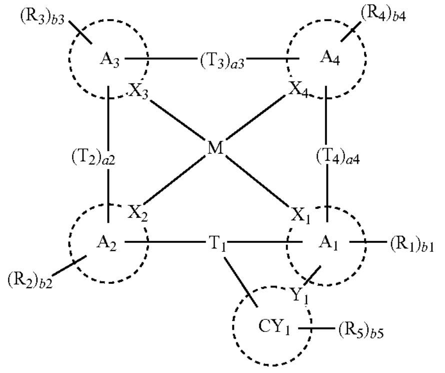

In Formula 1,

M may be platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$ may each independently be carbon (C) or nitrogen (N), $Y_1$ may be N, $A_1$ to $A_4$ may each independently be a $C_3$-$C_{60}$ carbocyclic group or a $C_1$-$C_{60}$ heterocyclic group, $CY_1$ may be a $C_1$-$C_{60}$ heterocyclic group, $T_1$ may be N, B, P, $C(Z_{11})$, $Si(Z_{11})$, or $Ge(Z_{11})$, $T_2$ to $T_4$ may each independently be a single bond, a double bond, *—$N(Z_{21})$—*', *—$B(Z_{21})$—*', *—$P(Z_{21})$—*', *—$C(Z_{21})(Z_{22})$—*', *—$Si(Z_{21})(Z_{22})$—*', *—$Ge(Z_{21})(Z_{22})$—*', *—S—*', *—Se—*', *—O—*', *—C(=O)—*', *—S(=O)—*', *—$S(=O)_2$—*', *—$C(Z_{21})$=*', *=$C(Z_{21})$—*', *—$C(Z_{21})$=$C(Z_{22})$—*', *—C(=S)—*', or *—C≡C—*', a2 to a4 may each independently be an integer from 0 to 3, $R_1$ to $R_5$, $Z_{11}$, $Z_{21}$, and $Z_{22}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b1 to b5 may each independently be an integer from 0 to 10, two $R_1$(s) of at least two $R_1$(s) when b1 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_2$(s) of at least two $R_2$(s) when b2 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_3$(s) of at least two $R_3$(s) when b3 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_4$(s) of at least two $R_4$(s) when b4 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_5$(s) of at least two $R_5$(s) when b5 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ may be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and

* and *' each indicate a binding site to an adjacent atom.

In an embodiment, a bond between $X_1$ and M may be a covalent bond, a bond between $X_2$ and M may be a covalent bond, a bond between $X_3$ and M may be a coordinate bond, and a bond between $X_4$ and M may be a covalent bond or a coordinate bond.

In an embodiment, $A_3$ may be an $X_3$-containing 5-membered ring or an $X_3$-containing 5-membered ring to which at least one 6-membered ring is condensed, and $A_4$ may be an $X_4$-containing 5-membered ring, an $X_4$-containing 5-membered ring to which at least one 6-membered ring is condensed, or an $X_4$-containing 6-membered ring.

In an embodiment, a group represented by

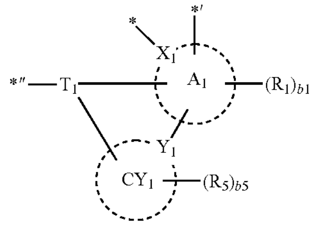

in Formula 1 may be a group represented by one of Formulae A1(1) to A1(32), which are explained below.

In an embodiment, a group represented by

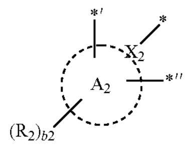

in Formula 1 may be a group represented by one of Formulae A2-1 to A2-8, which are explained below.

In an embodiment, a group represented by

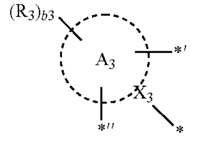

Formula 1 may be a group represented by one of Formulae A3-1 to A3-15, which are explained below.

In an embodiment, a group represented by

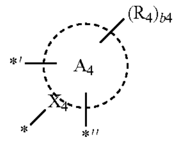

in Formula 1 may be a group represented by one of Formulae A4-1 to A4-32, which are explained below.

In an embodiment, $CY_1$ may be a $Y_1$-containing 5-membered ring, a $Y_1$-containing 5-membered ring condensed to at least one 6-membered ring, or a $Y_1$-containing 6-membered ring.

In an embodiment, a group represented by

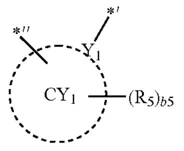

in Formula 1 may be a group represented by Formula CY1(a), which is explained below.

In an embodiment, the organometallic compound is selected from Compounds 1 to 105, which are explained below.

In an embodiment, the organometallic compound may emit blue light having a maximum emission wavelength in a range of about 430 nanometers (nm) to about 490 nm.

According to embodiments, a light-emitting device may include a first electrode, a second electrode facing the first electrode, an interlayer disposed between the first electrode and the second electrode and including an emission layer, and an organometallic compound represented by Formula 1.

In an embodiment, the interlayer may include a first compound that is the organometallic compound represented by Formula 1; and a second compound comprising at least one π electron-deficient nitrogen-containing $C_1$-$C_{60}$ cyclic group, a third compound comprising a group represented by Formula 3, which is explained below, a fourth compound capable of emitting delayed fluorescence, or any combination thereof. The first compound, the second compound, the third compound, and the fourth compound may be different from one another.

In an embodiment, the emission layer may include the first compound; and the second compound, the third compound, the fourth compound, or any combination thereof. The emission layer may emit phosphorescence or fluorescence emitted from the first compound.

In an embodiment, the second compound may include a pyridine group, a pyrimidine group, a pyrazine group, a pyridazine group, a triazine group, or any combination thereof.

In an embodiment, the fourth compound may be a compound including at least one cyclic group comprising boron (B) and nitrogen (N) as ring-forming atoms.

In an embodiment, the second compound may include a compound represented by Formula 2, which is explained below.

In an embodiment, at least one of Conditions 1 to 4 is satisfied, which are explained below.

According to embodiments, an electronic apparatus may include the light-emitting device and a thin-film transistor. The thin-film transistor may include a source electrode and a drain electrode, and the first electrode of the light-emitting device may be electrically connected to at least one of the source electrode and the drain electrode of the thin-film transistor.

In an embodiment, the electronic apparatus may further include a color filter, a color-conversion layer, a touchscreen layer, a polarization layer, or any combination thereof.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
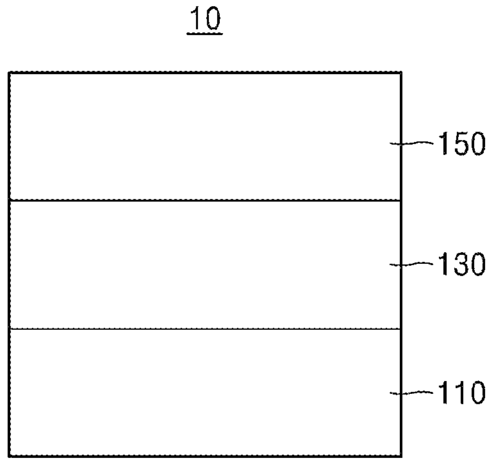
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An organometallic compound may be represented by Formula 1:

[Formula 1]

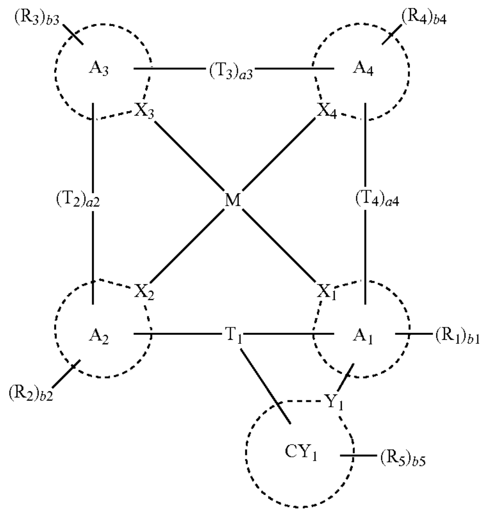

In Formula 1, M may be platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm).

In an embodiment, M in Formula 1 may be platinum (Pt), palladium (Pd), nickel (Ni), copper (Cu), silver (Ag), or gold (Au), but embodiments are not limited thereto.

In Formula 1, $X_1$ to $X_4$ may each independently be C or N.

In an embodiment, $X_1$ to $X_4$ may each be C, or $X_1$ to $X_3$ may each be C and $X_4$ may be N.

In an embodiment, in Formula 1, a bond between $X_1$ and M may be a covalent bond, a bond between $X_2$ and M may be a covalent bond, a bond between $X_3$ and M may be a coordinate bond, and a bond between $X_4$ and M may be a covalent bond or a coordinate bond.

In embodiments, in Formula 1, a bond between $X_1$ and M may be a covalent bond, and $X_1$ may be C.

In embodiments, in Formula 1, a bond between $X_2$ and M may be a covalent bond, and $X_2$ may be C.

In embodiments, in Formula 1, a bond between $X_3$ and M may be a coordinate bond, and $X_3$ may be C.

In embodiments, in Formula 1, a bond between $X_4$ and M may be a coordinate bond, and $X_4$ may be C.

In embodiments, in Formula 1, a bond between $X_4$ and M may be a covalent bond, and $X_4$ may be N.

In Formula 1, $Y_1$ may be N.

In Formula 1, $A_1$ to $A_4$ may each independently be a $C_3$-$C_{60}$ carbocyclic group or a $C_1$-$C_{60}$ heterocyclic group.

In an embodiment, in Formula 1, $A_1$ may be an $X_1$-containing 6-membered ring.

In an embodiment, in Formula 1, $A_2$ may be an $X_2$-containing 6-membered ring.

In an embodiment, in Formula 1, $A_3$ may be an $X_3$-containing 5-membered ring or an $X_3$-containing 5-membered ring condensed with at least one 6-membered ring.

In an embodiment, in Formula 1, $A_4$ may be an $X_4$-containing 5-membered ring, an $X_4$-containing 5-membered ring condensed with at least one 6-membered ring, or an $X_4$-containing 6-membered ring.

In an embodiment, in Formula 1, $A_3$ may be an $X_3$-containing 5-membered ring or an $X_3$-containing 5-membered ring condensed with at least one 6-membered ring, and $A_4$ may be an $X_4$-containing 5-membered ring, an $X_4$-containing 5-membered ring condensed with at least one 6-membered ring, or an $X_4$-containing 6-membered ring.

In an embodiment, the $X_1$-containing 6-membered ring in $A_1$, the $X_2$-containing 6-membered ring in $A_2$, and the $X_4$-containing 6-membered ring in $A_4$ may each independently be a benzene group, a pyridine group, or a pyrimidine group.

In an embodiment, the $X_3$-containing 5-membered ring and the $X_3$-containing 5-membered ring condensed with at least one 6-membered ring in $A_3$ and the $X_4$-containing 5-membered ring and the $X_4$-containing 5-membered ring condensed with at least one 6-membered ring in $A_4$ may each independently be a pyrrole group, a pyrazole group, an imidazole group, a triazole group, a furan group, an oxazole group, an isooxazole group, a thiazole group, an isothiazole group, an oxadiazole group, or a thiadiazole group.

In an embodiment, in Formula 1, a group represented by

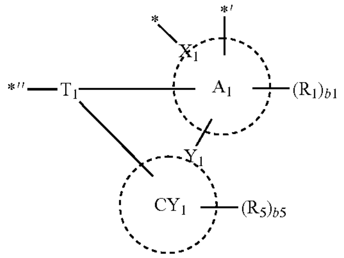

may be a group represented by one of Formulae A1(1) to A1(32):
A1(1)
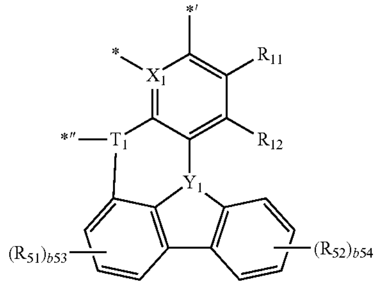
A1(2)
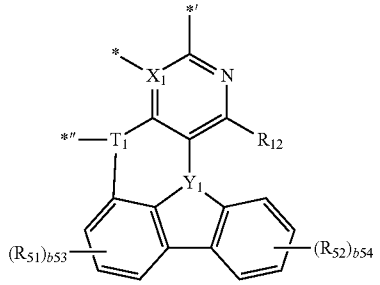
A1(3)
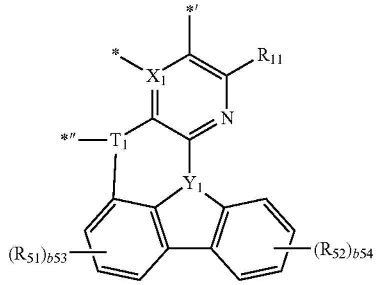
A1(4)
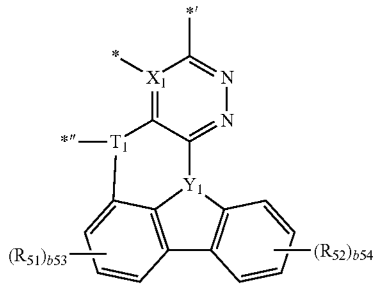
A1(5)
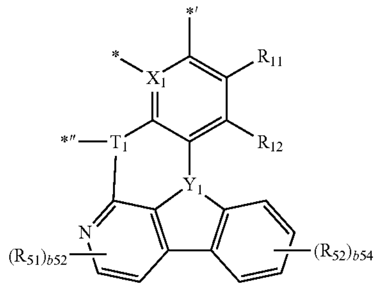
-continued
A1(6)
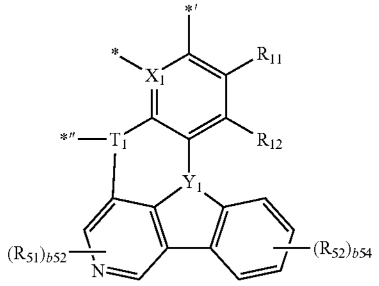
A1(7)
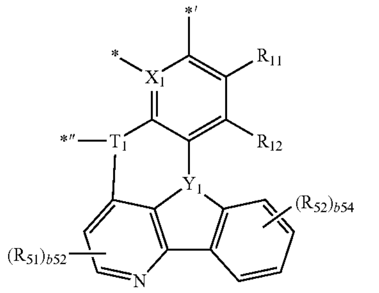
A1(8)
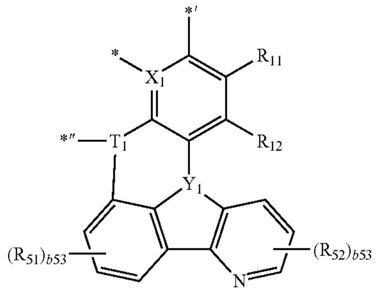
A1(9)
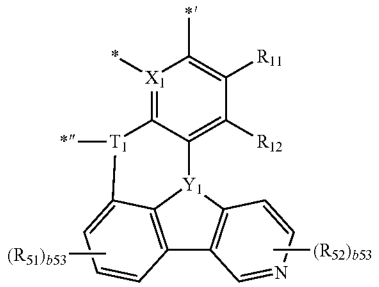
A1(10)
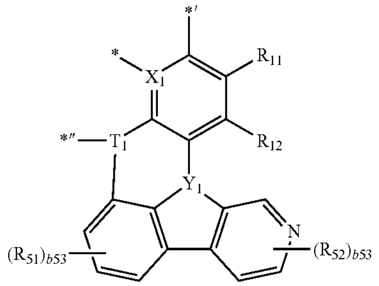

-continued
A1(11)
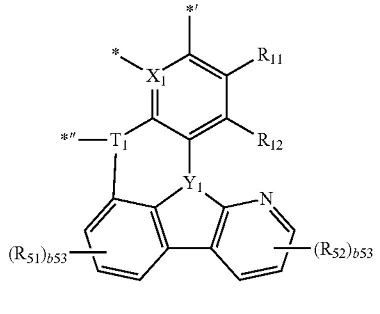
A1(12)
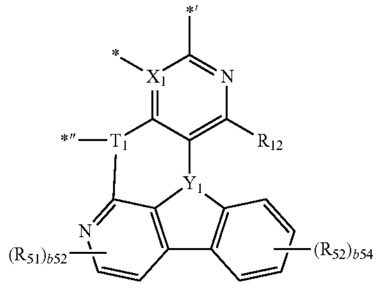
A1(13)
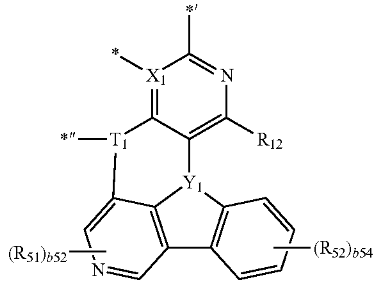
A1(14)
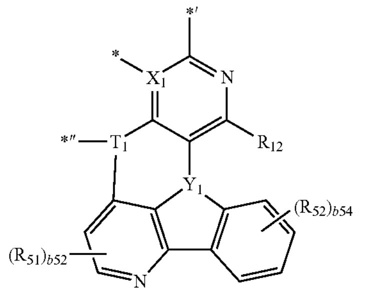
A1(15)
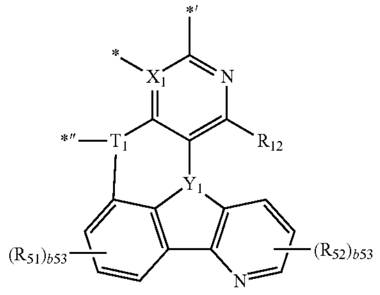
-continued
A1(16)
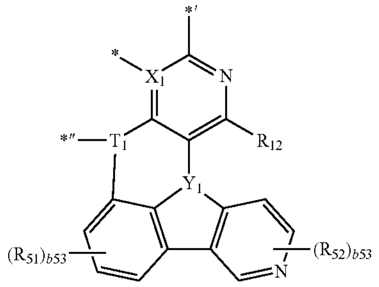
A1(17)
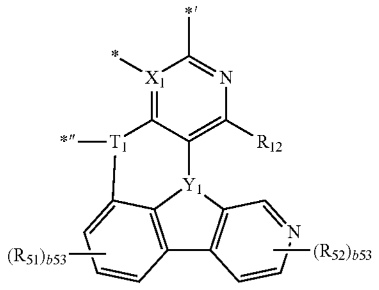
A1(18)
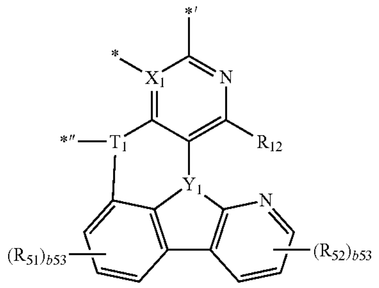
A1(19)
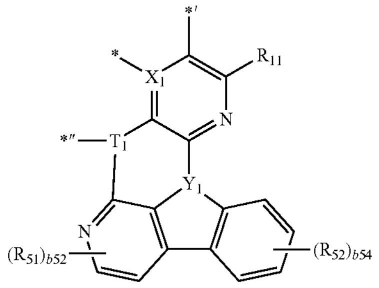
A1(20)
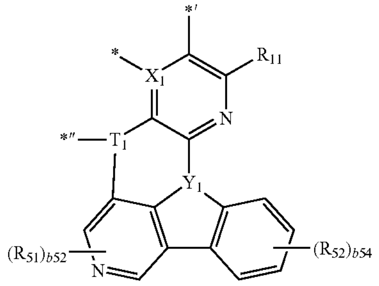

-continued
A1(21)
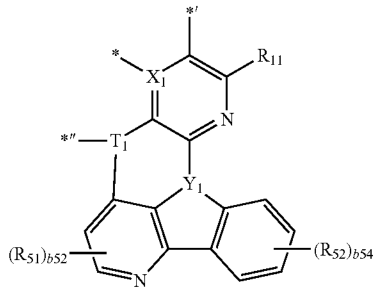
A1(22)
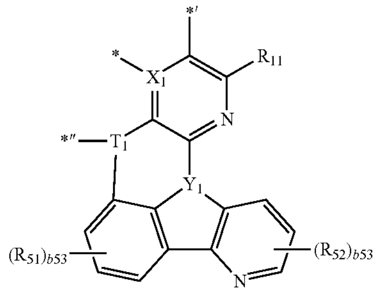
A1(23)
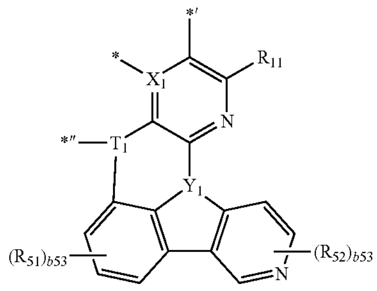
A1(24)
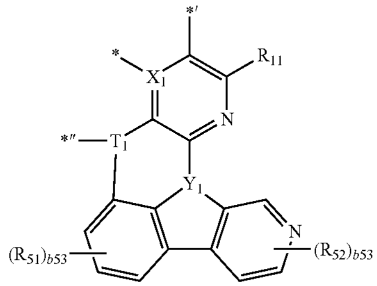
A1(25)
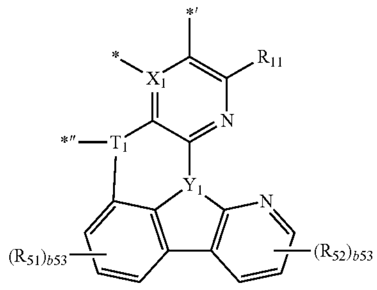
-continued
A1(26)
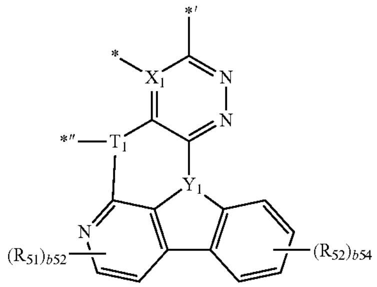
A1(27)
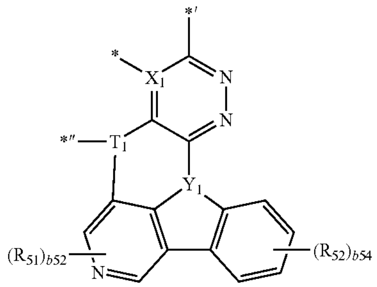
A1(28)
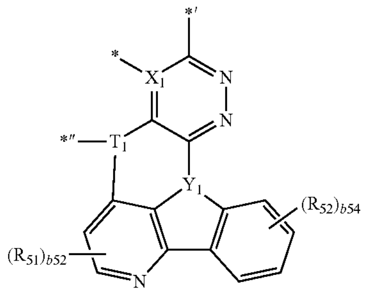
A1(29)
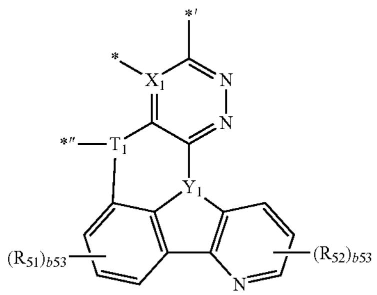
A1(30)
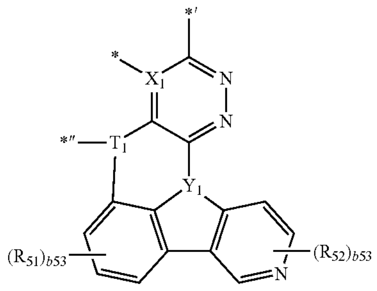

-continued

A1(31)

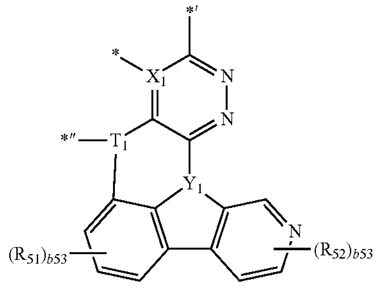

A1(32)

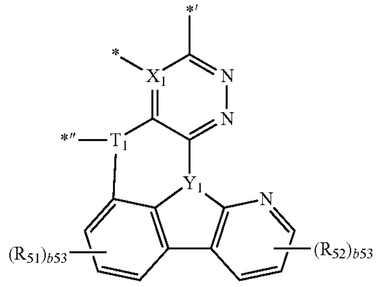

In Formulae A1 (1) to A1 (32), $X_1$, $T_1$, and $Y_1$ may respectively be the same as described in connection with $X_1$, $T_1$, and $Y_1$ in Formula 1, $R_{11}$ and $R_{12}$ may each independently be the same as described in connection with $R_1$ in Formula 1, $R_{51}$ and $R_{52}$ may each independently be the same as described in connection with $R_5$ in Formula 1, b52 may be an integer from 0 to 2, b53 may be an integer from 0 to 3, b54 may be an integer from 0 to 4, $R_{11}$ and $R_{12}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{51}$(s) of at least two $R_{51}$(s) when b53 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{51}$(s) when b52 is 2 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{52}$(s) of at least two $R_{52}$(s) when b54 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{52}$(s) of at least two $R_{52}$(s) when b53 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be the same as described in connection with $R_{10a}$ in Formula 1,

* indicates a binding site to M in Formula 1,

*' indicates a binding site to $T_4$ in Formula 1, and

*" indicates a binding site to $A_2$ in Formula 1.

In an embodiment, in Formula 1, a group represented by

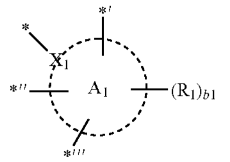

may be a group represented by one of Formulae A1-1 to A1-4:

A1-1

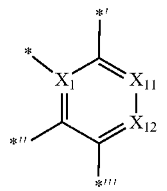

A1-2

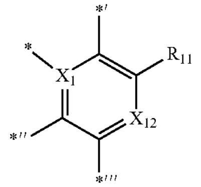

A1-3

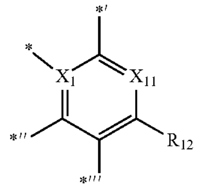

A1-4

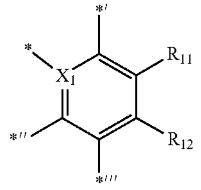

In Formulae A1-1 to A1-4, $X_1$ may be the same as described in connection with $X_1$ in Formula 1, $X_{11}$ and $X_{12}$ may each independently be the same as described in connection with $X_1$ in Formula 1, $R_{11}$ and $R_{12}$ may each independently be the same as described in connection with $R_1$ in Formula 1, and $R_{11}$ and $R_{12}$ may not each be hydrogen, $R_{11}$ and $R_{12}$ may be optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be the same as described in connection with $R_{10a}$ in Formula 1,

* indicates a binding site to M in Formula 1,

*' indicates a binding site to $T_4$ in Formula 1,

*" indicates a binding site to $T_1$ in Formula 1, and

*"' indicates a binding site to $Y_1$ in Formula 1.

In an embodiment, in Formula 1, a group represented by

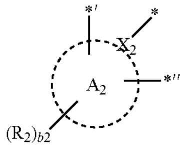

may be a group represented by one of Formulae A2-1 to A2-8:

A2-1

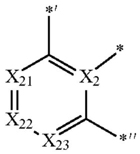

A2-2

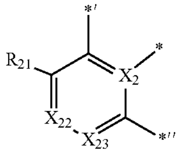

A2-3

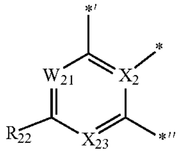

A2-4

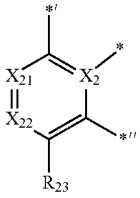

A2-5

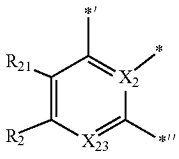

A2-6

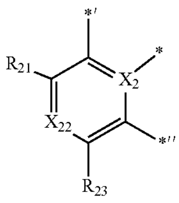

A2-7

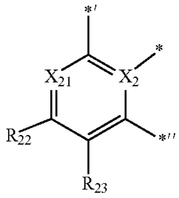

-continued

A2-8

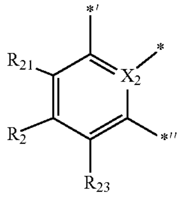

In Formulae A2-1 to A2-8, $X_2$ may be the same as described in connection with $X_2$ in Formula 1, $X_{21}$ to $X_{23}$ may independently each be the same as described in connection with $X_2$ in Formula 1, $R_{21}$ to $R_{23}$ may each independently be the same as described in connection with $R_2$ in Formula 1, and $R_{21}$ to $R_{23}$ may not each be hydrogen, two of $R_{21}$ to $R_{23}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be the same as described in connection with $R_{10a}$ in Formula 1,

* indicates a binding site to M in Formula 1,

*' indicates a binding site to $T_2$ in Formula 1, and

*" indicates a binding site to $T_1$ in Formula 1.

In an embodiment, in Formula 1, a group represented by

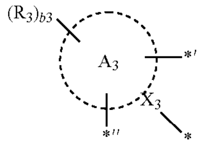

may be a group represented by one of Formulae A3-1 to A3-15:

A3-1

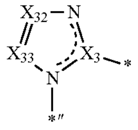

A3-2

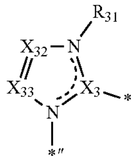

A3-3

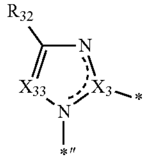

A3-4

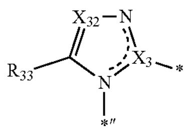

-continued

A3-5

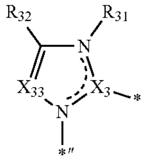

A3-6

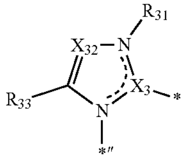

A3-7

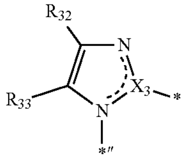

A3-8

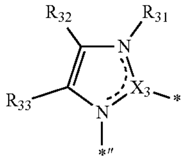

A3-9

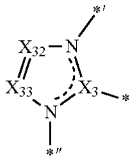

A3-10

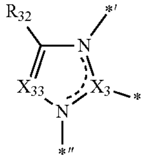

A3-11

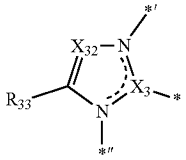

A3-12

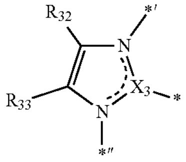

A3-13

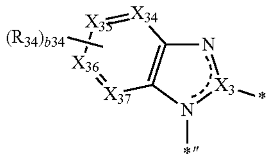

-continued

A3-14

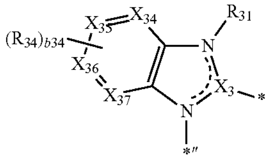

A3-15

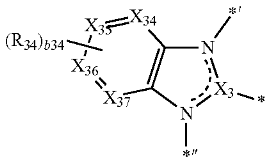

In Formulae A3-1 to A3-15, $X_3$ may be the same as described in connection with $X_3$ in Formula 1, $X_{32}$ to $X_{37}$ may each independently be the same as described in connection with $X_3$ in Formula 1, $R_{31}$ to $R_{34}$ may each independently be the same as described in connection with $R_3$ in Formula 1, and $R_{31}$ to $R_{33}$ may not each be hydrogen, b34 may be an integer from 0 to 4, two of $R_{31}$ to $R_{34}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{34}$(s) of at least two $R_{34}$(s) when b34 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be the same as described in connection with $R_{10a}$ in Formula 1,

* indicates a binding site to M in Formula 1,

*" indicates a binding site to $T_2$ in Formula 1, and

*' in Formulae A3-9 to A3-12 and A3-15 may be a binding site to $T_3$ in Formula 1.

In an embodiment, in Formula 1, a group represented by

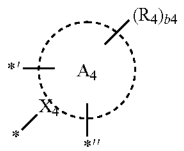

may be a group represented by one of Formulae A4-1 to A4-32:

A4-1

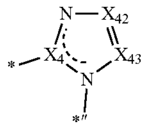

A4-2

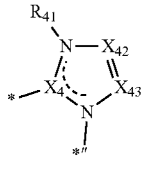

-continued
A4-3
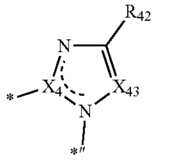
A4-4
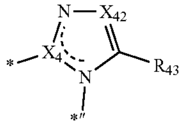
A4-5
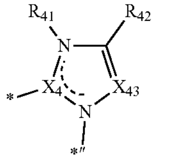
A4-6
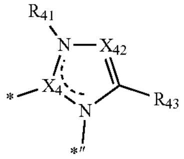
A4-7
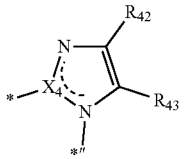
A4-8
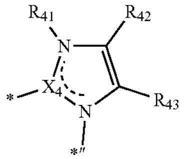
A4-9
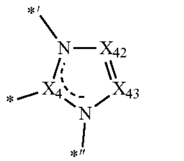
A4-10
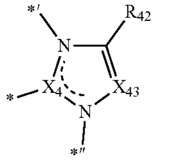
A4-11
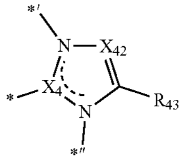
-continued
A4-12
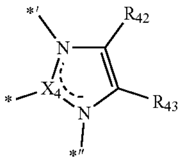
A4-13
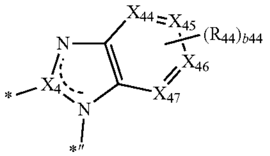
A4-14
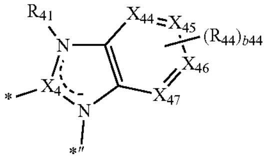
A4-15
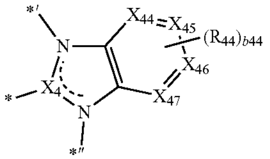
A4-16
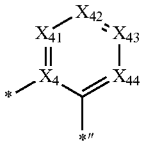
A4-17
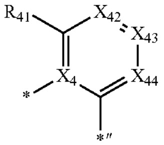
A4-18
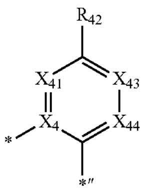
A4-19
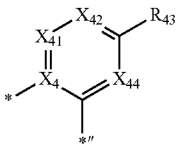
A4-20
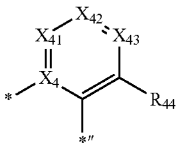

-continued

A4-21

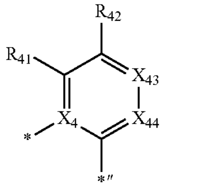

A4-22

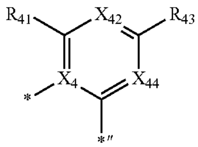

A4-23

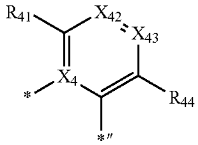

A4-24

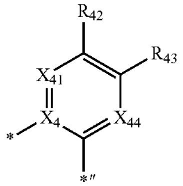

A4-25

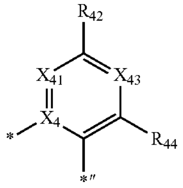

A4-26

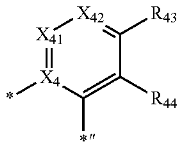

A4-27

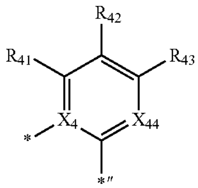

A4-28

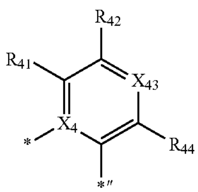

A4-29

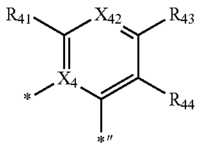

-continued

A4-30

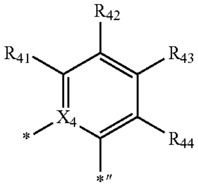

A4-31

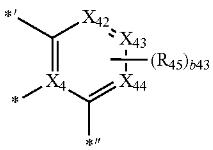

A4-32

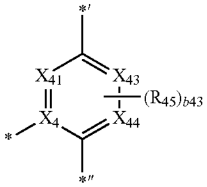

In Formulae A4-1 to A4-32, $X_4$ may be the same as described in connection with $X_4$ in Formula 1, $X_{41}$ to $X_{47}$ may each independently be the same as described in connection with $X_4$ in Formula 1, $R_{41}$ to $R_{45}$ may each independently be the same as described in connection with $R_4$ in Formula 1, and $R_{41}$ to $R_{43}$ may not each be hydrogen, $R_{44}$ in Formulae A4-20, A4-25, A4-26, and A4-28 to A4-30 may not be hydrogen, b43 may be an integer from 0 to 3, b44 may be an integer from 0 to 4, two of $R_{41}$ to $R_{45}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{44}$(s) of at least two $R_{44}$(s) when b44 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{45}$(s) of at least two $R_{45}$(s) when b43 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be the same as described in connection with $R_{10a}$ in Formula 1,

* indicates a binding site to M in Formula 1,

*" indicates a binding site to $T_4$ in Formula 1, and

*' in Formulae A4-9 to A4-12, A4-15, A4-31, and A4-32 may be a binding site to $T_3$ in Formula 1.

In Formula 1, $CY_1$ may be a $C_1$-$C_{60}$ heterocyclic group.

In an embodiment, in Formula 1, $CY_1$ may be a $Y_1$-containing 5-membered ring, a $Y_1$-containing 5-membered ring condensed with at least one 6-membered ring, or a $Y_1$-containing 6-membered ring.

In an embodiment, the $Y_1$-containing 5-membered ring or the $Y_1$-containing 5-membered ring condensed ring with at least one 6-membered ring in $CY_1$ may each independently be a pyrrole group, a pyrazole group, an imidazole group, a triazole group, an oxazole group, an isooxazole group, an isothiazole group, an oxadiazole group, or a thiadiazole group.

In an embodiment, the $Y_1$-containing 6-membered ring in $CY_1$ may be a pyridine group or a pyrimidine group.

In embodiments, in Formula 1, a group represented by

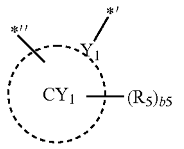

may be a group represented by Formula CY1(a):

CY1(a)

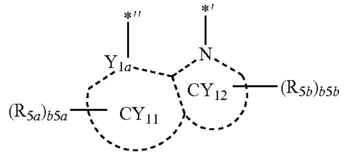

In Formula CY1(a), $Y_{1a}$ may be C or N, $CY_{11}$ may be a $C_3$-$C_{60}$ carbocyclic group or a $C_1$-$C_{60}$ heterocyclic group, $CY_{12}$ may be the same as described in connection with $CY_1$ in Formula 1, $R_{5a}$ and $R_{5b}$ may each independently be the same as described in connection with $R_5$ in Formula 1, b5a and b5b may each independently be the same as described in connection with b5 in Formula 1, two $R_{5a}$(s) of at least two $R_{5a}$(s) when b5a is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{5b}$(s) of at least two $R_{5b}$(s) when b5b is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be the same as described in connection with $R_{10a}$ in Formula 1,

*' indicates a binding site to $A_1$ in Formula 1, and

*" indicates a binding site to $T_1$ in Formula 1.

In an embodiment, in Formula 1, a group represented by

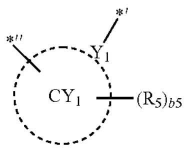

may be a group represented by Formula CY1-1 or Formula CY1-2:

CY1-1

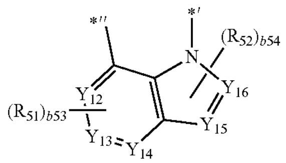

CY1-2

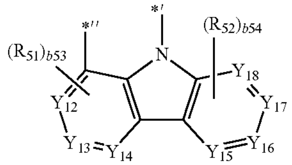

In Formulae CY1-1 and CY1-2, $Y_{12}$ to $Y_{18}$ may each independently be C or N, $R_{51}$ and $R_{52}$ may each independently be the same as described in connection with $R_5$ in Formula 1, b52 may be an integer from 0 to 2, b53 may be an integer from 0 to 3, b54 may be an integer from 0 to 4, two $R_{51}$ (s) of at least two $R_{51}$ (s) when b53 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{52}$(s) when b52 is 2 may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{52}$(s) of at least two $R_{52}$(s) when b54 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be the same as described in connection with $R_{10a}$ in Formula 1,

*' indicates a binding site to $A_1$ in Formula 1, and

*" indicates a binding site to $T_1$ in Formula 1.

In Formula 1, $T_1$ may be N, B, P, $C(Z_{11})$, $Si(Z_{11})$, or $Ge(Z_{11})$.

In an embodiment, in Formula 1, $T_1$ may be N or $C(Z_{11})$, but embodiments are not limited thereto.

In Formula 1, $T_2$ to $T_4$ may each independently be a single bond, a double bond, *—N($Z_{21}$)—*', *—B($Z_{21}$)—*', *—P($Z_{21}$)—*', *—C($Z_{21}$)($Z_{22}$)—*', *—Si($Z_{21}$)($Z_{22}$)—*', *—Ge($Z_{21}$)($Z_{22}$)—*', *—S—*', *—Se—*', *—O—*', *—C(=O)—*', *—S(=O)—*', *—S(=O)$_2$—*', *—C($Z_{21}$)=*', *=C($Z_{21}$)—*', *—C($Z_{21}$)=C($Z_{22}$)—*', *—C(=S)—*', or *—C≡C—*', and * and *' each indicate a binding site to an adjacent atom.

In an embodiment, $T_2$ to $T_4$ may each be a single bond, but embodiments are not limited thereto.

In Formula 1, a2 to a4 may each independently be an integer from 0 to 3.

In an embodiment, in Formula 1, a2 to a4 may each independently be 0 or 1.

In an embodiment, in Formula 1, a2 and a4 may each be 1, but embodiments are not limited thereto.

In an embodiment, in Formula 1, a3 may be 0, but embodiments are not limited thereto.

In Formula 1, $R_1$ to $R_5$, $Z_{11}$, $Z_{12}$, $Z_{21}$, and $Z_{22}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_1$-$C_{60}$ aryloxy group unsubstituted or substituted with at least one $R_{10a}$, a $C_1$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$). $R_{10a}$ and $Q_1$ to $Q_3$ may be understood by referring to the descriptions of $R_{10a}$ and $Q_1$ to $Q_3$ provided herein.

In an embodiment, in Formula 1, $R_1$ to $R_5$, $Z_{11}$, $Z_{21}$, and $Z_{22}$ may respectively be understood by referring to the descriptions of $R_1$ to $R_5$, $Z_{11}$, $Z_{21}$, and $Z_{22}$ in the present disclosure disclosure.

In an embodiment, $R_1$ to $R_5$, $Z_{11}$, $Z_{21}$, and $Z_{22}$ may each independently be:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, a phenyl group, a naphthyl group, —Si($Q_{31}$)($Q_{32}$)($Q_{33}$), —N($Q_{31}$)($Q_{32}$), —B($Q_{31}$)($Q_{32}$), or any combination thereof;

a phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, —Si($Q_{31}$)($Q_{32}$)($Q_{33}$), —N($Q_{31}$)($Q_{32}$), —B($Q_{31}$)($Q_{32}$), or any combination thereof; or —Si($Q_1$)($Q_2$)($Q_3$), —N($Q_1$)($Q_2$), or —B($Q_1$)($Q_2$).

In Formula 1, b1 to b5 may each independently be an integer from 0 to 10.

In an embodiment, in Formula 1, b1 to b5 may each independently be an integer from 0 to 5.

In Formula 1, two $R_1$(s) of at least two $R_1$(s) when b1 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_2$(s) of at least two $R_2$(s) when b2 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_3$(s) of at least two $R_3$(s) when b3 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_4$(s) of at least two $R_4$(s) when b4 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and two $R_5$(s) of at least two $R_5$(s) when b5 is 2 or greater may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the organometallic compound represented by Formula 1 may be selected from Compounds 1 to 105:

1

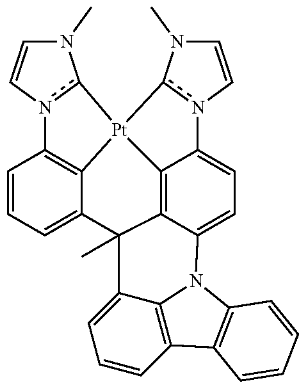

2

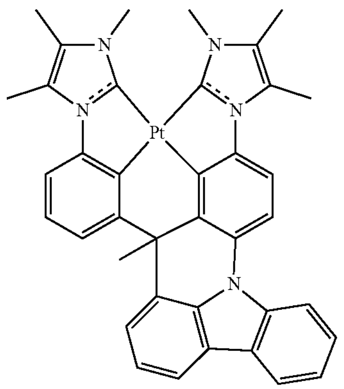

3

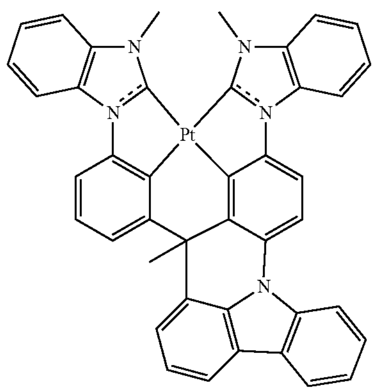

-continued
4
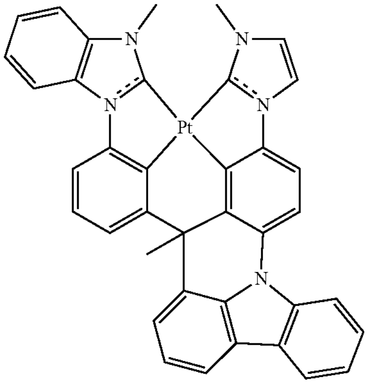
5
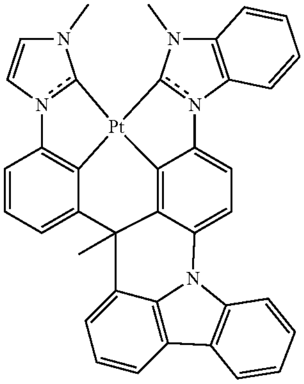
6
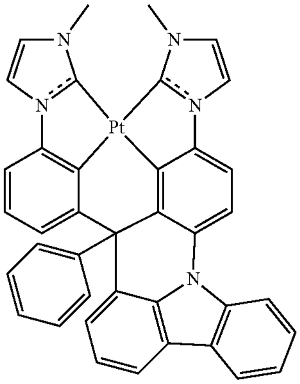
7
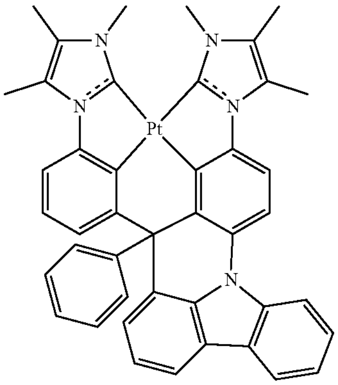
-continued
8
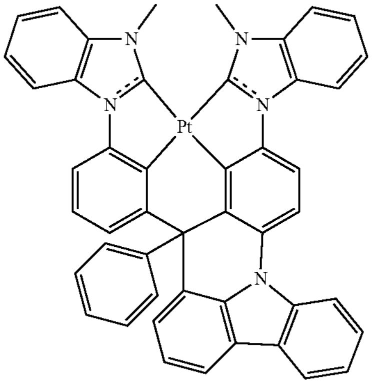
9
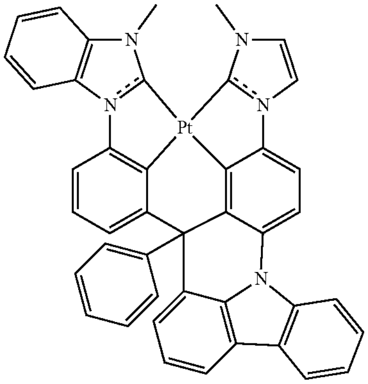
10
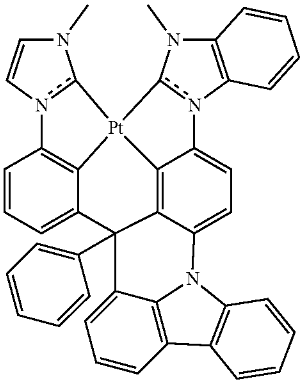
11
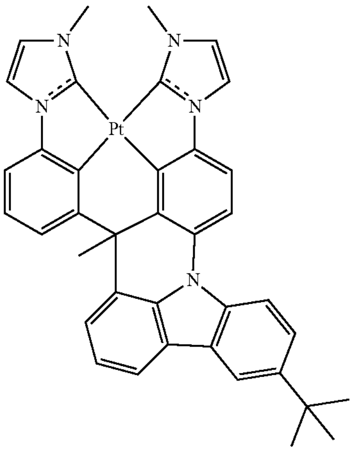

-continued
12
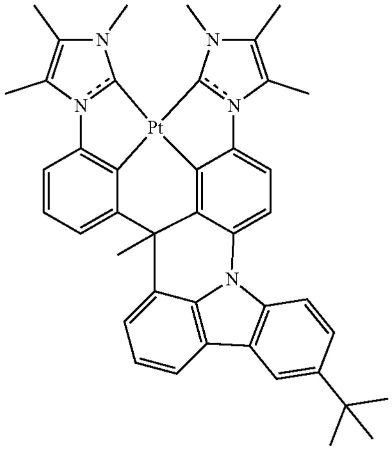
13
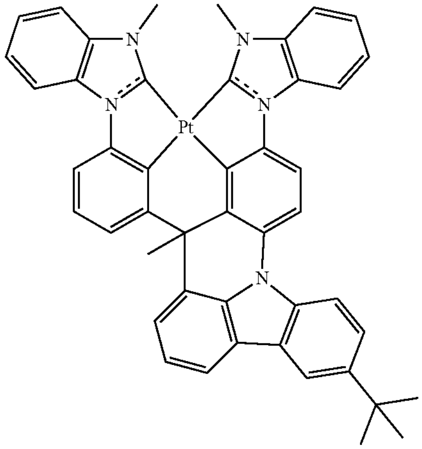
14
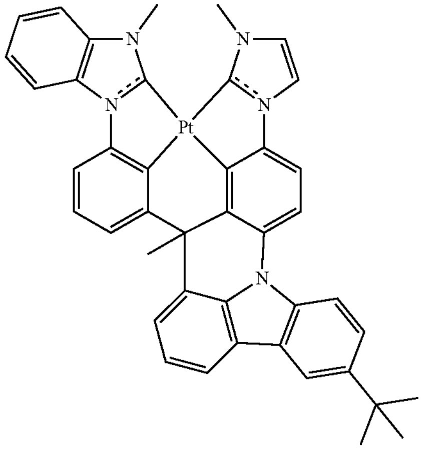
-continued
15
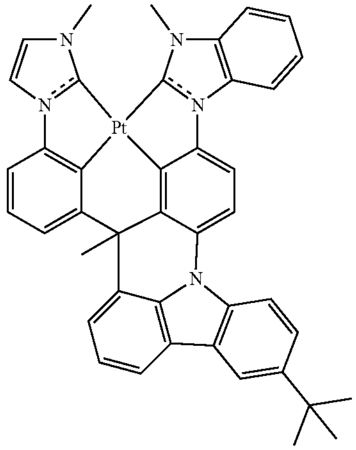
16
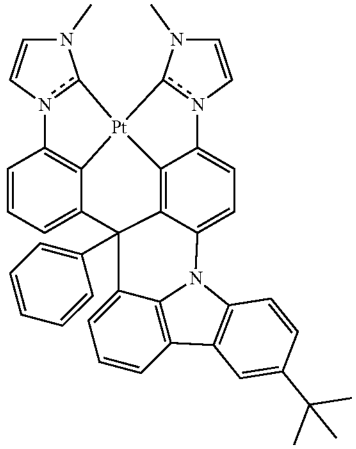
17
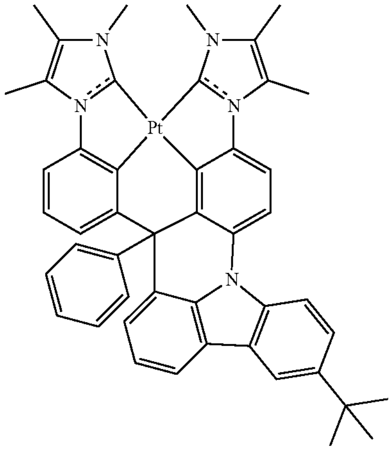

-continued
18
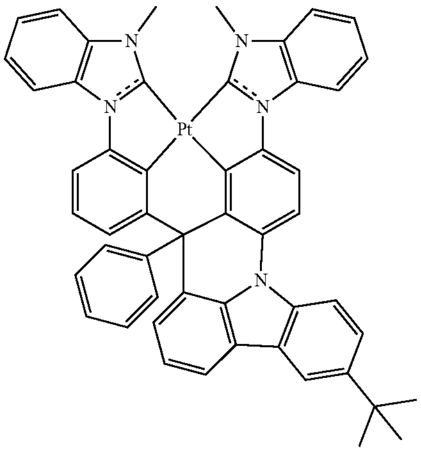
19
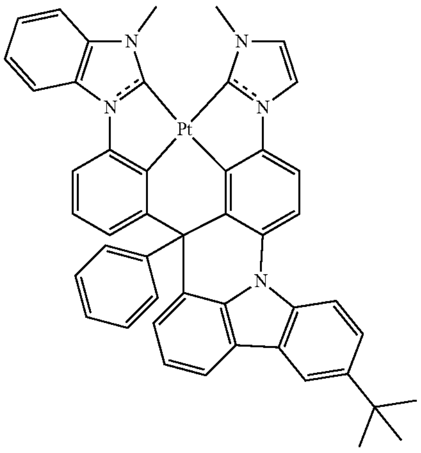
20
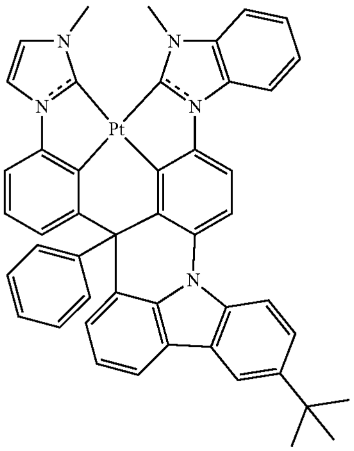
-continued
21
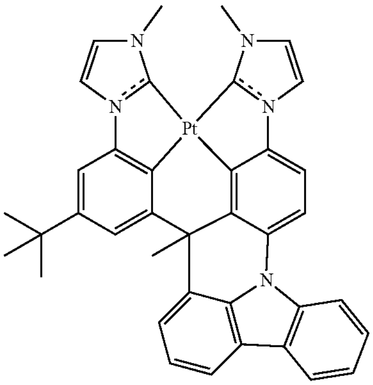
22
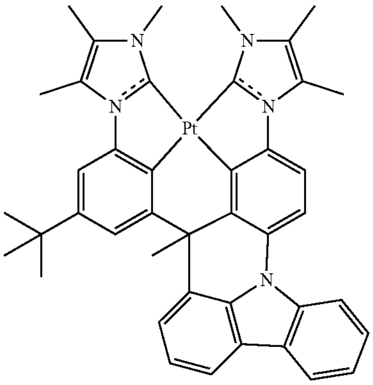
23
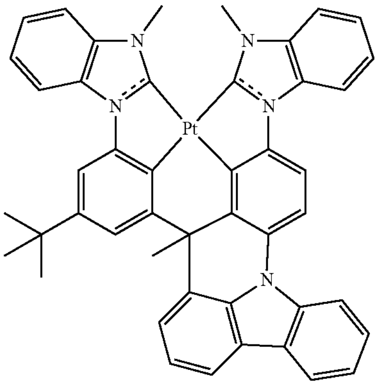
24
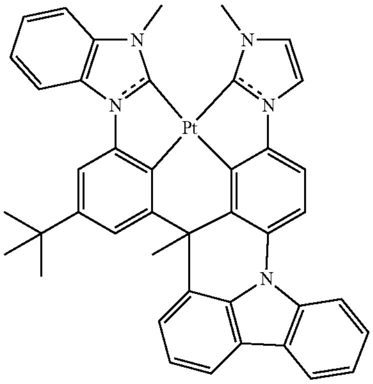

-continued
25
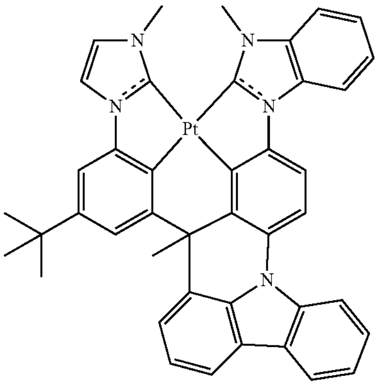
26
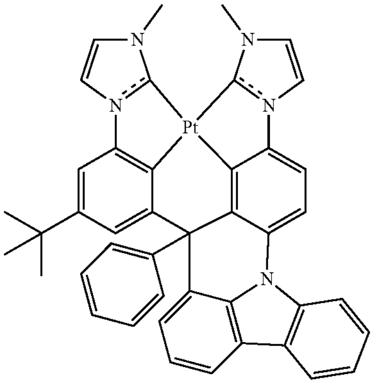
27
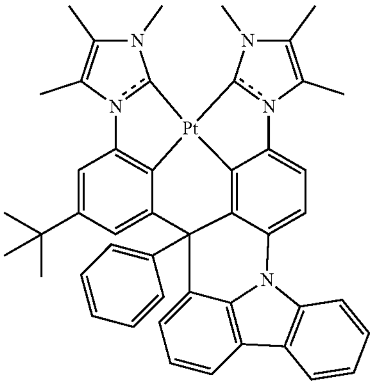
28
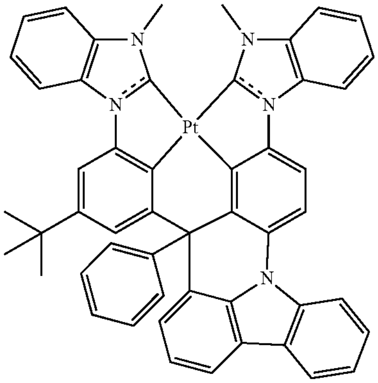
-continued
29
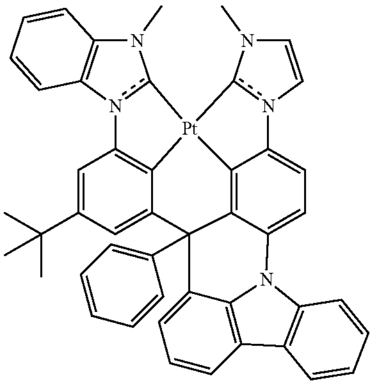
30
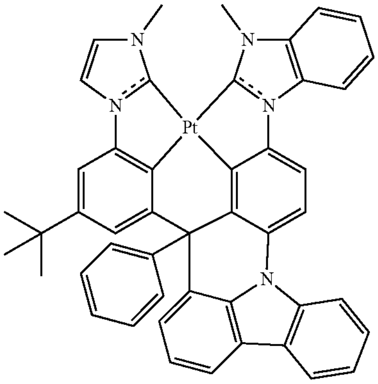
31
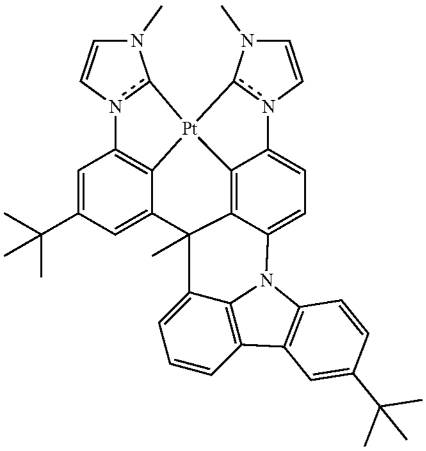

-continued
32
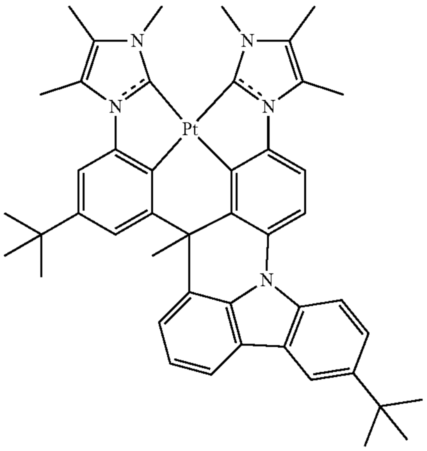
33
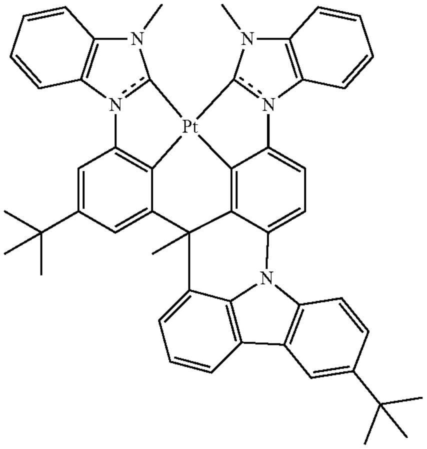
34
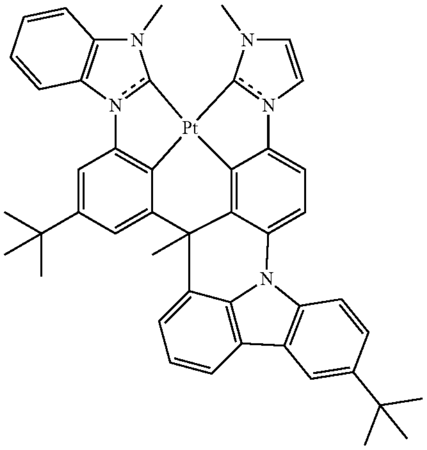
-continued
35
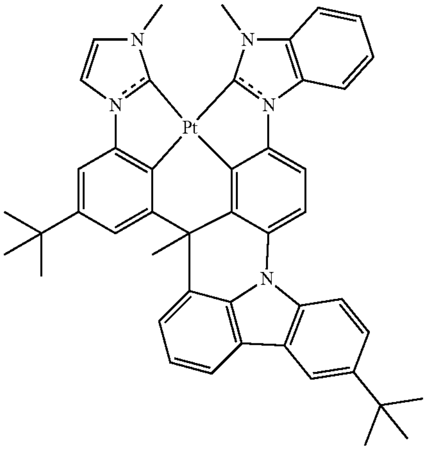
36
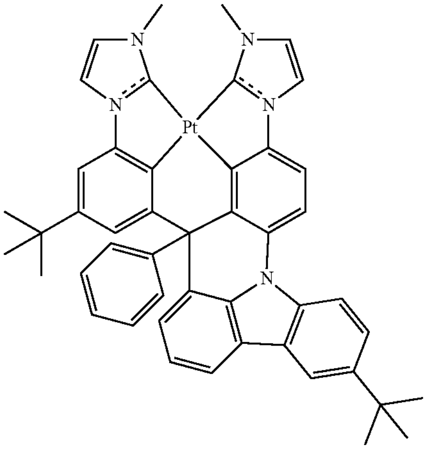
37
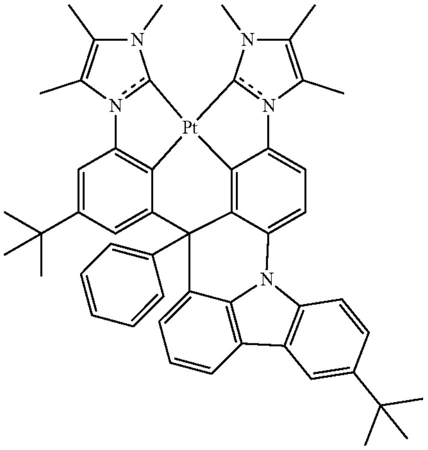

-continued
38
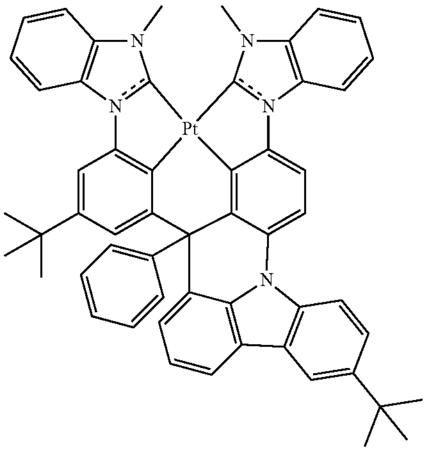
39
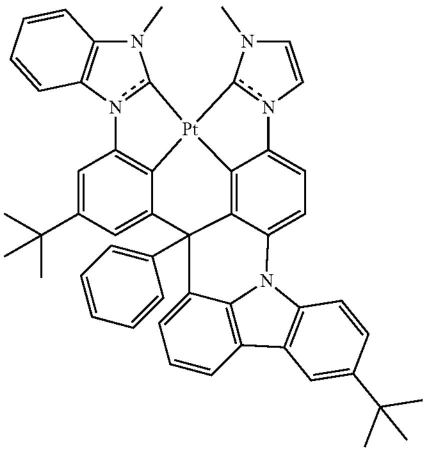
40
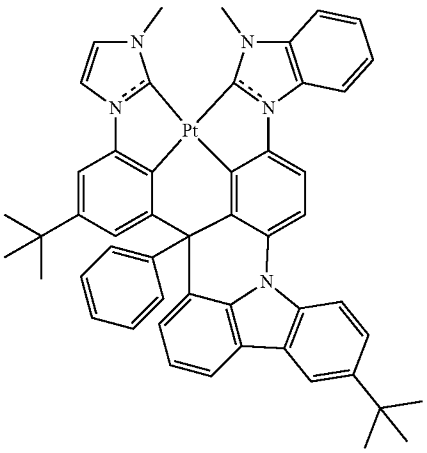
-continued
41
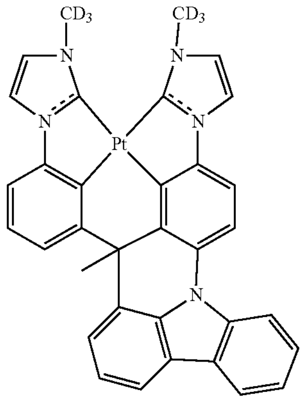
42
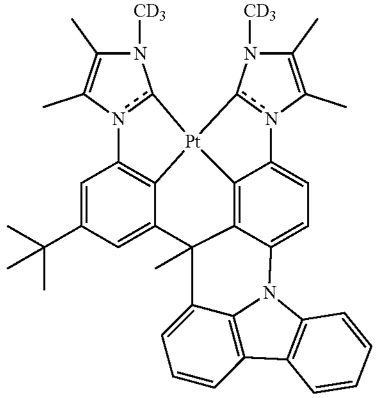
43
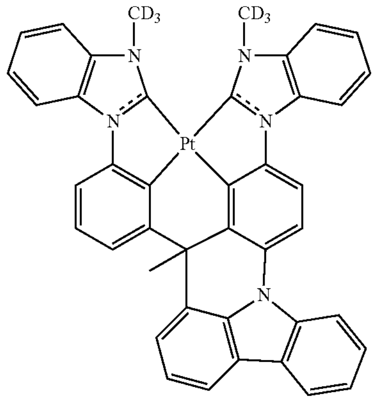
44
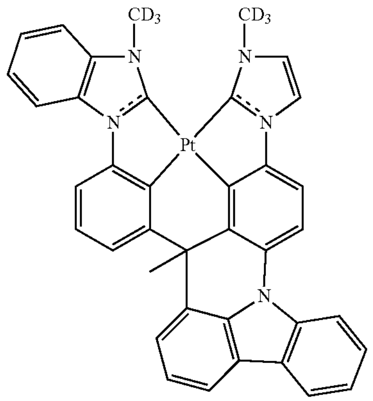

-continued
45
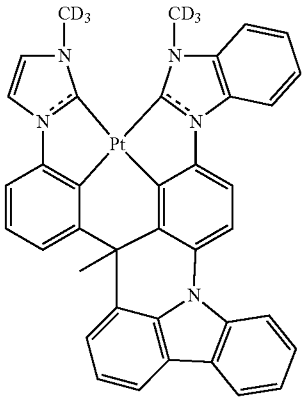
46
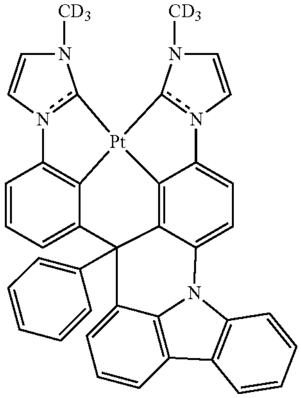
47
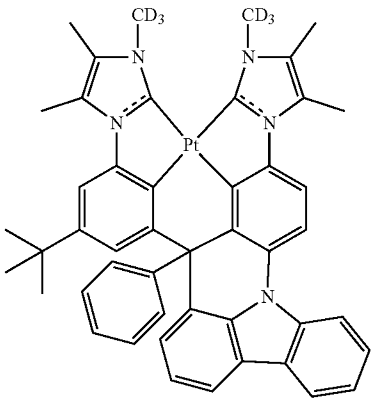
48
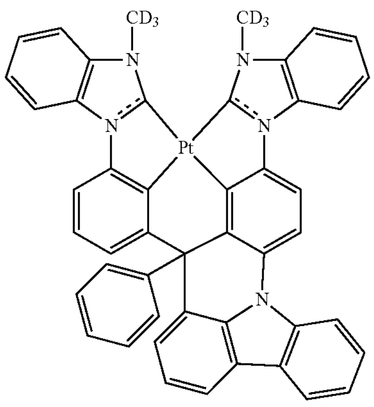
-continued
49
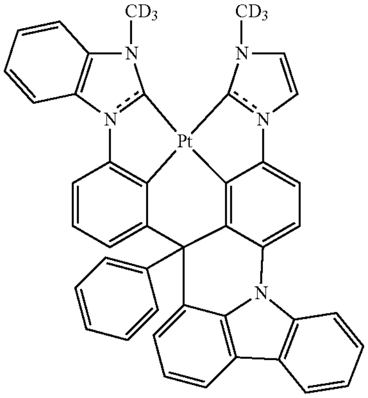
50
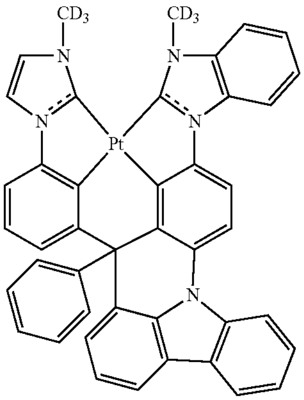
51
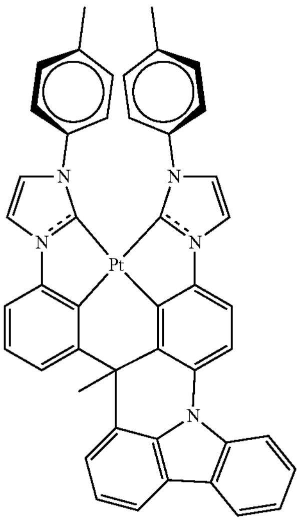

-continued
52
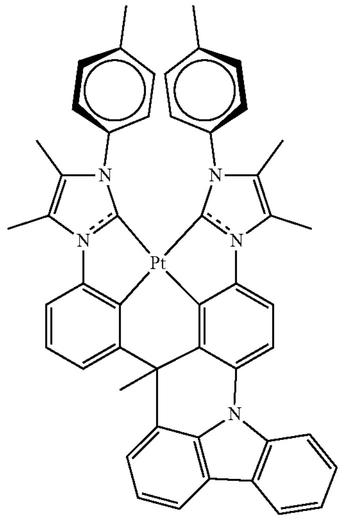
53
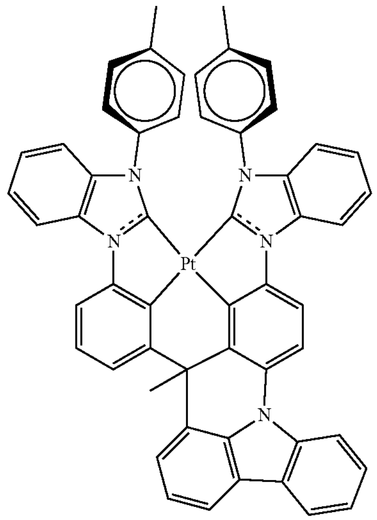
54
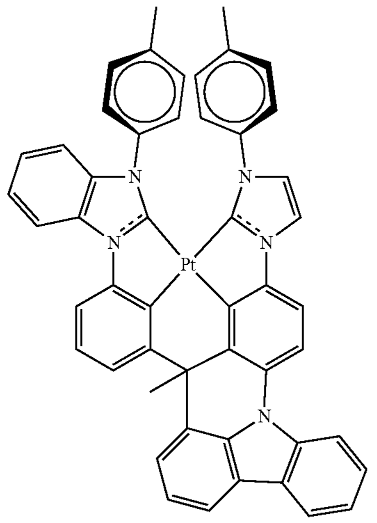
-continued
55
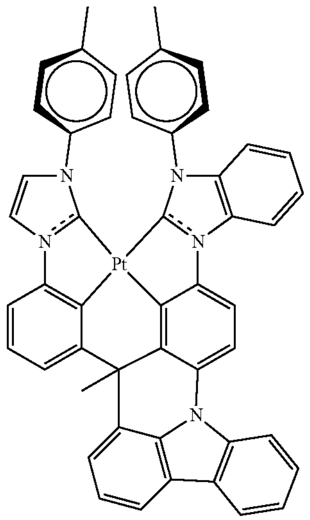
56
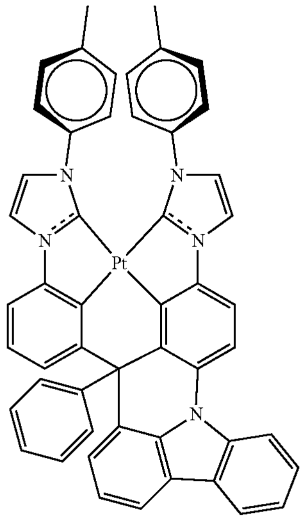
57
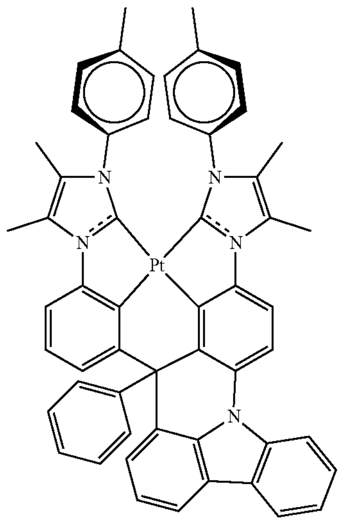

-continued
58
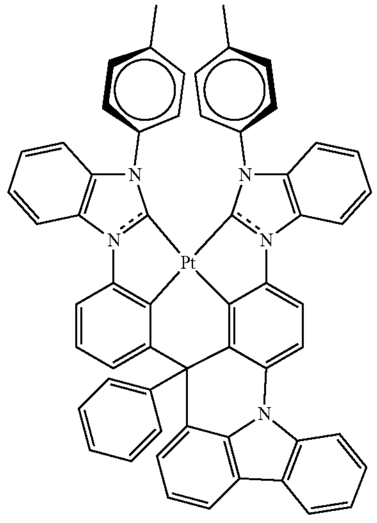
59
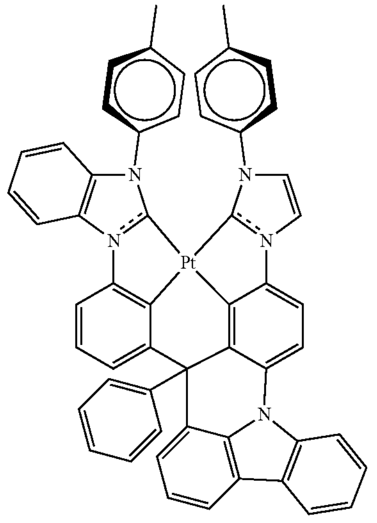
60
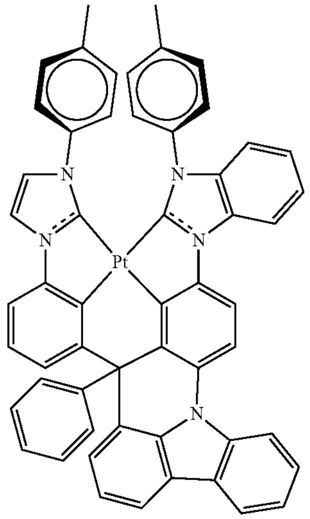
-continued
61
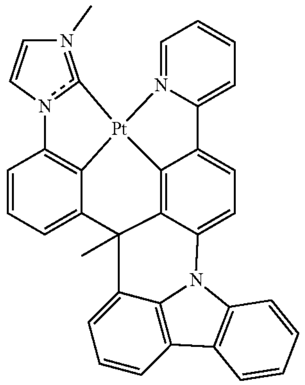
62
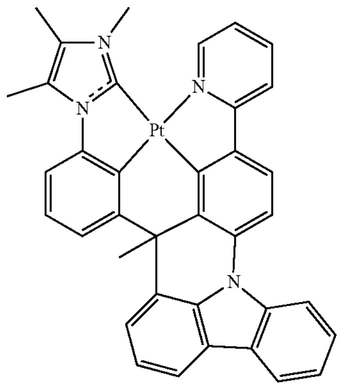
63
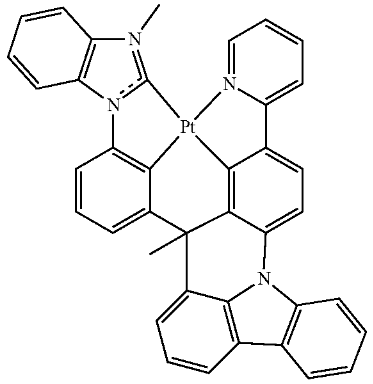
64
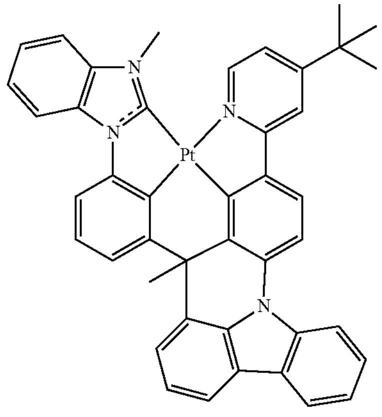

-continued
65
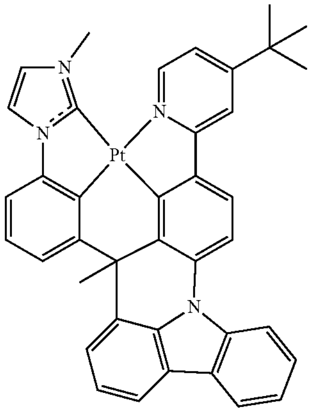
66
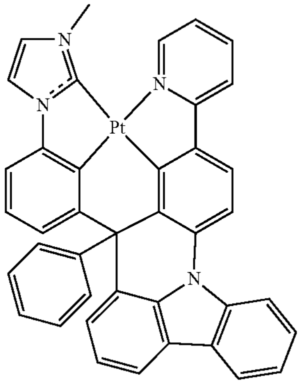
67
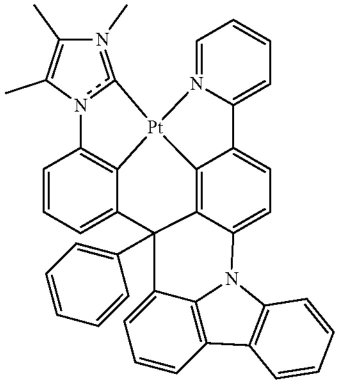
68
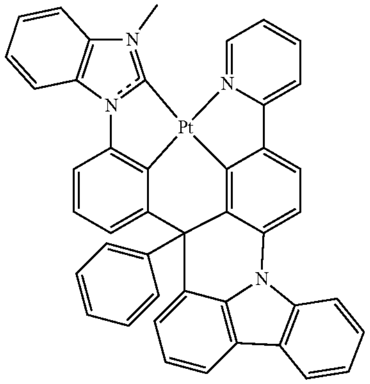
-continued
69
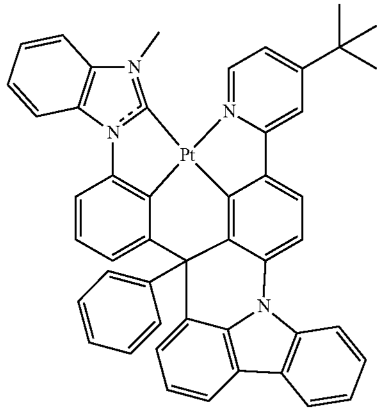
70
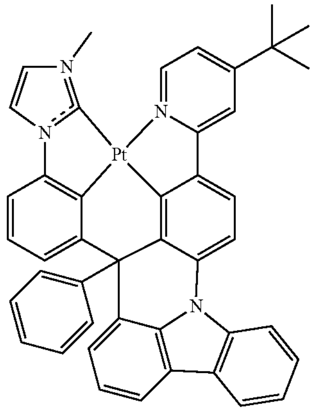
71
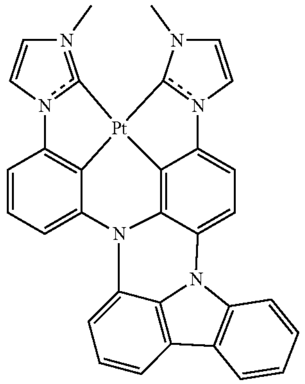
72
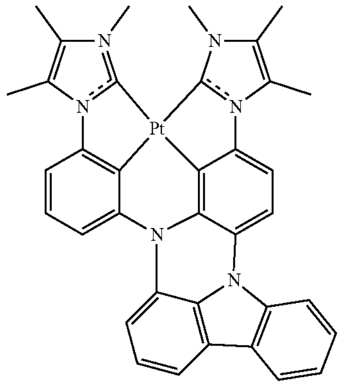

-continued
73
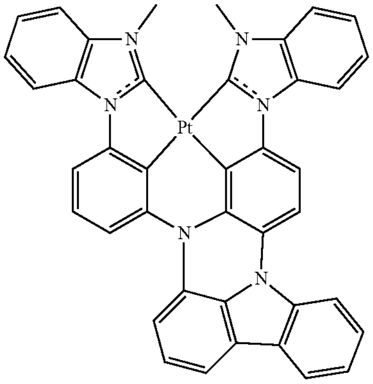
74
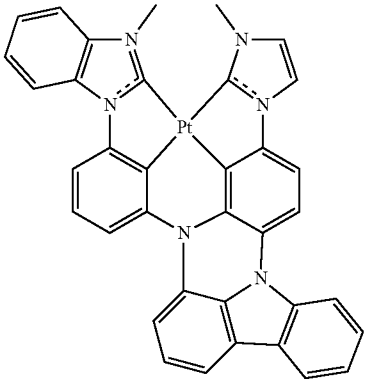
75
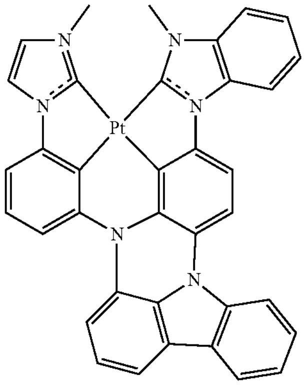
76
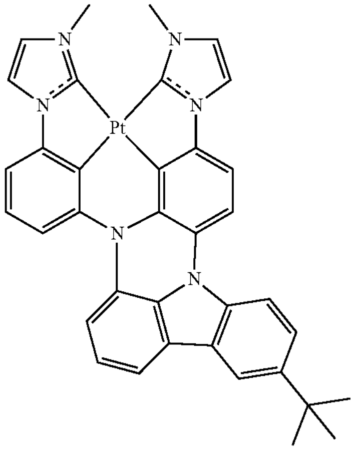
-continued
77
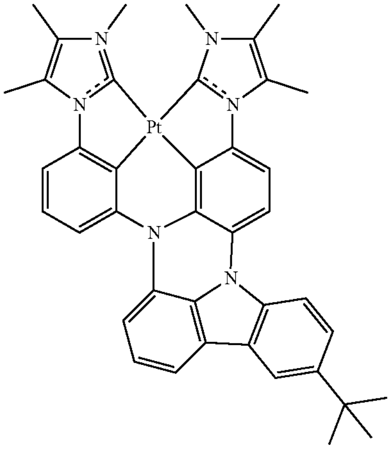
78
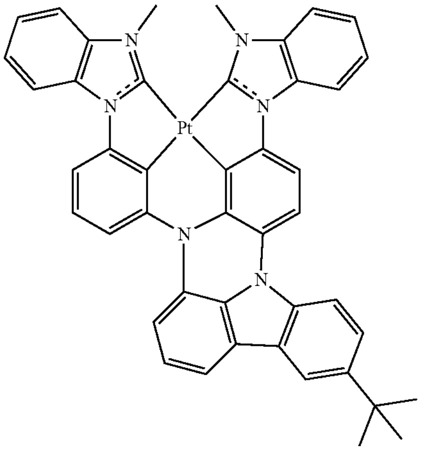
79
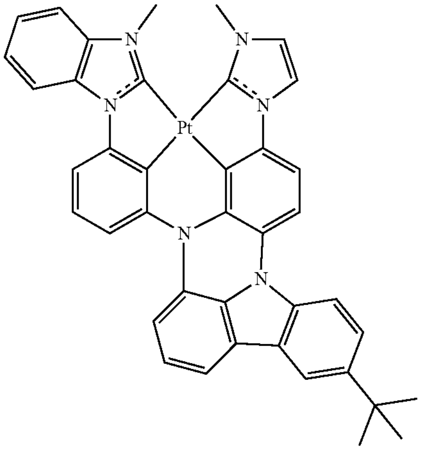

-continued
80
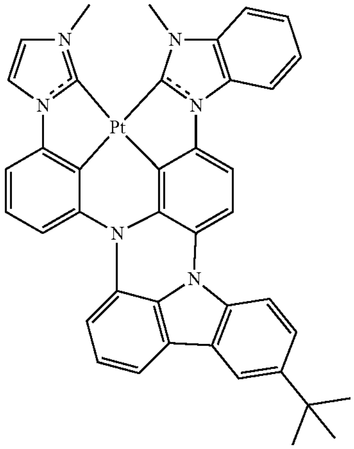
81
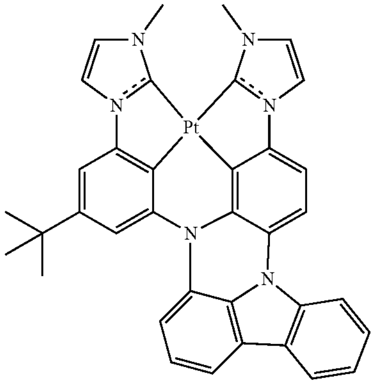
82
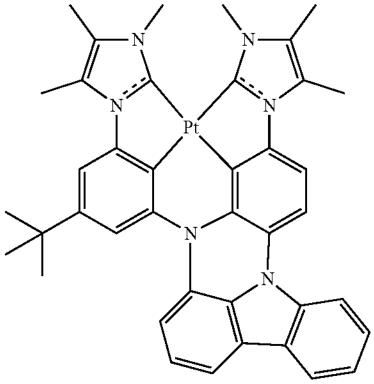
83
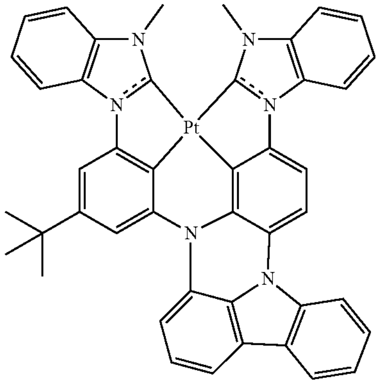
-continued
84
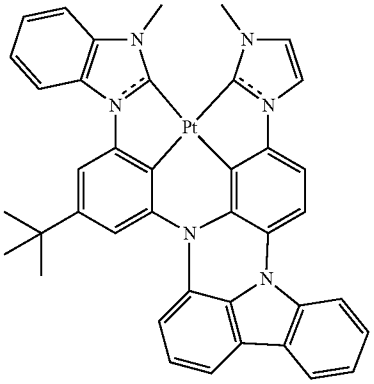
85
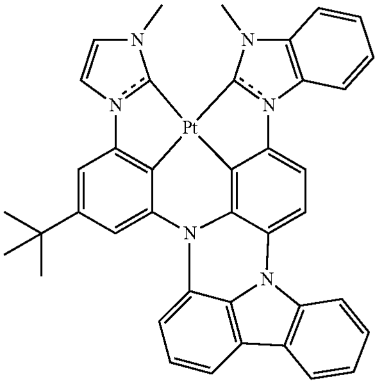
86
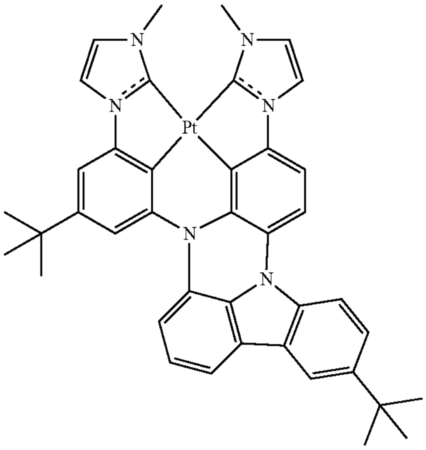

-continued
87
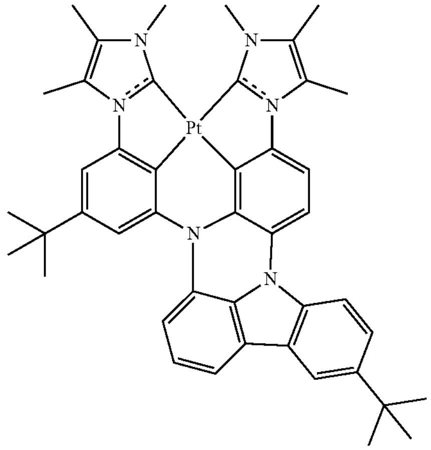
88
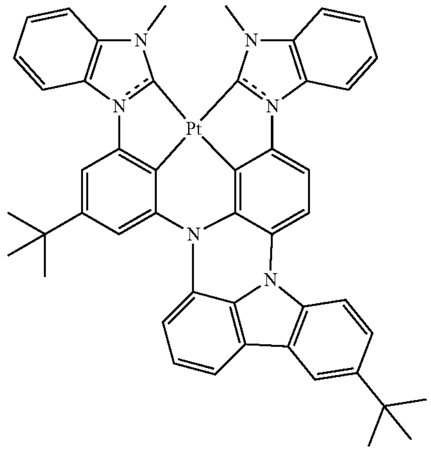
89
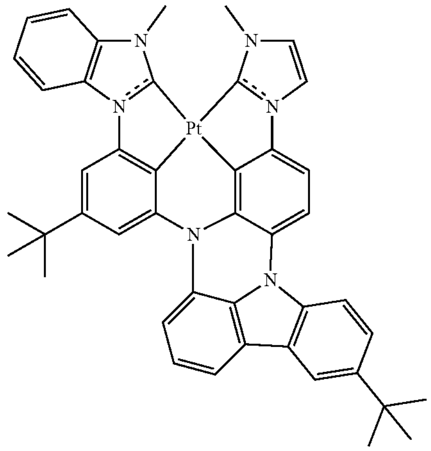
-continued
90
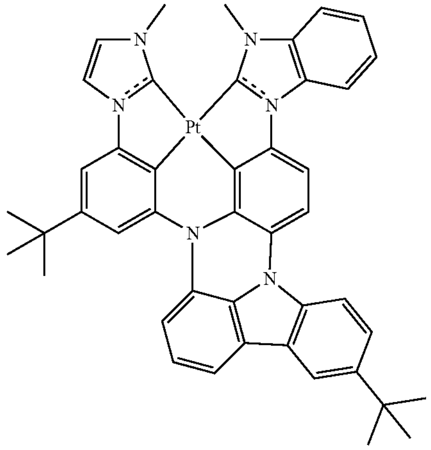
91
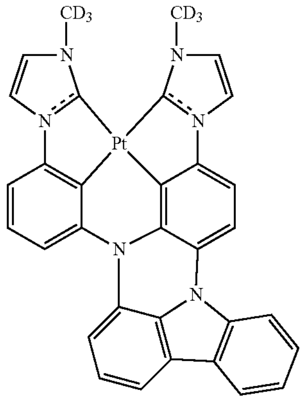
92
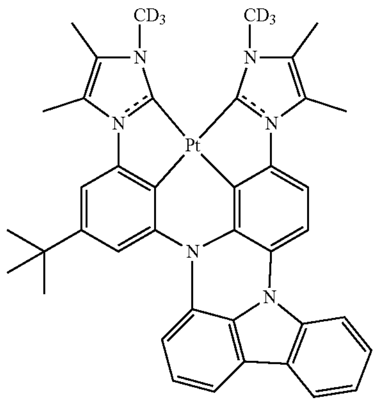
93
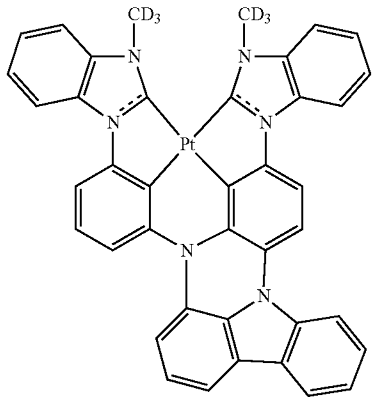

-continued
94
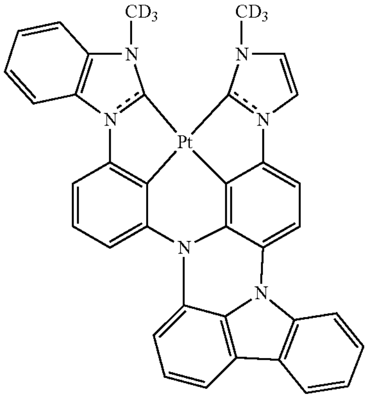
95
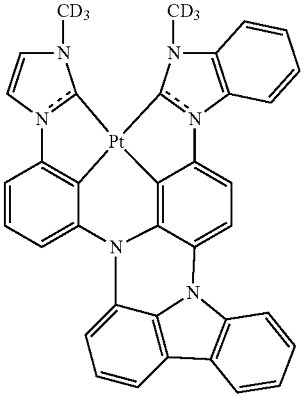
96
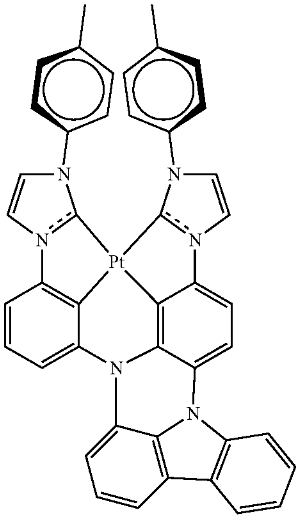
-continued
97
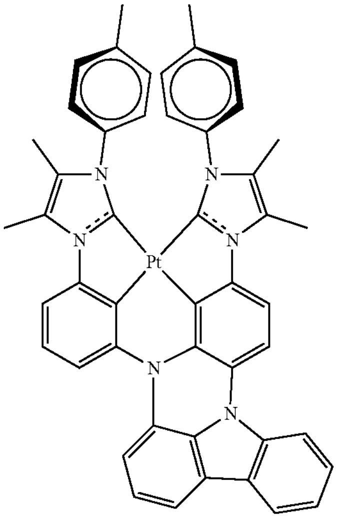
98
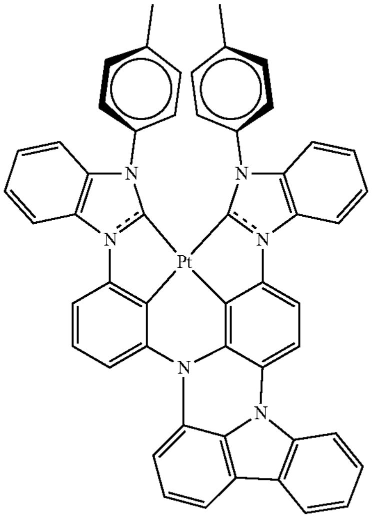
99
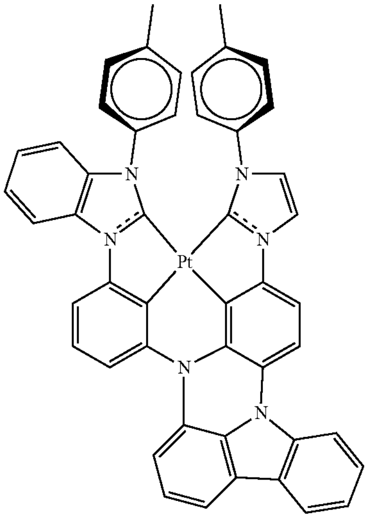

-continued

100

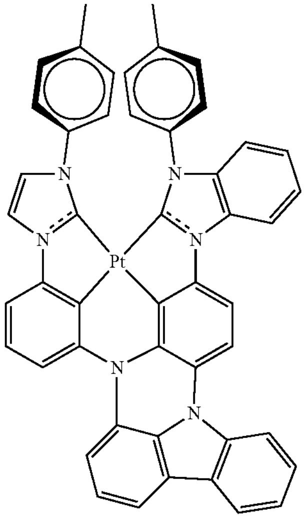

101

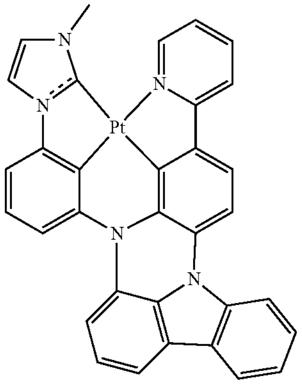

102

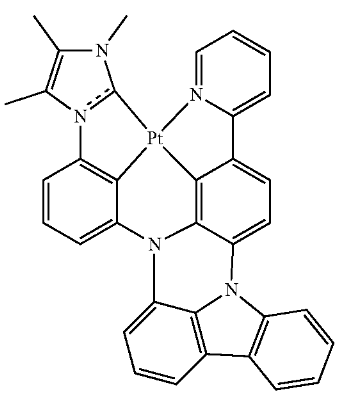

-continued

103

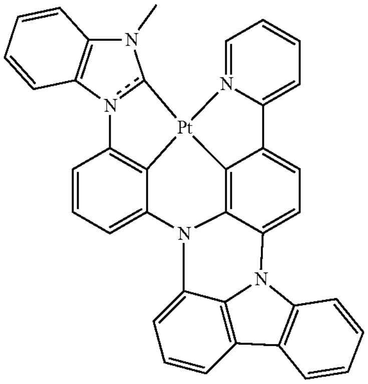

104

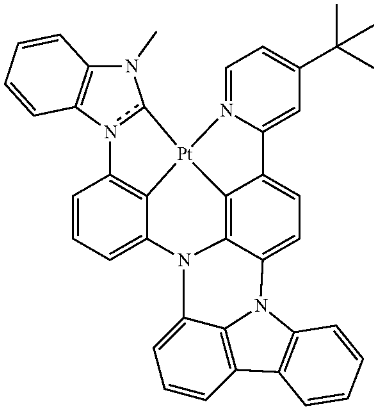

105

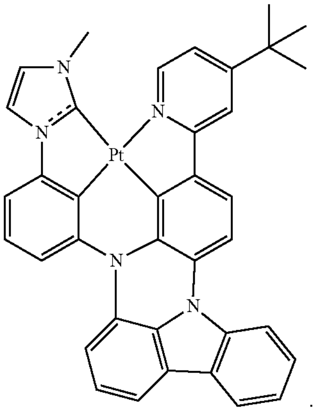

In embodiments, the organometallic compound represented by Formula 1 may emit blue light. In embodiments, the organometallic compound represented by Formula 1 may emit blue light having a maximum emission wavelength in a range of about 430 nanometers (nm) to about 490 nm. For example, the organometallic compound represented by Formula 1 may emit blue light having a maximum emission wavelength in a range of about 430 nm to about 485 nm. For example, the organometallic compound represented by Formula 1 may emit blue light having a maximum emission wavelength in a range of about 440 nm to about 475 nm. For example, the organometallic compound represented by Formula 1 may emit blue light having a maximum emission wavelength in a range of about 455 nm to about 470 nm.

In the organometallic compound represented by Formula 1, $Y_1$ in Formula 1 may be N, and thus, the organometallic compound may have a non-planar structure. In Formula 1, a degree of intramolecular conjugation may be adjusted in the organometallic compound in which $T_1$ is $C(Z_{11})$ or N. Thus, in the light-emitting device including the organometallic compound, formation of exciplex or excimer may be prevented between a dopant and a dopant or between a dopant and a host. Accordingly, the light-emitting device may be used in the manufacture of an electronic apparatus having a low driving voltage, excellent luminescence efficiency, long lifespan, and excellent colorimetric purity.

Methods of synthesizing the organometallic compound represented by Formula 1 may be easily understood to those of ordinary skill in the art by referring to Synthesis Examples and Examples described herein.

According to embodiments, at least one of the organometallic compounds represented by Formula 1 may be used in a light-emitting device (e.g., an organic light-emitting device). Therefore, according to an embodiment, a light-emitting device may include a first electrode, a second electrode facing the first electrode, an interlayer disposed between the first electrode and the second electrode and including an emission layer, and the organometallic compound represented by Formula 1.

In an embodiment, the interlayer in the light-emitting device may include a first compound as the organometallic compound represented by Formula 1; and a second compound including at least one π electron-deficient nitrogen-containing $C_1$-$C_{60}$ cyclic group, a third compound including a group represented by Formula 3, a fourth compound that may emit delayed fluorescence, or any combination thereof, wherein the first compound, the second compound, the third compound, and the fourth compound may be different from one another:

[Formula 3]

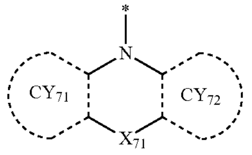

In Formula 3, ring $CY_{71}$ and ring $CY_{72}$ may each independently be a π electron-rich $C_3$-$C_{60}$ cyclic group or a pyridine group, $X_{71}$ may be a single bond or a linking group including O, S, N, B, C, Si, or any combination thereof,

* in Formula 3 indicates a binding site to an adjacent atom in the third compound, and the following compounds may be excluded from the third compound:

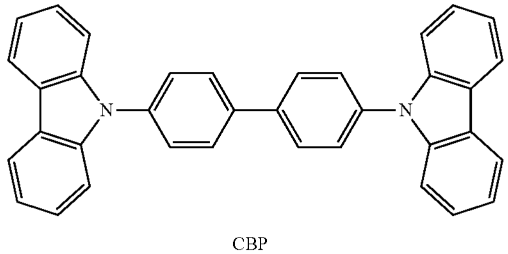

CBP

-continued

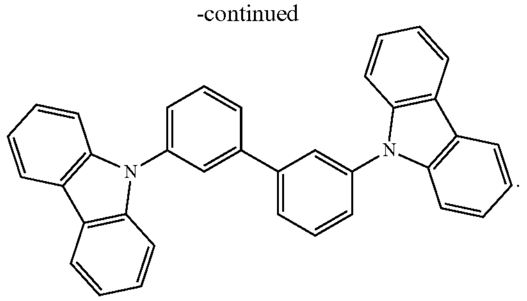

mCBP

Descriptions of Second Compound, Third Compound, and Fourth Compound

In an embodiment, the second compound may include a pyridine group, a pyrimidine group, a pyrazine group, a pyridazine group, a triazine group, or any combination thereof.

In embodiments, the light-emitting device may further include at least one of the second compound and the third compound, in addition to the first compound.

In embodiments, the light-emitting device may further include the fourth compound, in addition to the first compound.

In embodiments, the light-emitting device may include the first compound, the second compound, the third compound, and the fourth compound.

In embodiments, the interlayer may include the second compound. The interlayer may further include, in addition to the first compound and the second compound, the third compound, the fourth compound, or any combination thereof.

In embodiments, a difference between the triplet energy level in electron volts (eV) of the fourth compound and the singlet energy level in electron volts (eV) of the fourth compound may be in a range of about 0 eV to about 0.5 eV. For example, the difference between the triplet energy level in electron volts (eV) of the fourth compound and the singlet energy level in electron volts (eV) of the fourth compound may be in a range of about 0 eV to about 0.3 eV.

In embodiments, the fourth compound may be a compound including at least one cyclic group including boron (B) and nitrogen (N) as ring-forming atoms.

In embodiments, the fourth compound may be a $C_8$-$C_{60}$ polycyclic group-containing compound including at least two condensed cyclic groups that share a boron atom (B).

In embodiments, the fourth compound may include a condensed ring in which at least one third ring may be condensed with at least one fourth ring, the third ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In embodiments, the interlayer may include the fourth compound. The interlayer may include, in addition to the first compound and the fourth compound, the second compound, the third compound, or any combination thereof.

In embodiments, the interlayer may include the third compound. For example, the third compound may not include CBP described herein and a compound represented by mCBP.

In an embodiment, the emission layer in the interlayer may include: the first compound; and the second compound, the third compound, the fourth compound, or any combination thereof.

In an embodiment, the emission layer may emit phosphorescence or fluorescence emitted from the first compound. In embodiments, phosphorescence or fluorescence emitted from the first compound may be blue light.

In embodiments, the emission layer in the light-emitting device may include the first compound and the second compound, and the first compound and the second compound may form an exciplex.

In embodiments, the emission layer in the light-emitting device may include the first compound, the second compound, and the third compound, and the first compound and the second compound may form an exciplex.

In embodiments, the emission layer in the light-emitting device may include the first compound and the fourth compound, and the fourth compound may improve color purity, luminescence efficiency, and lifespan characteristics of the light-emitting device.

In embodiments, the second compound may include a compound represented by Formula 2:

[Formula 2]

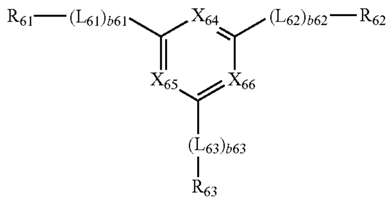

In Formula 2, $L_{61}$ to $L_{63}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b61 to b63 may each independently be an integer from 1 to 5, $X_{64}$ may be N or C($R_{64}$), $X_{65}$ may be N or C($R_{65}$), $X_{66}$ may be N or C($R_{66}$), and at least one of $X_{64}$ to $X_{66}$ may be N, $R_{61}$ to Ree may respectively be understood by referring to the descriptions of $R_{61}$ to Ree provided herein, and $R_{10a}$ may be understood by referring to the description of $R_{10a}$ provided herein.

In embodiments, the third compound may include a compound represented by Formula 3-1, a compound represented by Formula 3-2, a compound represented by Formula 3-3, a compound represented by Formula 3-4, a compound represented by Formula 3-5, or any combination thereof:

[Formula 3-1]

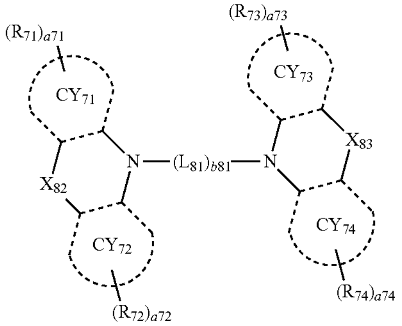

[Formula 3-2]

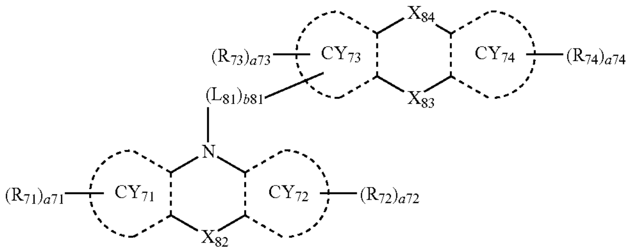

-continued

[Formula 3-3]

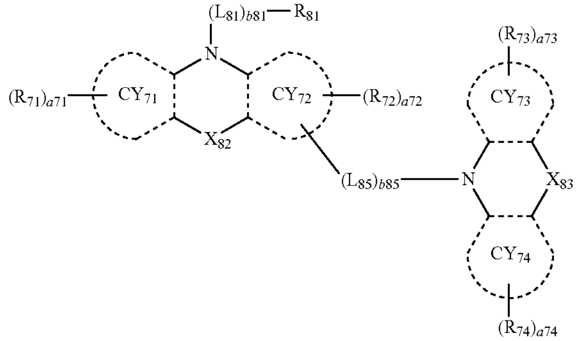

[Formula 3-4]

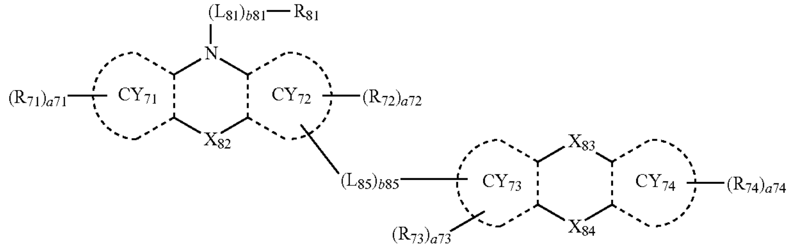

[Formula 3-5]

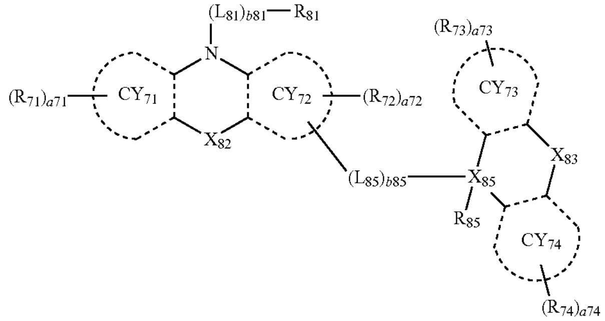

In Formulae 3-1 to 3-5, ring $CY_{71}$ to ring $CY_{74}$ may each independently be a π electron-rich $C_3$-$C_{60}$ cyclic group or a pyridine group, $X_{82}$ may be a single bond, O, S, N-[$(L_{82})_{b82}$-$R_{82}$], $C(R_{82a})(R_{82b})$, or $Si(R_{82a})(R_{82b})$, $X_{83}$ may be a single bond, O, S, N-[$(L_{83})_{b83}$-$R_{83}$], $C(R_{83a})(R_{83b})$, or $Si(R_{83a})(R_{83b})$, $X_{84}$ may be O, S, N-[$(L_{84})_{b84}$-$R_{84}$], $C(R_{84a})(R_{84b})$, or $Si(R_{84a})(R_{84b})$, $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group unsubstituted or substituted with at least one $R_{10a}$, or a pyridine group unsubstituted or substituted with at least one $R_{10a}$, wherein $Q_4$ and $Q_5$ may each independently be the same as defined in connection with $Q_1$ provided herein, * and *' each indicate a binding site to a neighboring atom, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may respectively be understood by referring to the descriptions of $R_{71}$ to $R_{74}$, $R_{81}$ to $R_{85}$, $R_{82a}$, $R_{82b}$, $R_{83a}$, $R_{83b}$, $R_{84a}$, and $R_{84b}$ provided herein, a71 to a74 may each independently be an integer from 0 to 20, and $R_{10a}$ may be understood by referring to the description of $R_{10a}$ provided herein.

In embodiments, the fourth compound may be a compound represented by Formula 502, a compound represented by Formula 503, or any combination thereof:

[Formula 502]

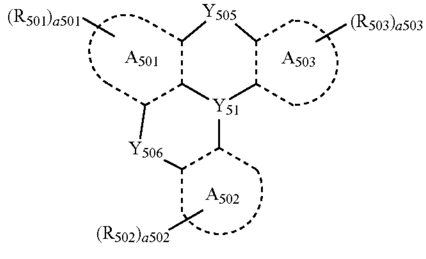

-continued

[Formula 503]

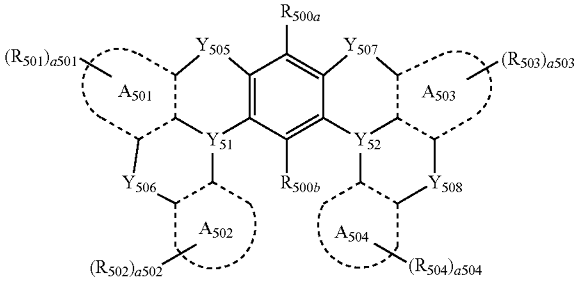

In Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{508}$ may be O, S, $N(R_{508})$, $B(R_{508})$, $C(R_{508a})(R_{508b})$, or $Si(R_{508a})(R_{508b})$, $Y_{51}$ and $Y_{52}$ may each independently be B, P(═O), or S(═O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may respectively be understood by referring to the descriptions of $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ provided herein, a501 to a504 may each independently be an integer from 0 to 20, and $R_{10a}$ may be understood by referring to the description of $R_{10a}$ provided herein.

Description of Formulae 2, 3, 3-1 to 3-5, 502, and 503

In Formula 2, b61 to b63 may respectively indicate the number of $L_{61}$(s) to $L_{63}$(s), and b61 to b63 may each independently be an integer from 1 to 5. When b61 is 2 or greater, at least two $L_{61}$(s) may be identical to or different from each other, when b62 is 2 or greater, at least two $L_{62}$(s) may be identical to or different from each other, and when b63 is 2 or greater, at least two $L_{63}$(s) may be identical to or different from each other. In embodiments, b61 to b63 may each independently be 1 or 2.

In an embodiment, in Formula 2, $L_{61}$ to $L_{63}$ may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodisiline group, a dibenzodihydrosiline group, a dibenzodioxane group, a dibenzooxathiene group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —C(═O)($Q_{31}$), —S(═O)$_2$($Q_{31}$), —P(═O)($Q_{31}$)($Q_{32}$), or any combination thereof, wherein $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In embodiments, in Formula 2, a bond between $L_{61}$ and $R_{61}$, a bond between $L_{62}$ and $R_{62}$, a bond between $L_{63}$ and $R_{63}$, a bond between at least two $L_{61}$ (s), a bond between at least two $L_{62}$(s), a bond between at least two $L_{63}$(s), a bond between $L_{61}$ and a carbon atom between $X_{64}$ and $X_{65}$ in Formula 2, a bond between $L_{62}$ and a carbon atom between $X_{64}$ and $X_{66}$ in Formula 2, and a bond between $L_{63}$ and a carbon atom between $X_{65}$ and $X_{66}$ in Formula 2 may each be a carbon-carbon single bond.

In Formula 2, $X_{64}$ may be N or $C(R_{64})$, $X_{65}$ may be N or $C(R_{65})$, $X_{66}$ may be N or $C(R_{66})$, and at least one of $X_{64}$ to $X_{66}$ may be N. $R_{64}$ to $R_{66}$ may respectively be understood by referring to the descriptions of $R_{64}$ to $R_{66}$ provided herein. In embodiments, two or three of $X_{64}$ to $X_{66}$ may each be N.

$R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$ and $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —C(═O)($Q_1$), —S(═O)$_2$($Q_1$), or —P(═O)

$(Q_1)(Q_2)$. $Q_1$ to $Q_3$ may respectively be understood by referring to the descriptions of $Q_1$ to $Q_3$ provided herein.

For example, i) $R_1$ to $R_5$, $Z_{11}$, $Z_{21}$, and $Z_{22}$ in Formula 1, ii) $R_{11}$, $R_{12}$, $R_{21}$, $R_{22}$, $R_{31}$ to $R_{34}$, $R_{41}$ to $R_{45}$, $R_{5a}$, $R_{5b}$, $R_{51}$, and $R_{52}$ in Formulae A1(1) to A1(32), A1-1 to A1-4, A2-1 to A2-8, A3-1 to A3-15, A4-1 to A4-32, CY1(a), CY1-1, and CY1-2, iii) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$ and $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and iv) $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $-CD_3$, $-CD_2H$, $-CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $-CD_3$, $-CD_2H$, $-CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolylgroup, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be selected from:

$—CH_3$, —CDs, $-CD_2H$, $-CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, —CHDCDs, $-CD_2CD_3$, $-CD_2CD_2H$, or $-CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

[Formula 91]

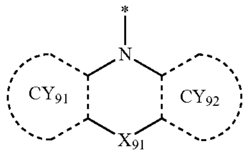

wherein in Formula 91, ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ may respectively be the same as defined in connection with $R_{82}$, $R_{82a}$, and $R_{82b}$ provided herein, $R_{10a}$ may be understood by referring to the description of $R_{10a}$ provided herein, and

* indicates a binding site to an adjacent atom.

In embodiments, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{91}$, $R_{91a}$ and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In embodiments, i) $R_1$ to $R_5$, $Z_{11}$, $Z_{21}$, and $Z_{22}$ in Formula 1, ii) $R_{11}$, $R_{12}$, $R_{21}$, $R_{22}$, $R_{31}$ to $R_{34}$, $R_{41}$ to $R_{45}$, $R_{5a}$, $R_{5b}$, $R_{51}$, and $R_{52}$ in Formulae A1(1) to A1(32), A1-1 to A1-4, A2-1 to A2-8, A3-1 to A3-15, A4-1 to A4-32, CY1(a), CY1-1, and CY1-2, iii) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$ and $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and iv) $R_{10a}$ may each independently be:

hydrogen, deuterium, —F, a cyano group, a nitro group, —$CH_3$, -$CD_3$, -$CD_2H$, -$CDH_2$, —$CF_3$, —$CF_2H$, —$CFH_2$, a group represented by one of Formulae 9-1 to 9-19, a group represented by one of Formulae 10-1 to 10-246, —C($Q_1$)($Q_2$)($Q_3$), —Si($Q_1$)($Q_2$)($Q_3$), or —P(=O)($Q_1$)($Q_2$), wherein $Q_1$ to $Q_3$ may respectively be understood by referring to the descriptions of $Q_1$ to $Q_3$ provided herein:

9-1
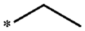
9-2
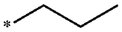
9-3
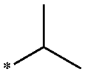
9-4
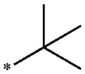
9-5
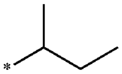
9-6
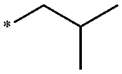
9-7
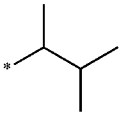
9-8
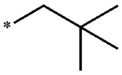
9-9
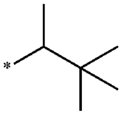
9-10
9-11
9-12
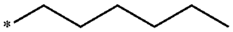
9-13
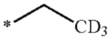

-continued 9-14
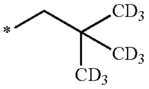
9-15
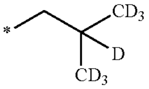
9-16
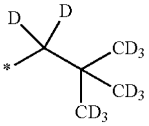
9-17
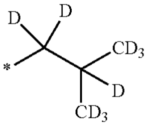
9-18
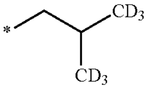
9-19
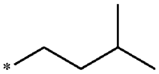
10-1
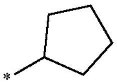
10-2
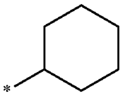
10-3
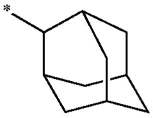
10-4
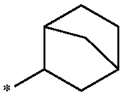
10-5
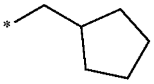
10-6
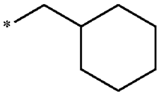
10-7
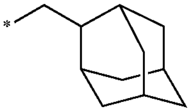
10-8
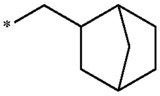

10-9
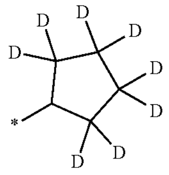
10-10
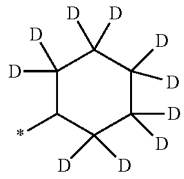
10-11
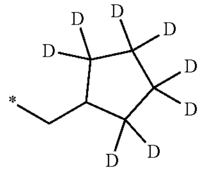
10-12
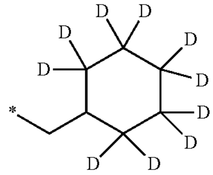
10-13
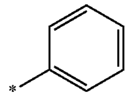
10-14
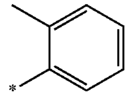
10-15
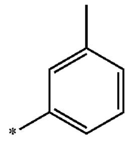
10-16
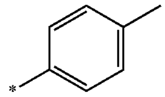
10-17
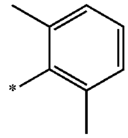
10-18
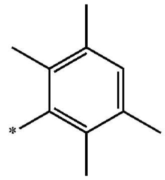
10-19
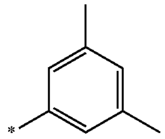
10-20
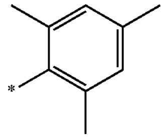
10-21
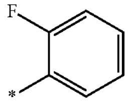
10-22
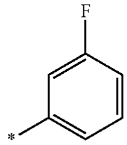
10-23
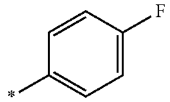
10-24
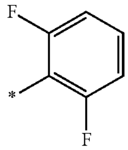
10-25
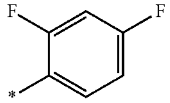
10-26
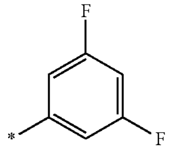
10-27
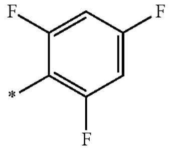
10-28
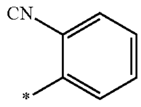
10-29
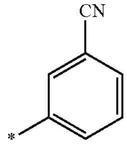

-continued
10-30
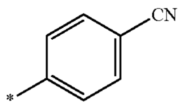
10-31
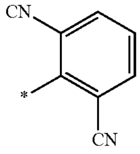
10-32
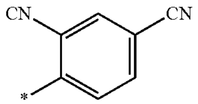
10-33
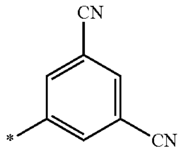
10-34
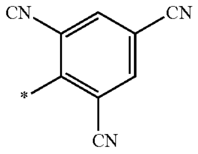
10-35
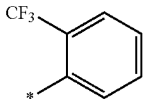
10-36
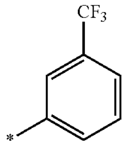
10-37
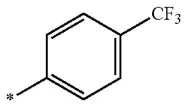
10-38
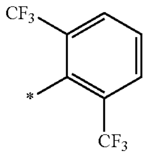
10-39
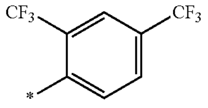
10-40
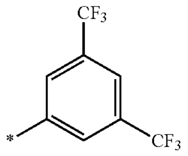
-continued
10-41
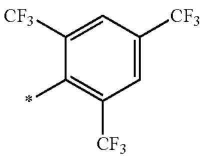
10-42
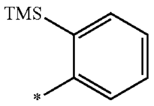
10-43
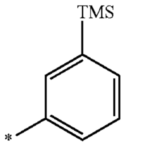
10-44
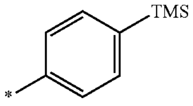
10-45
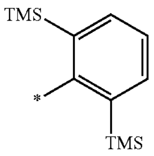
10-46
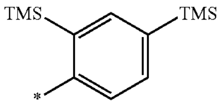
10-47
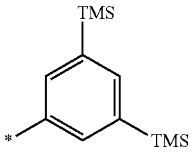
10-48
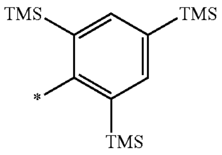
10-49
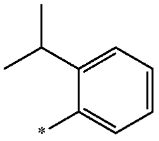
10-50
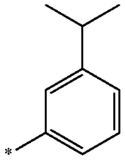
10-51
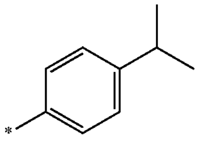

-continued
10-52
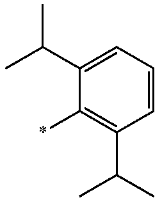
10-53
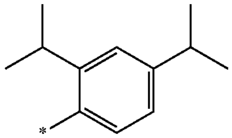
10-54
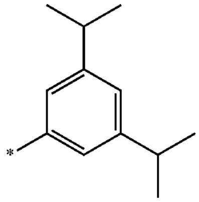
10-55
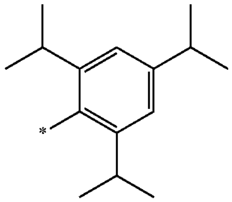
10-56
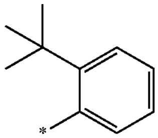
10-57
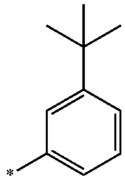
10-58
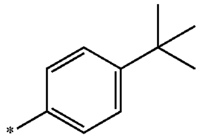
10-59
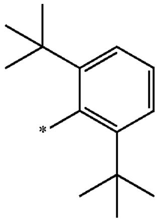
-continued
10-60
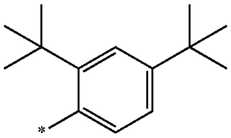
10-61
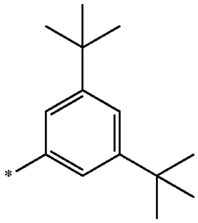
10-62
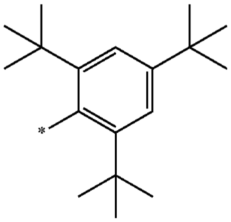
10-63
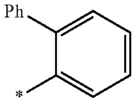
10-64
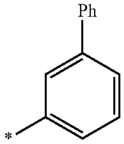
10-65
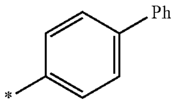
10-66
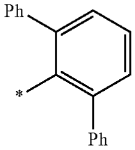
10-67
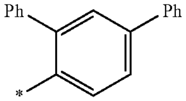
10-68
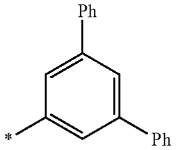
10-69
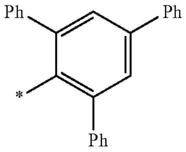

-continued
10-70
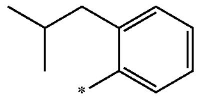
10-71
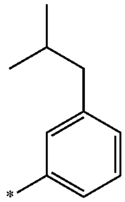
10-72
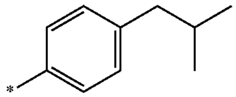
10-73
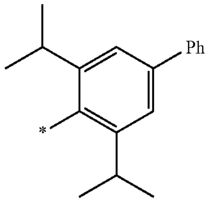
10-74
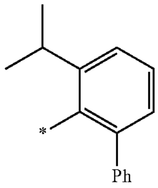
10-75
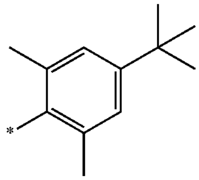
10-76
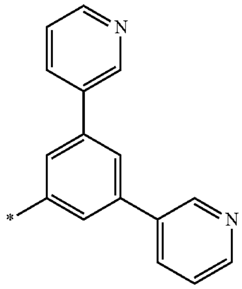
10-77
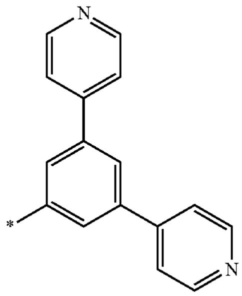
-continued
10-78
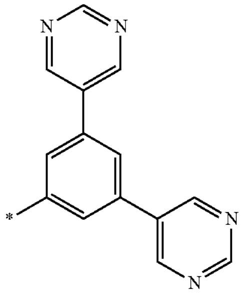
10-79
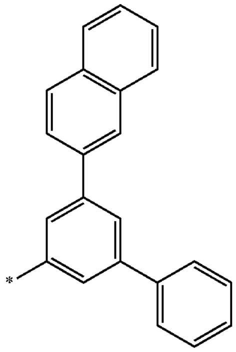
10-80
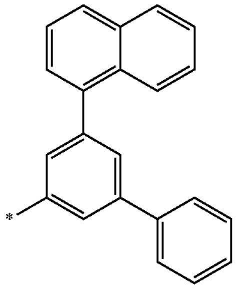
10-81
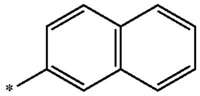
10-82
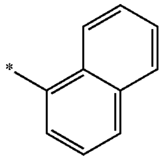
10-83
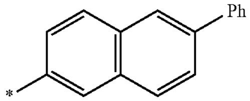
10-84
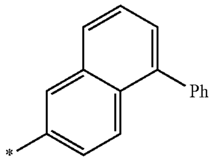

-continued
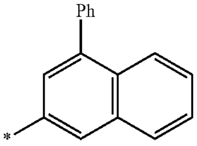
10-85
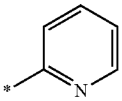
10-86
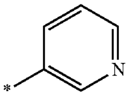
10-87
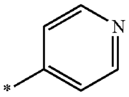
10-88
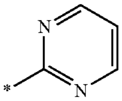
10-89
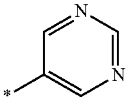
10-90
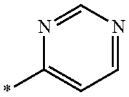
10-91
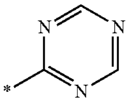
10-92
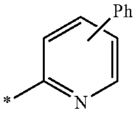
10-93
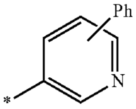
10-94
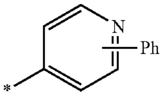
10-95
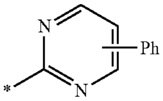
10-96
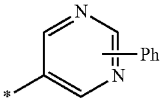
10-97
-continued
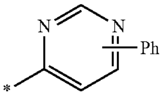
10-98
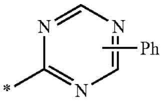
10-99
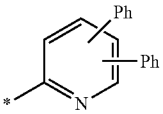
10-100
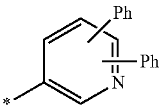
10-101
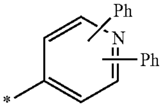
10-102
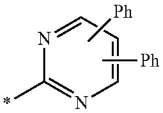
10-103
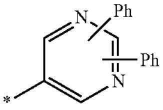
10-104
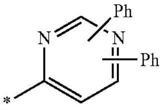
10-105
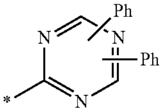
10-106
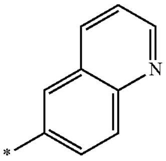
10-107
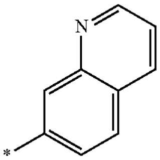
10-108
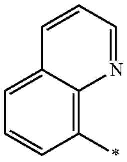
10-109

-continued
10-110
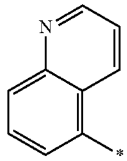
10-111
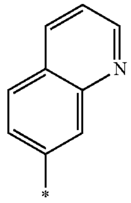
10-112
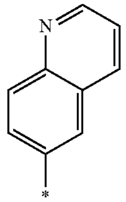
10-113
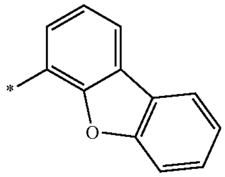
10-114
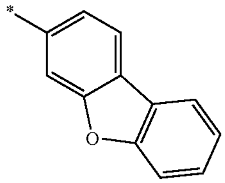
10-115
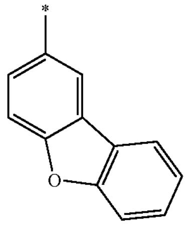
10-116
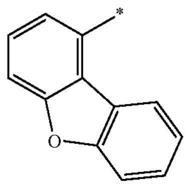
10-117
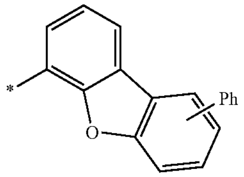
-continued
10-118
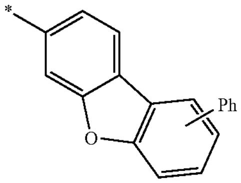
10-119
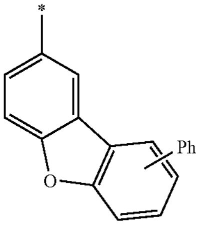
10-120
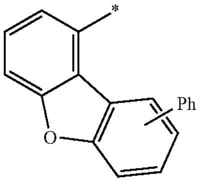
10-121
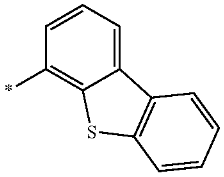
10-122
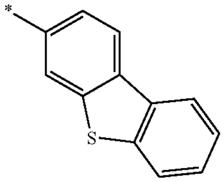
10-123
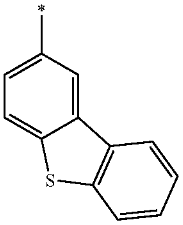
10-124
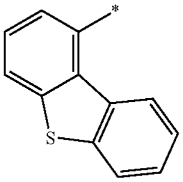
10-125
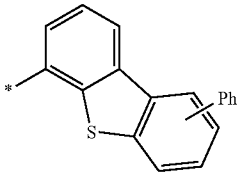

-continued
10-126
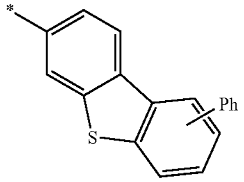
10-127
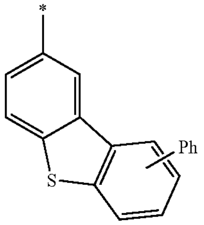
10-128
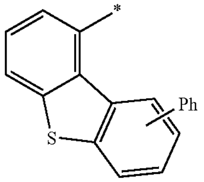
10-129
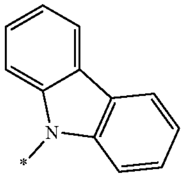
10-130
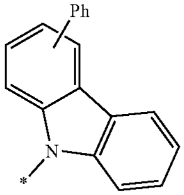
10-131
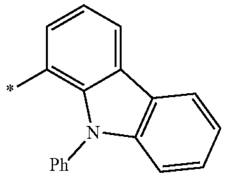
10-132
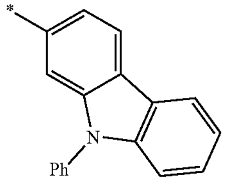
10-133
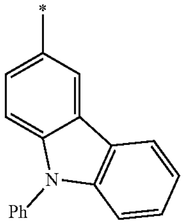
-continued
10-134
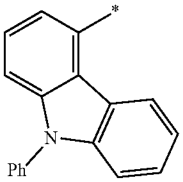
10-135
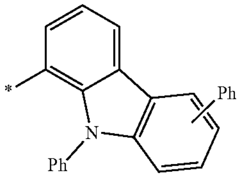
10-136
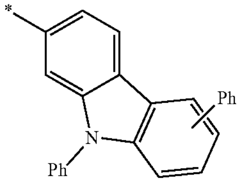
10-137
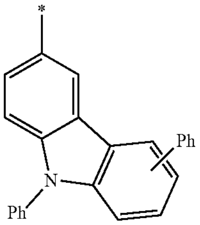
10-138
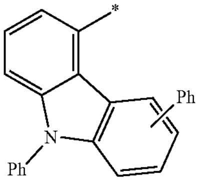
10-139
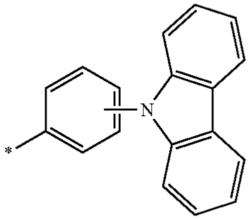
10-140
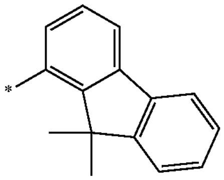
10-141
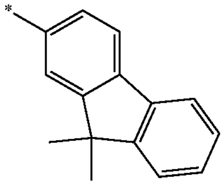

-continued
10-142
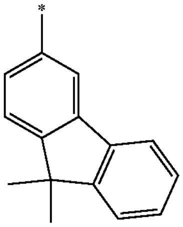
10-143
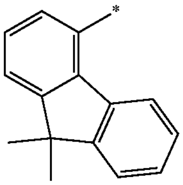
10-144
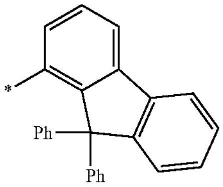
10-145
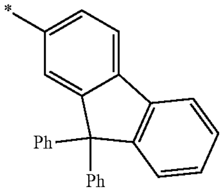
10-146
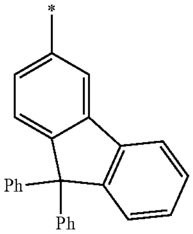
10-147
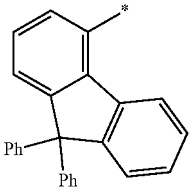
10-148
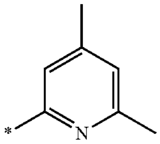
10-149
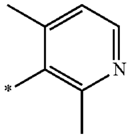
-continued
10-150
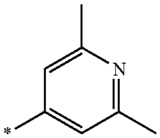
10-151
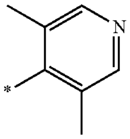
10-152
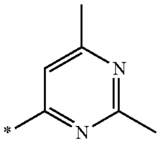
10-153
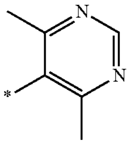
10-154
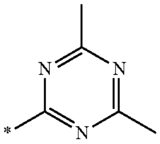
10-155
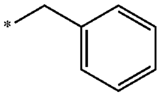
10-156
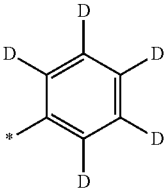
10-157
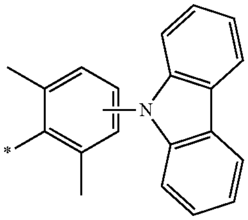
10-158
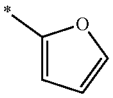
10-159
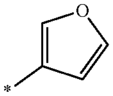

-continued
10-160
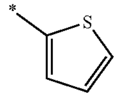
10-161
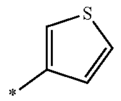
10-162
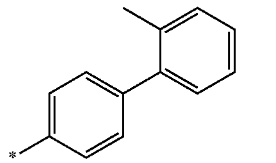
10-163
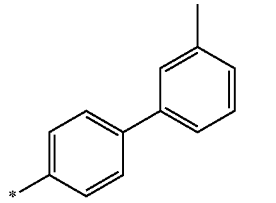
10-164
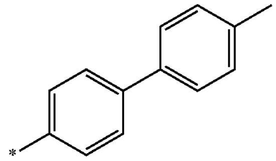
10-165
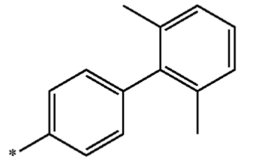
10-166
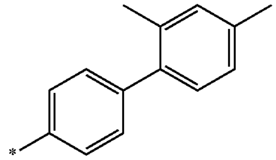
10-167
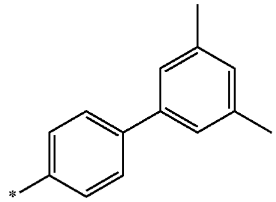
10-168
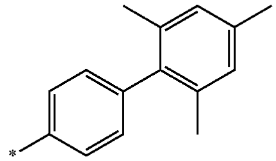
-continued
10-169
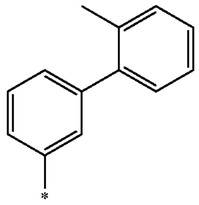
10-170
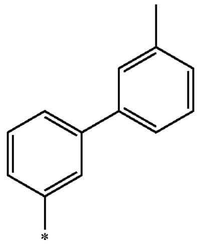
10-171
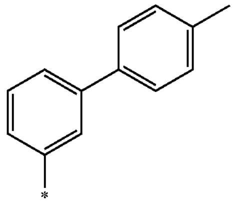
10-172
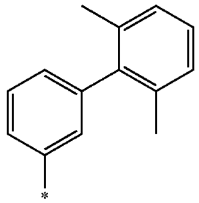
10-173
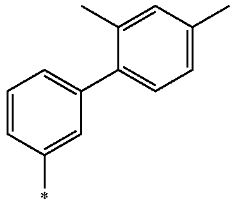
10-174
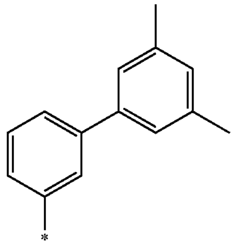
10-175
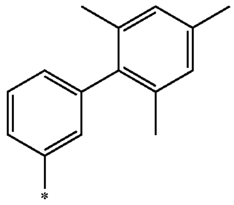

-continued
10-176
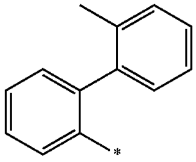
10-177
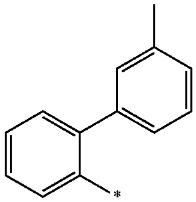
10-178
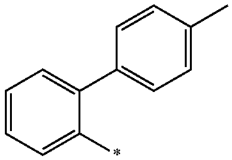
10-179
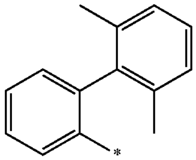
10-180
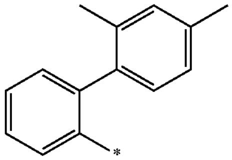
10-181
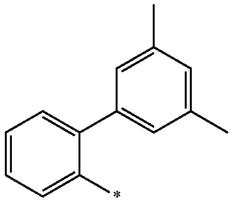
10-182
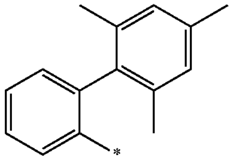
10-183
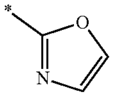
10-184
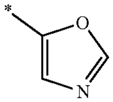
10-185
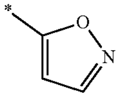
-continued
10-186
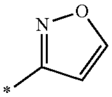
10-187
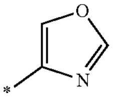
10-188
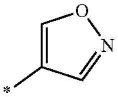
10-189
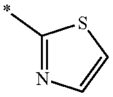
10-190
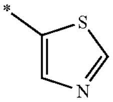
10-191
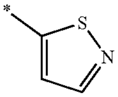
10-192
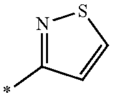
10-193
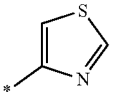
10-194
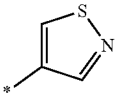
10-195
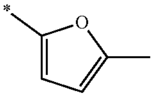
10-196
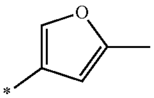
10-197
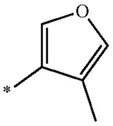
10-198
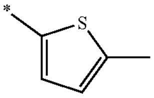
10-199
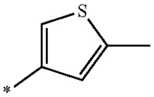

-continued
10-200
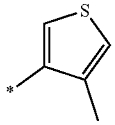
10-201
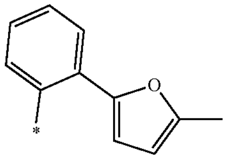
10-202
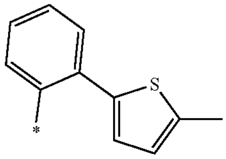
10-203
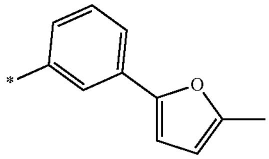
10-204
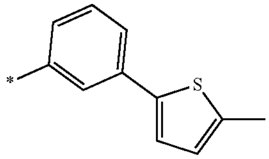
10-205
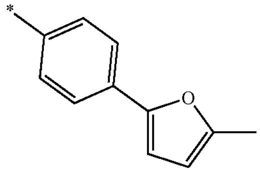
10-206
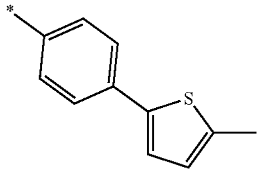
10-207
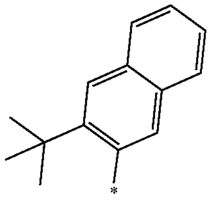
10-208
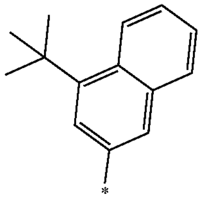
-continued
10-209
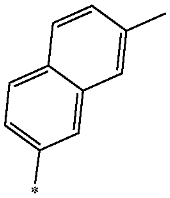
10-210
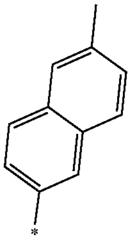
10-211
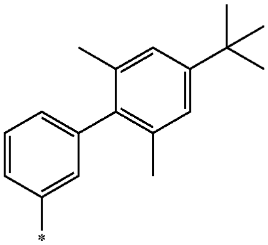
10-212
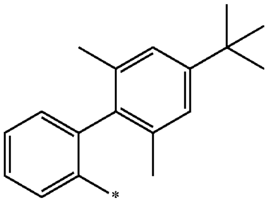
10-213
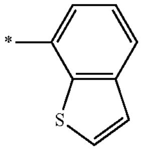
10-214
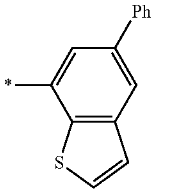
10-215
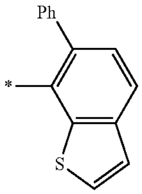
10-216
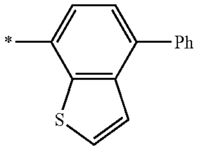

-continued
10-217
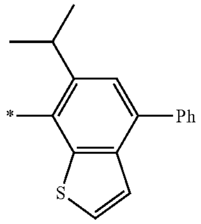
10-218
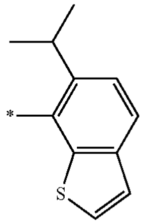
10-219
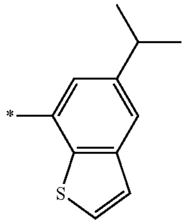
10-220
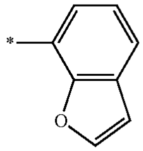
10-221
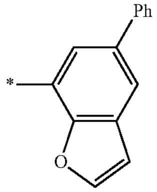
10-222
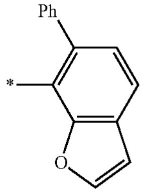
10-223
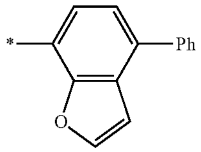
-continued
10-224
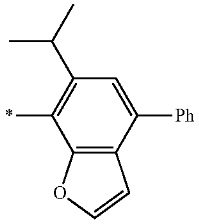
10-225
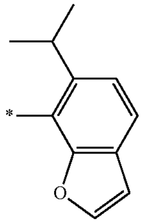
10-226
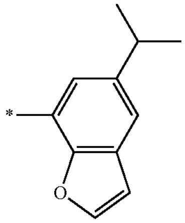
10-227
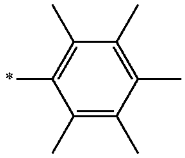
10-228
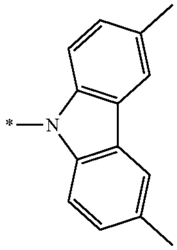
10-229
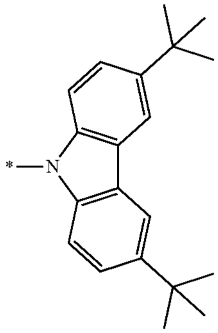

-continued
10-230
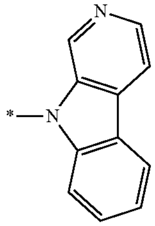
10-231
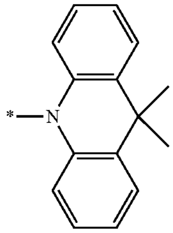
10-232
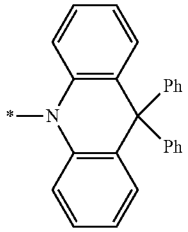
10-233
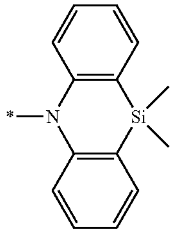
10-234
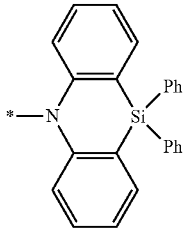
10-235
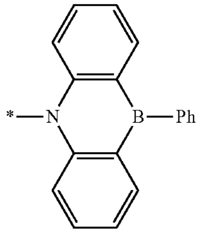
10-236
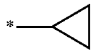
-continued
10-237
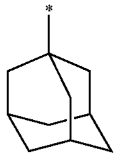
10-238
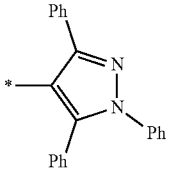
10-239
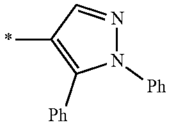
10-240
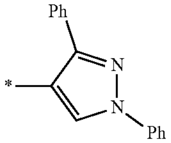
10-241
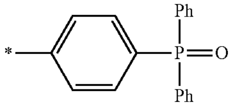
10-242
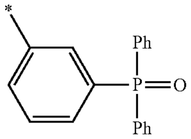
10-243
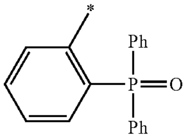
10-244
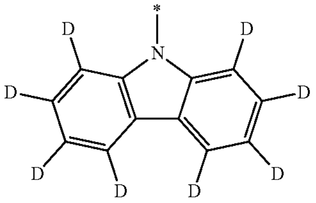
10-245
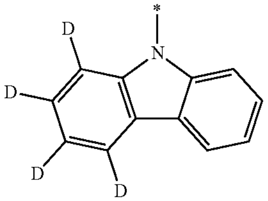

-continued 10-246

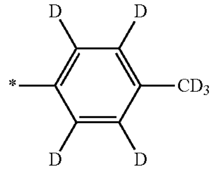

wherein, in Formulae 9-1 to 9-19 and 10-1 to 10-246, * indicates a binding site to an adjacent atom, "Ph" represents a phenyl group, and "TMS" represents a trimethylsilyl group.

In Formulae 3-1 to 3-5, 502, and 503, a71 to a74 and a501 to a504 may respectively indicate the number of $R_{71}$(s) to $R_{74}$(s) and $R_{501}$(s) to $R_{504}$(s), and a71 to a74 and a501 to a504 may each independently be an integer from 0 to 20. When a71 is 2 or greater, at least two $R_{71}$(s) may be identical to or different from each other, when a72 is 2 or greater, at least two $R_{72}$(s) may be identical to or different from each other, when a73 is 2 or greater, at least two $R_{73}$(s) may be identical to or different from each other, when a74 is 2 or greater, at least two $R_{74}$(s) may be identical to or different from each other, when a501 is 2 or greater, at least two $R_{501}$(s) may be identical to or different from each other, when a502 is 2 or greater, at least two $R_{502}$(s) may be identical to or different from each other, when a503 is 2 or greater, at least two $R_{503}$(s) may be identical to or different from each other, and when a504 is 2 or greater, at least two $R_{504}$(s) may be identical to or different from each other. In embodiments, a71 to a74 and a501 to a504 may each independently be an integer from 0 to 8.

In embodiments, in Formula 2, the group represented by $*-(L_{61})_{b61}-R_{61}$ and the group represented by $*-(L_{62})_{b62}-R_{62}$ may not be a phenyl group.

In embodiments, in Formula 2, the group represented by $*-(L_{61})_{b61}-R_{61}$ may be identical to the group represented by $*-(L_{62})_{b62}-R_{62}$.

In embodiments, in Formula 2, the group represented by $*-(L_{61})_{b61}-R_{61}$ and the group represented by $*-(L_{62})_{b62}-R_{62}$ may be different from each other.

In embodiments, in Formula 2, b61 and b62 may each independently be 1, 2, or 3, $L_{61}$ and $L_{62}$ may each independently be a benzene group, a pyridine group, a pyrimidine group, a pyridazine group, a pyrazine group, or a triazine group, each unsubstituted or substituted with at least one $R_{10a}$.

In embodiments, in Formula 2, $R_{61}$ and $R_{62}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, or —$Si(Q_1)(Q_2)(Q_3)$, wherein $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In embodiments, in Formula 2, the group represented by $*-(L_{61})_{b61}-R_{61}$ may be a group represented by one of Formulae CY51-1 to CY51-26, in Formula 2, the group represented by $*-(L_{62})_{b62}-R_{62}$ may be a group represented by one of Formulae CY52-1 to CY52-26, and/or in Formula 2, the group represented by $*-(L_{63})_{b63}-R_{63}$ may be a group represented by one of Formulae CY53-1 to CY53-27, —$C(Q_1)(Q_2)(Q_3)$, or —$Si(Q_1)(Q_2)(Q_3)$:

CY51-1

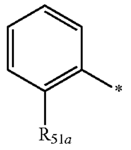

CY51-2

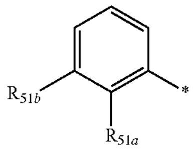

CY51-3

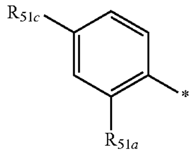

CY51-4

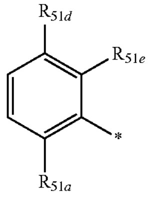

CY51-5

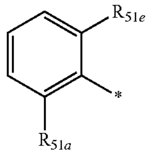

CY51-6

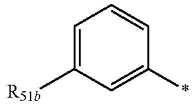

CY51-7

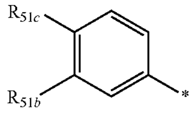

CY51-8

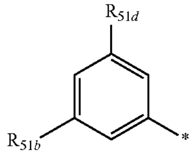

CY51-9

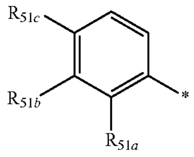

-continued
CY51-10
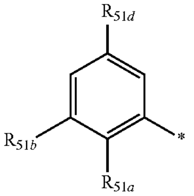
CY51-11
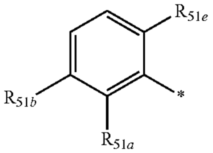
CY51-12
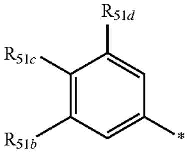
CY51-13
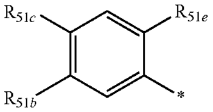
CY51-14
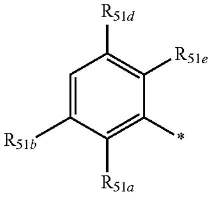
CY51-15
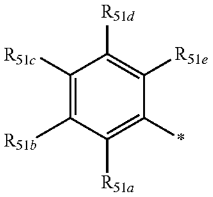
CY51-16
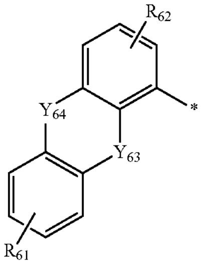
CY51-17
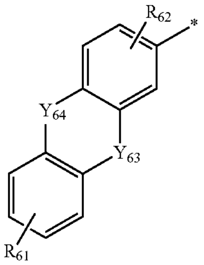
-continued
CY51-18
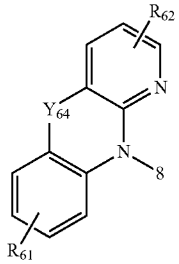
CY51-19
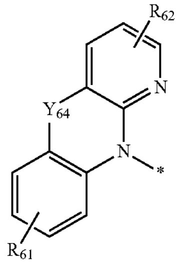
CY51-20
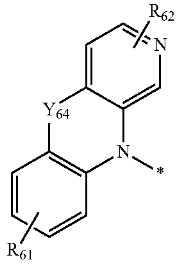
CY51-21
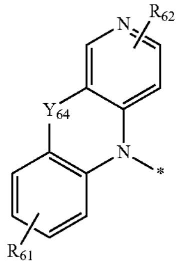
CY51-22
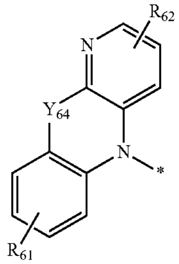
CY51-23
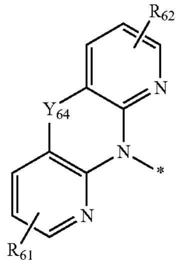

-continued
CY51-24
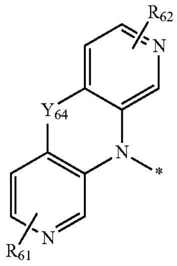
CY51-25
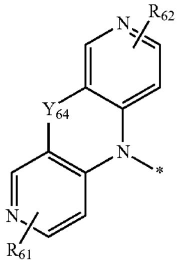
CY51-26
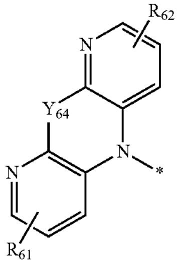
CY52-1
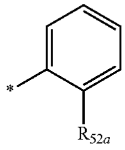
CY52-2
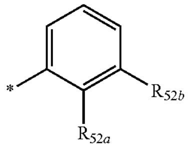
CY52-3
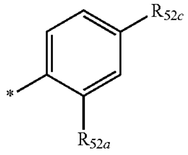
CY52-4
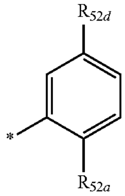
-continued
CY52-5
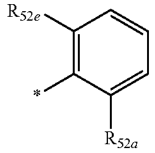
CY52-6
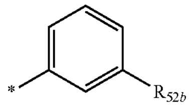
CY52-7
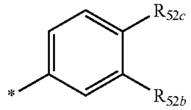
CY52-8
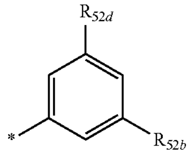
CY52-9
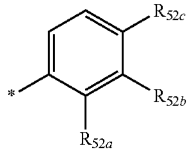
CY52-10
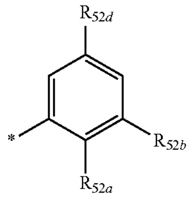
CY52-11
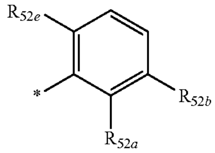
CY52-12
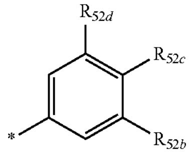
CY52-13
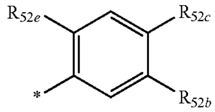
CY52-14
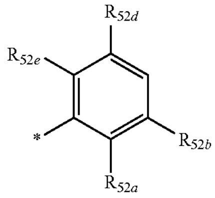

-continued
CY52-15
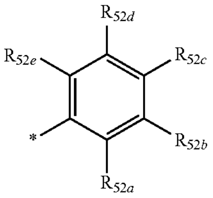
CY52-16
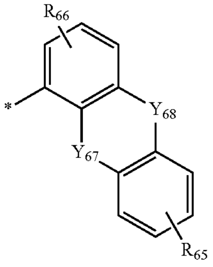
CY52-17
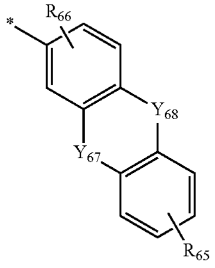
CY52-18
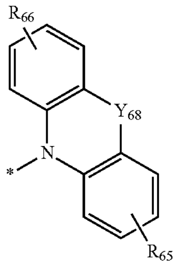
CY52-19
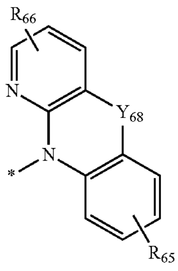
CY52-20
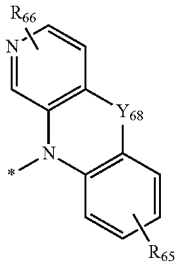
-continued
CY52-21
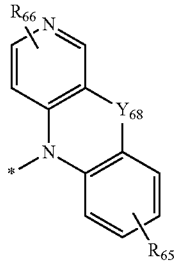
CY52-22
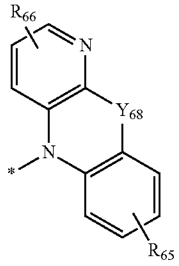
CY52-23
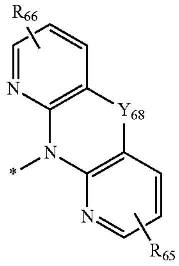
CY52-24
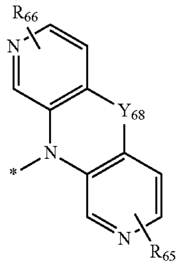
CY52-25
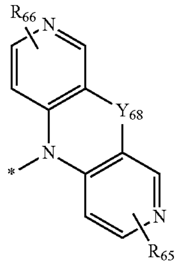
CY52-26
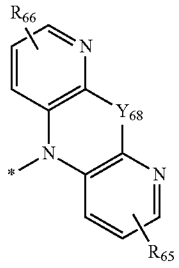

-continued
CY53-1
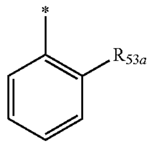
CY53-2
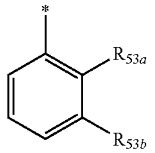
CY53-3
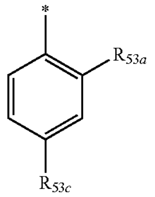
CY53-4
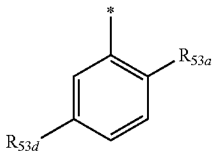
CY53-5
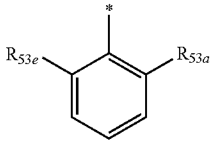
CY53-6
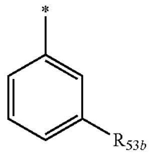
CY53-7
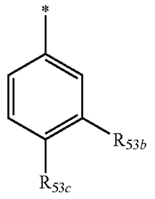
CY53-8
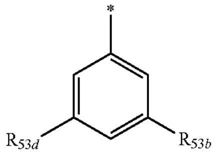
CY53-9
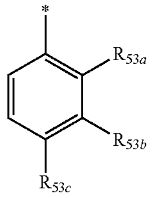
-continued
CY53-10
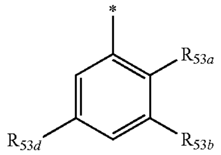
CY53-11
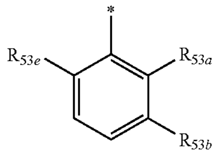
CY53-12
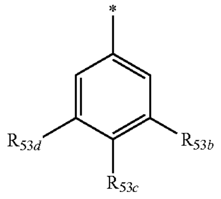
CY53-13
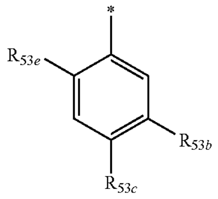
CY53-14
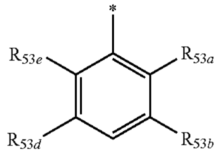
CY53-15
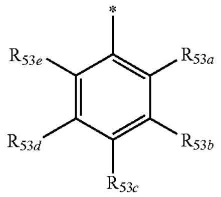
CY53-16
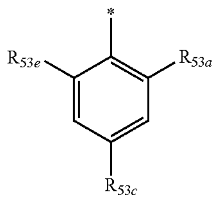
CY53-17
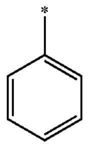

-continued

CY53-18

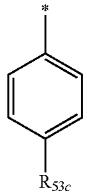

CY53-19

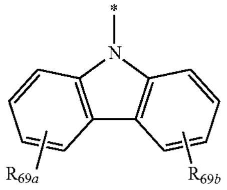

CY53-20

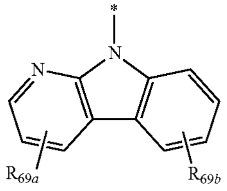

CY53-21

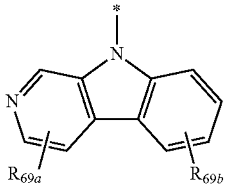

CY53-22

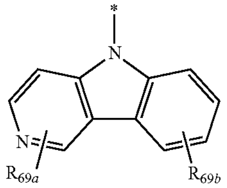

CY53-23

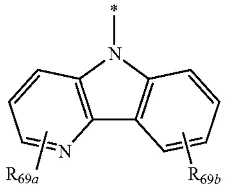

CY53-24

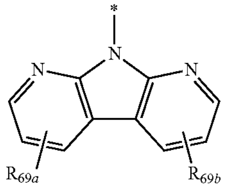

CY53-25

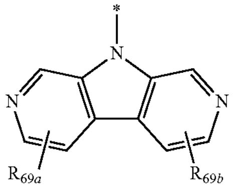

-continued

CY53-26

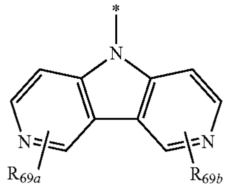

CY53-27

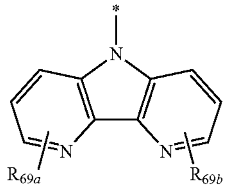

wherein in Formulae CY51-1 to CY51-26, CY52-1 to CY52-26, and CY53-1 to CY53-27, $Y_{63}$ may be a single bond, O, S, $N(R_{63})$, $B(R_{63})$, $C(R_{63a})(_{63b})$, or $Si(R_{63a})(R_{63b})$, $Y_{64}$ may be a single bond, O, S, $N(R_{64})$, $B(R_{64})$, $C(R_{64a})(R_{64b})$, or $Si(R_{64a})(R_{64b})$, $Y_{67}$ may be a single bond, O, S, $N(R_{67})$, $B(R_{67})$, $C(R_{67a})(R_{67b})$, or $Si(R_{67a})(R_{67b})$, $Y_{68}$ may be a single bond, O, S, $N(R_{68})$, $B(R_{68})$, $C(R_{68a})(R_{68b})$, or $Si(R_{68a})(R_{68b})$, $Y_{63}$ and $Y_{64}$ in Formulae CY51-16 and CY51-17 may not be a single bond at the same time, $Y_{67}$ and $Y_{68}$ in Formulae CY52-16 and CY52-17 may not be a single bond at the same time, $R_{51a}$ to $R_{51e}$, $R_{61}$ to $R_{64}$, $R_{63a}$, $R_{63b}$, $R_{64a}$, and $R_{64b}$ may each independently be the same as defined in connection with $R_{51}$, and $R_{51a}$ to $R_{51e}$ may not each be hydrogen, $R_{52a}$ to $R_{52e}$, $R_{65}$ to $R_{68}$, $R_{67a}$, $R_{67b}$, $R_{68a}$, and $R_{68b}$ may each independently be the same as defined in connection with $R_{52}$, and $R_{52a}$ to $R_{52e}$ may not each be hydrogen, $R_{53a}$ to $R_{53e}$, $R_{69a}$, and $R_{69b}$ may each independently be the same as defined in connection with $R_{53}$, and $R_{53a}$ to $R_{53e}$ may not each be hydrogen, and

* indicates a binding site to an adjacent atom.

In embodiments, $R_{51a}$ to $R_{51e}$ and $R_{52a}$ to $R_{52e}$ in Formulae CY51-1 to CY51-26 and Formulae CY52-1 to 52-26 may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $-CD_3$, $-CD_2H$, $-CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, wherein $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, in Formulae CY51-16 and CY51-17, i) $Y_{63}$ may be O or S, and $Y_{64}$ may be $Si(R_{64a})(R_{64b})$, or ii) $Y_{63}$ may be $Si(R_{63a})(R_{63b})$, and $Y_{64}$ may be O or S, and in Formulae CY52-16 and CY52-17, i) $Y_{67}$ may be O or S, and Yes may be $Si(R_{68a})(R_{68b})$, or ii) $Y_{67}$ may be $Si(R_{67a})(R_{67b})$, and Yes may be O or S.

In Formulae 3-1 to 3-5, $L_{81}$ to $L_{85}$ may each independently be:

a single bond; or $*—C(Q_4)(Q)-*'$ or $*—Si(Q_4)(Q_5)-*'$; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In embodiments, in Formulae 3-1 and 3-2, a group represented by

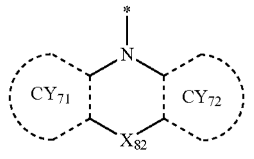

may be represented by one of Formulae CY71-1(1) to CY71-1(8), in Formulae 3-1 and 3-3, a group represented by

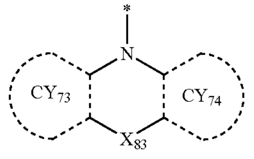

may be represented by one of Formulae CY71-2(1) to CY71-2(8), 7 in Formulae 3-2 and 3-4, a group represented by

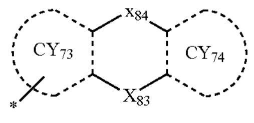

may be represented by one of Formulae CY71-3(1) to CY71-3(32),
in Formulae 3-3 to 3-5, a group represented by
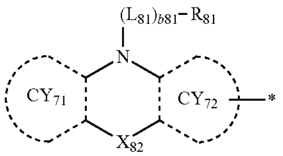
may be represented by one of Formulae CY71-4(1) to CY71-4(32), and/or
in Formula 3-5, a group represented by
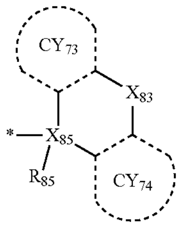
may be represented by one of Formulae CY71-5(1) to CY71-5(8):
CY71-1(1)
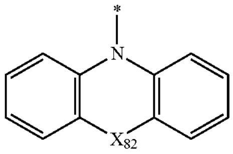
CY71-1(2)
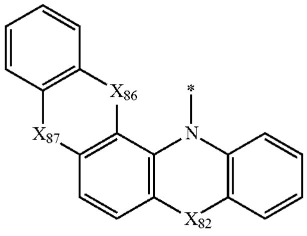
CY71-1(3)
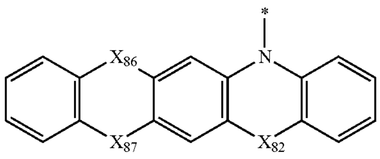
CY71-1(4)
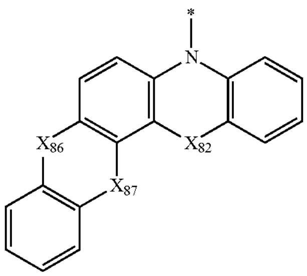
-continued
CY71-1(5)
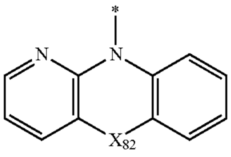
CY71-1(6)
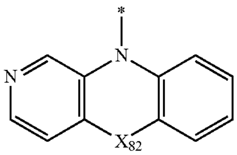
CY71-1(7)
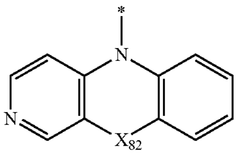
CY71-1(8)
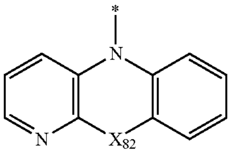
CY71-2(1)
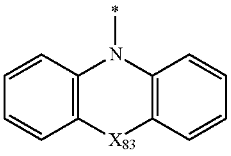
CY71-2(2)
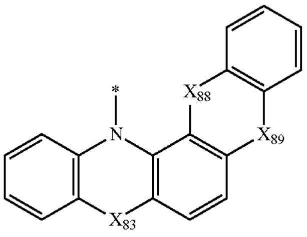
CY71-2(3)
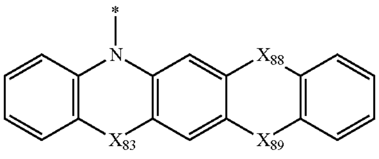
CY71-2(4)
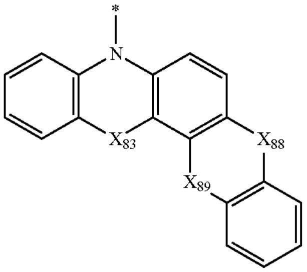

-continued
CY71-2(5)
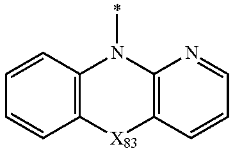
CY71-2(6)
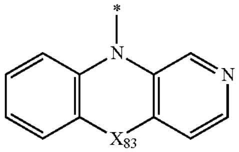
CY71-2(7)
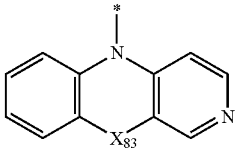
CY71-2(8)
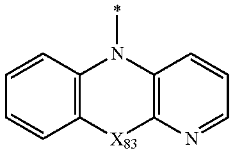
CY71-3(1)
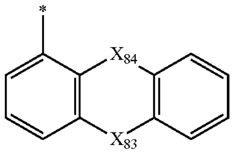
CY71-3(2)
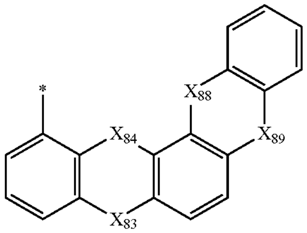
CY71-3(3)
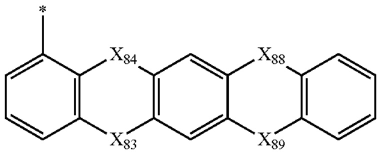
CY71-3(4)
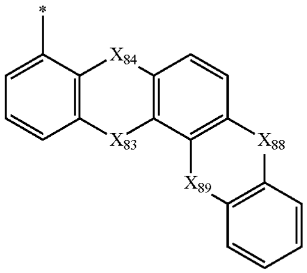
-continued
CY71-3(5)
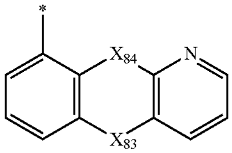
CY71-3(6)
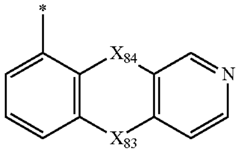
CY71-3(7)
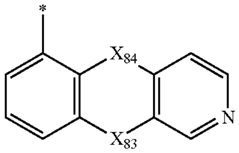
CY71-3(8)
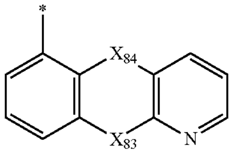
CY71-3(9)
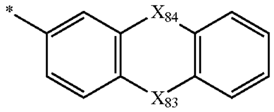
CY71-3(10)
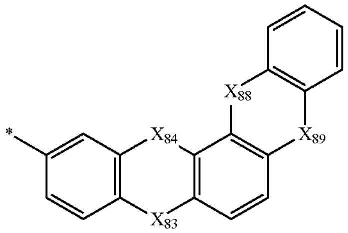
CY71-3(11)
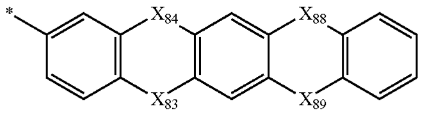
CY71-3(12)
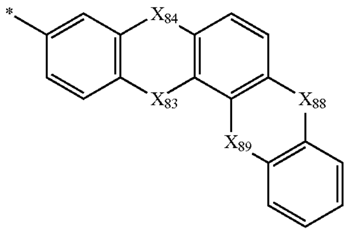
CY71-3(13)
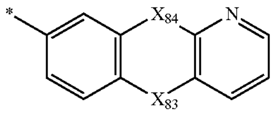

-continued
CY71-3(14)
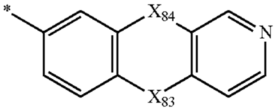
CY71-3(15)
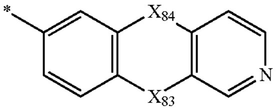
CY71-3(16)
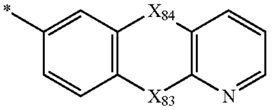
CY71-3(17)
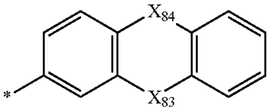
CY71-3(18)
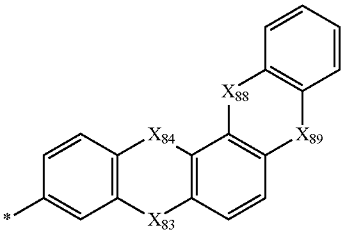
CY71-3(19)
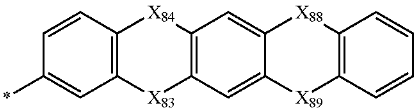
CY71-3(20)
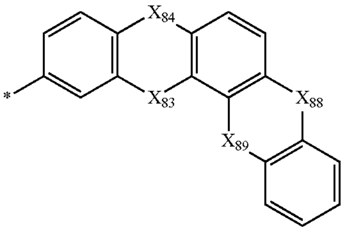
CY71-3(21)
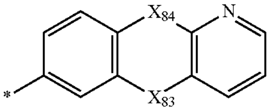
CY71-3(22)
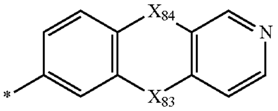
CY71-3(23)
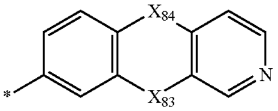
CY71-3(24)
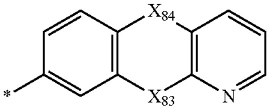
-continued
CY71-3(25)
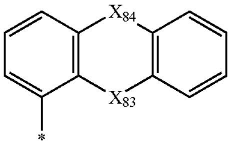
CY71-3(26)
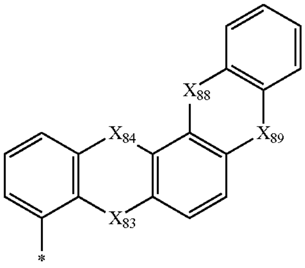
CY71-3(27)
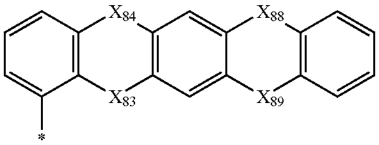
CY71-3(28)
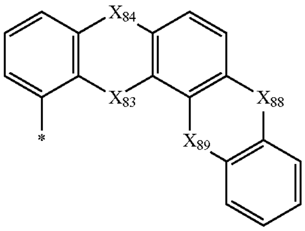
CY71-3(29)
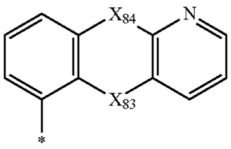
CY71-3(30)
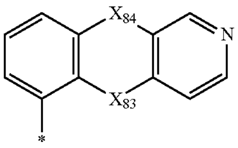
CY71-3(31)
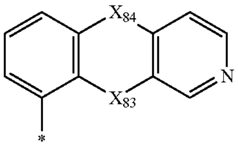
CY71-3(32)
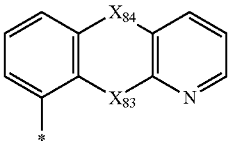

-continued
CY71-4(1)
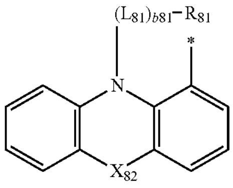
CY71-4(2)
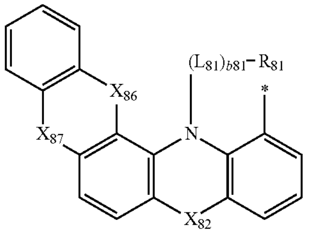
CY71-4(3)
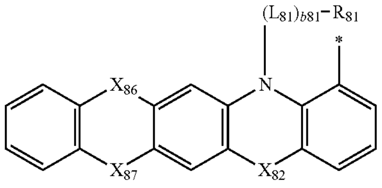
CY71-4(4)
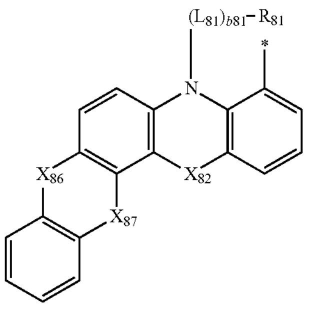
CY71-4(5)
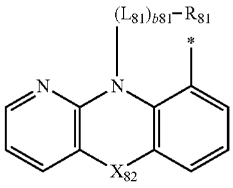
CY71-4(6)
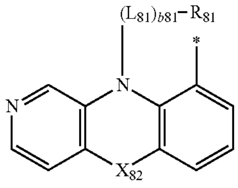
CY71-4(7)
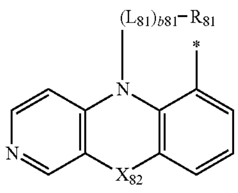
-continued
CY71-4(8)
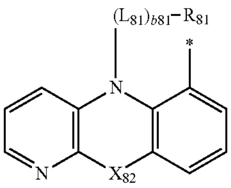
CY71-4(9)
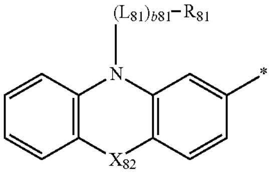
CY71-4(10)
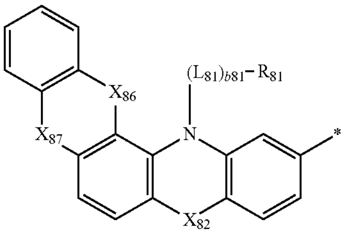
CY71-4(11)
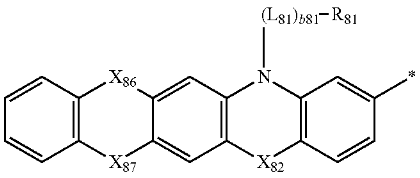
CY71-4(12)
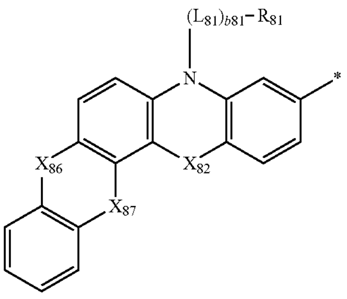
CY71-4(13)
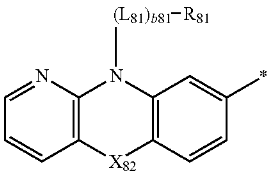
CY71-4(14)
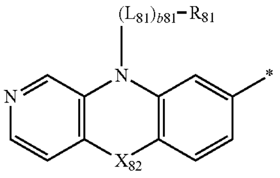

-continued
CY71-4(15)
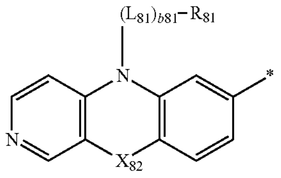
CY71-4(16)
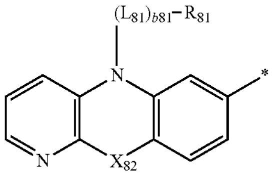
CY71-(17)
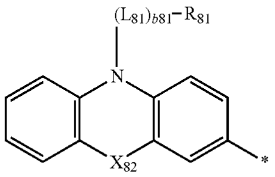
CY71-4(18)
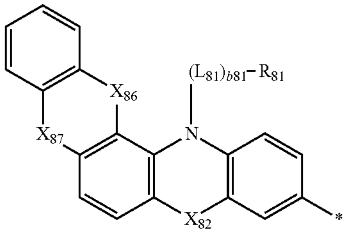
CY71-4(19)
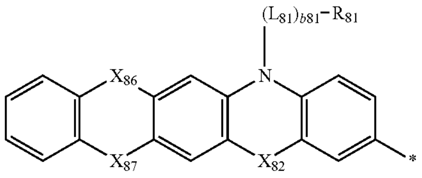
CY71-4(20)
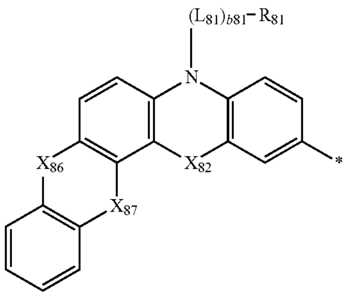
CY71-4(21)
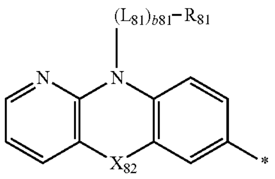
-continued
CY71-4(22)
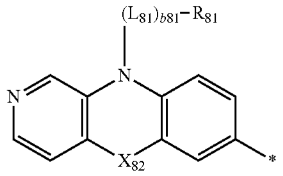
CY71-4(23)
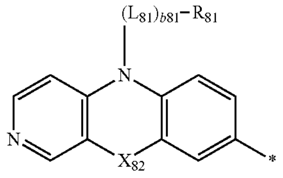
CY71-4(24)
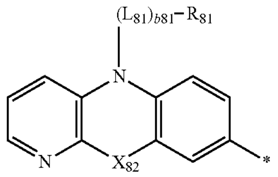
CY71-4(25)
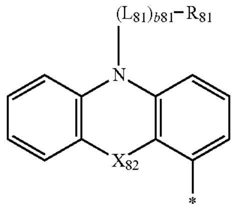
CY71-4(26)
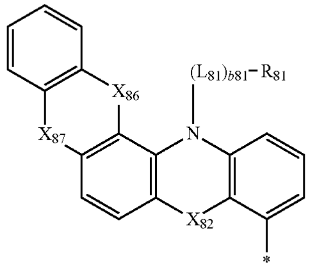
CY71-4(27)
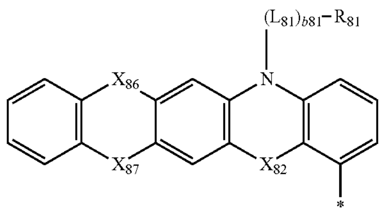
CY71-4(28)
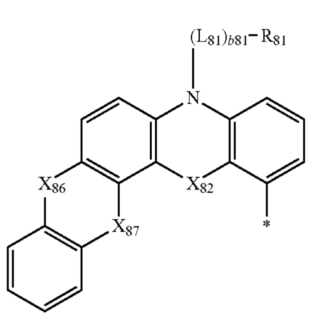

-continued

CY71-4(29)

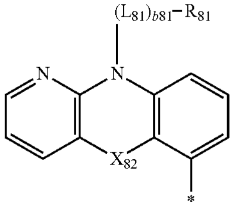

CY71-4(30)

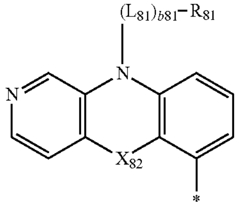

CY71-4(31)

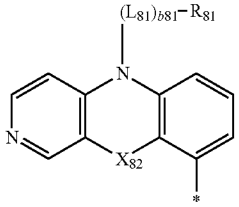

CY71-4(32)

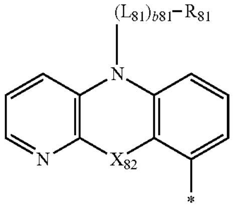

CY71-5(1)

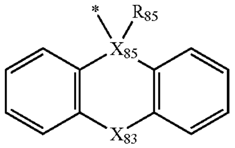

CY71-5(2)

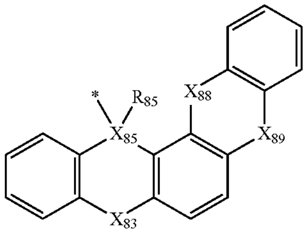

CY71-5(3)

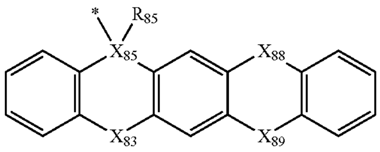

-continued

CY71-5(4)

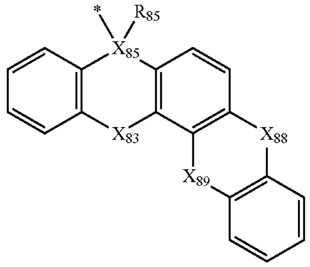

CY71-5(5)

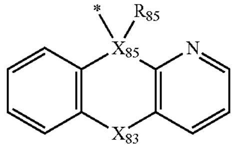

CY71-5(6)

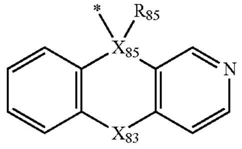

CY71-5(7)

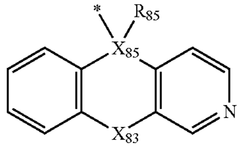

CY71-5(8)

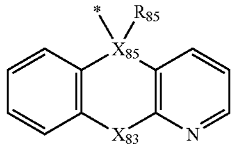

wherein in Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{85}$, $L_{81}$, b81, $R_{81}$, and $R_{85}$ may respectively be understood by referring to the descriptions of $X_{81}$ to $X_{85}$, $L_{81}$, b81, $R_{81}$, and $R_{85}$ provided herein, $X_{86}$ may be a single bond, O, S, N($R_{86}$), B($R_{86}$), C($R_{86a}$)($R_{86b}$), or Si($R_{86a}$)($R_{86b}$), $X_{87}$ may be a single bond, O, S, N($R_{87}$), B($R_{87}$), C($R_{87a}$)($R_{87b}$), or Si($R_{87a}$)($R_{87b}$), in Formulae CY71-1(1) to CY71-1(8) and CY71-4(1) to CY71-4(32), $X_{86}$ and $X_{87}$ may not be a single bond at the same time, $X_{88}$ may be a single bond, O, S, N($R_{88}$), B($R_{88}$), C($R_{88a}$)($R_{88b}$), or Si($R_{88a}$)($R_{88b}$), $X_{89}$ may be a single bond, O, S, N($R_{89}$), B($R_{89}$), C($R_{89a}$)($R_{89b}$), or Si($R_{89a}$)($R_{89b}$), in Formulae CY71-2(1) to CY71-2(8), CY71-3(1) to CY71-3(32), and CY71-5(1) to CY71-5(8), $X_{88}$ and $X_{89}$ may not be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may each independently be the same as defined in connection with $R_{81}$ provided herein.

Examples of Second Compound, Third Compound, and Fourth Compound
In embodiments, the second compound may include at least one of Compounds ETH1 to ETH84:
ETH1
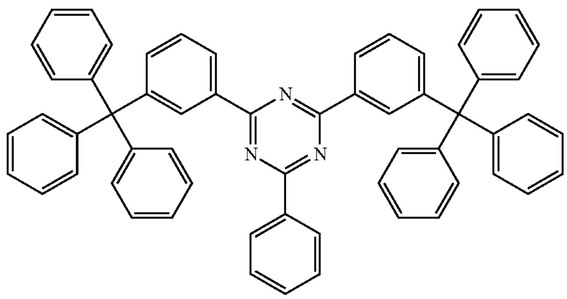
ETH2
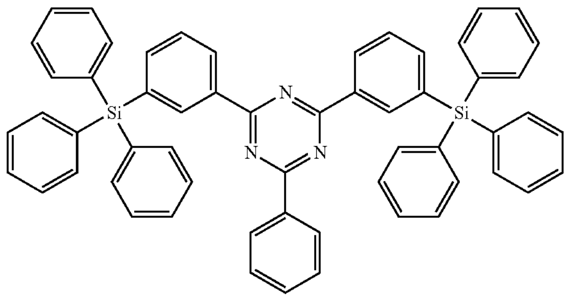
ETH3
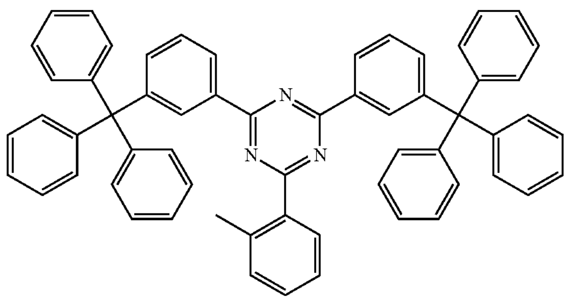
ETH4
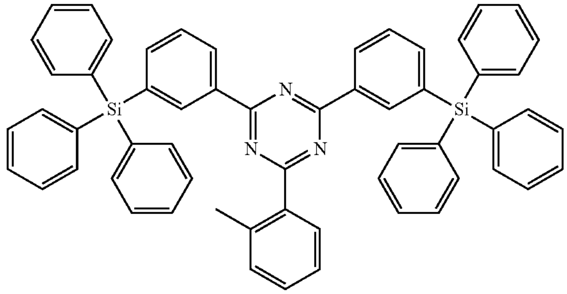
-continued
ETH5
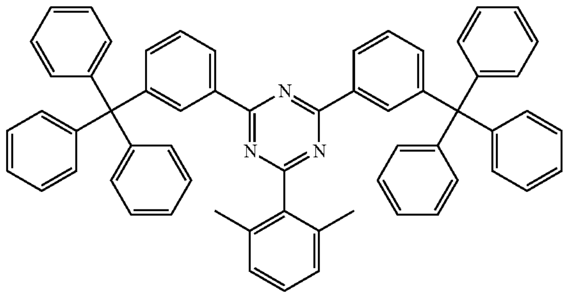
ETH6
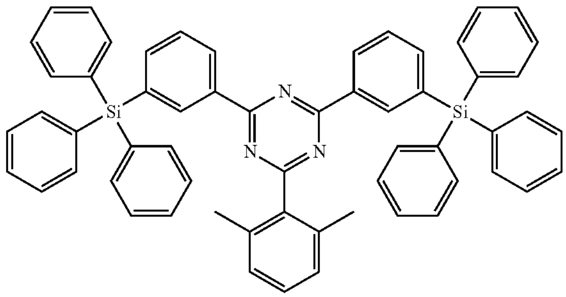
ETH7
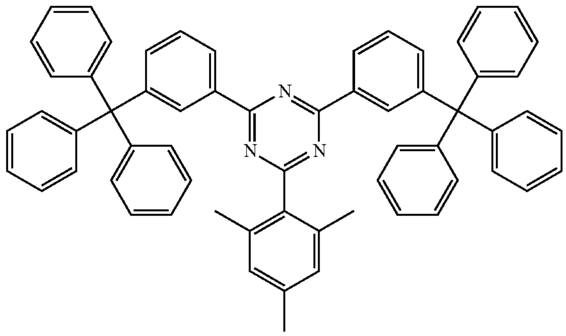
ETH8
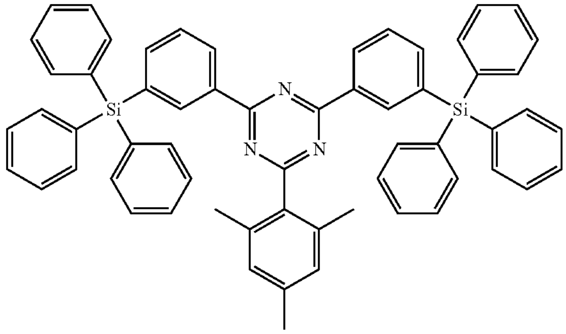

-continued
ETH9
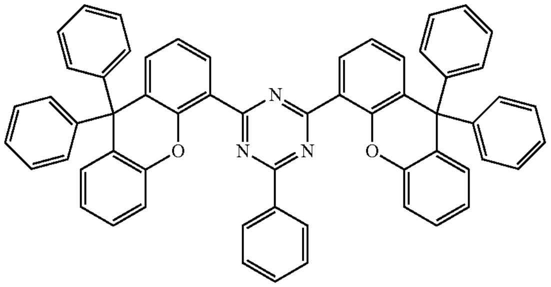
ETH10
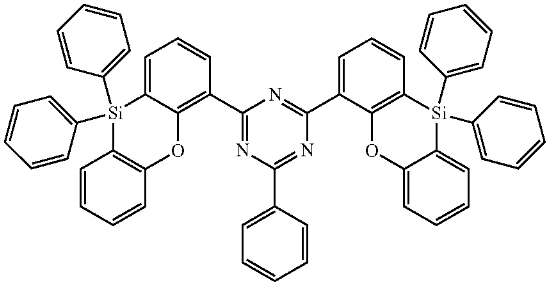
ETH11
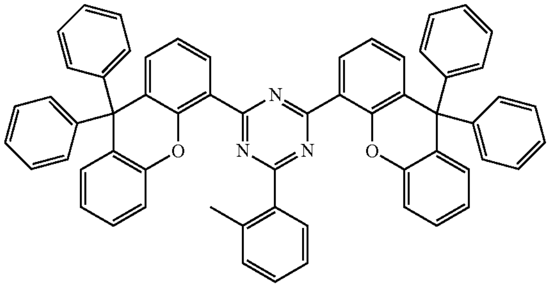
ETH12
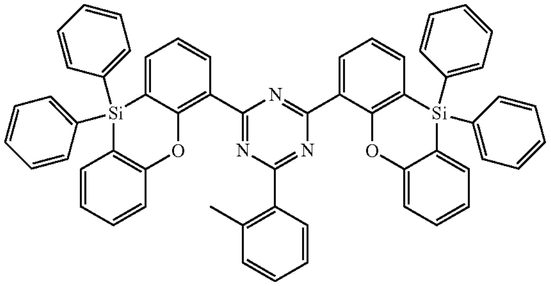
ETH13
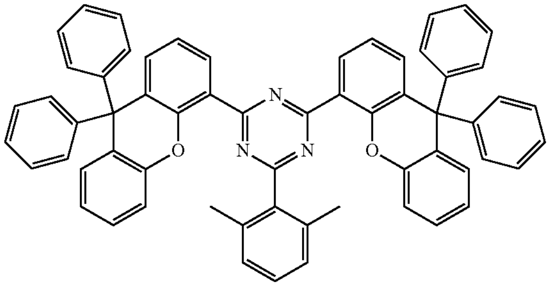
-continued
ETH14
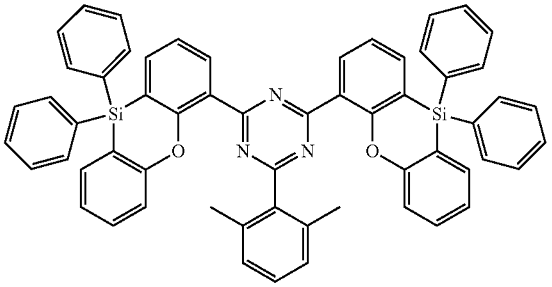
ETH15
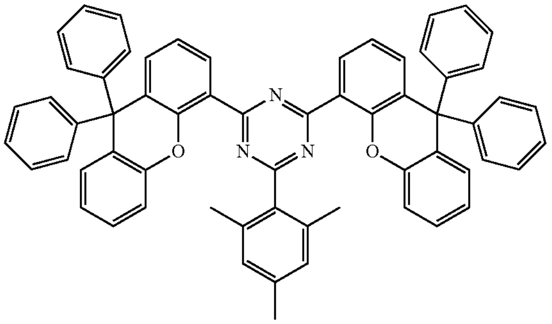
ETH16
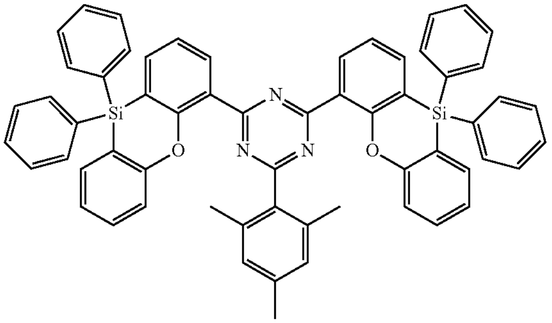
ETH17
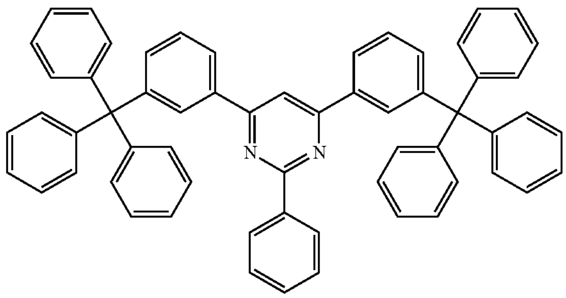
ETH18
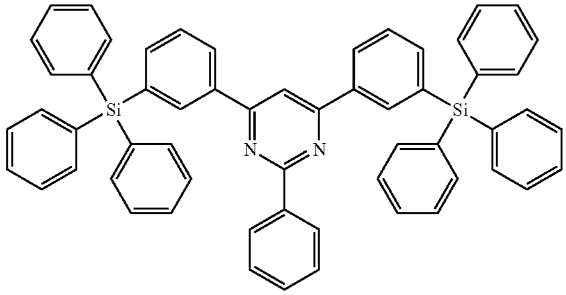

-continued
ETH19
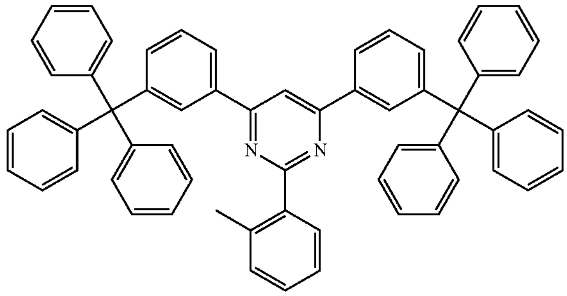
ETH20
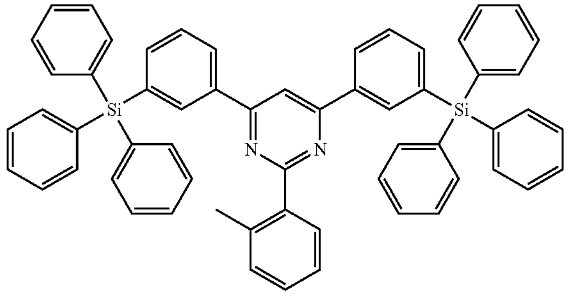
ETH21
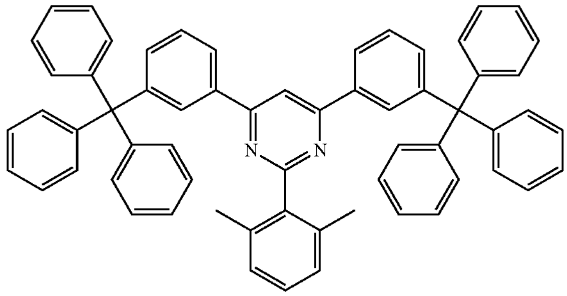
ETH22
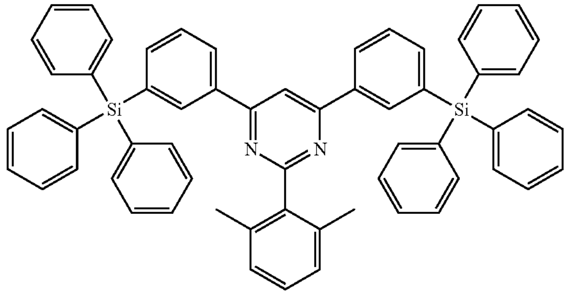
ETH23
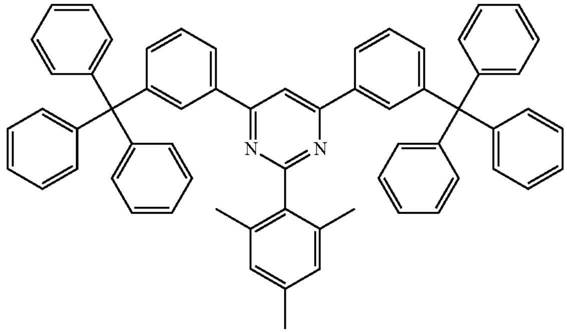
-continued
ETH24
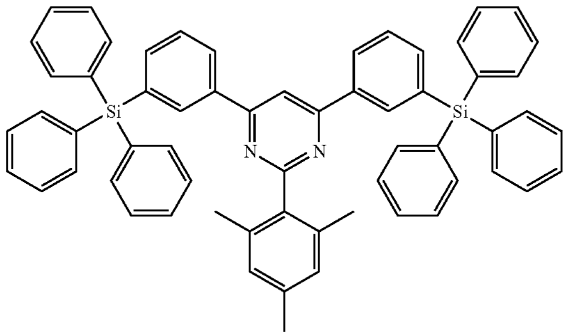
ETH25
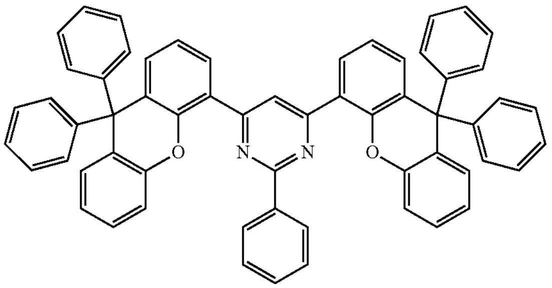
ETH26
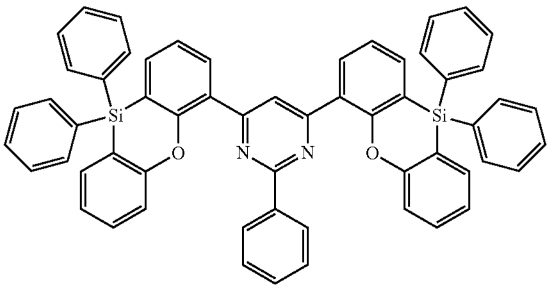
ETH27
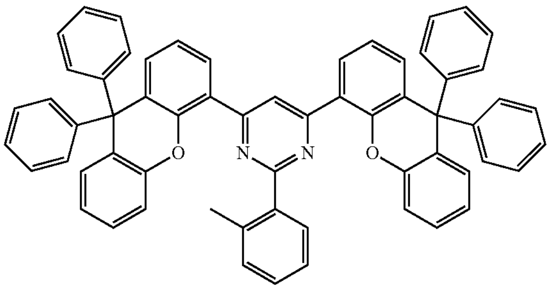
ETH28
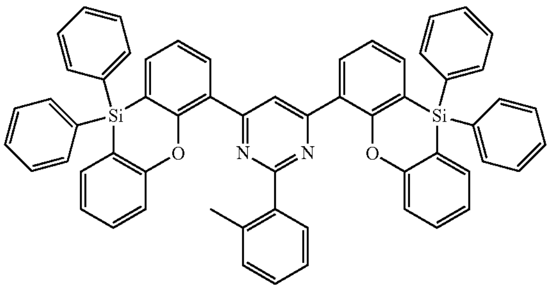

-continued
ETH29
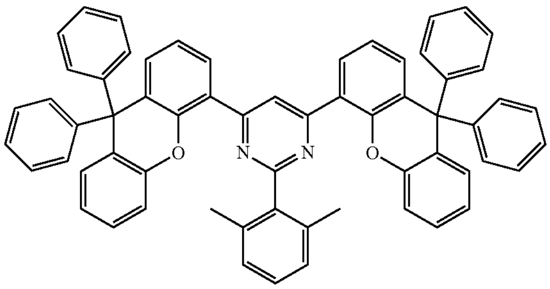
ETH30
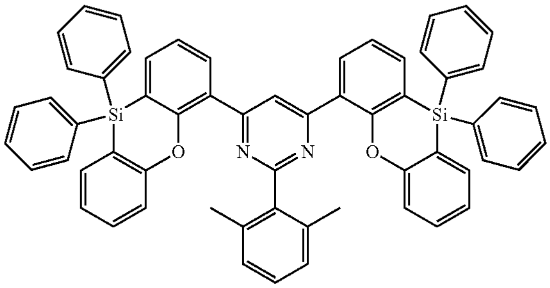
ETH31
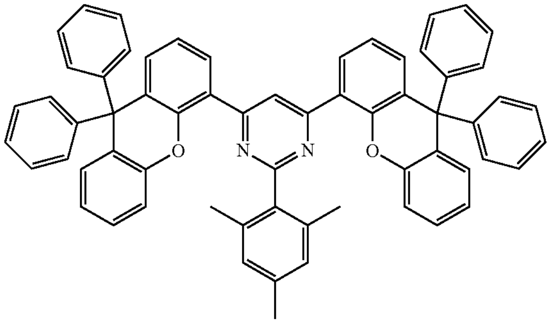
ETH32
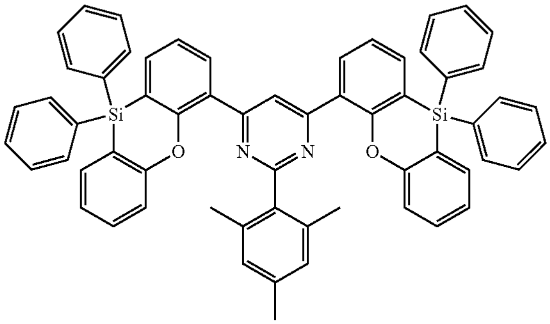
ETH33
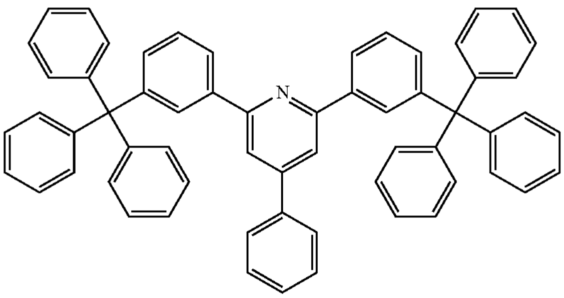
-continued
ETH34
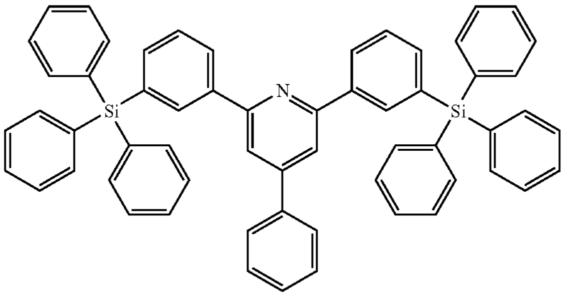
ETH35
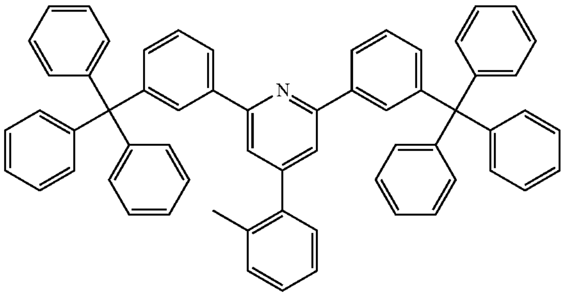
ETH36
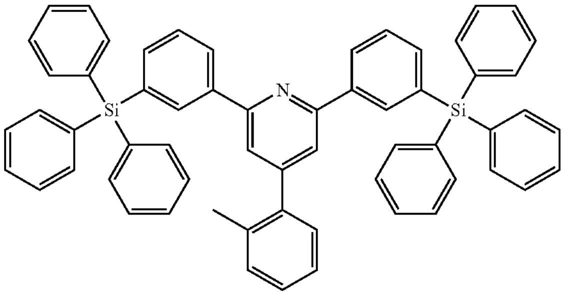
ETH37
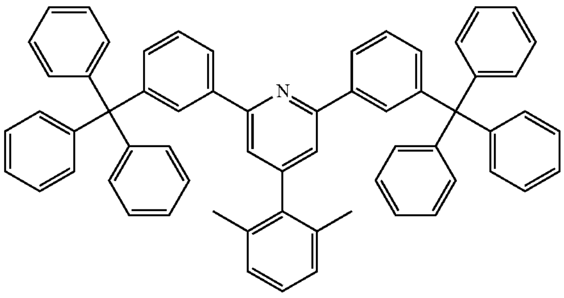
ETH38
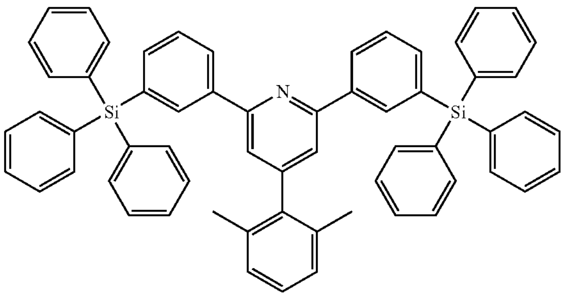

-continued
ETH39
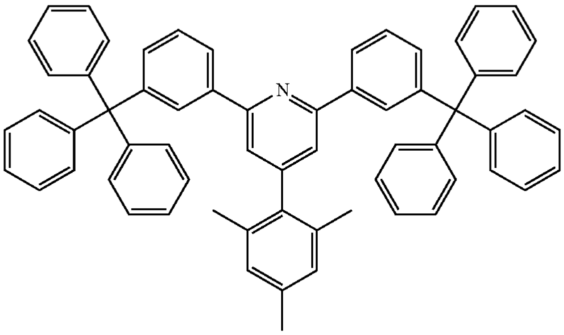
ETH40
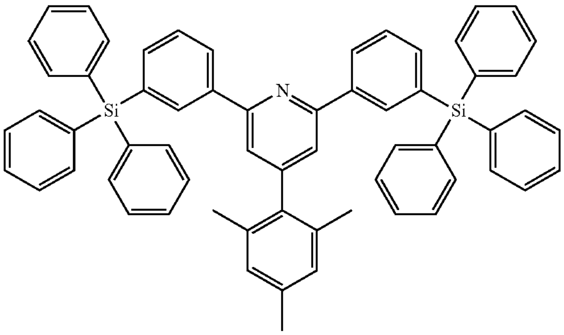
ETH41
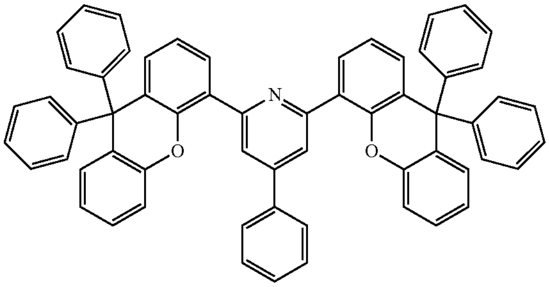
ETH42
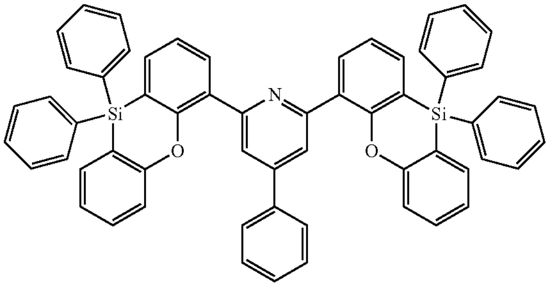
ETH43
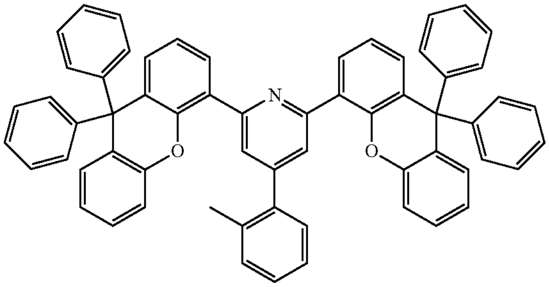
-continued
ETH44
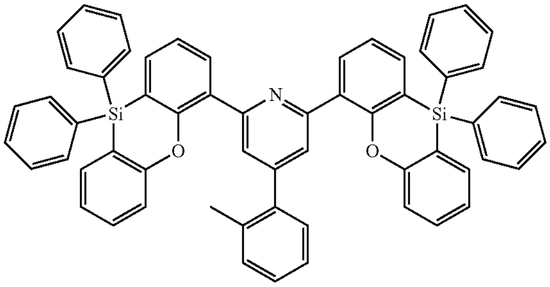
ETH45
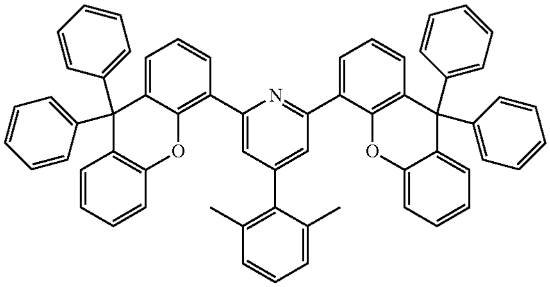
ETH46
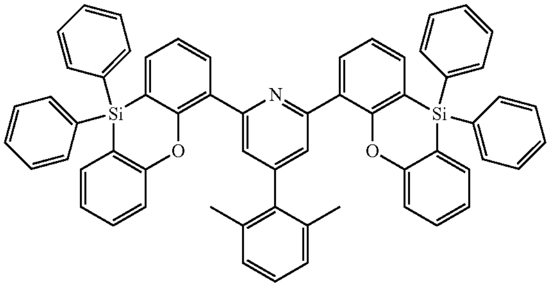
ETH47
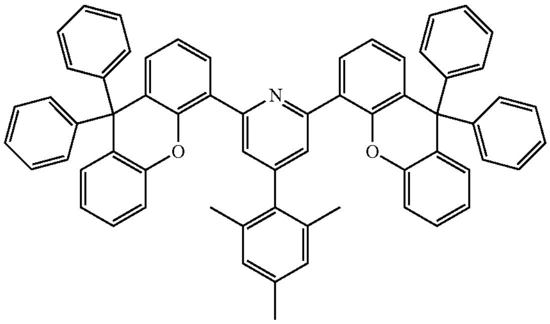
ETH48
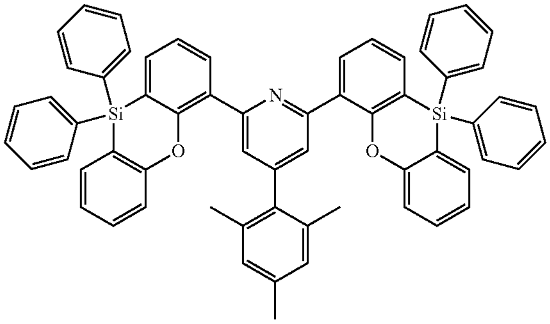

-continued
ETH49
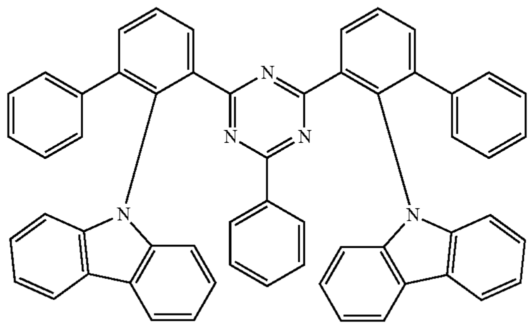
ETH50
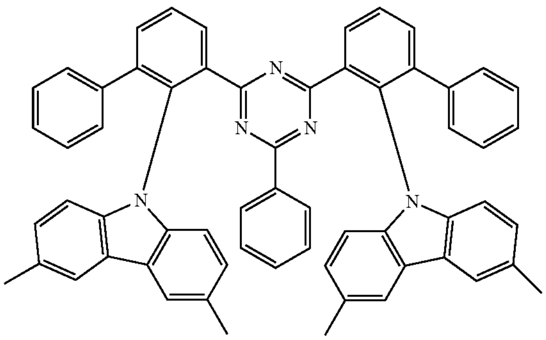
ETH51
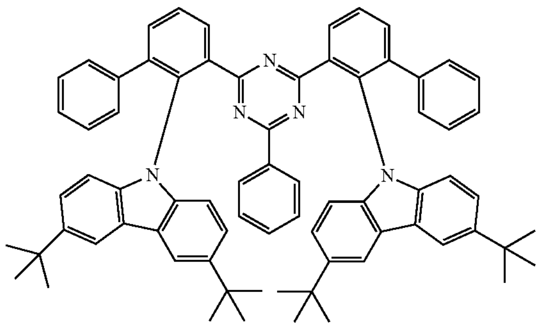
ETH52
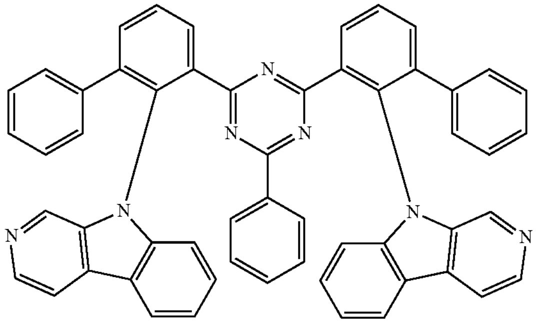
-continued
ETH53
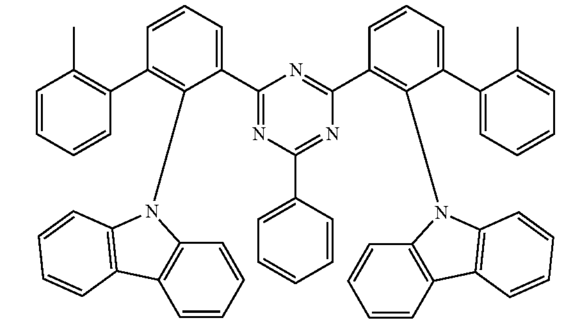
ETH54
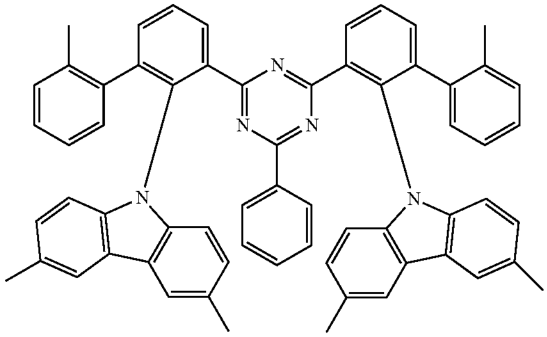
ETH55
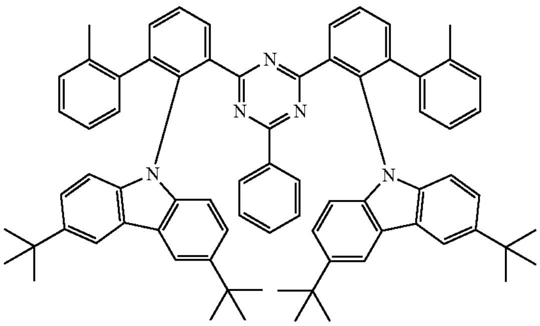
ETH56
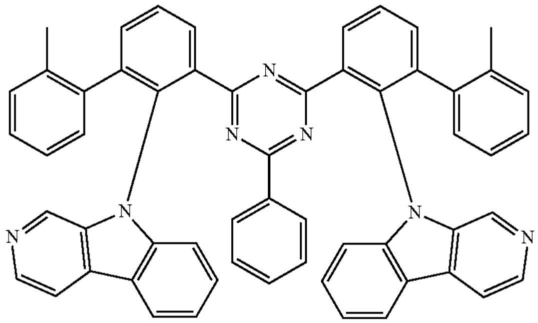

-continued
ETH57
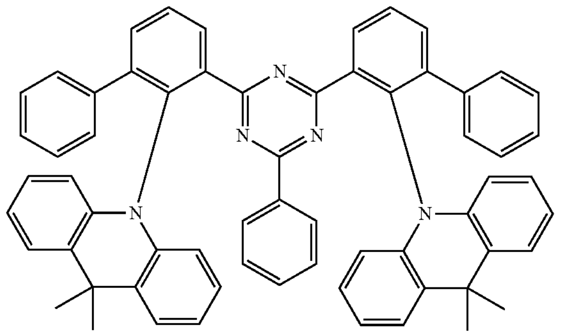
ETH58
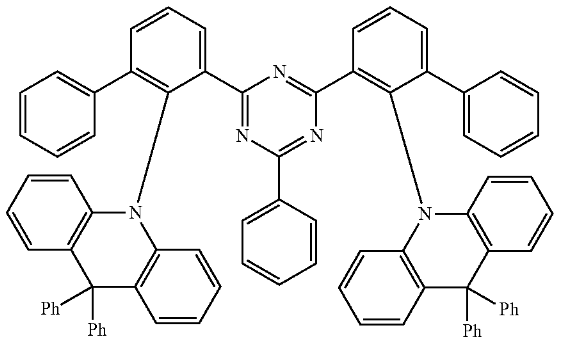
ETH59
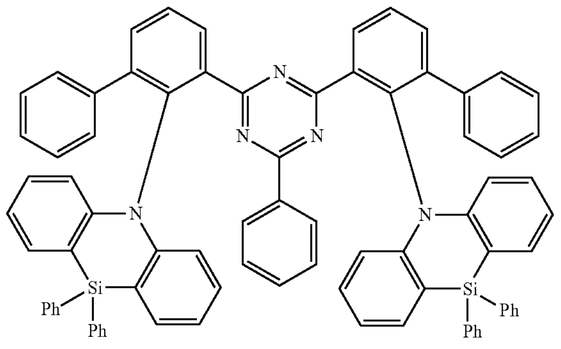
ETH60
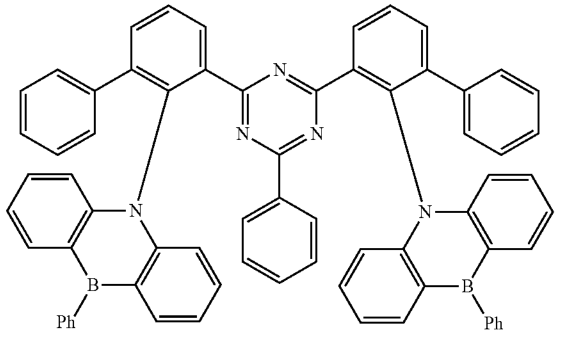
-continued
ETH61
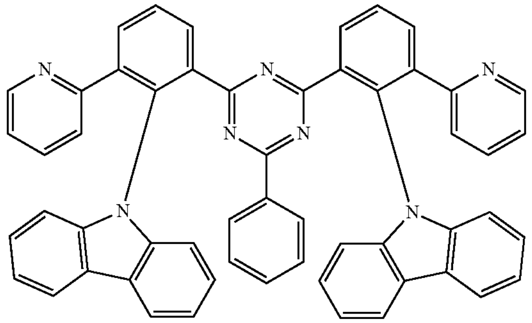
ETH62
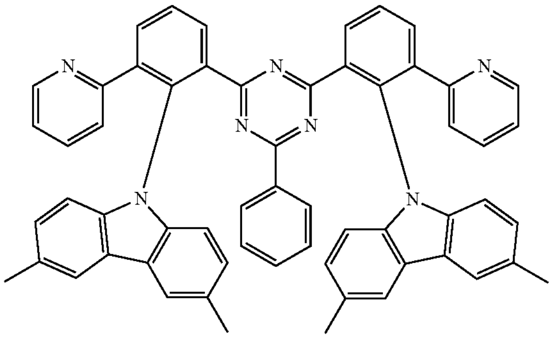
ETH63
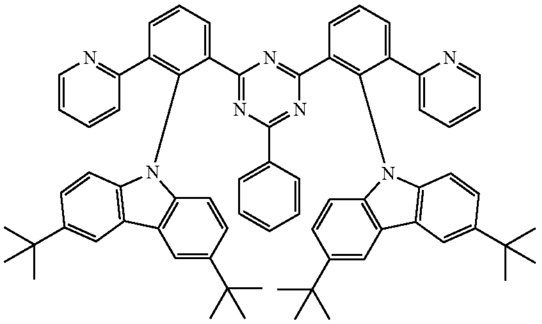
ETH64
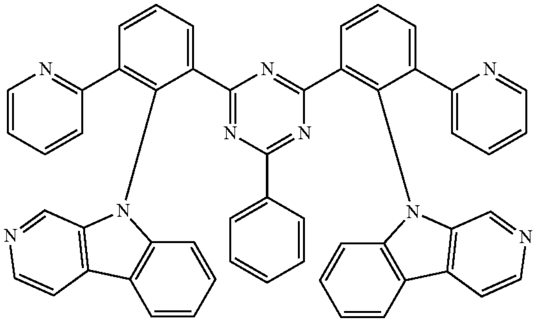

ETH65
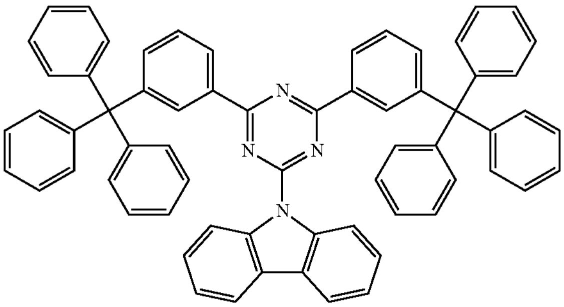
ETH66
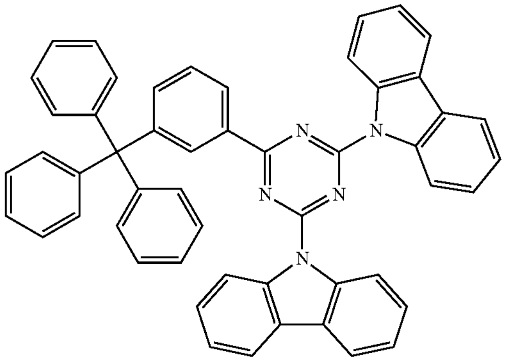
ETH67
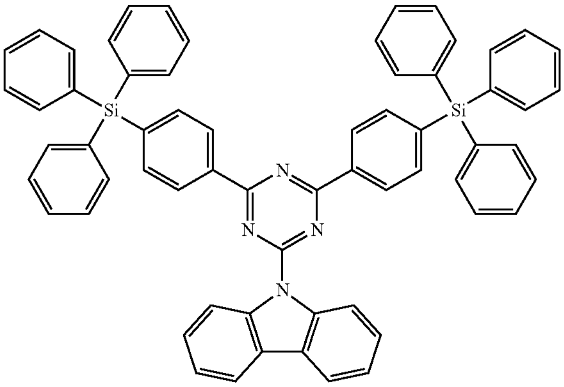
ETH68
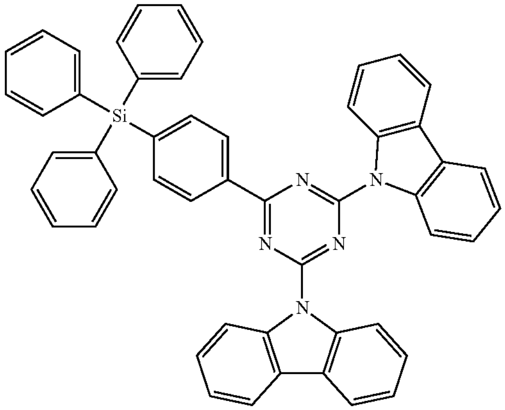
ETH69
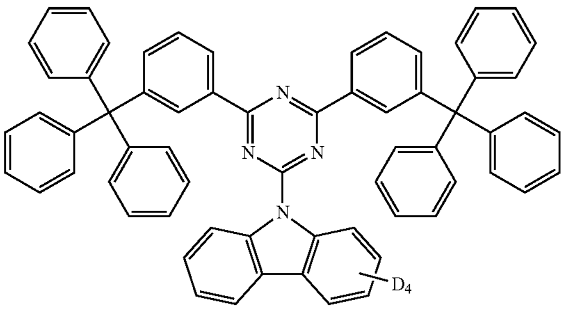
ETH70
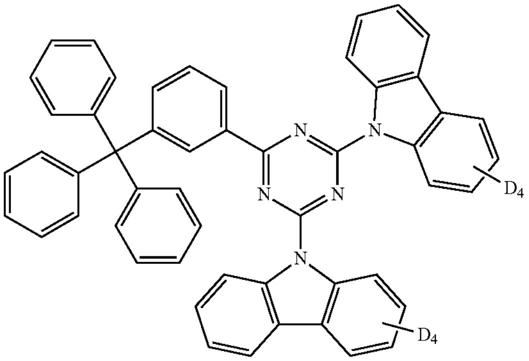
ETH71
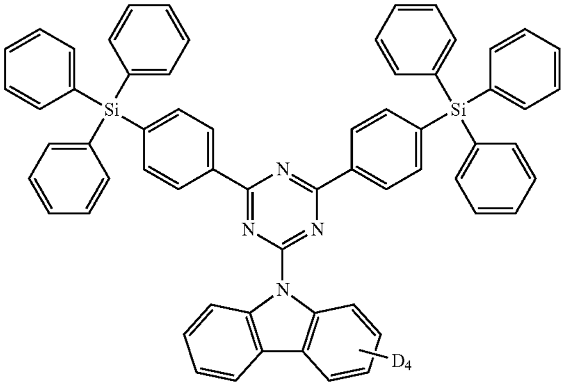
ETH72
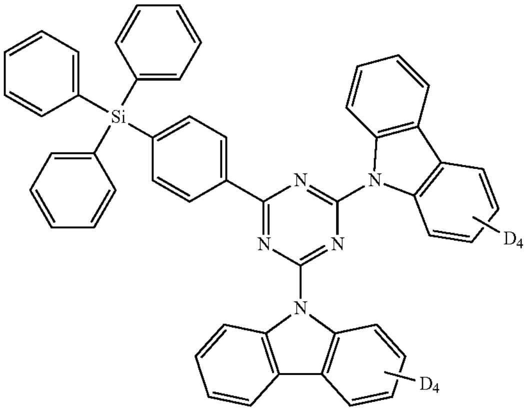

-continued
ETH73
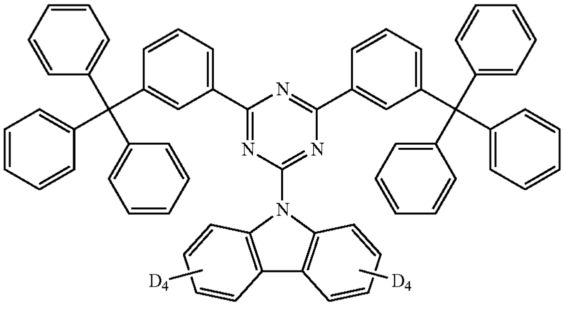
ETH74
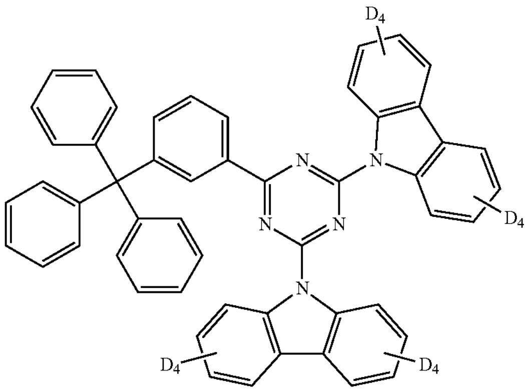
ETH75
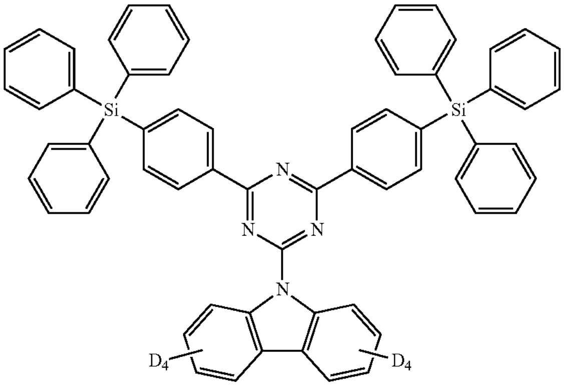
ETH76
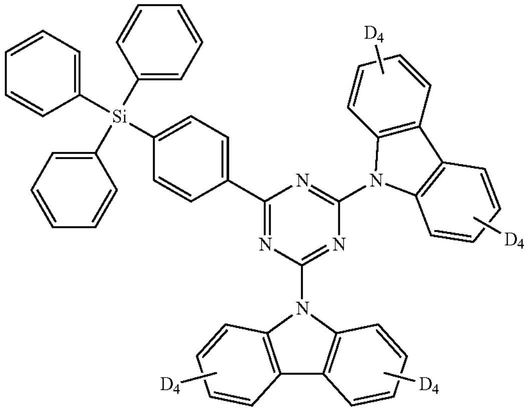
-continued
ETH77
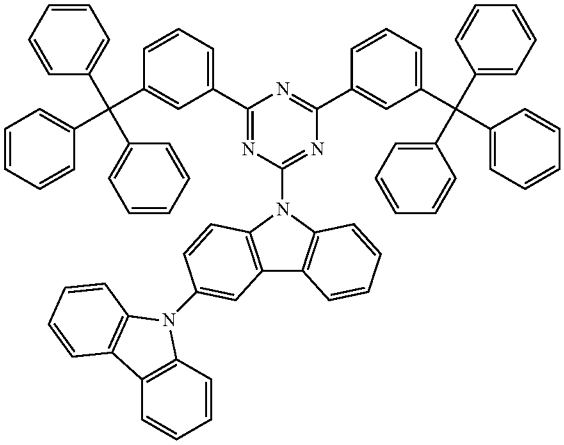
ETH78
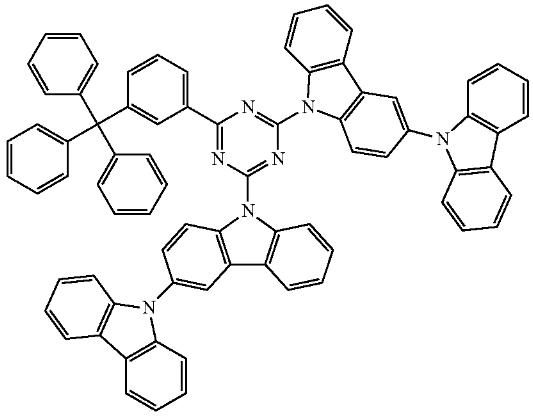
ETH79
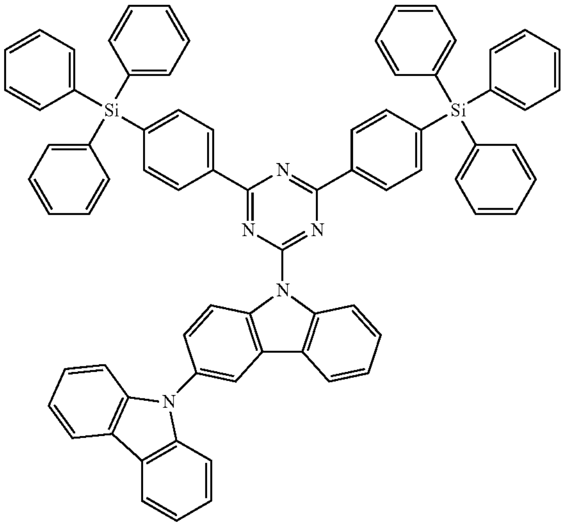

-continued
ETH80
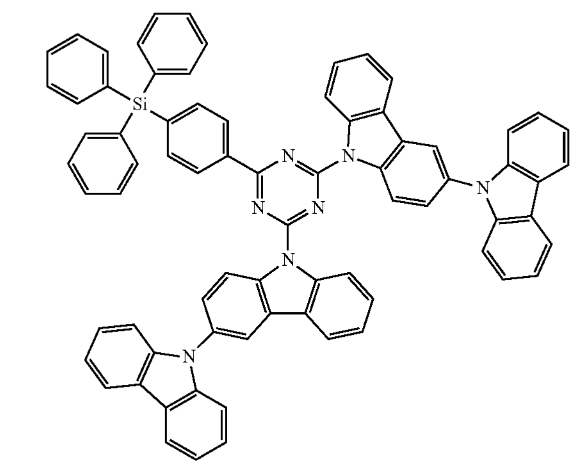
ETH81
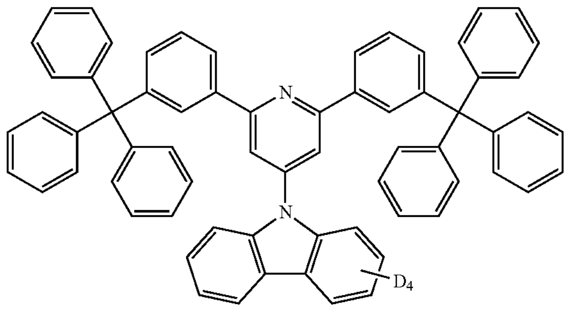
ETH82
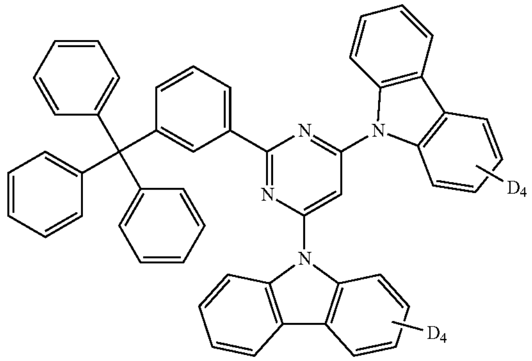
ETH83
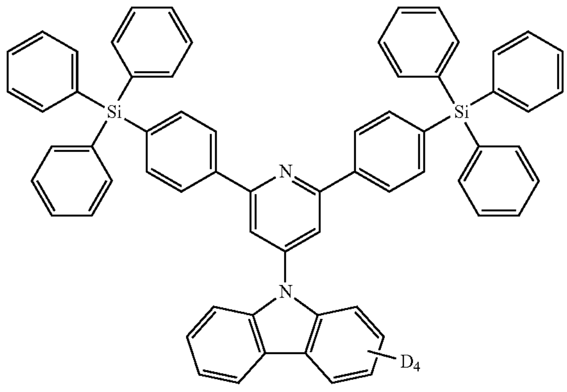
-continued
ETH84
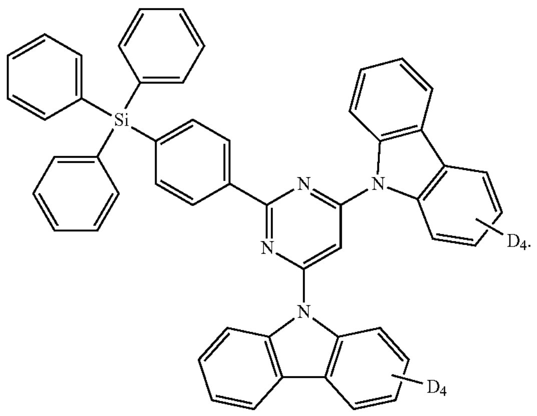
In embodiments, the third compound may include at least one of Compounds HTH1 to HTH52:
HTH1
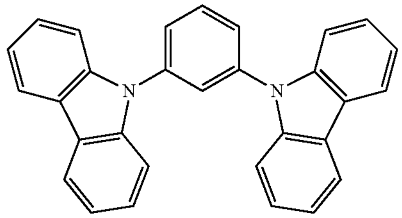
HTH2
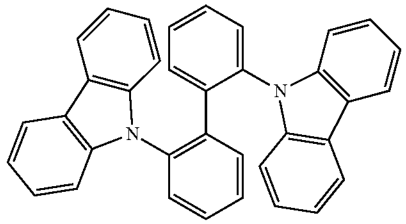
HTH3
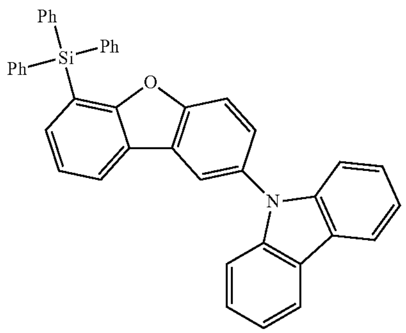

-continued
HTH4
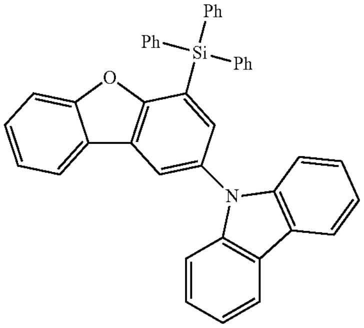
HTH5
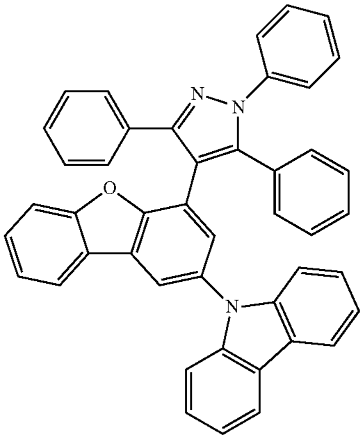
HTH6
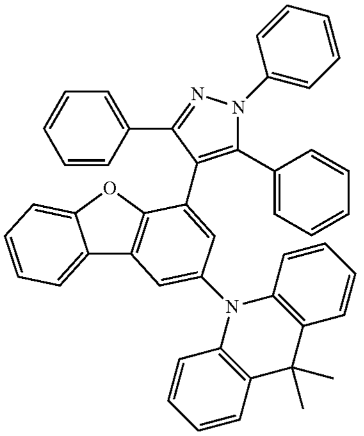
HTH7
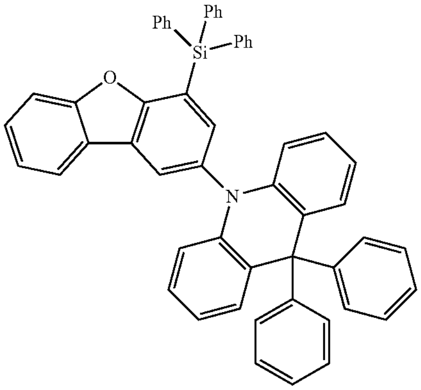
-continued
HTH8
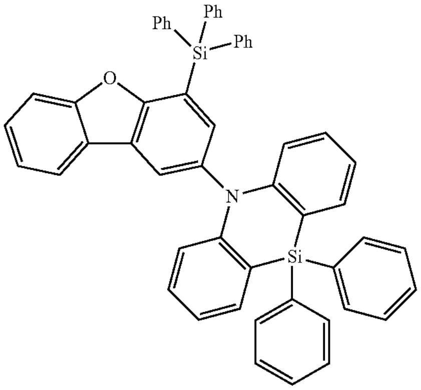
HTH9
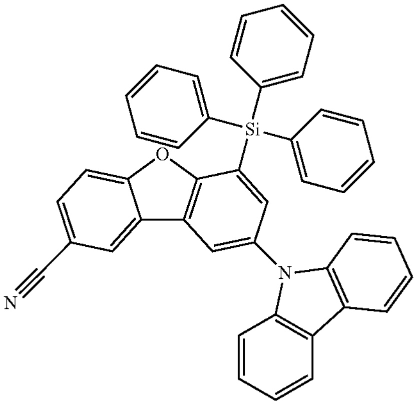
HTH10
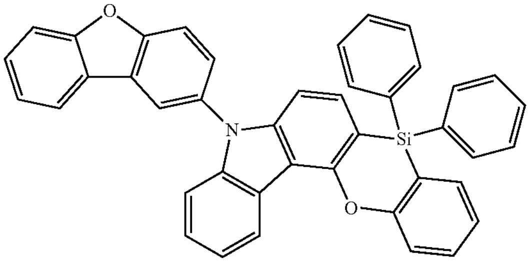
HTH11
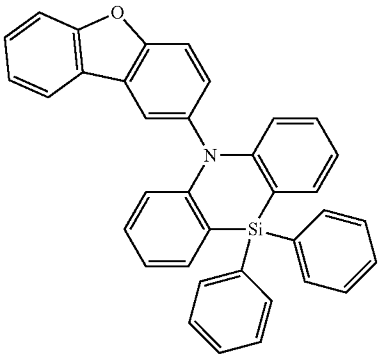

-continued
HTH12
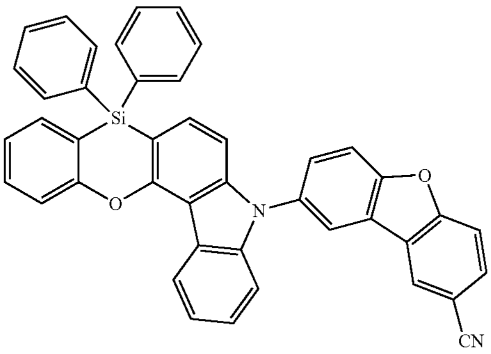
HTH13
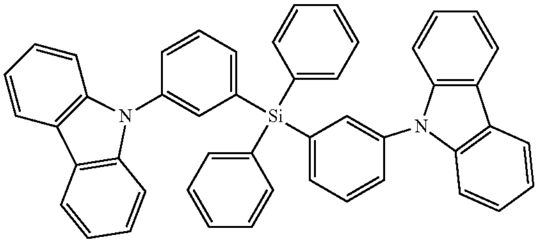
HTH14
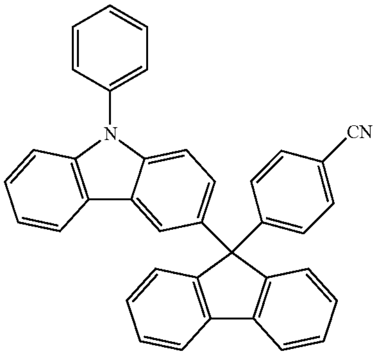
HTH15
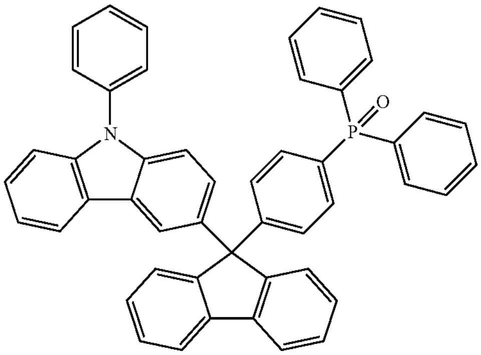
-continued
HTH16
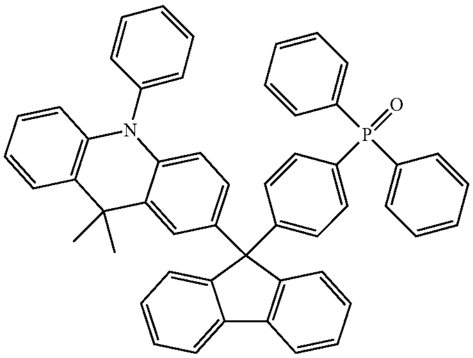
HTH17
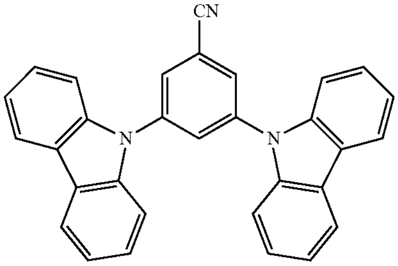
HTH18
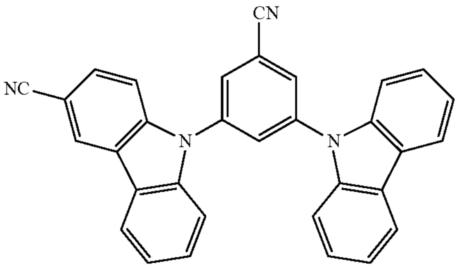
HTH19
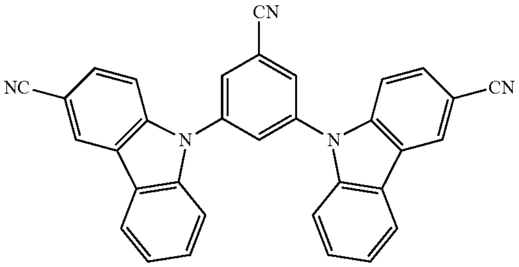
HTH20
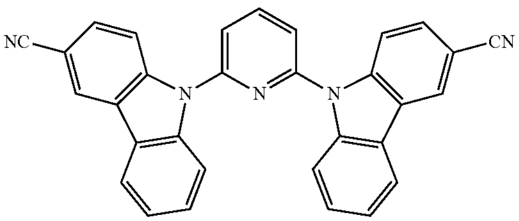

-continued
HTH21
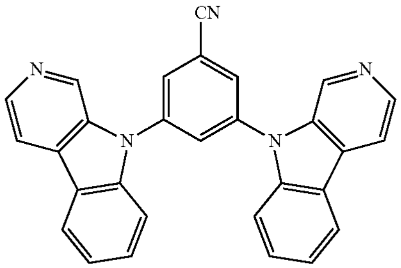
HTH22
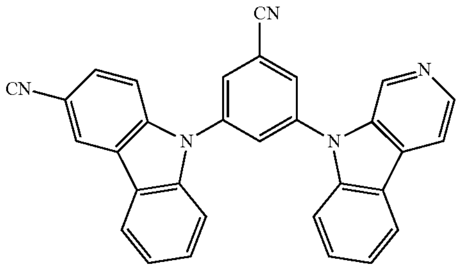
HTH23
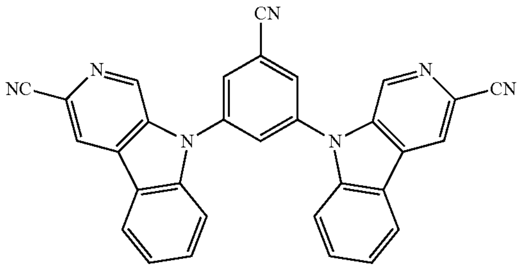
HTH24
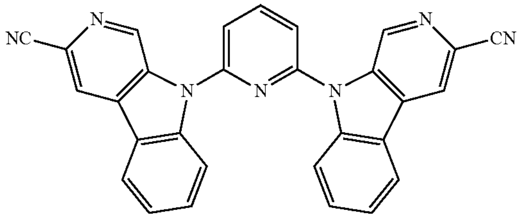
HTH25
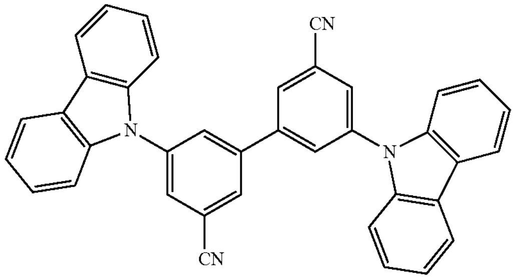
-continued
HTH26
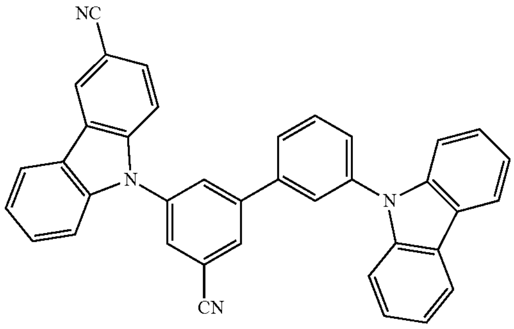
HTH27
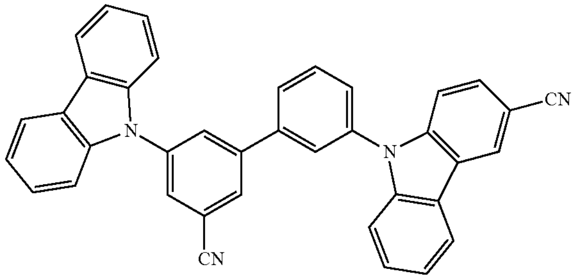
HTH28
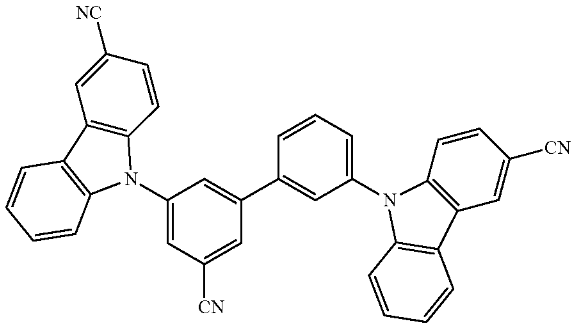
HTH29
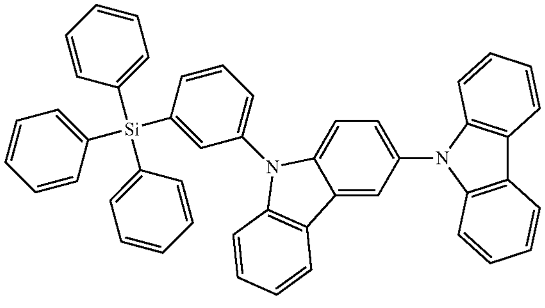

-continued
HTH30
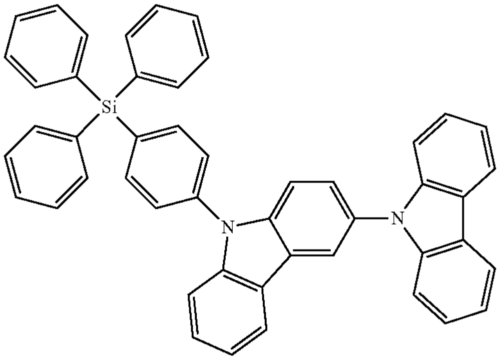
HTH31
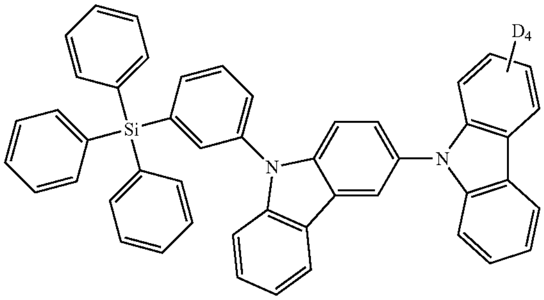
HTH32
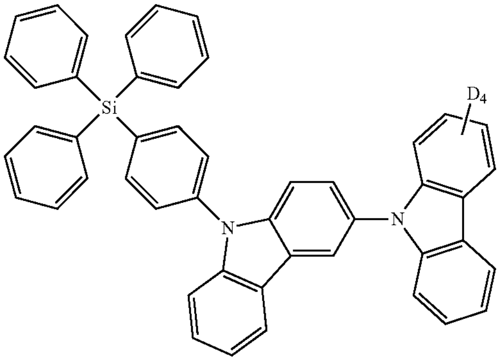
HTH33
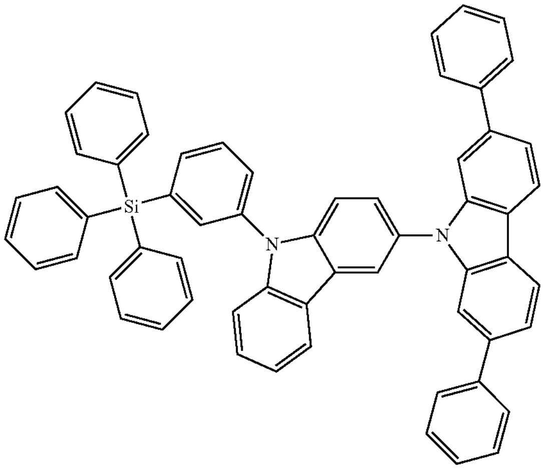
-continued
HTH34
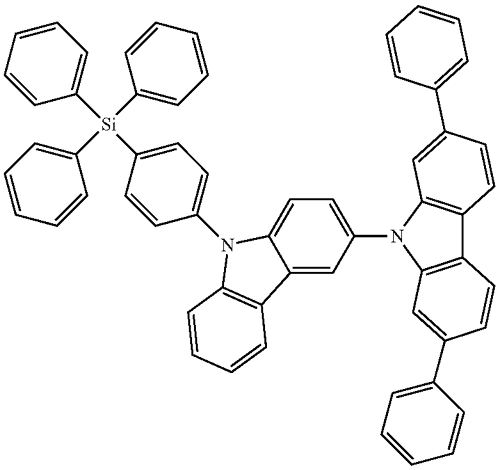
HTH35
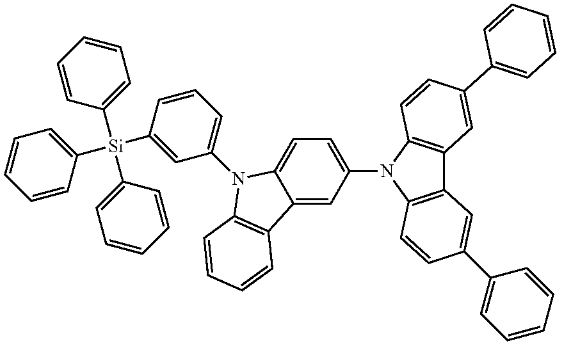
HTH36
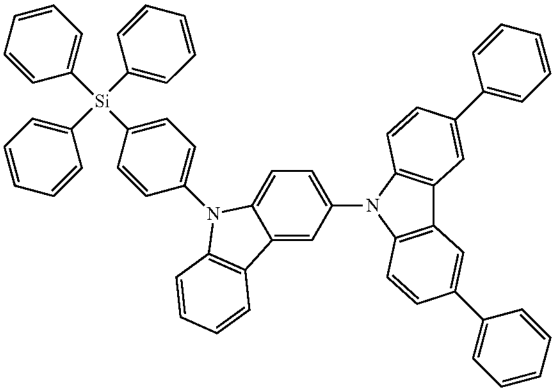
HTH37
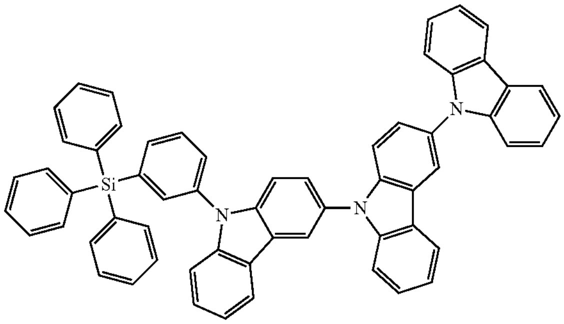

-continued
HTH38
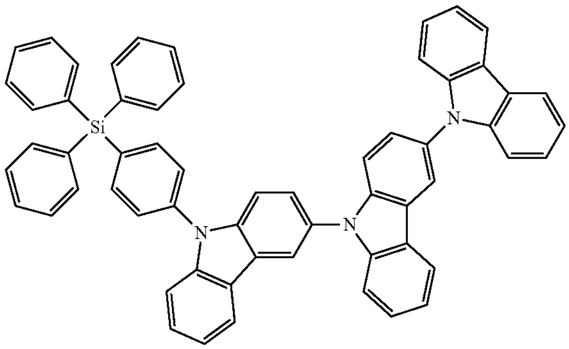
HTH39
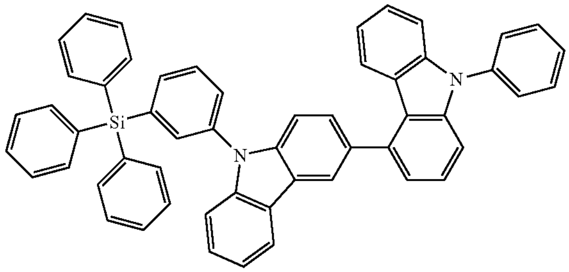
HTH40
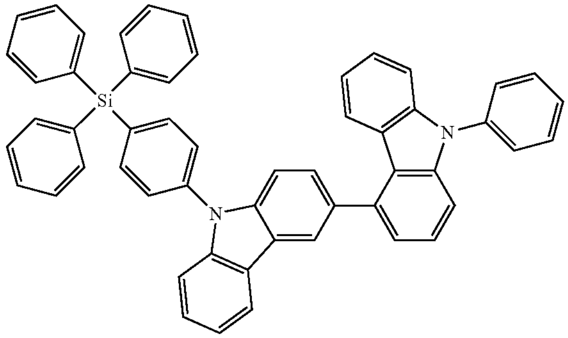
HTH41
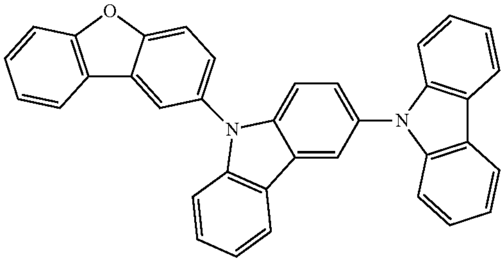
HTH42
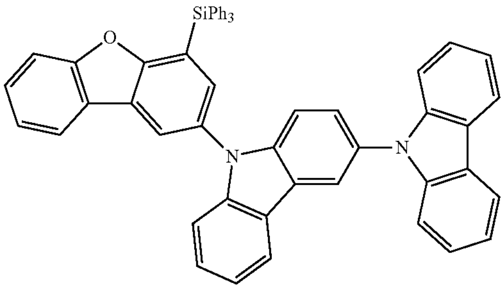
-continued
HTH43
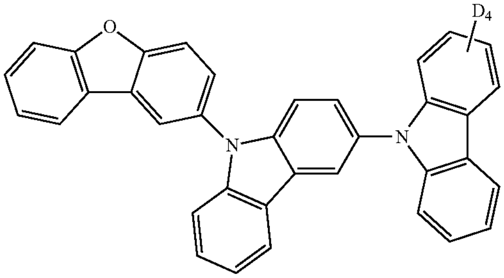
HTH44
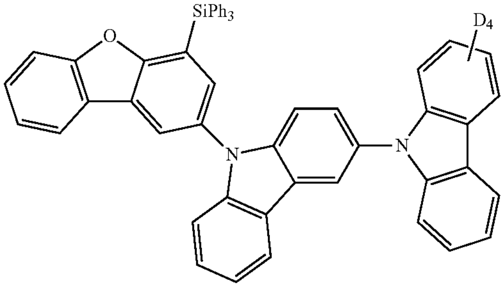
HTH45
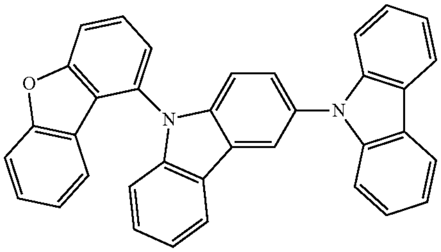
HTH46
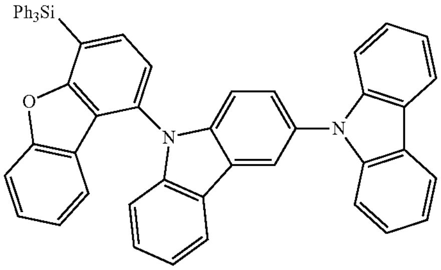
HTH47
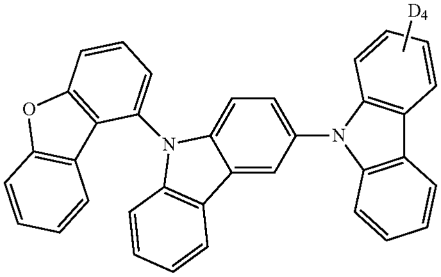

-continued
HTH48
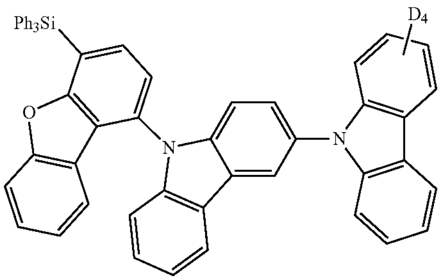
HTH49
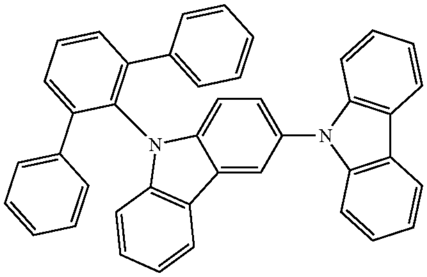
HTH50
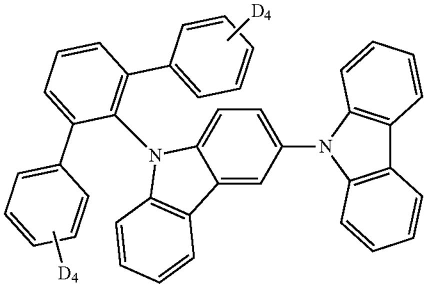
HTH51
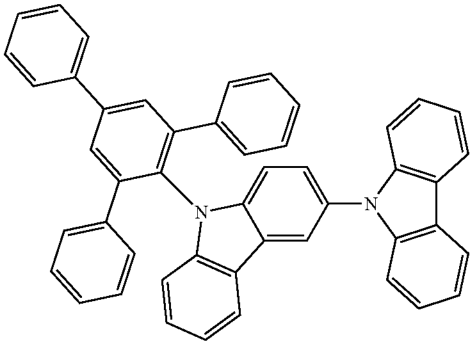
HTH52
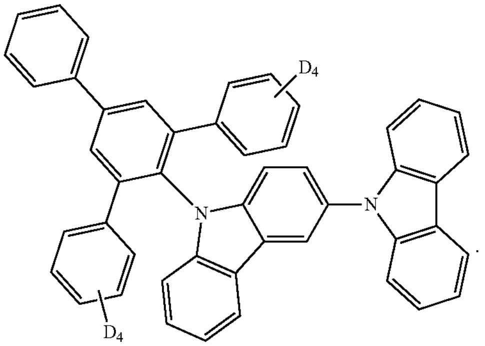
In embodiments, the fourth compound may include at least one of Compounds DFD1 to DFD12:
DFD1
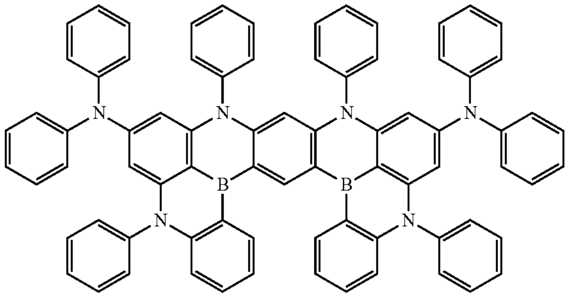
DFD2
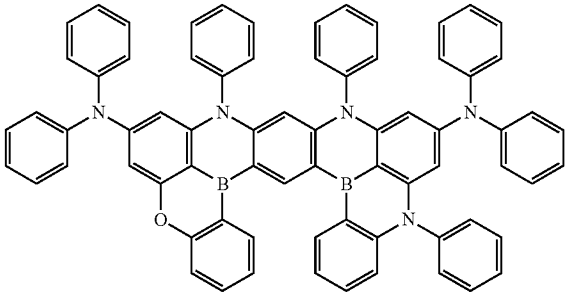
DFD3
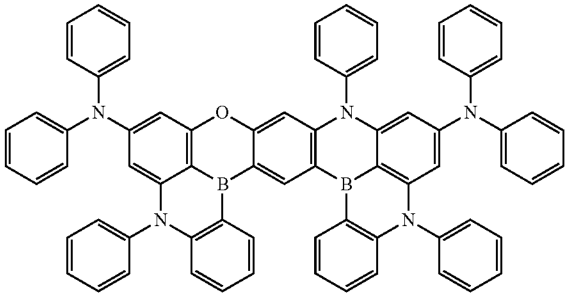
DFD4
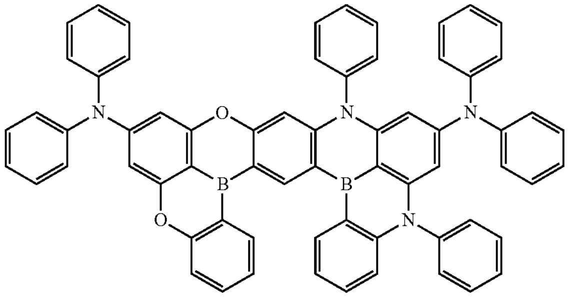

-continued
DFD5
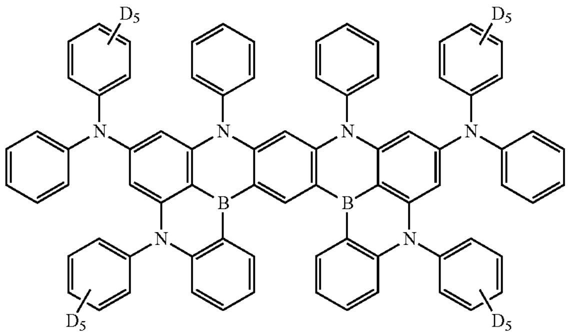
DFD6
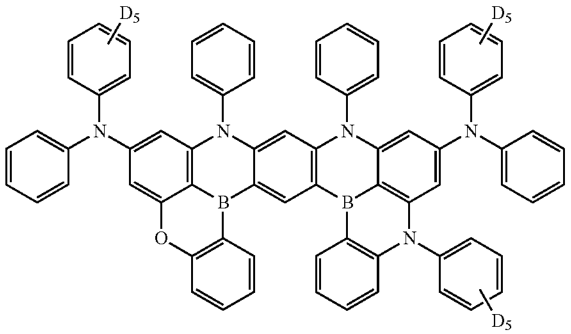
DFD7
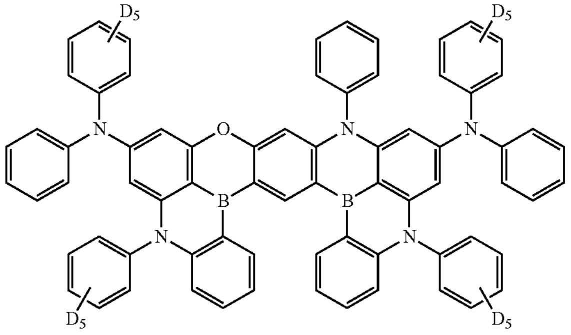
DFD8
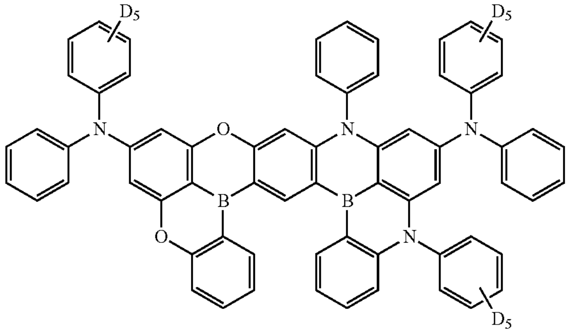
-continued
DFD9
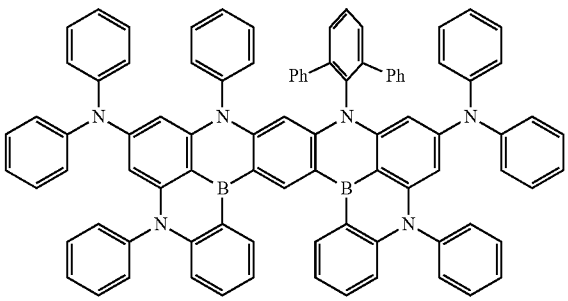
DFD10
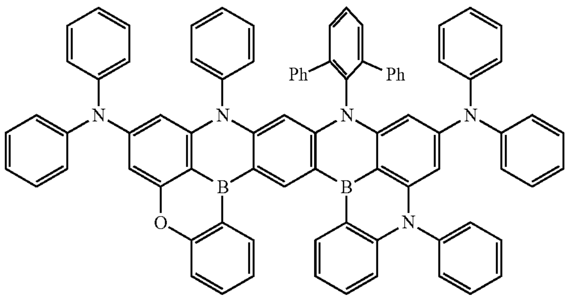
DFD11
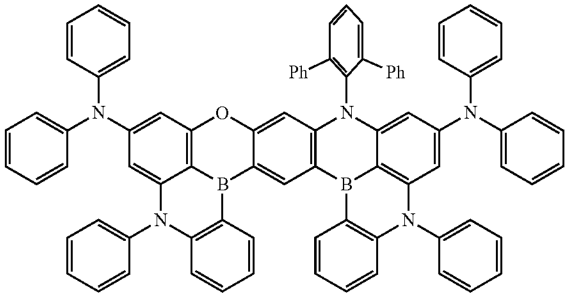
DFD12
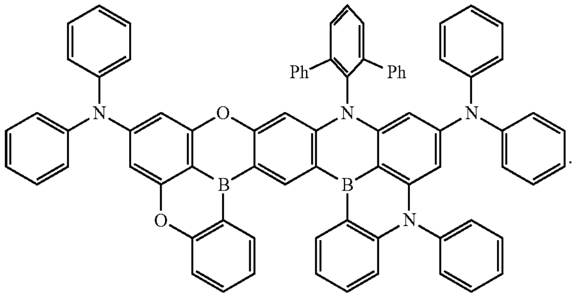
In Compounds ETH1 to ETH84, HTH1 to HTH52, and DFD1 to DFD12, “Ph” represents a phenyl group, “$D_5$” represents substitution with five deuterium atoms, and “$D_4$” represents substitution with four deuterium atoms. For example, a group represented by
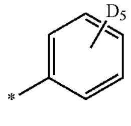

may be identical to a group represented by

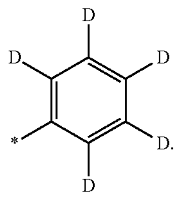

In embodiments, the light-emitting device may satisfy at least one of Conditions 1 to 4:

LUMO energy level in electron volts (eV) of the third compound>LUMO energy level in electron volts (eV) of the first compound [Condition 1]

LUMO energy level in electron volts (eV) of the first compound>LUMO energy level in electron volts (eV) of the second compound [Condition 2]

HOMO energy level in electron volts (eV) of the first compound>HOMO energy level in electron volts (eV) of the third compound [Condition 3]

HOMO energy level in electron volts (eV) of the third compound>HOMO energy level in electron volts (eV) of the second compound [Condition 4]

The HOMO and LUMO energy levels of the first compound, the second compound, and the third compound may each be a negative value. The HOMO and LUMO energy levels may each be an actual measurement value, or the HOMO and LUMO energy levels may each be a value evaluated according to a density functional theory (DFT) method.

In embodiments, an absolute value of a difference between the LUMO energy level of the first compound and the LUMO energy level of the second compound may be in a range of about 0.1 eV to about 1.0 eV, an absolute value of a difference between the LUMO energy level of the first compound and the LUMO energy level of the third compound may be in a range of about 0.1 eV to about 1.0 eV, an absolute value of a difference between the HOMO energy level of the first compound and the HOMO energy level of the second compound may be equal to or less than about 1.25 eV (e.g., about 1.25 eV or lower and about 0.2 eV or higher), and an absolute value of a difference between the HOMO energy level of the first compound and the HOMO energy level of the third compound may be equal to or less than about 1.25 eV (e.g., about 1.25 eV or lower and about 0.2 eV or higher).

When the relationships between LUMO energy level and HOMO energy level satisfy the conditions as described above, a balance between holes and electrons injected into the emission layer may exist.

The light-emitting device may have a structure of a first embodiment or a second embodiment:

Description of First Embodiment

According to a first embodiment, the first compound may be included in an emission layer in an interlayer of a light-emitting device, wherein the emission layer may further include a host, the first compound may be different from the host, and the emission layer may emit phosphorescence or fluorescence from the first compound. For example, according to the first embodiment, the first compound may be a dopant or an emitter. In embodiments, the first compound may be a phosphorescent dopant or a phosphorescence emitter.

Phosphorescence or fluorescence emitted from the first compound may be blue light.

The emission layer may further include an ancillary dopant. The ancillary dopant may serve to improve luminescence efficiency from the first compound by effectively transferring energy to the first compound as a dopant or an emitter.

The ancillary dopant may be different from the first compound and the host.

In embodiments, the ancillary dopant may be a delayed fluorescence-emitting compound.

In embodiments, the ancillary dopant may be a compound including at least one cyclic group including boron (B) and nitrogen (N) as ring-forming atoms.

Description of Second Embodiment

According to a second embodiment, the first compound may be included in an emission layer in an interlayer of a light-emitting device, wherein the emission layer may further include a host and a dopant, the first compound may be different from the host and the dopant, and the emission layer may emit phosphorescence or fluorescence (e.g., delayed fluorescence) from the dopant.

For example, the first compound in the second embodiment may serve as an ancillary dopant that transfers energy to a dopant (or an emitter), and may not serve as a dopant.

In embodiments, the first compound in the second embodiment may serve as an emitter and as an ancillary dopant that transfers energy to a dopant (or an emitter).

For example, phosphorescence or fluorescence emitted from the dopant (or the emitter) in the second embodiment may be blue phosphorescence or blue fluorescence (e.g., blue delayed fluorescence).

The dopant (or the emitter) in the second embodiment may be a phosphorescent dopant material (e.g., the organometallic compound represented by Formula 1, the organometallic compound represented by Formula 401, or any combination thereof) or any fluorescent dopant material (e.g., the compound represented by Formula 501, the compound represented by Formula 502, the compound represented by Formula 503, or any combination thereof).

In the first embodiment and the second embodiment, the blue light may be blue light having a maximum emission wavelength in a range of about 430 nanometers (nm) to about 490 nm. For example, the blue light may have a maximum emission wavelength in a range of about 430 nm to about 485 nm. For example, the blue light may have a maximum emission wavelength in a range of about 440 nm to about 475 nm. For example, the blue light may have a maximum emission wavelength in a range of about 455 nm to about 470 nm.

The ancillary dopant in the first embodiment may include, e.g. the fourth compound represented by Formula 502 or Formula 503.

The host in the first embodiment and the second embodiment may be any host material (e.g., the compound represented by Formula 301, the compound represented by 301-1, the compound represented by Formula 301-2, or any combination thereof).

In embodiments, the host in the first embodiment and the second embodiment may be the second compound, the third compound, or any combination thereof.

In embodiments, the light-emitting device may further include at least one of a first capping layer located outside a first electrode and a second capping layer located outside a second electrode, and at least one of the first capping layer and the second capping layer may include the organometallic compound represented by Formula 1. The first capping layer and the second capping layer may respectively be understood by referring to the descriptions of the first capping layer and the second capping layer provided herein.

In embodiments, the light-emitting device may include: a first capping layer located outside the first electrode and including the organometallic compound represented by Formula 1; a second capping layer located outside the second electrode and including the organometallic compound represented by Formula 1; or the first capping layer and the second capping layer.

The expression that an "(interlayer and/or a capping layer) includes at least one organometallic compound represented by Formula 1" as used herein may be construed as meaning that the "(interlayer and/or the capping layer) may include one organometallic compound of Formula 1 or two different organometallic compounds of Formula 1".

For example, the interlayer and/or the capping layer may include Compound D1 only as the organometallic compound. In this embodiment, Compound D1 may be included in the emission layer of the light-emitting device. In embodiments, Compounds D1 and D2 may be included in the interlayer as organometallic compounds. In this embodiment, Compounds D1 and D2 may be included in the same layer (for example, both Compounds D1 and D2 may be included in an emission layer) or in different layers (for example, Compound D1 may be included in an emission layer, and Compound D2 may be included in an electron transport region).

The term "interlayer" as used herein refers to a single layer or multiple layers located between a first electrode and a second electrode in a light-emitting device.

According to embodiments, an electronic apparatus may include the light-emitting device. The electronic apparatus may further include a thin-film transistor. In embodiments, the electronic apparatus may further include a thin-film transistor including a source electrode and drain electrode, and a first electrode of the light-emitting device may be electrically connected to the source electrode or the drain electrode. In an embodiment, the electronic apparatus may further include a color filter, a color-conversion layer, a touchscreen layer, a polarization layer, or any combination thereof. The electronic apparatus may be understood by referring to the description of the electronic apparatus provided herein.

[Description of FIG. 1]

FIG. 1 is a schematic cross-sectional view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

[First Electrode 110]

In FIG. 1, a substrate may be further included under the first electrode 110 or above the second electrode 150. The substrate may be a glass substrate or a plastic substrate. The substrate may be a flexible substrate including plastic having excellent heat resistance and durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering, on the substrate, a material for forming the first electrode 110. When the first electrode 110 is an anode, a high work function material that may easily inject holes may be used as a material for a first electrode 110.

The first electrode 110 may be a reflective electrode, a transflective electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combinations thereof. In embodiments, when the first electrode 110 is a transflective electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a structure consisting of a single layer or a structure including two or more layers. In embodiments, the first electrode 110 may have a triple-layered structure of ITO/Ag/ITO.

[Interlayer 130]

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include at least two emitting units sequentially stacked between the first electrode 110 and the second electrode 150; and a charge generation layer between the at least two emitting units. When the interlayer 130 includes the at least two emitting units and a charge generation layer, the light-emitting device 10 may be a tandem light-emitting device.

[Hole Transport Region in Interlayer 130]

The hole transport region may have a structure consisting of a layer consisting of a single material, a structure consisting of a layer including different materials, or a multi-layered structure having layers including a plurality of different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure may be stacked on the first electrode 110 in its respective stated order, but embodiments are not limited thereto.

The hole transport region may include the compound represented by Formula 201, the compound represented by Formula 202, or any combination thereof:

[Formula 201]

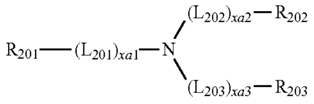

[Formula 202]

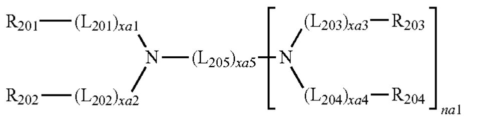

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and * and *' each indicate a binding site to a neighboring atom, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and $R_{10a}$ may be understood by referring to the description of $R_{10a}$ provided herein, and na1 may be an integer from 1 to 4.

In embodiments, Formulae 201 and 202 may each include at least one of groups represented by Formulae CY201 to CY217:

CY201

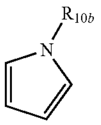

CY202

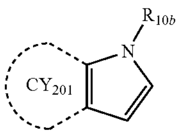

-continued

CY203

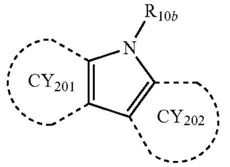

CY204

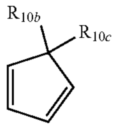

CY205

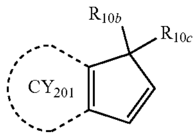

CY206

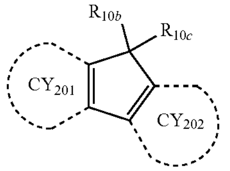

CY207

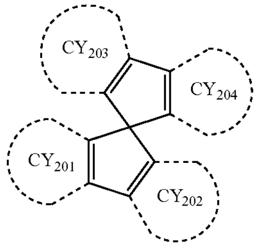

CY208

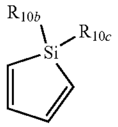

CY209

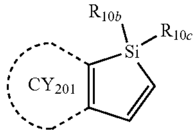

CY210

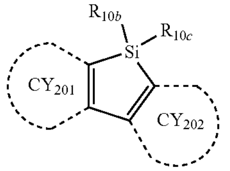

CY211

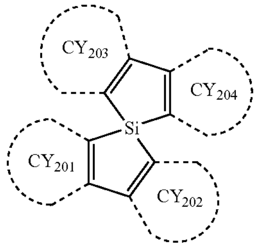

-continued

CY212

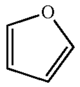

CY213

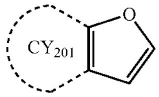

CY214

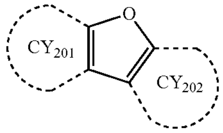

CY215

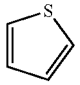

CY216

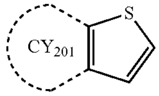

CY217

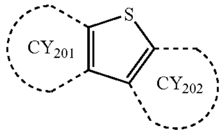

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In embodiments, in Formulae CY201 to CY217, ring CY201 to ring CY204 may each independently be a benzene group, a naphthalene group, a phenanthrene group, or an anthracene group.

In embodiments, Formulae 201 and 202 may each include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be a group represented by any one of Formulae CY201 to CY203, xa2 may be 0, and $R_{202}$ may be a group represented by any one of Formulae CY204 to CY207.

In embodiments, Formulae 201 and 202 may each not include groups represented by Formulae CY201 to CY203.

In embodiments, Formulae 201 and 202 may each not include groups represented by Formulae CY201 to CY203, and include at least one of groups represented by Formulae CY204 to CY217.

In embodiments, Formulae 201 and 202 may each not include groups represented by Formulae CY201 to CY217.

In embodiments, the hole transport region may include one of Compounds HT1 to HT46 and m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PANI/PSS), or any combination thereof:

HT1

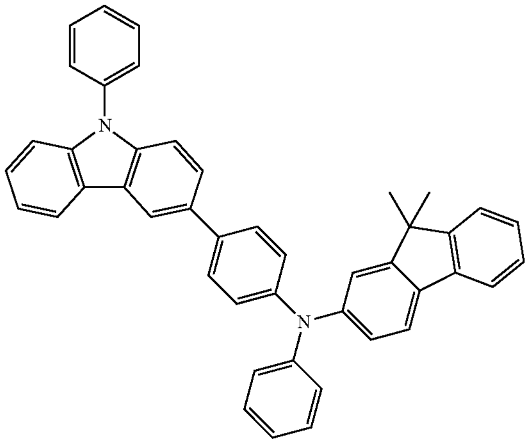

HT2

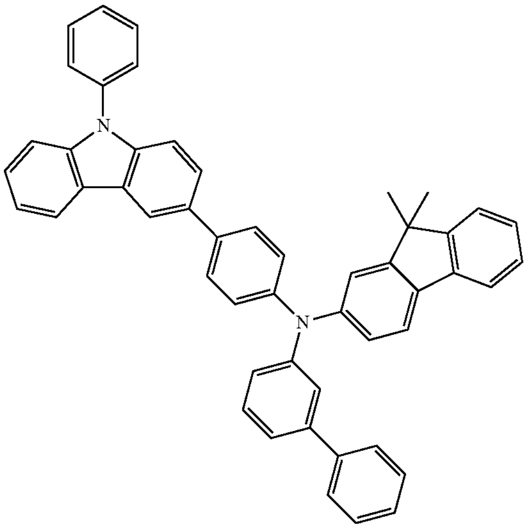

-continued
HT3
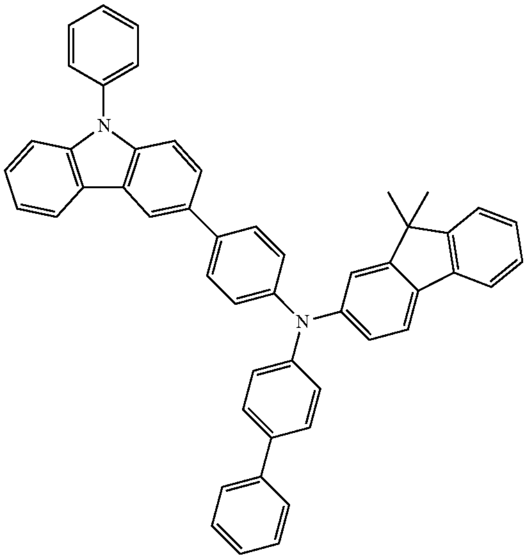
HT4
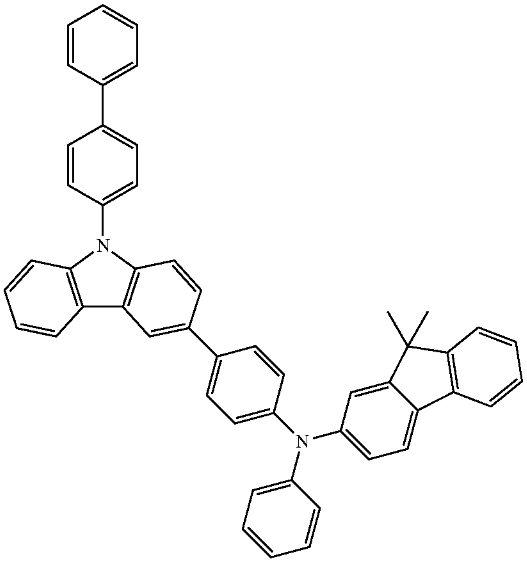
HT5
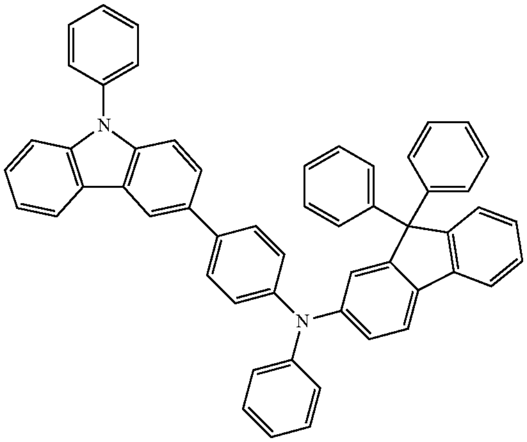
HT6
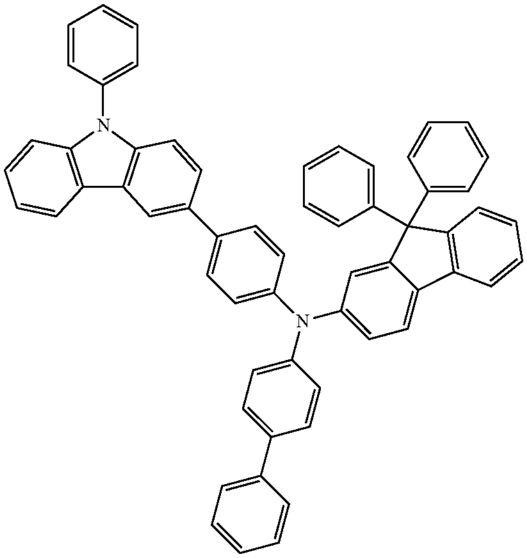

-continued
HT7
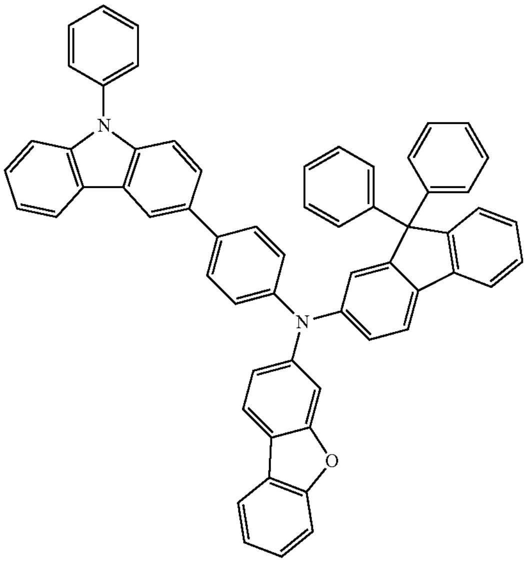
HT8
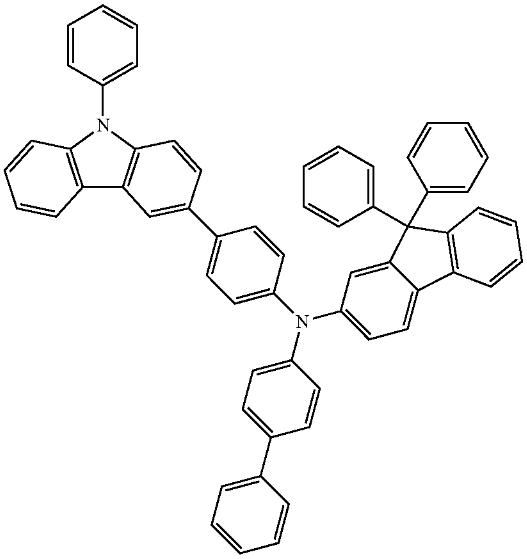
HT9
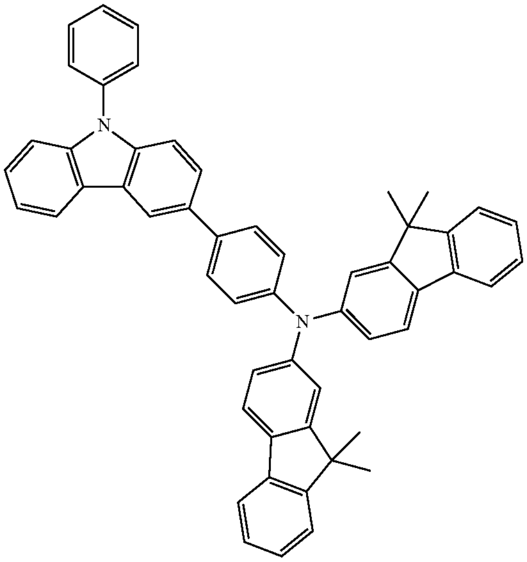
HT10
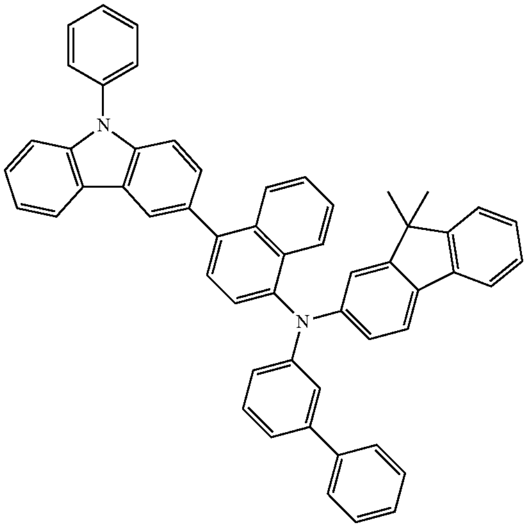
HT11
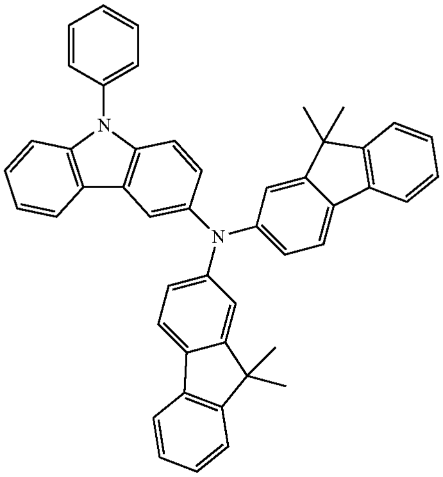
HT12
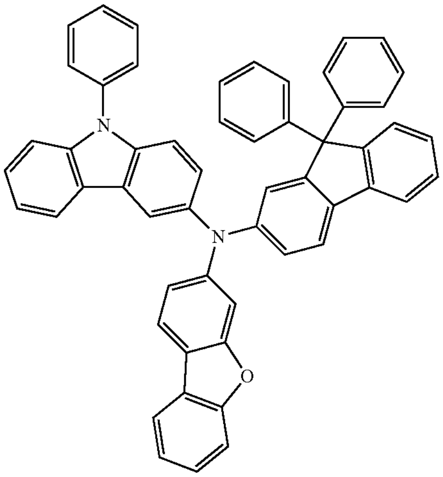

-continued
HT13
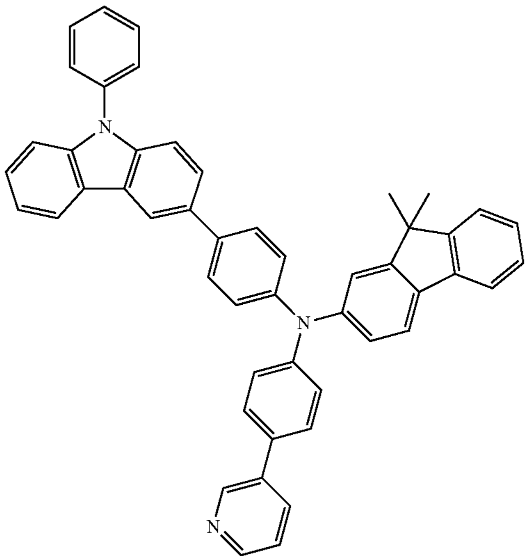
HT14
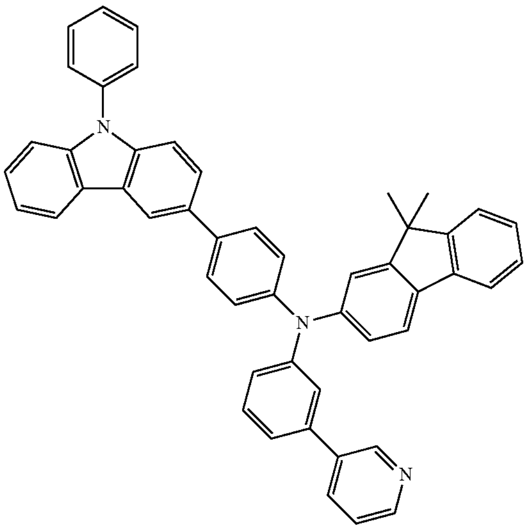
HT15
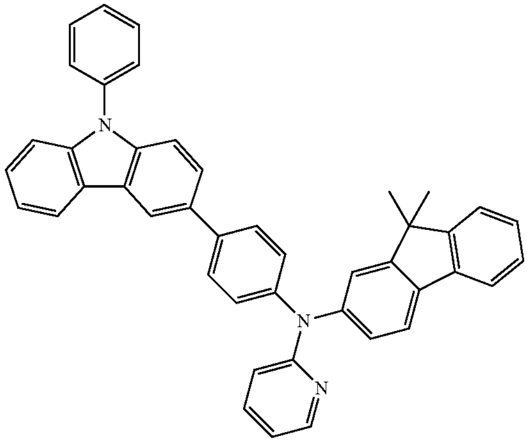
HT16
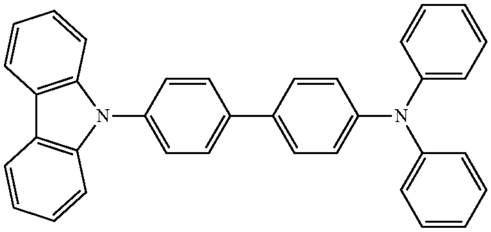
HT17
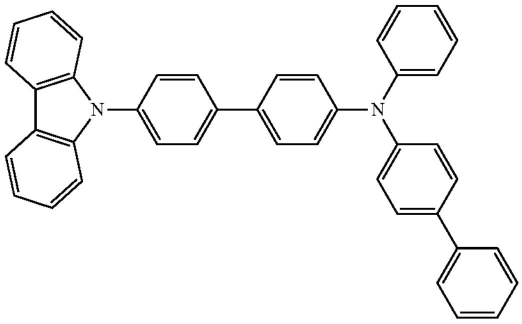
HT18
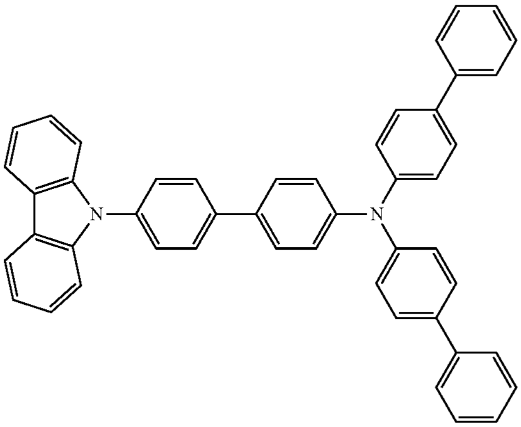

-continued
HT19
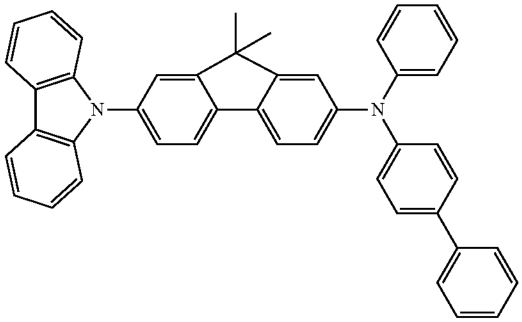
HT20
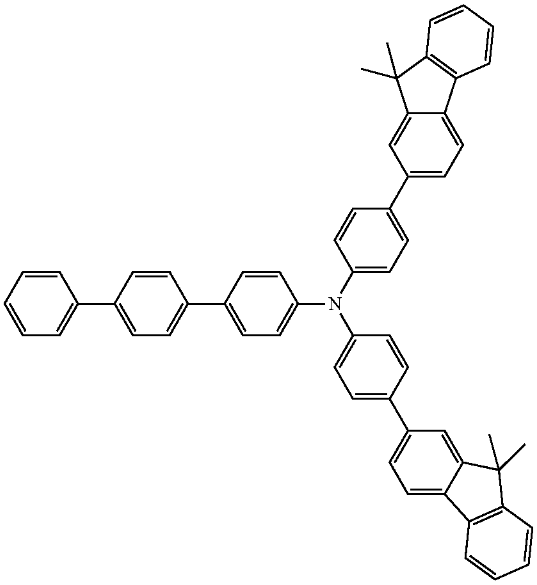
HT21
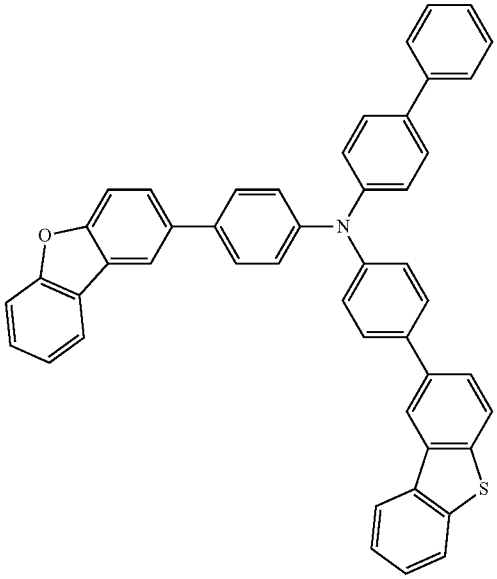
HT22
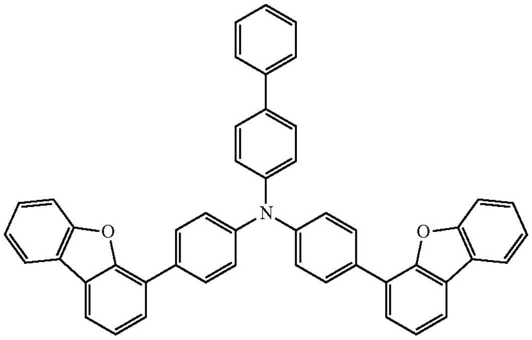

-continued
HT23
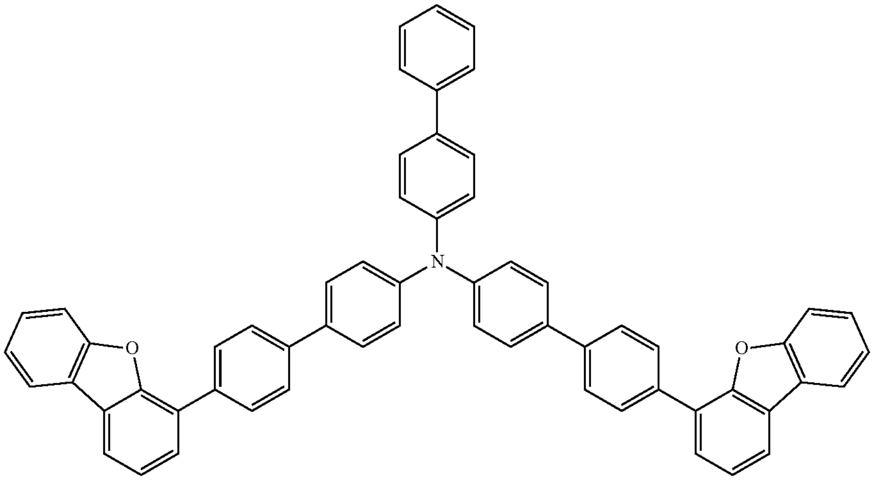
HT24
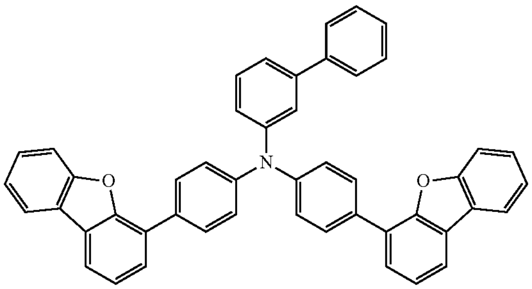
HT25
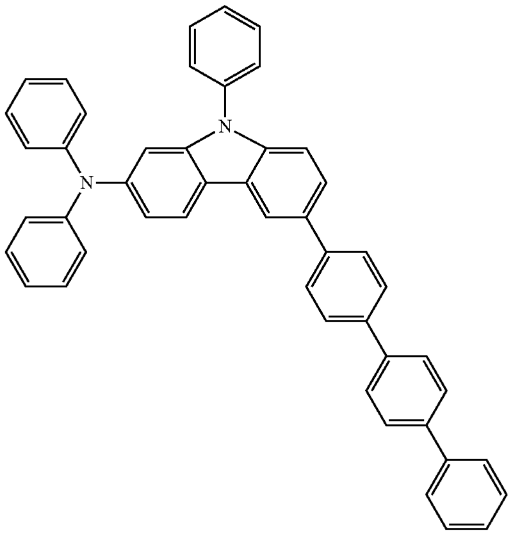
HT26
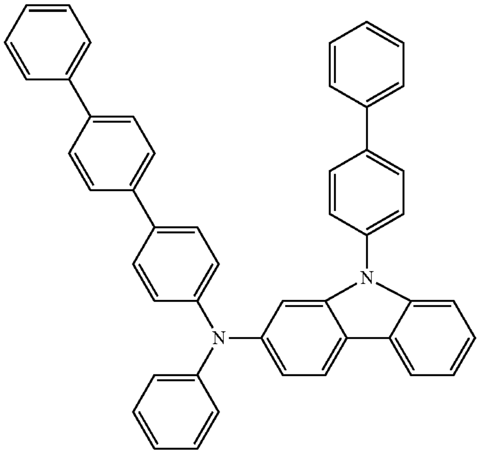
HT27
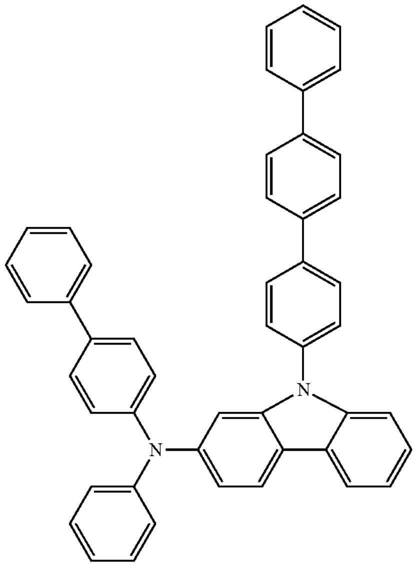

-continued
HT28
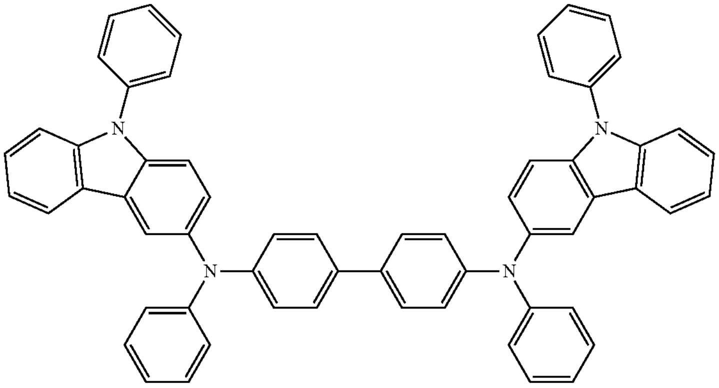
HT29
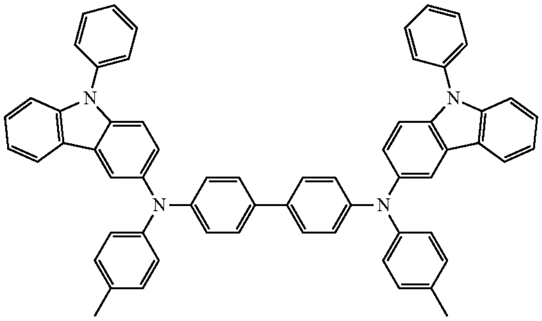
HT30
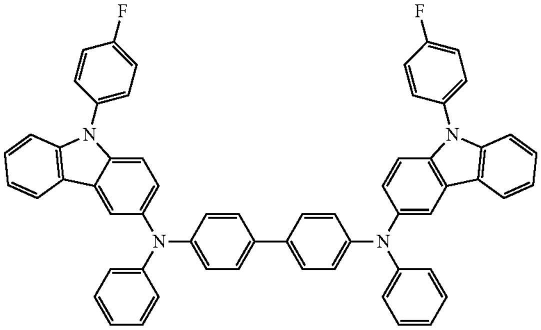
HT31
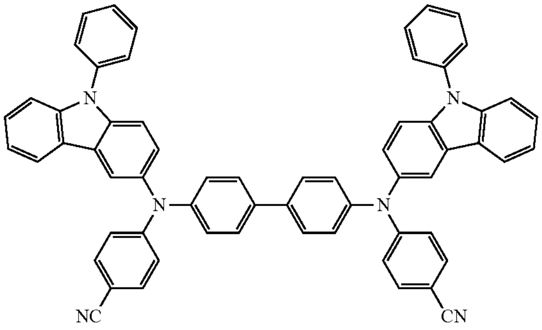
HT32
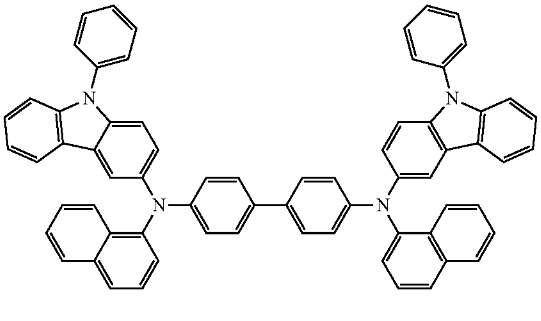
HT33
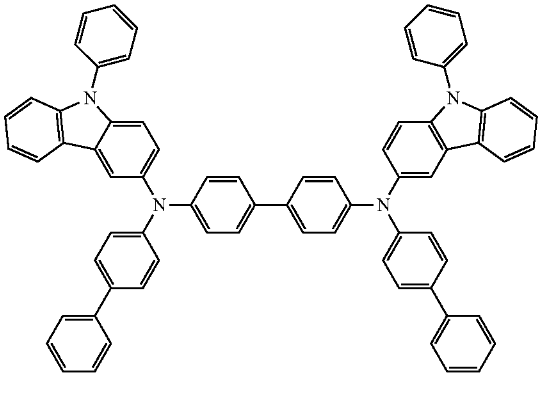
HT34
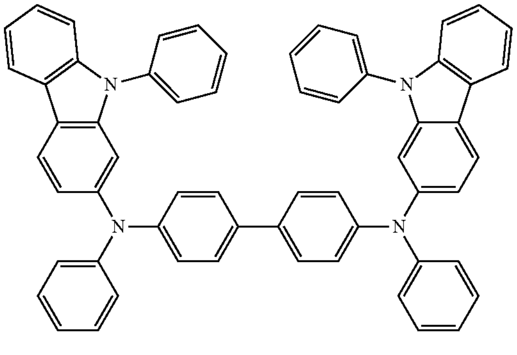

-continued
HT35
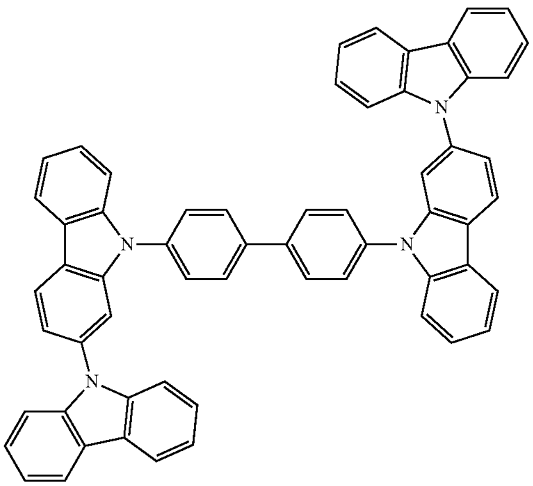
HT36
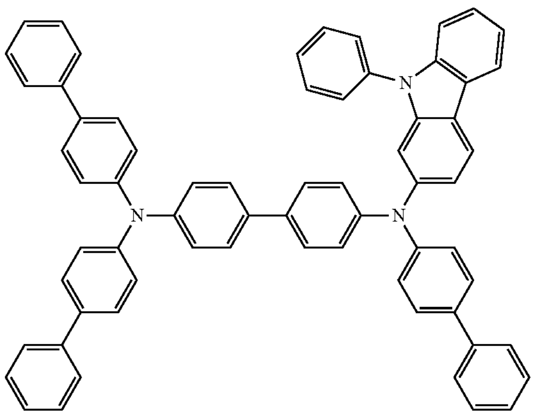
HT37
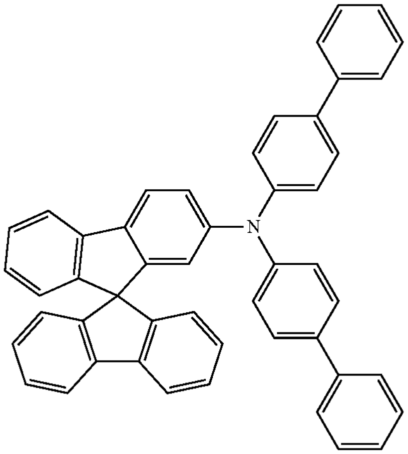
HT38
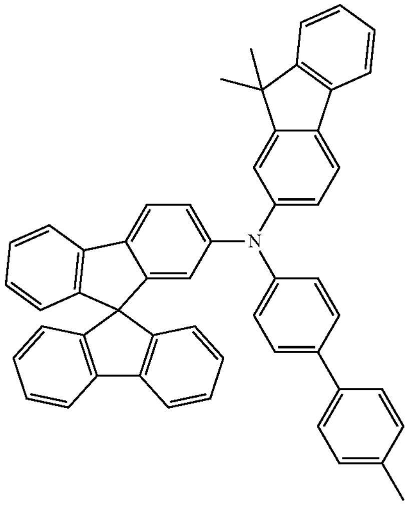
HT39
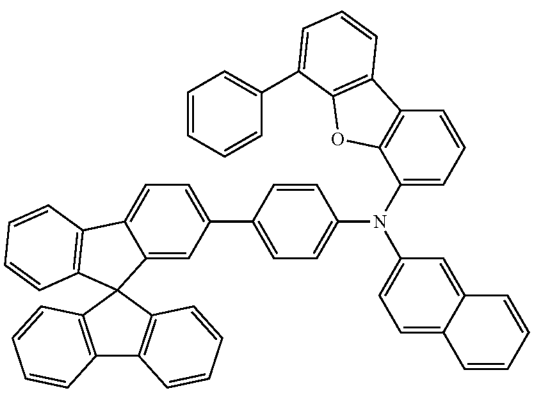
HT40
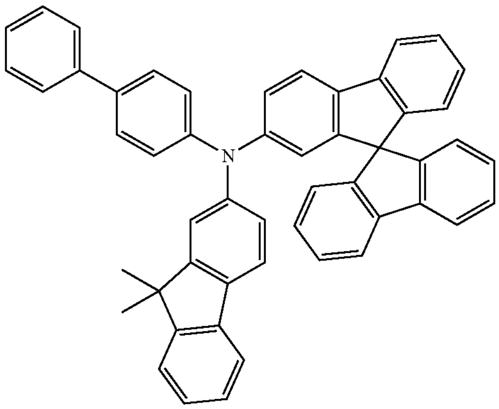

-continued
HT41
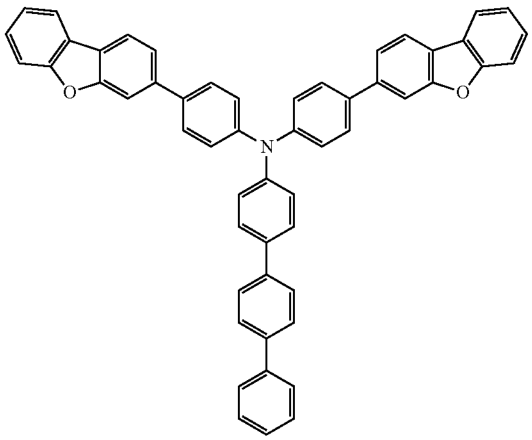
HT42
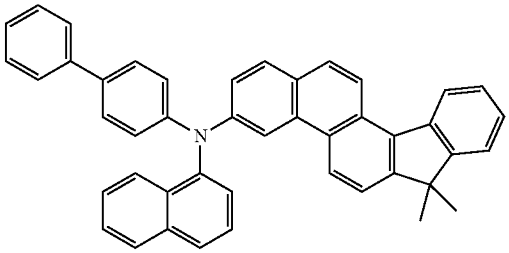
HT43
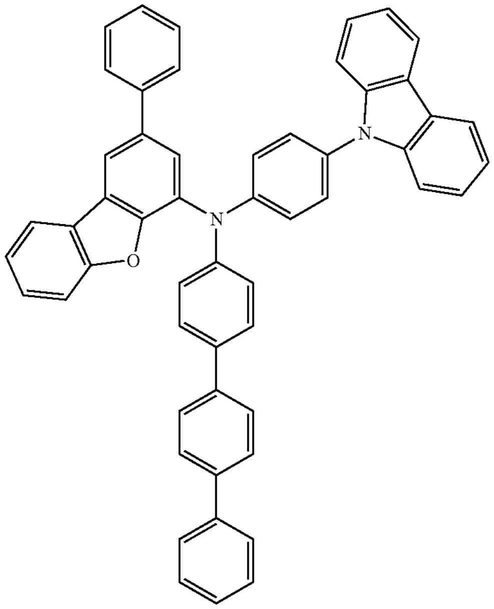
HT44
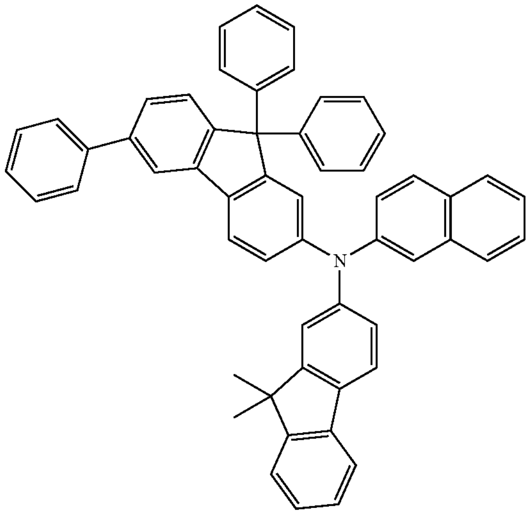
HT45
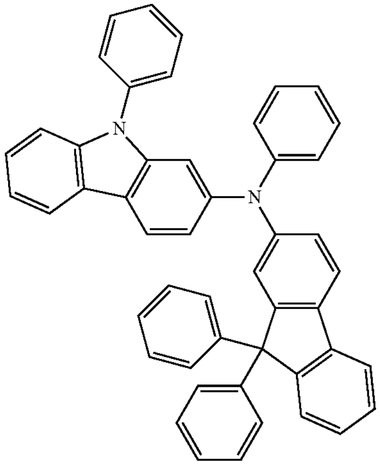
HT46
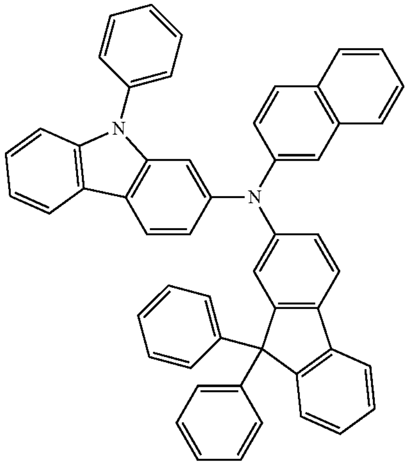

-continued
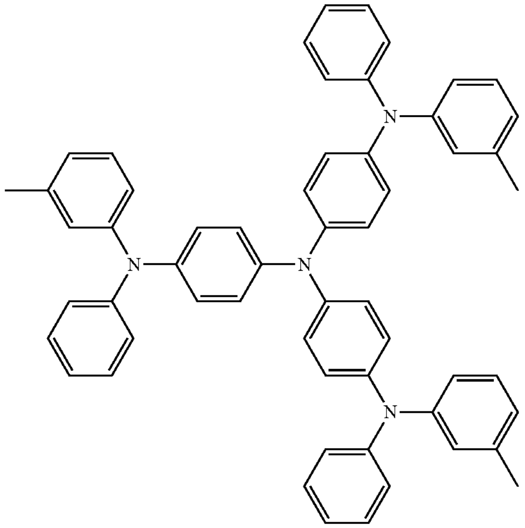
m-MTDATA
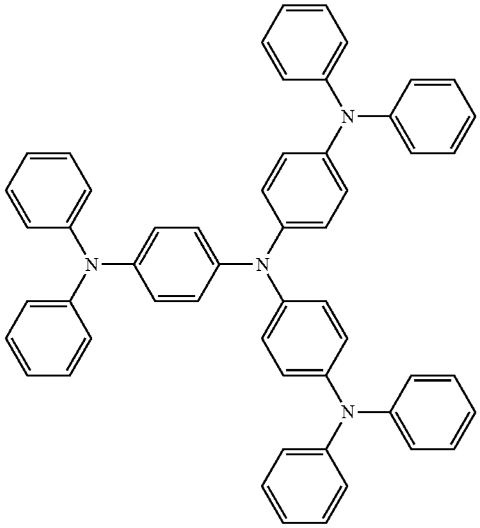
TDATA
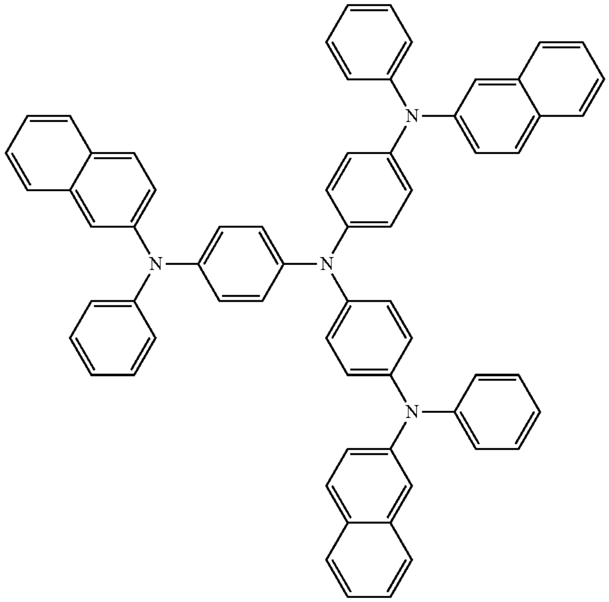
2-TNATA
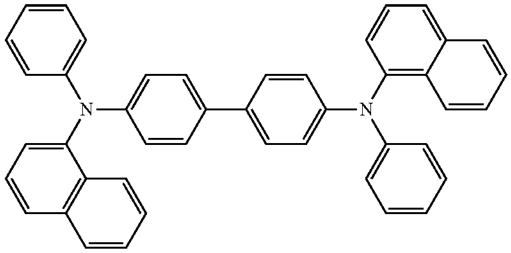
NPB
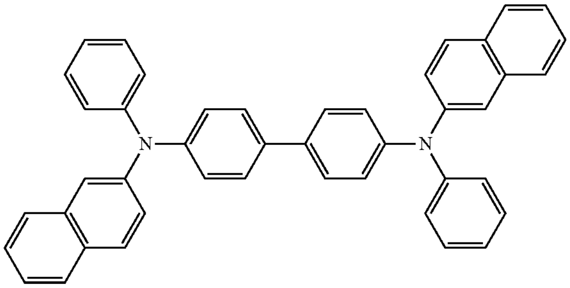
β-NPB -continued

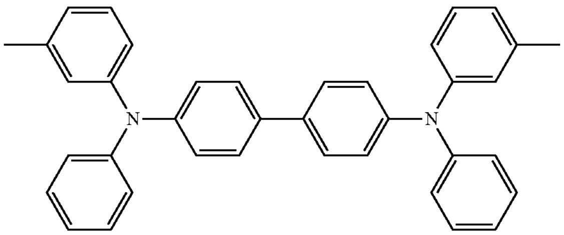

TPD

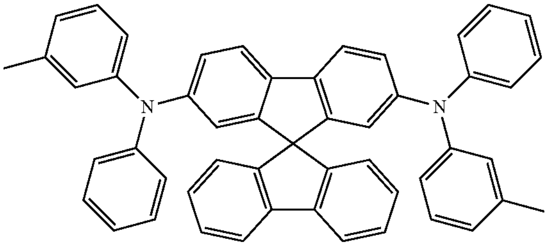

Spiro-TPD

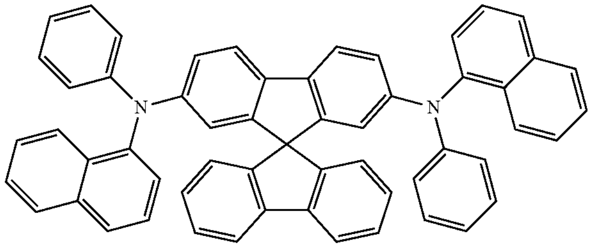

Spiro-NPB

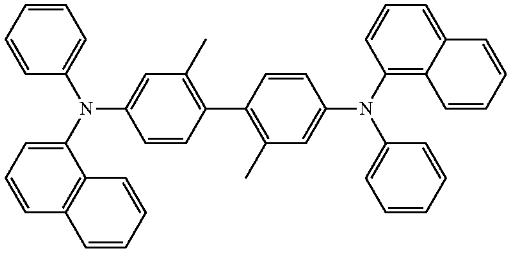

methylated-NPB

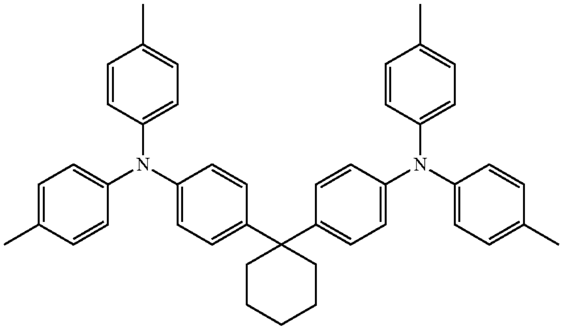

TAPC

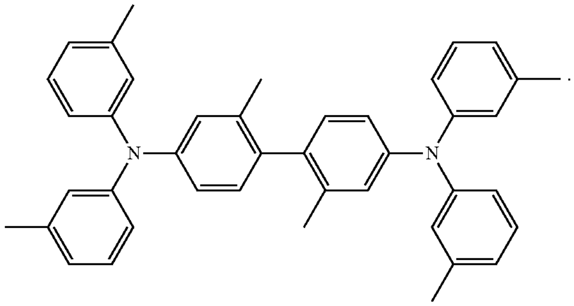

HMTPD

A thickness of the hole transport region may be in a range of about 50 Angstroms (Å) to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of 100 Å to about 1,000 Å. For example, the thickness of the hole transport layer may be in a range of about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase luminescence efficiency by compensating for an optical resonance distance according to a wavelength of light emitted by an emission layer. The electron blocking layer may prevent leakage of electrons to a hole transport region from the emission layer. Materials that may be included in the hole transport region may also be included in an emission auxiliary layer and an electron blocking layer.

[p-Dopant]

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In embodiments, a lowest unoccupied molecular orbital (LUMO) energy level of the p-dopant may be equal to or less than about −3.5 eV.

In embodiments, the p-dopant may include a quinone derivative, a compound containing a cyano group, a compound containing element EL1 and element EL2, or any combination thereof.

Examples of the quinone derivative may include TCNQ, F4-TCNQ, and the like.

Examples of the compound containing a cyano group include HAT-CN, a compound represented by Formula 221, and the like:

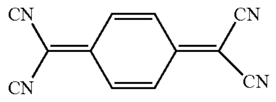

TCNQ

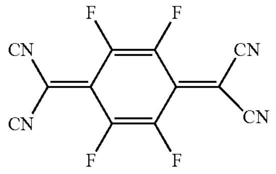

F4-TCNQ

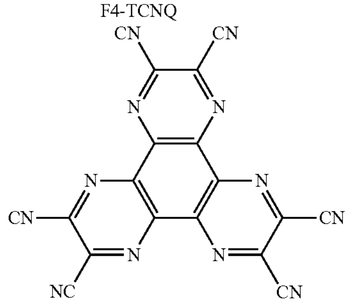

HAT-CN

[Formula 221]

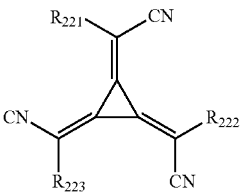

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Examples of the metal may include an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); a post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like); and the like.

Examples of the metalloid may include silicon (Si), antimony (Sb), tellurium (Te), and the like.

Examples of the non-metal may include oxygen (O), a halogen (e.g., F, Cl, Br, I, and the like), and the like.

For example, the compound containing element EL1 and element EL2 may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include tungsten oxide (e.g., WO, $W_2O_3$, $WO_2$, $WO_3$, $W_2O_5$, and the like), vanadium oxide (e.g., VO, $V_2O_3$, $VO_2$, $V_2O_5$, and the like), molybdenum oxide (e.g., MoO, $Mo_2O_3$, $MoO_2$, $MoO_3$, $Mo_2O_5$, and the like), rhenium oxide (e.g., $ReO_3$ and the like), and the like.

Examples of the metal halide may include an alkali metal halide, an alkaline earth metal halide, a transition metal halide, a post-transition metal halide, a lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $Sr_{12}$, $BaI_2$, and the like.

Examples of the transition metal halide may include titanium halide (e.g., $TiF_4$, $TiCl_4$, $TiBr_4$, $TiI_4$, and the like), zirconium halide (e.g., $ZrF_4$, $ZrCl_4$, $ZrBr_4$, $ZrI_4$, and the like), hafnium halide (e.g., $HfF_4$, $HfCl_4$, $HfBr_4$, $HfI_4$, and the like), vanadium halide (e.g., $VF_3$, $VCl_3$, $VBr_3$, $VI_3$, and the like), niobium halide (e.g., $NbF_3$, $NbCl_3$, $NbBr_3$, $NbI_3$, and the like), tantalum halide (e.g., $TaF_3$, $TaCl_3$, $TaBr_3$, $TaI_3$, and the like), chromium halide (e.g., $CrF_3$, $CrCl_3$, $CrBr_3$, $CrI_3$, and the like), molybdenum halide (e.g., $MoF_3$, $MoCl_3$, $MoBr_3$, $MoI_3$, and the like), tungsten halide (e.g., $WF_3$, $WCl_3$, $WBr_3$, $WI_3$, and the like), manganese halide (e.g., $MnF_2$, $MnCl_2$, $MnBr_2$, $MnI_2$, and the like), technetium halide (e.g., $TcF_2$, $TcCl_2$, $TcBr_2$, $TcI_2$, and the like), rhenium halide (e.g., $ReF_2$, $ReCl_2$, $ReBr_2$, $ReI_2$, and the like), iron halide (e.g., $FeF_2$, $FeCl_2$, $FeBr_2$, $FeI_2$, and the like), ruthenium halide (e.g., $RuF_2$, $RuCl_2$, $RuBr_2$, $RuI_2$, and the like), osmium halide (e.g., $OsF_2$, $OsCl_2$, $OsBr_2$, $OsI_2$, and the like), cobalt halide (e.g., $CoF_2$, $CoCl_2$, $CoBr_2$, $CoI_2$, and the like), rhodium halide (e.g., $RhF_2$, $RhCl_2$, $RhBr_2$, $RhI_2$, and the like), iridium halide (e.g., $IrF_2$, $IrCl_2$, $IrBr_2$, $IrI_2$, and the like), nickel halide (e.g., $NiF_2$, $NiCl_2$, $NiBr_2$, $NiI_2$, and the like), palladium halide (e.g., $PdF_2$, $PdCl_2$, $PdBr_2$, $PdI_2$, and the like), platinum halide (e.g., $PtF_2$, $PtCl_2$, $PtBr_2$, $PtI_2$, and the like), copper halide (e.g., CuF, CuCl, CuBr, CuI, and the like), silver halide (e.g., AgF, AgCl, AgBr, AgI, and the like), gold halide (e.g., AuF, AuCl, AuBr, AuI, and the like), and the like.

Examples of the post-transition metal halide may include zinc halide (e.g., $ZnF_2$, $ZnCl_2$, $ZnBr_2$, $ZnI_2$, and the like), indium halide (e.g., Inks and the like), tin halide (e.g., $SnI_2$ and the like), and the like.

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Examples of the metalloid halide may include antimony halide (e.g., $SbCl_5$ and the like) and the like.

Examples of the metal telluride may include an alkali metal telluride (e.g., $Li_2Te$, $Na_2Te$, $K_2Te$, $Rb_2Te$, $Cs_2Te$, and the like), an alkaline earth metal telluride (e.g., BeTe, MgTe, CaTe, SrTe, BaTe, and the like), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), a post-transition metal telluride (e.g., ZnTe and the like), a lanthanide metal telluride (e.g., LaTe, CeTe, PrTe, NdTe, PmTe, EuTe, GdTe, TbTe, DyTe, HoTe, ErTe, TmTe, YbTe, LuTe, and the like), and the like.

[Emission Layer in Interlayer 130]

When the light-emitting device 10 is a full color light-emitting device, the emission layer may be patterned into a red emission layer, a green emission layer, and/or a blue emission layer, according to a subpixel. In embodiments, the emission layer may have a stacked structure. The stacked structure may include two or more layers selected from a red emission layer, a green emission layer, and a blue emission layer. The two or more layers may directly contact each other. In embodiments, the two or more layers may be separated from each other. In embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a host and a dopant. The dopant may be a phosphorescent dopant, a fluorescent dopant, or any combination thereof.

An amount of the dopant in the emission layer may be in a range of about 0.01 parts to about 15 parts by weight based on 100 parts by weight of the host.

In embodiments, the emission layer may include a quantum dot.

The emission layer may include a delayed fluorescence material. The delayed fluorescence material may serve as a host or a dopant in the emission layer.

A thickness of the emission layer may be in a range of about 100 Å to about 1,000 Å. In embodiments, the thickness of the emission layer may be in a range of about 200 Å to about 600 Å. When the thickness of the emission layer is within any of these ranges, improved luminescence characteristics may be obtained without a substantial increase in driving voltage.

[Host]

The host may include a compound represented by Formula 301:

$$[Ar_{301}]_{xb11}\text{-}[(L_{301})_{xb1}\text{-}R_{301}]_{xb21}$$ [Formula 301]

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), and $R_{10a}$ may be understood by referring to the description of $R_{10a}$ provided herein, xb21 may be an integer from 1 to 5, and $Q_{301}$ to $Q_{303}$ may independently each be understood by referring to the description of $Q_1$ provided herein.

In embodiments, when xb11 in Formula 301 is 2 or greater, at least two $Ar_{301}$(s) may be bound via a single bond.

In embodiments, the host may include a compound represented by Formula 301-1, a compound represented by Formula 301-2, or any combination thereof:

[Formula 301-1]

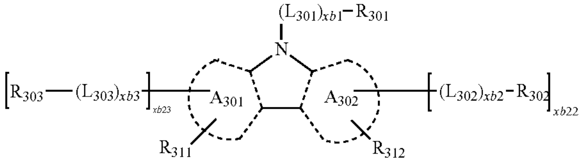

[Formula 301-2]

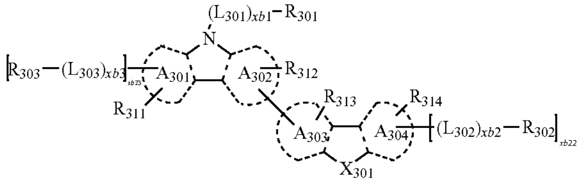

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ may be understood by referring to the description of $R_{10a}$ provided herein, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each independently be understood by referring to the description of $L_{301}$ provided herein, xb2 to xb4 may each independently be understood by referring to the description of xb1 provided herein, and $R_{302}$ to $R_{305}$ and $R_{311}$ to $R_{314}$ may each independently be understood by referring to the description of $R_{301}$ provided herein.

In embodiments, the host may include an alkaline earth-metal complex, a post-transitional metal complex, or any combination thereof. For example, the host may include a Be complex (e.g., Compound H55), a Mg complex, a Zn complex, or any combination thereof.

In embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1

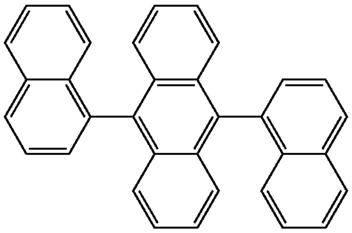

H2

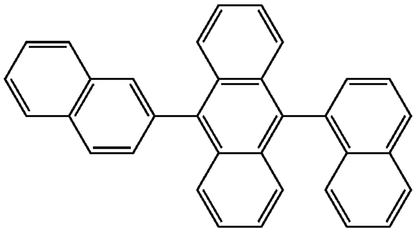

H3

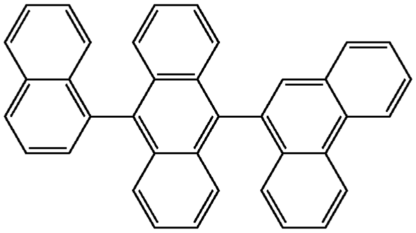

H4

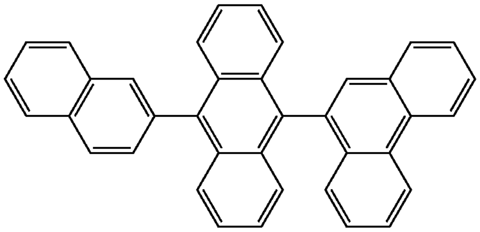

H5

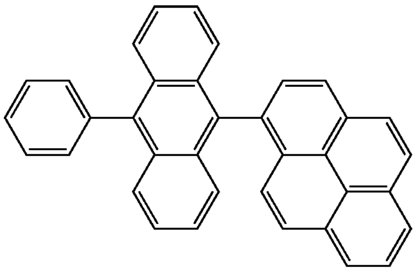

-continued

H6

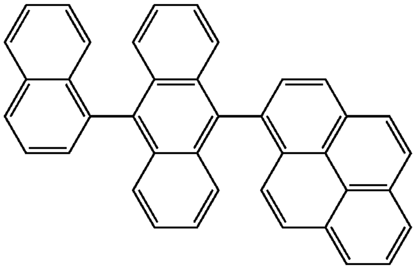

H7

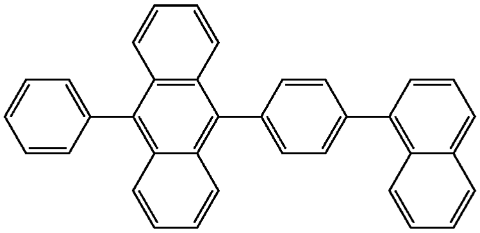

H8

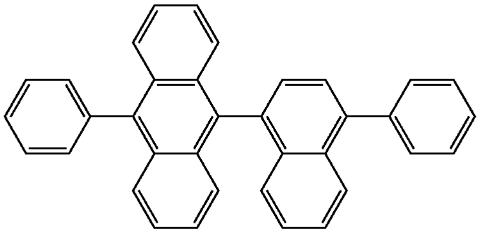

H9

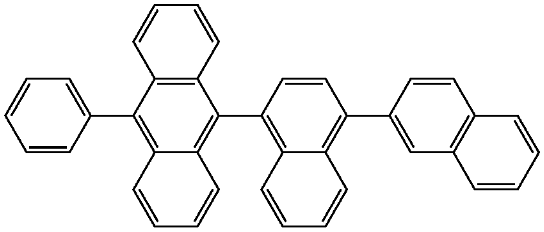

H10

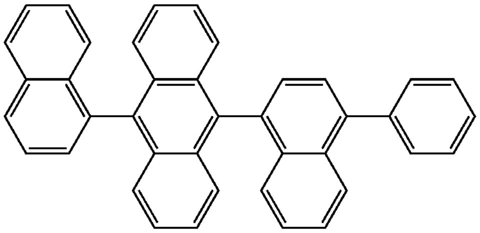

H11

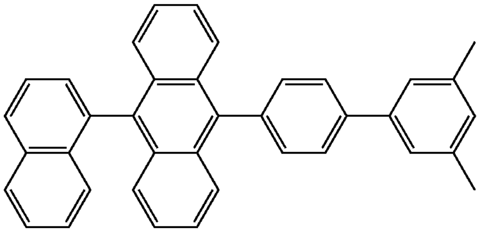

-continued
H12
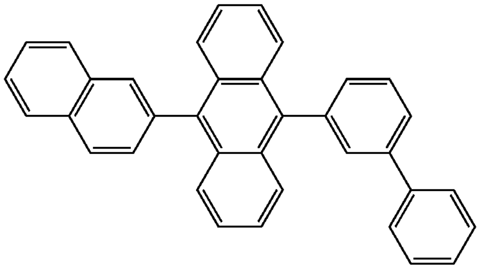
H13
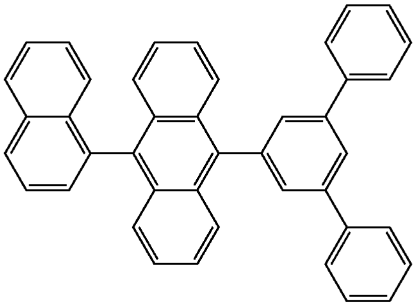
H14
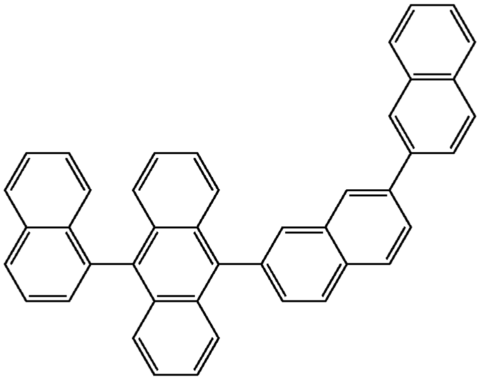
H15
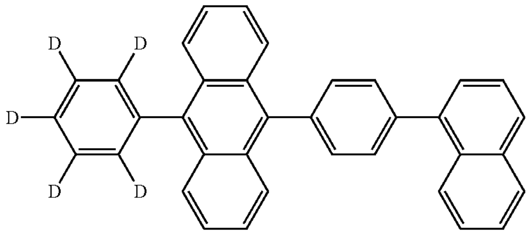
H16
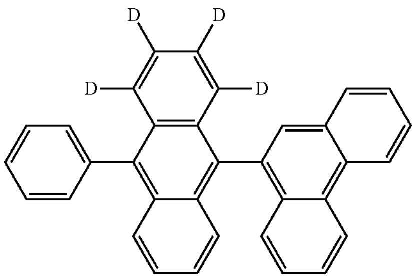
-continued
H17
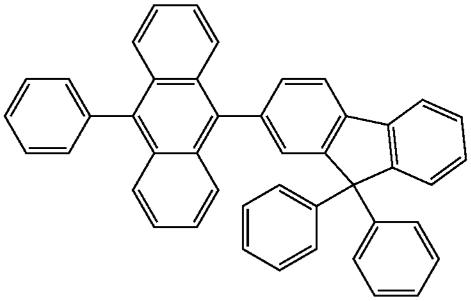
H18
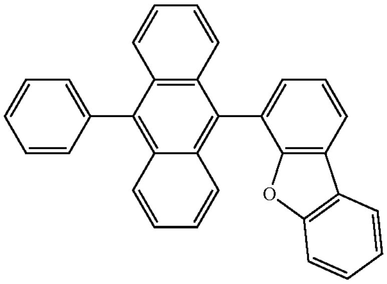
H19
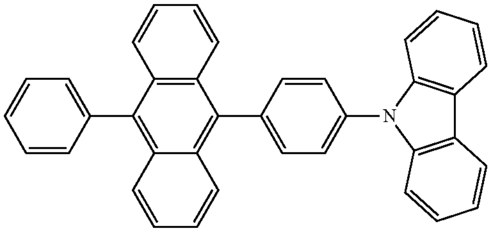
H20
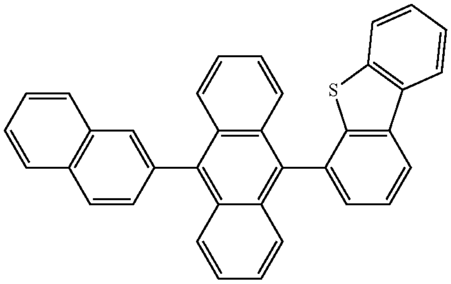
H21
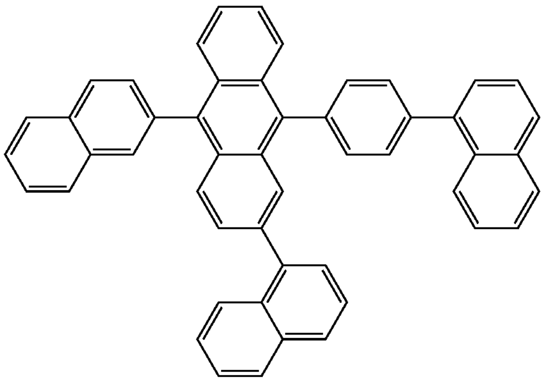

-continued
H22
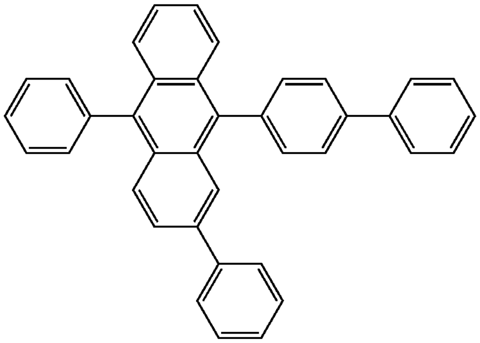
H23
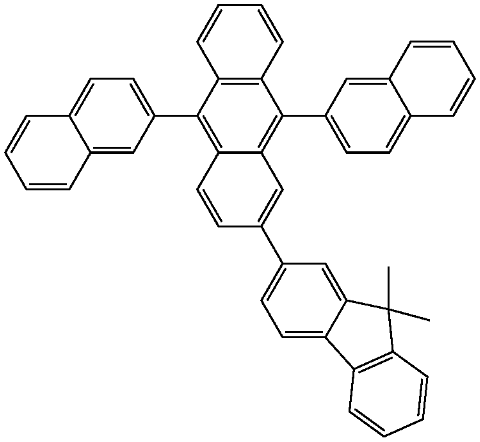
H24
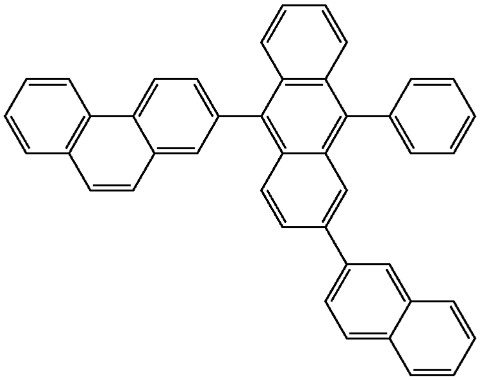
-continued
H25
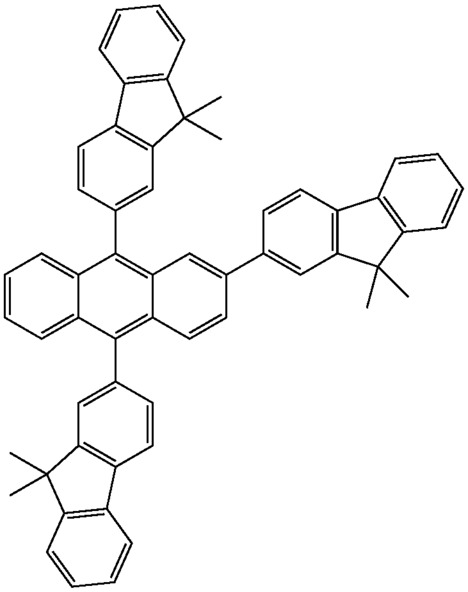
H26
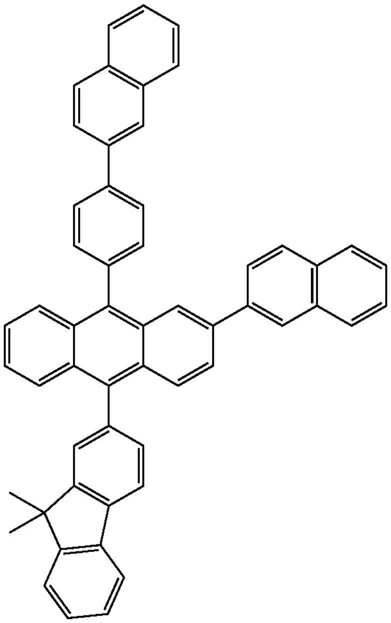

-continued
H27
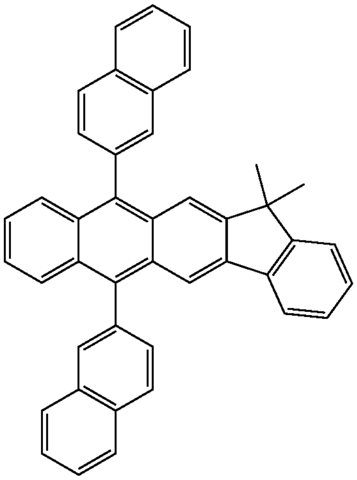
H28
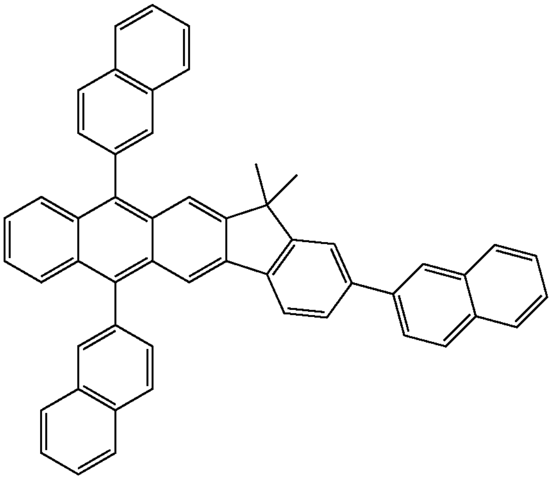
H29
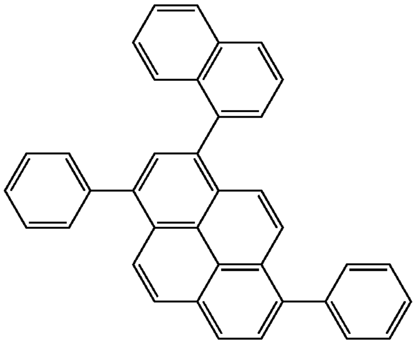
-continued
H30
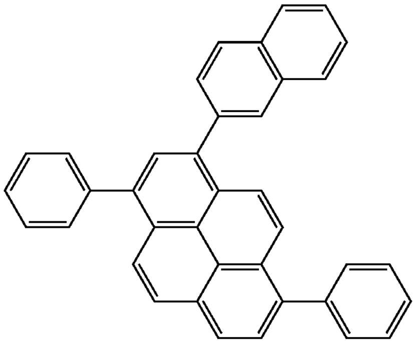
H31
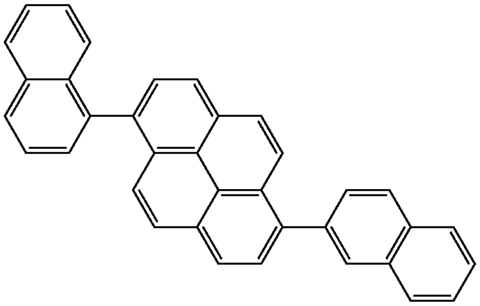
H32
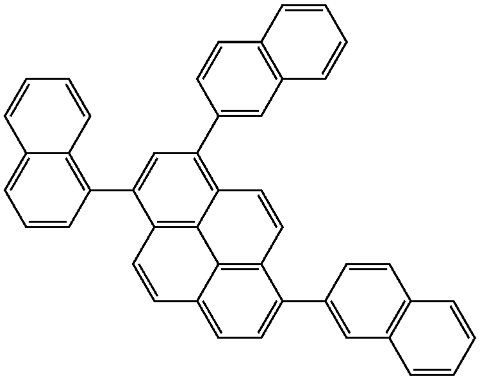
H33
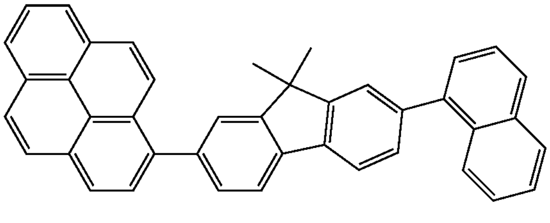
H34
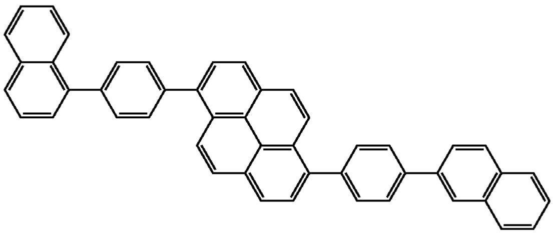

-continued
H35
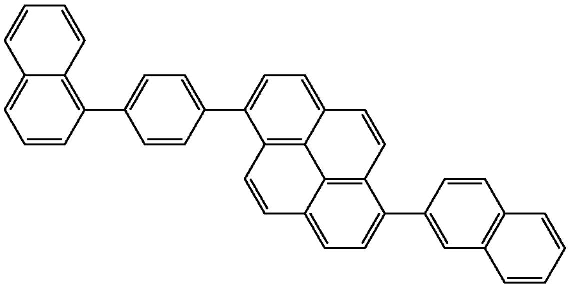
H36
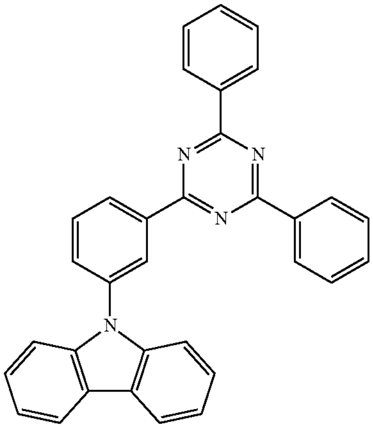
H37
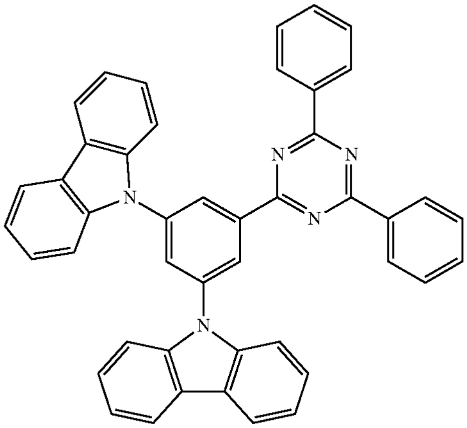
H38
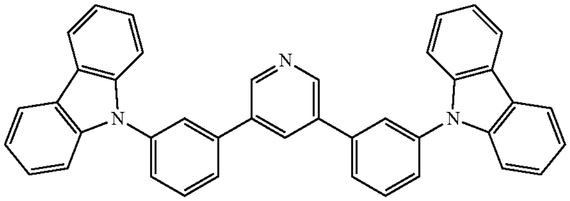
-continued
H39
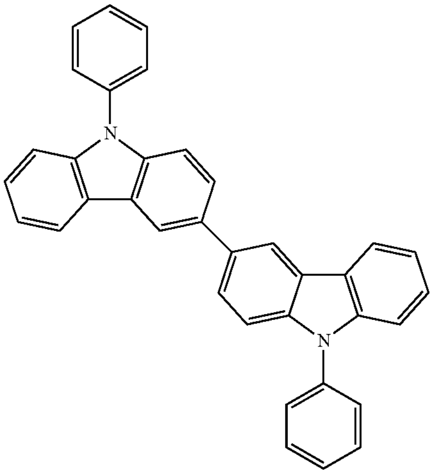
H40
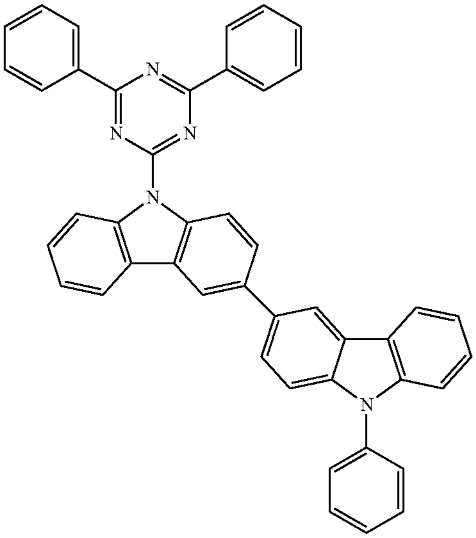
H41
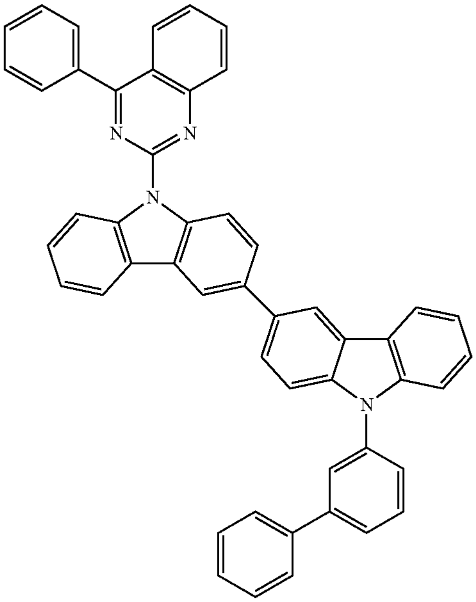

-continued
H42
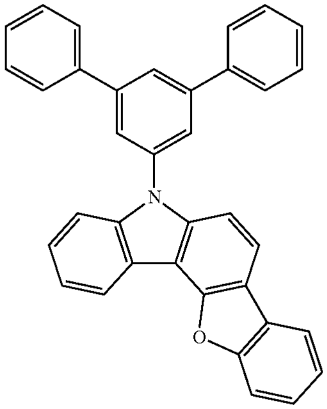
H43
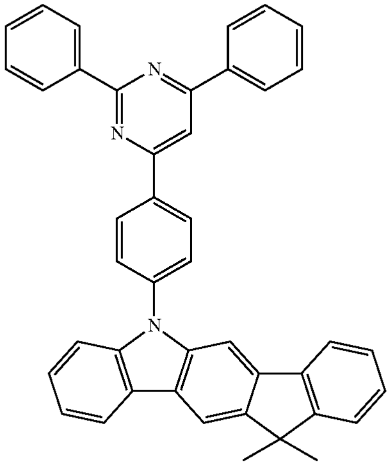
H44
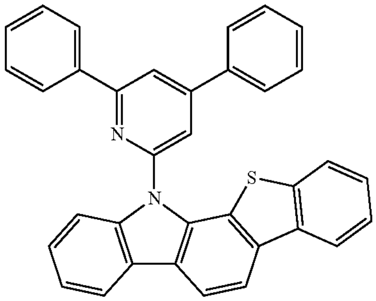
H45
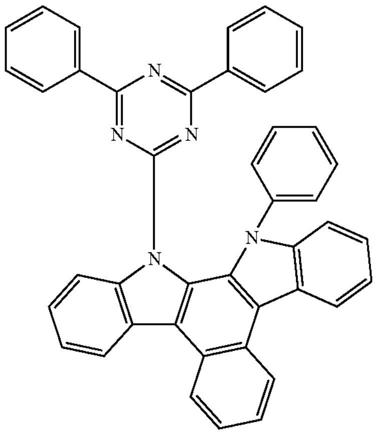
-continued
H46
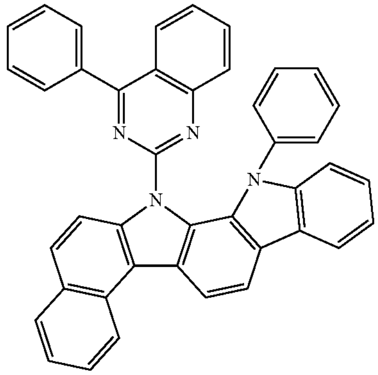
H47
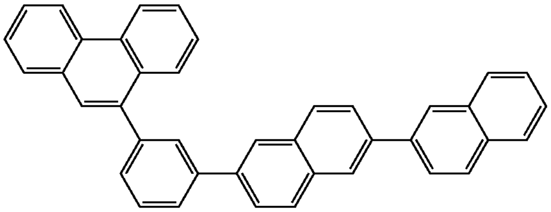
H48
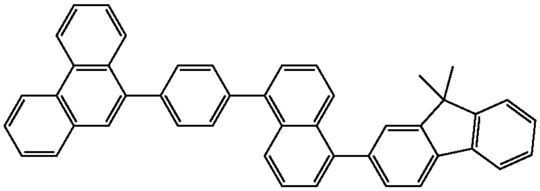
H49
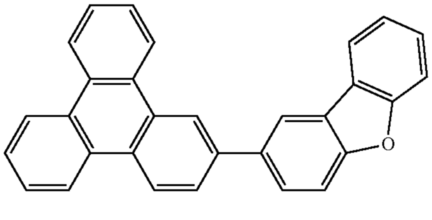
H50
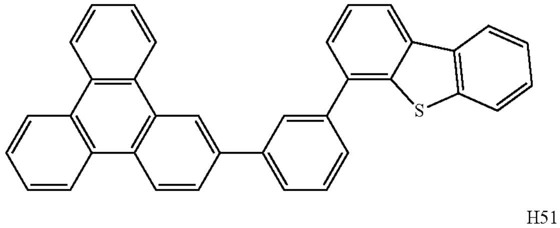
H51
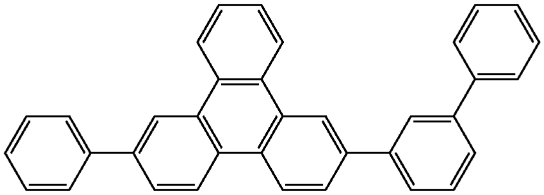

-continued
H52
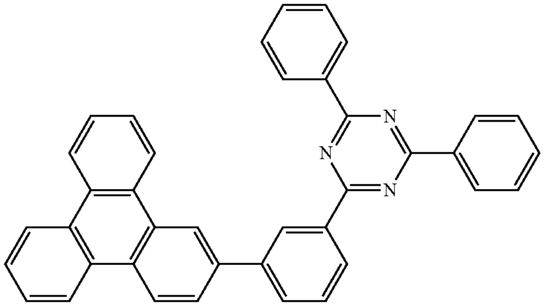
H53
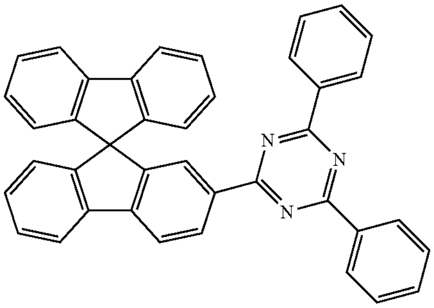
H54
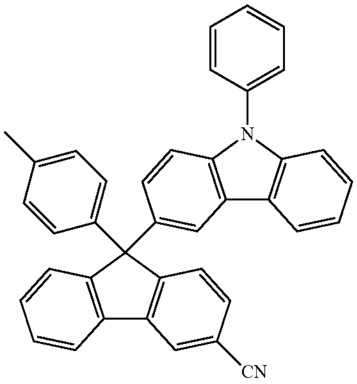
H55
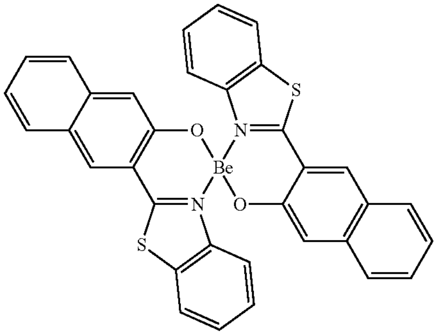
-continued
H56
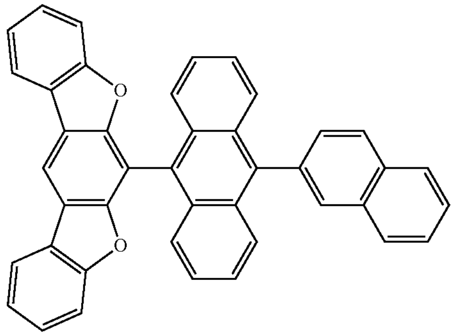
H57
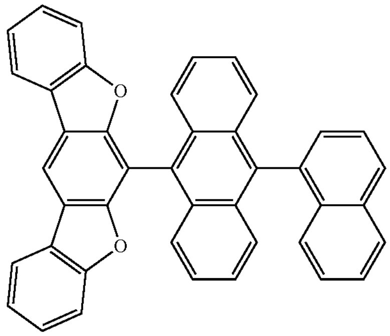
H58
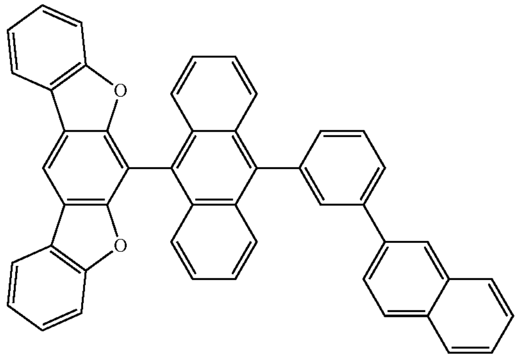
H59
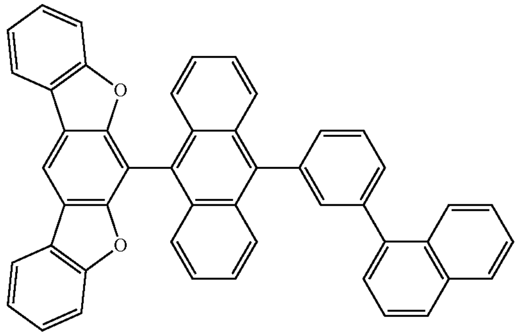

-continued
H60
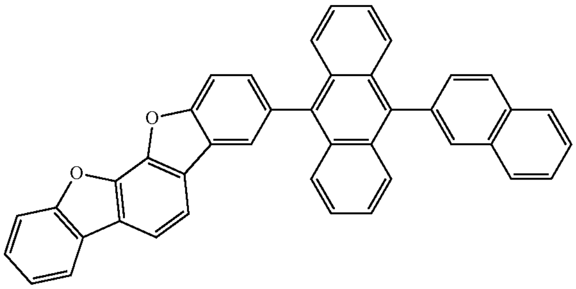
H61
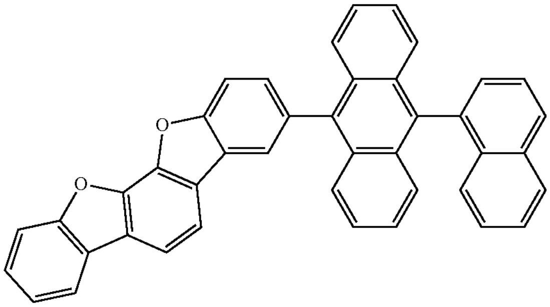
H62
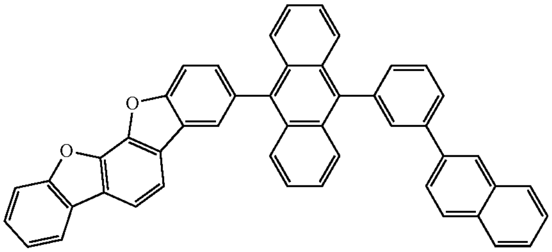
H63
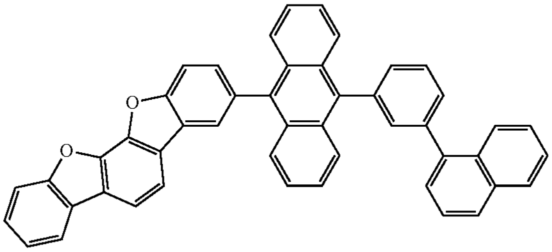
H64
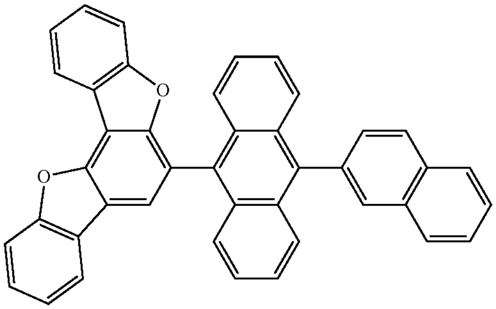
-continued
H65
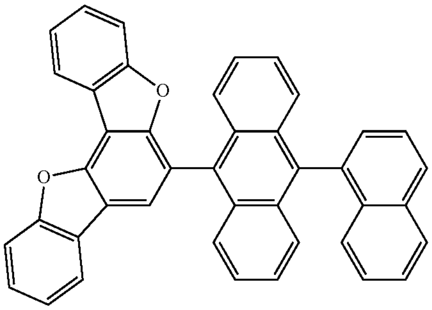
H66
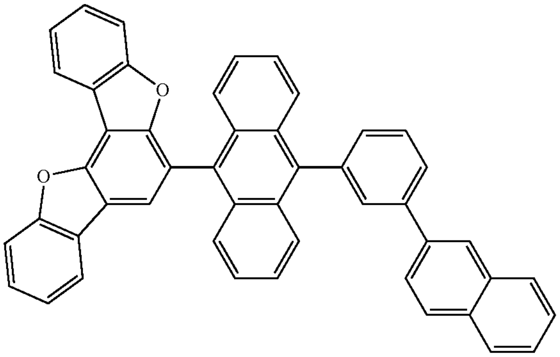
H67
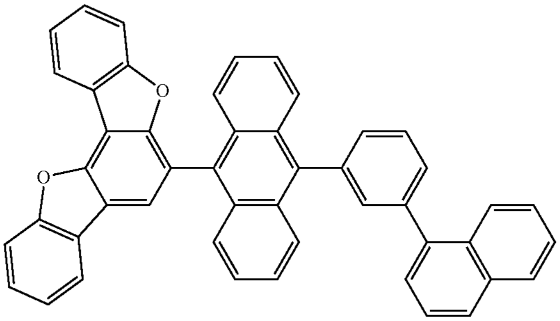
H68
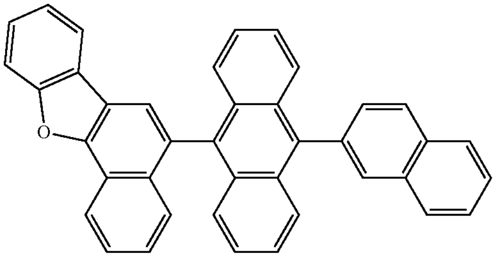
H69
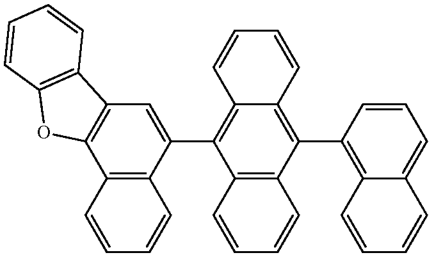

-continued
H70
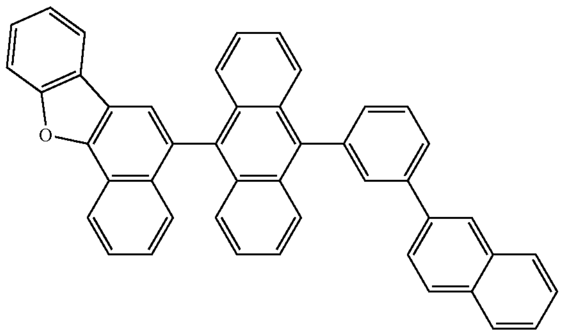
H71
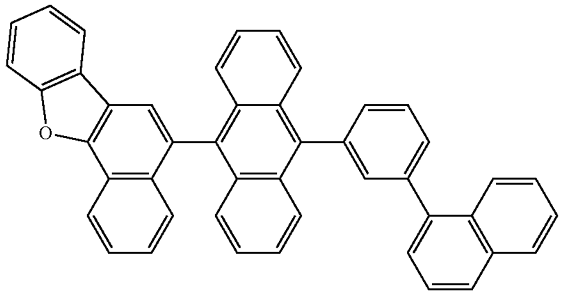
H72
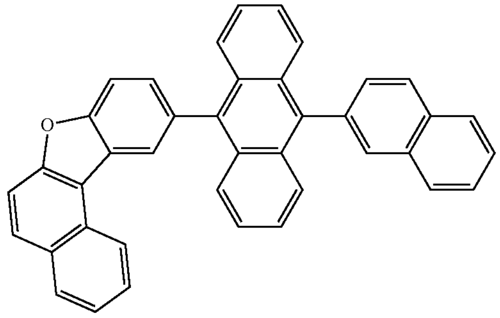
H73
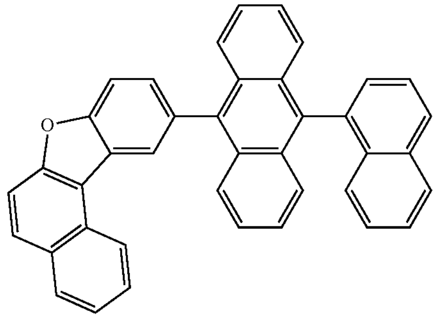
-continued
H74
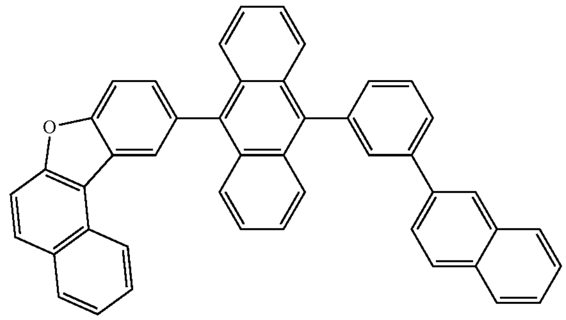
H75
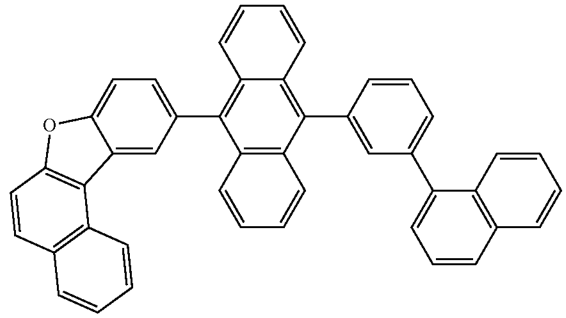
H76
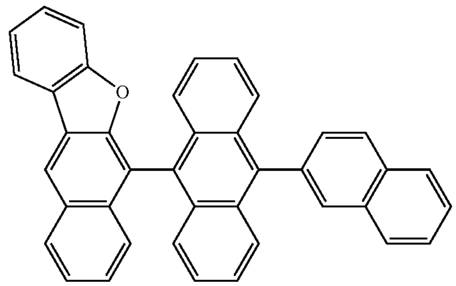
H77
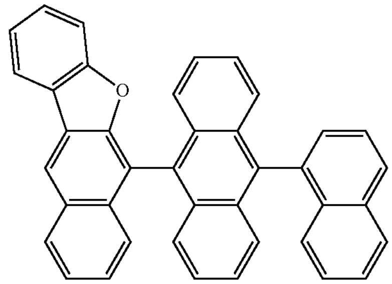
H78
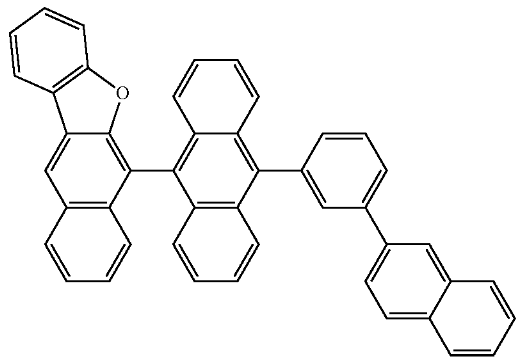

-continued
H79
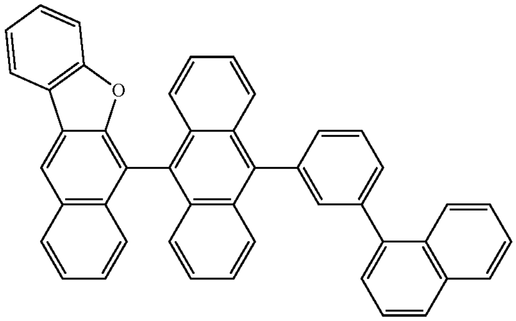
H80
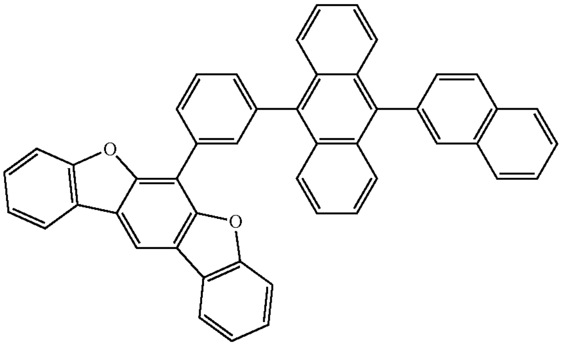
H81
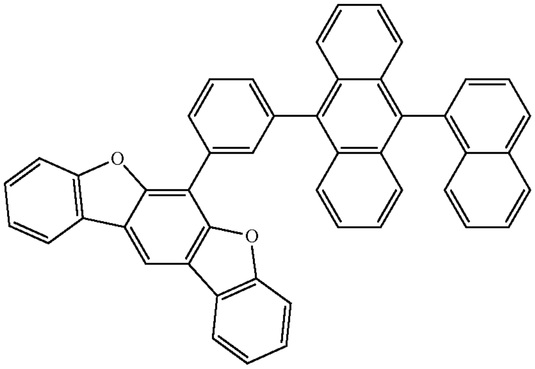
H82
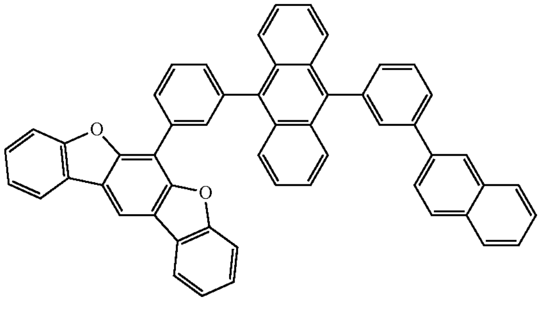
-continued
H83
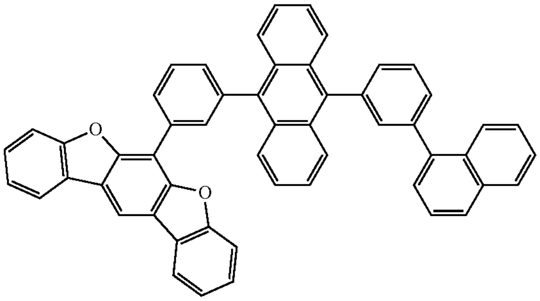
H84
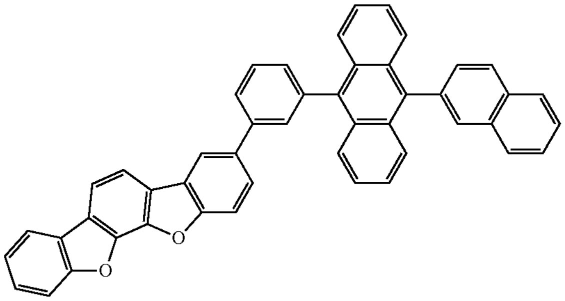
H85
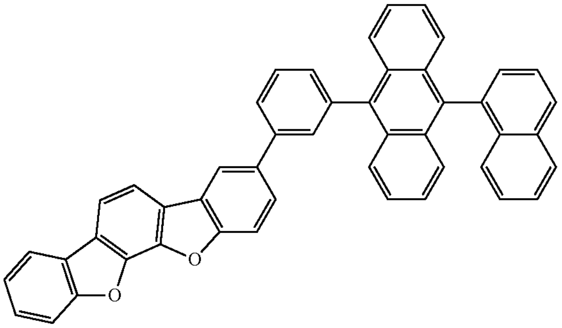
H86
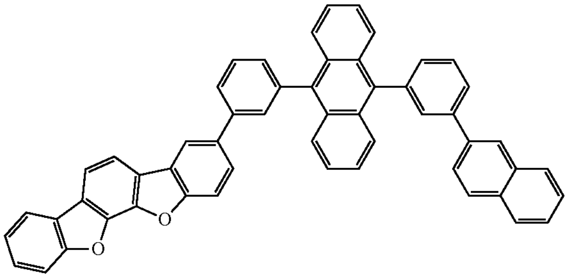
H87
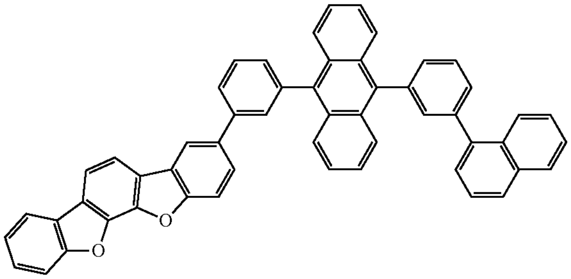

-continued
H88
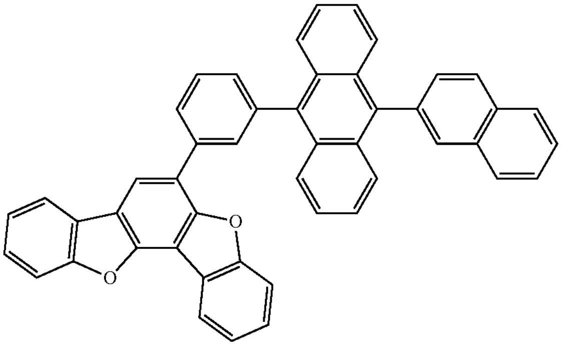
H89
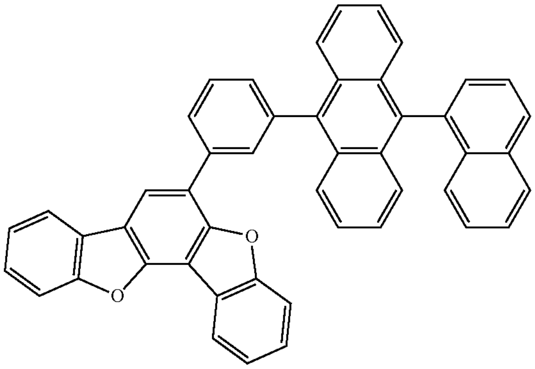
H90
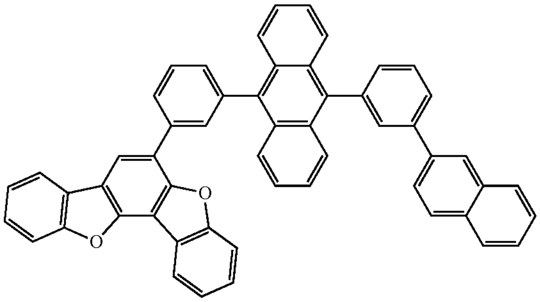
H91
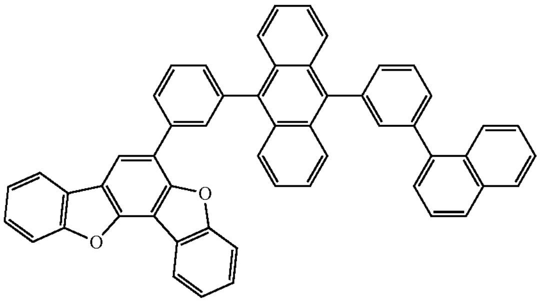
-continued
H92
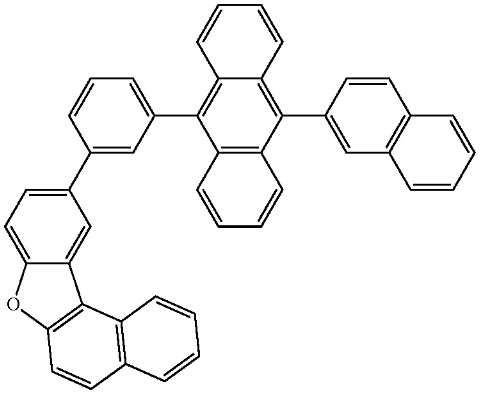
H93
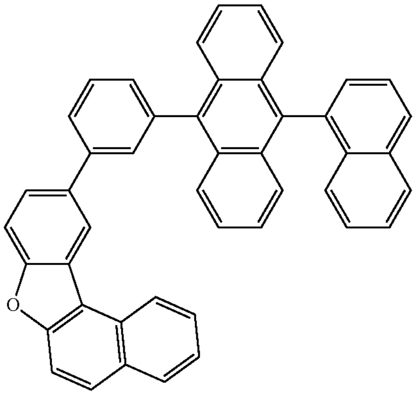
H94
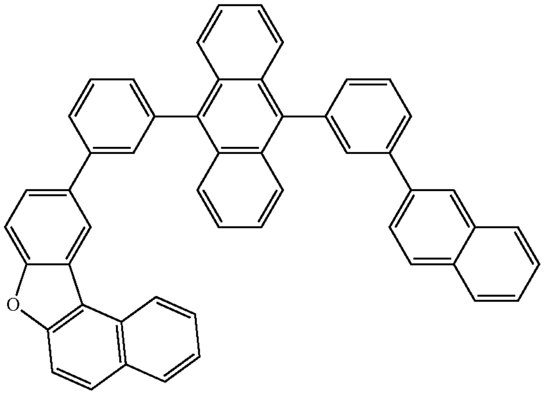
H95
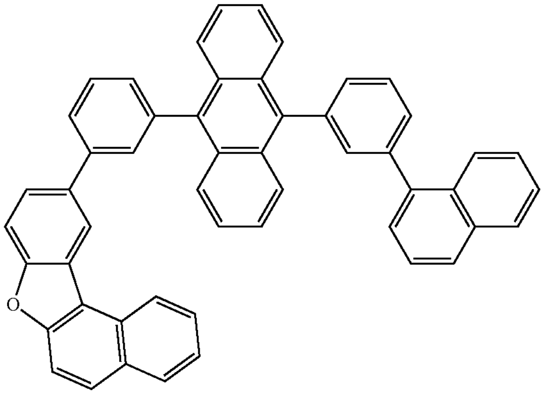

-continued
H96
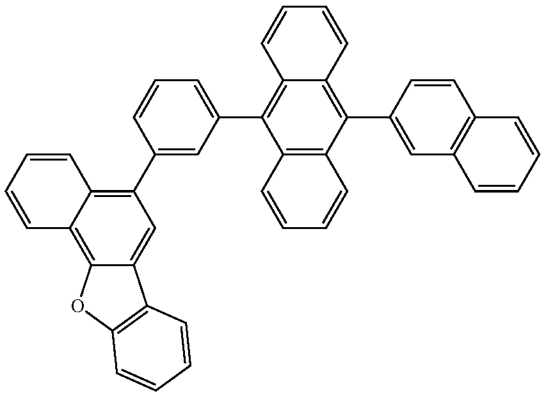
H97
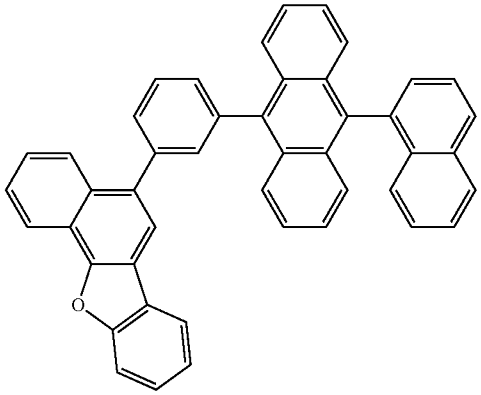
H98
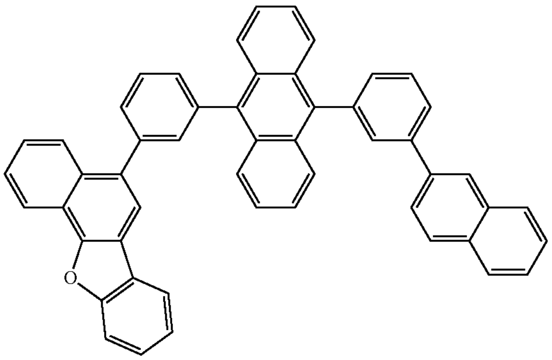
H99
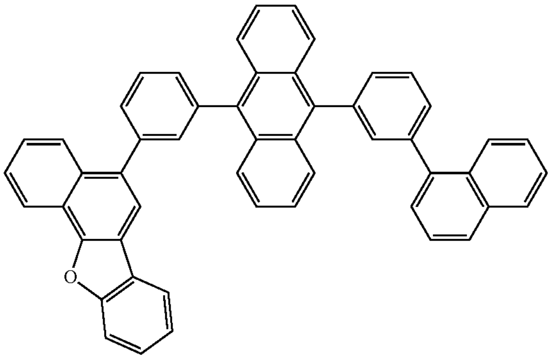
-continued
H100
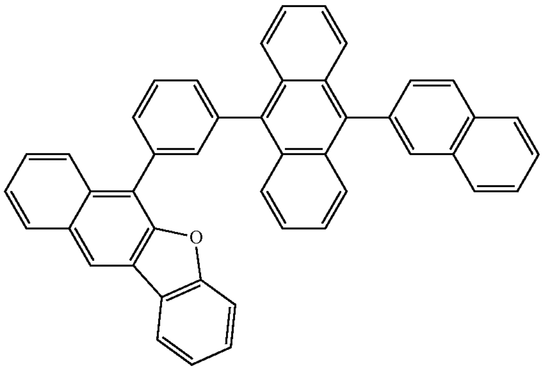
H101
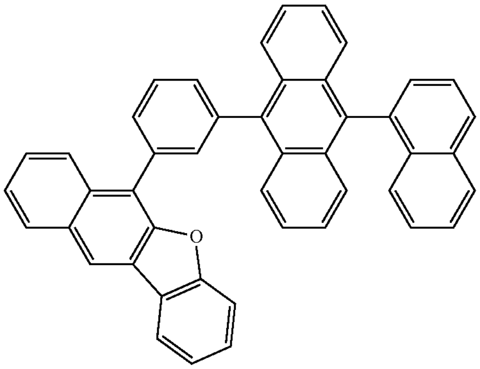
H102
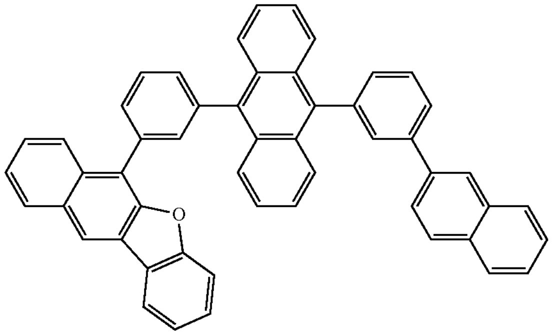
H103
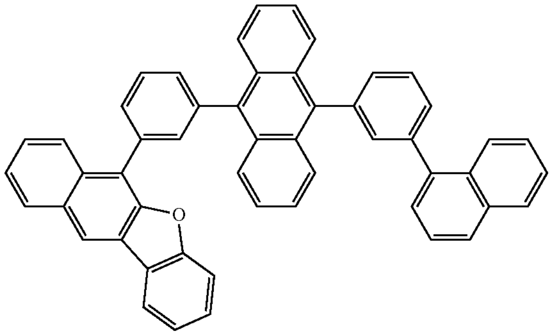

-continued
H104
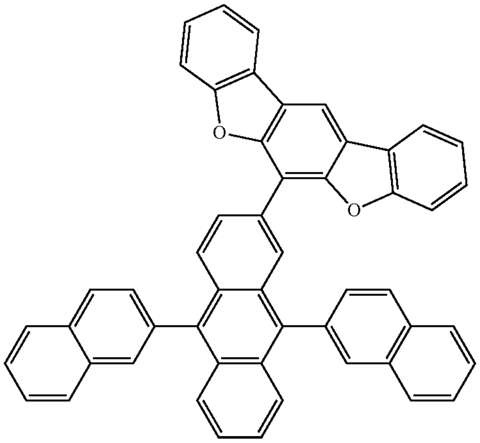
H105
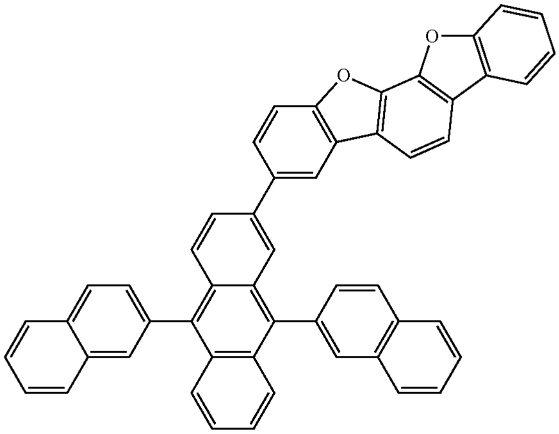
H106
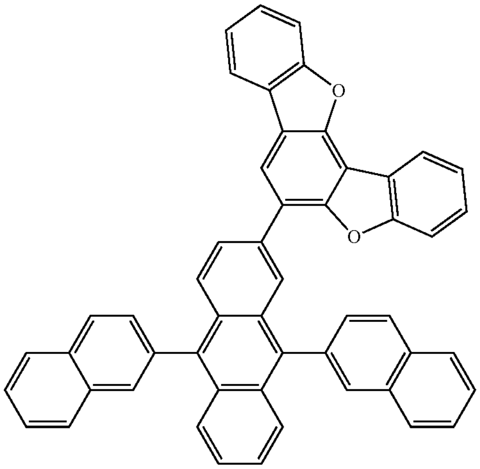
-continued
H107
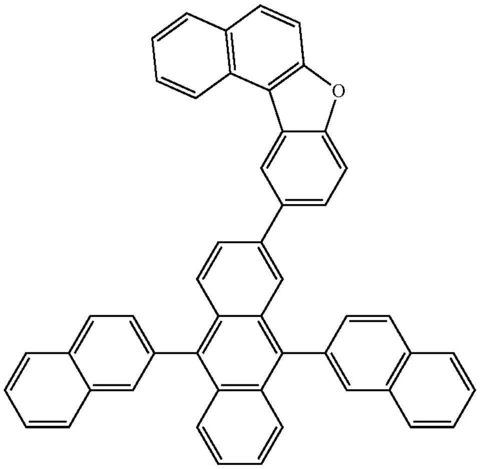
H108
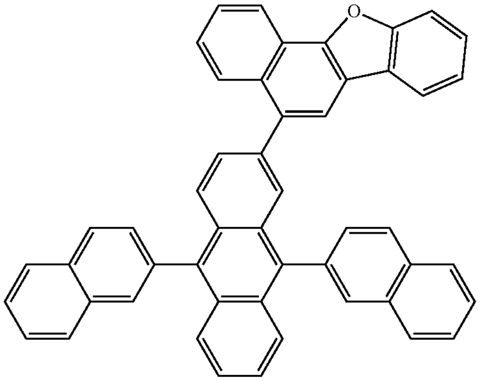
H109
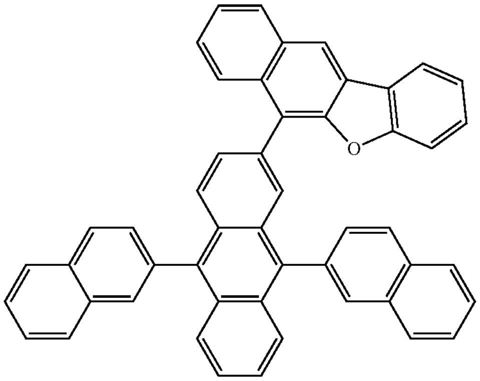
H110
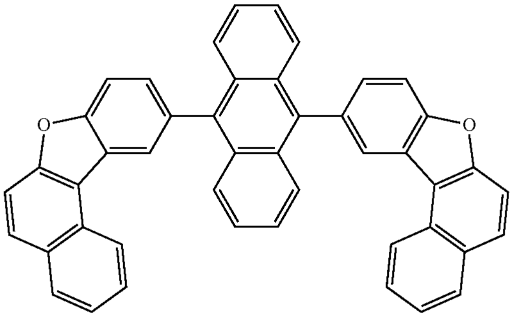

-continued
H111
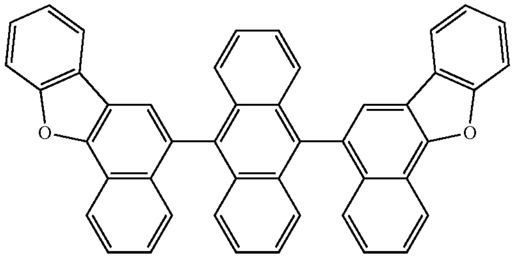
H112
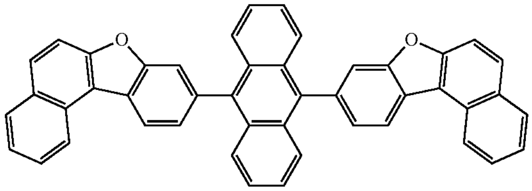
H113
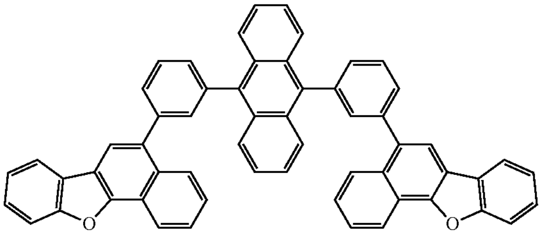
H114
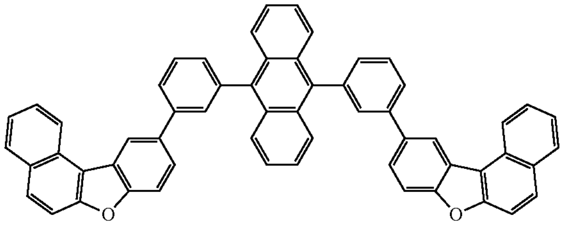
H115
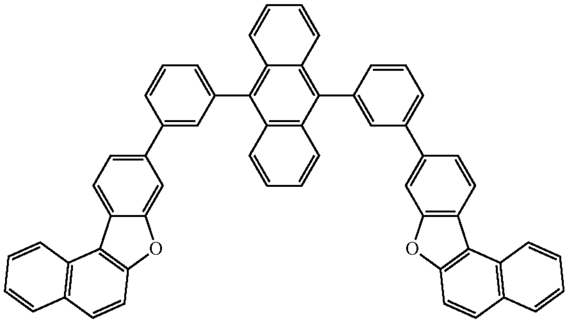
-continued
H116
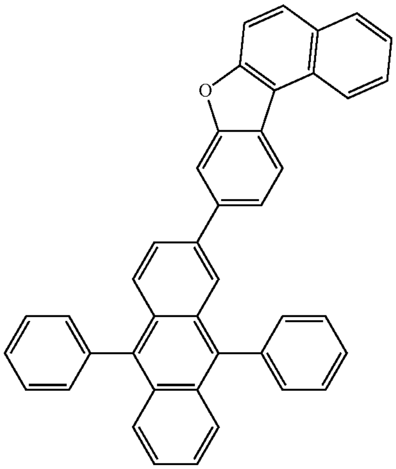
H117
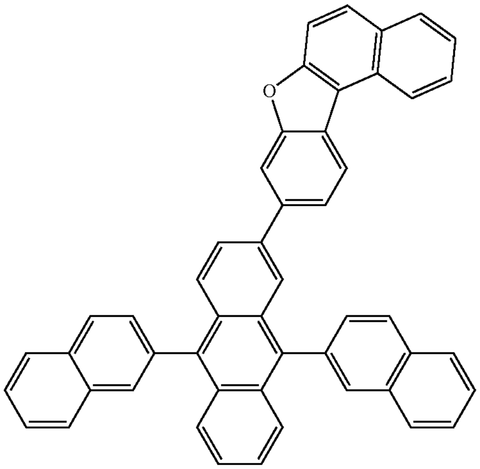
H118
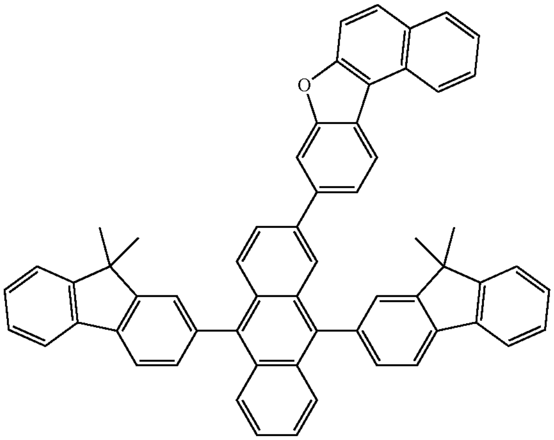

-continued

H119

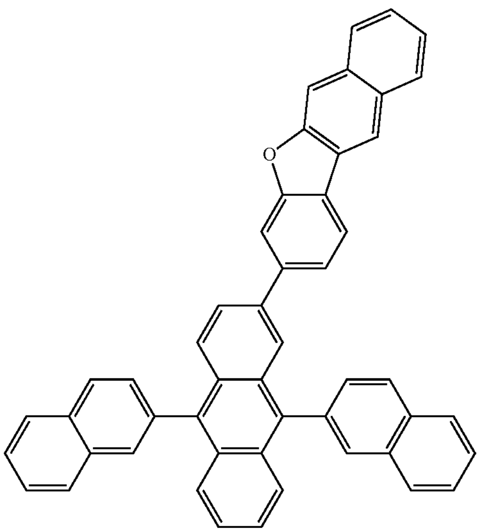

H120

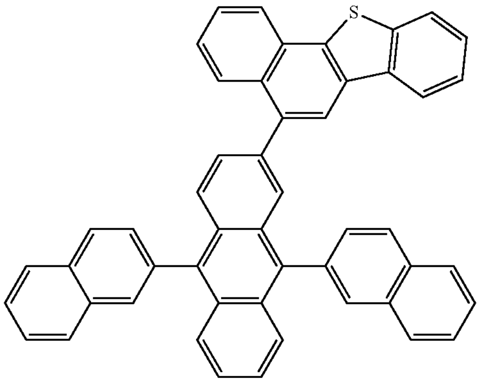

H121

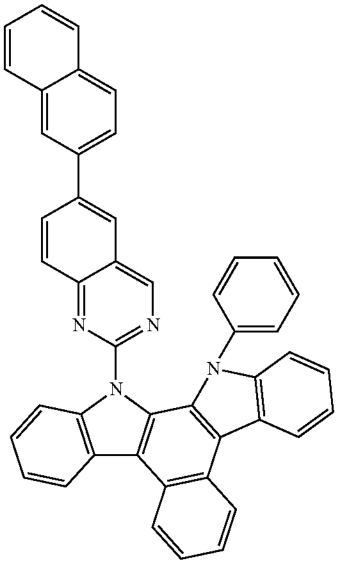

-continued

H122

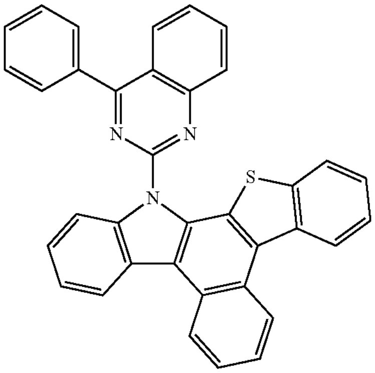

H123

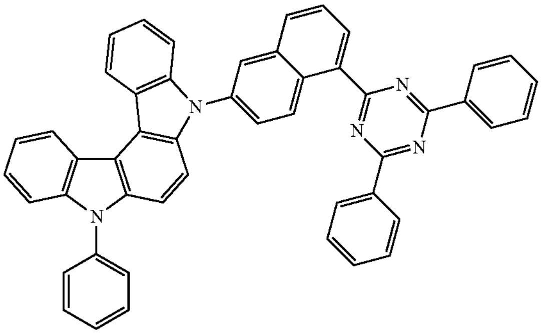

H124

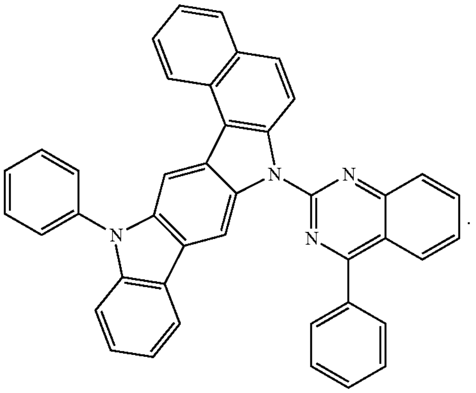

[Phosphorescent Dopant]

The phosphorescent dopant may include the organometallic compound represented by Formula 1.

In embodiments, the phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic complex represented by Formula 401:

[Formula 401]

$M(L_{401})_{xc1}(L_{402})_{xc2}$

[Formula 402]

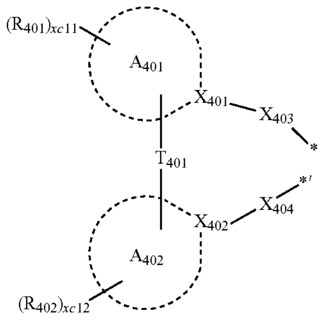

In Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen (N) or carbon (C), ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*, *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), and * and *' each indicate a binding site to a neighboring atom, $Q_{411}$ to $Q_{414}$ may each independently be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), and $R_{10a}$ may be understood by referring to the description of $R_{10a}$ provided herein, $Q_{401}$ to $Q_{403}$ may each independently be understood by referring to the description of $Q_1$ provided herein, xc11 and xc12 may each independently be an integer from 0 to 10, and

* and *' in Formula 402 each indicate a binding site to M in Formula 401.

In embodiments, in Formula 402, $X_{401}$ may be nitrogen and $X_{402}$ may be carbon, or $X_{401}$ and $X_{402}$ may both be nitrogen.

In embodiments, when xc1 in Formula 401 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each independently be understood by referring to the description of $T_{401}$ provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to PD25 or any combination thereof:

PD1

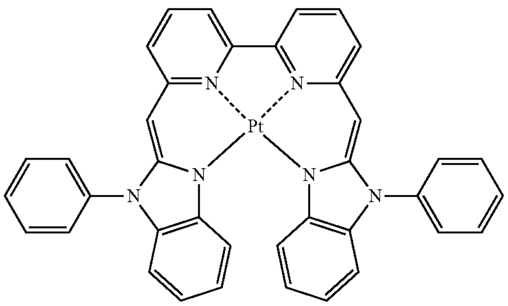

PD2

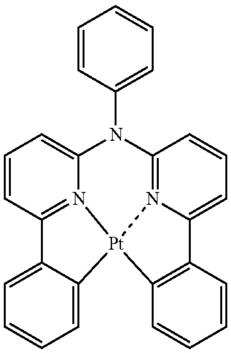

PD3

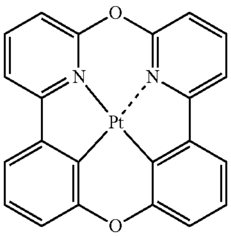

-continued
PD4
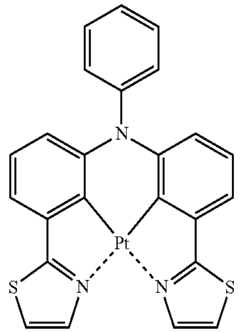
PD5
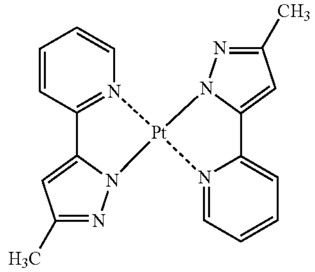
PD6
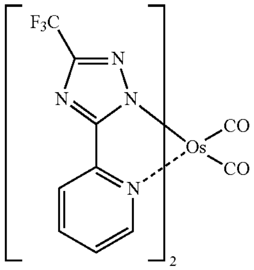
PD7
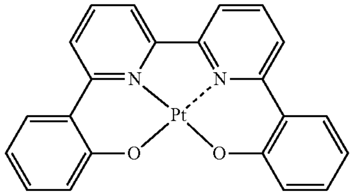
PD8
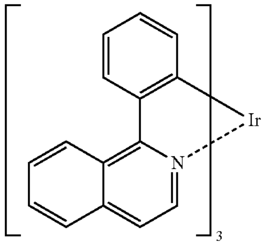
PD9
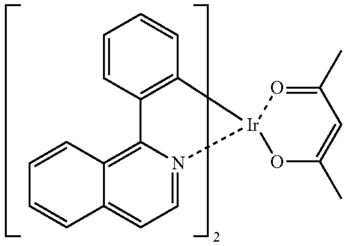
-continued
PD10
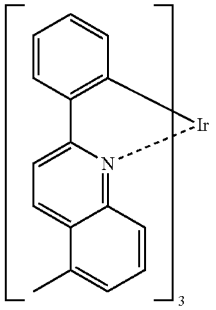
PD11
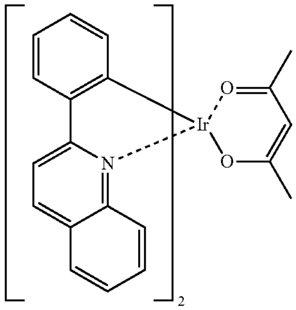
PD12
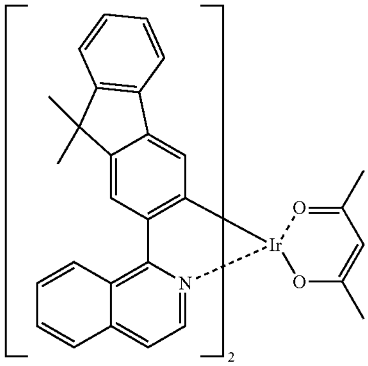
PD13
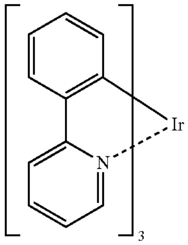
PD14
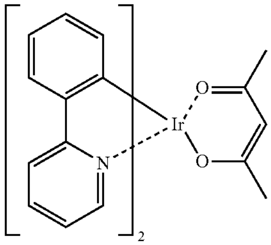

-continued
PD15
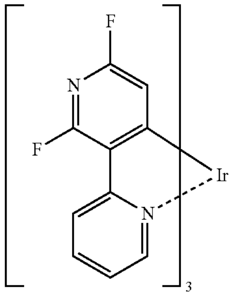
PD16
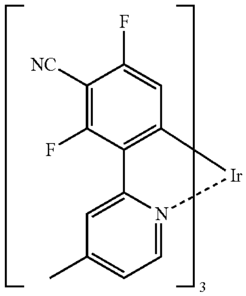
PD17
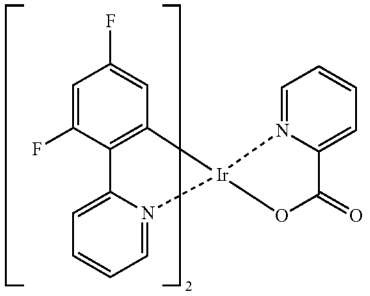
PD18
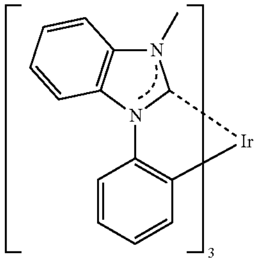
PD19
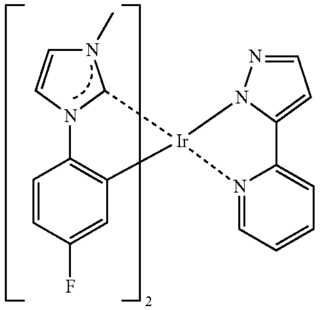
-continued
PD20
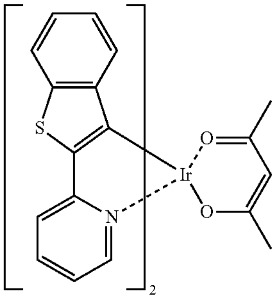
PD21
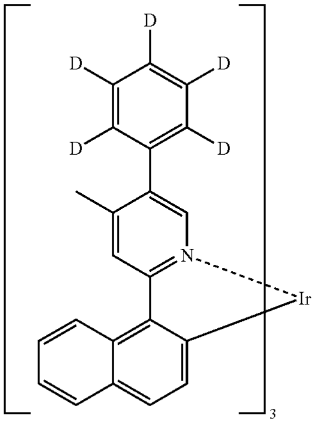
PD22
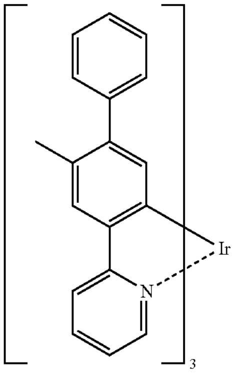
PD23
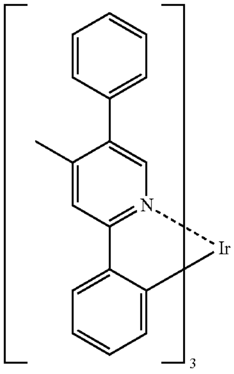

-continued

PD24

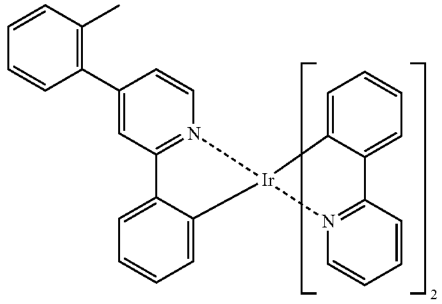

PD25

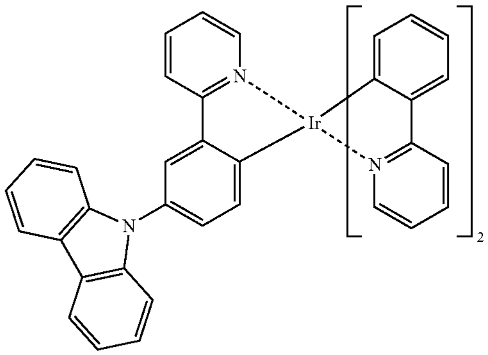

.

[Fluorescent Dopant]

The fluorescent dopant may include an amine group-containing compound, a styryl group-containing compound, or any combination thereof.

In embodiments, the fluorescent dopant may include a compound represented by Formula 501:

[Formula 501]

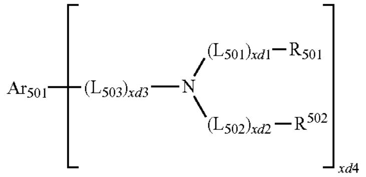

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In embodiments, in Formula 501, $Ar_{501}$ may include a condensed ring group (e.g., an anthracene group, a chrysene group, or a pyrene group) in which at least three monocyclic groups are condensed.

In embodiments, xd4 in Formula 501 may be 2.

In embodiments, the fluorescent dopant may include one of Compounds FD1 to FD36, DPVBi, DPAVBi, or any combination thereof:

FD1

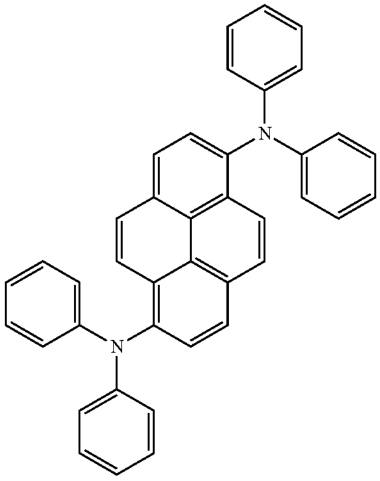

FD2

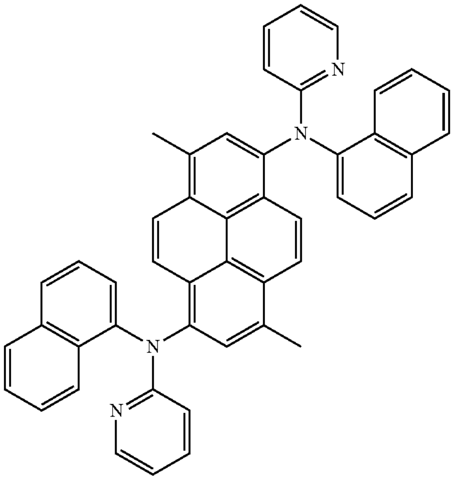

-continued
FD3
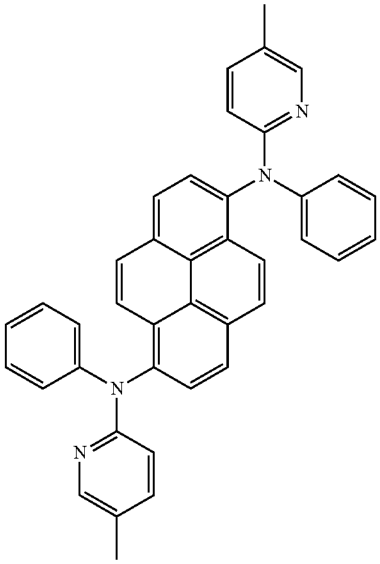
FD4
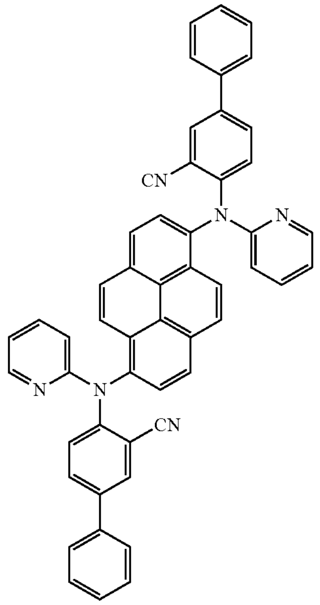
FD5
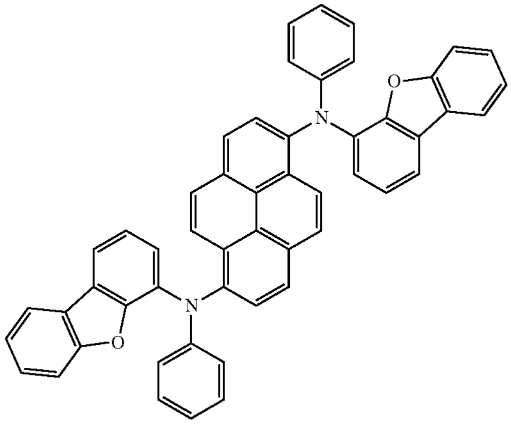
FD6
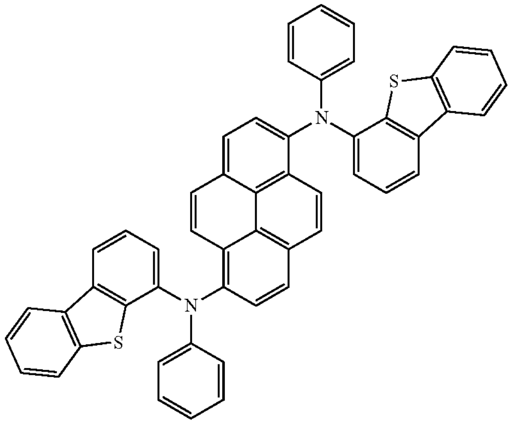
FD7
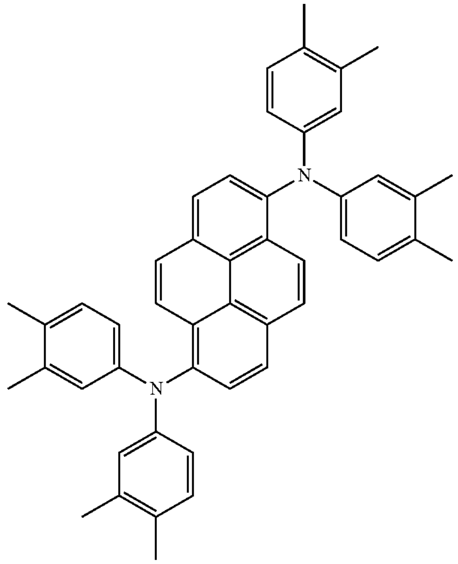
FD8
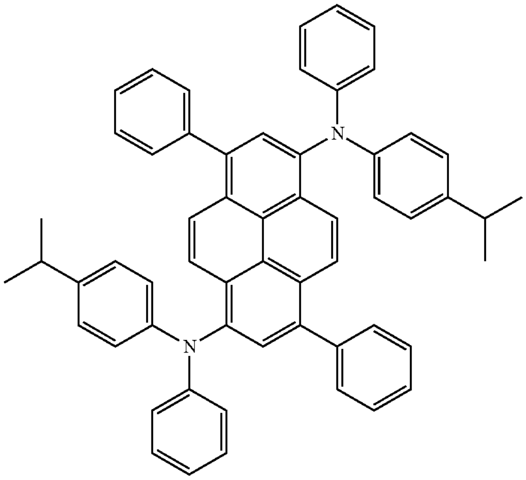

-continued
FD9
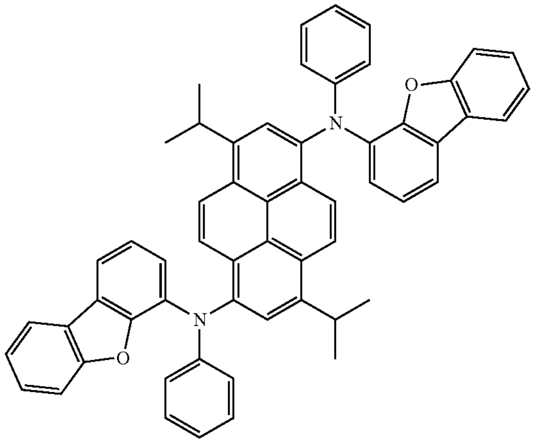
FD10
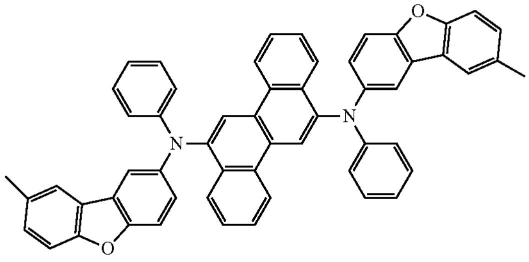
FD11
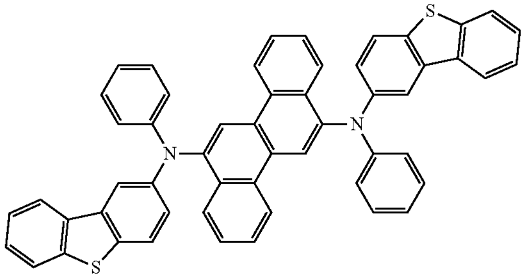
FD12
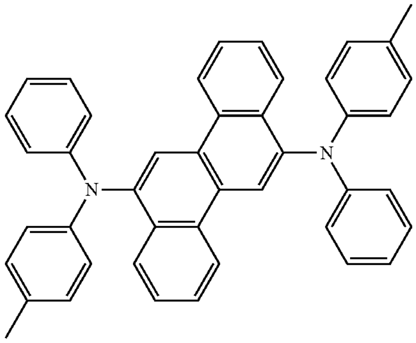
FD13
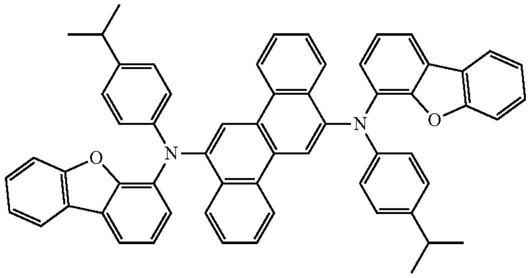
FD14
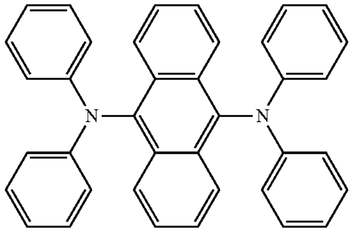
FD15
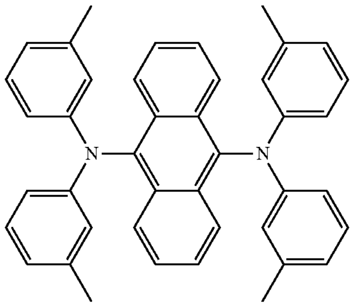
FD16
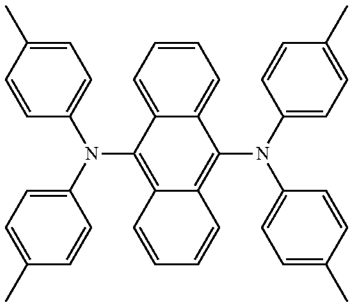

-continued
FD17
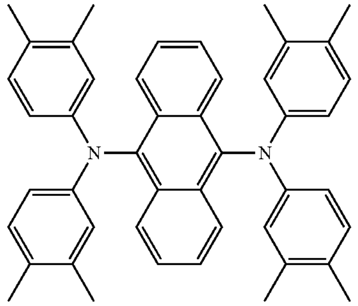
FD18
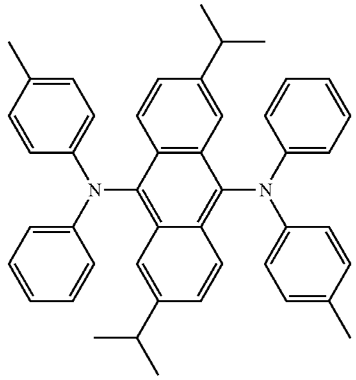
FD19
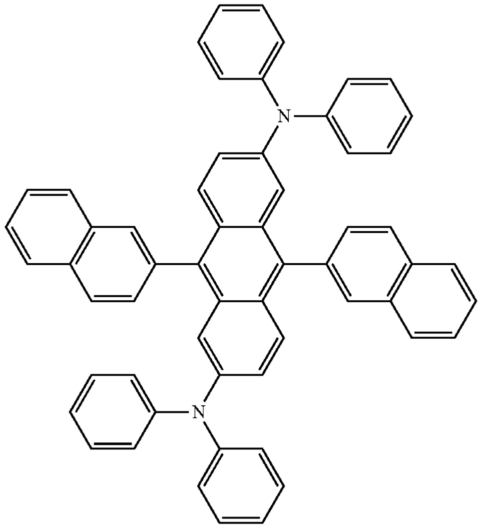
FD20
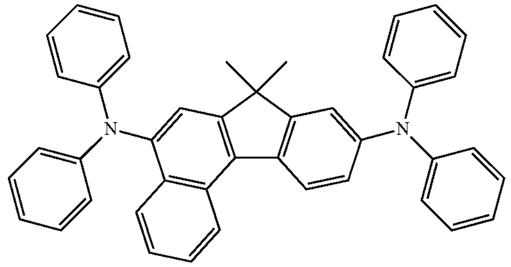
FD21
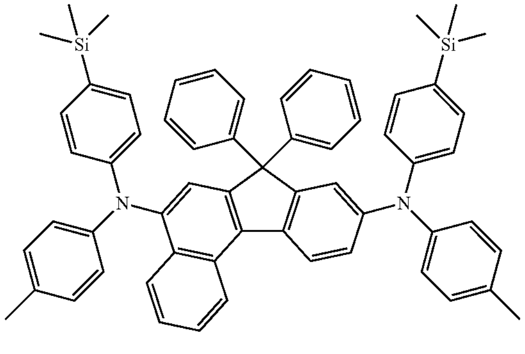
FD22
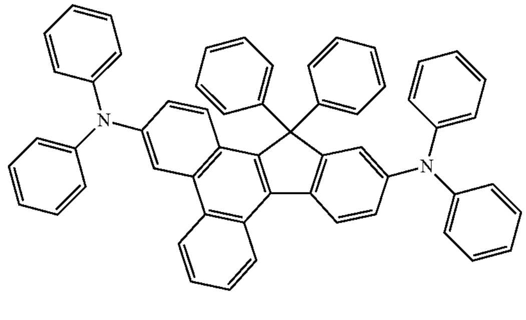
FD23
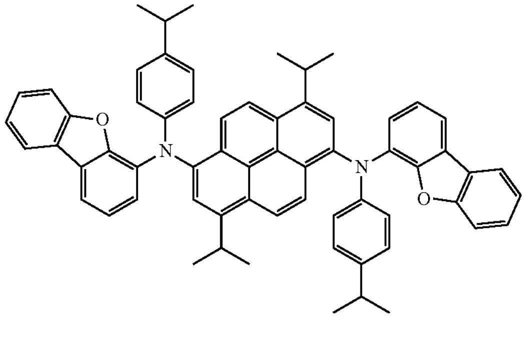
FD24
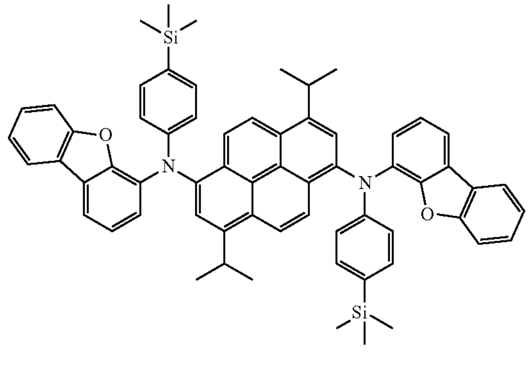

-continued
FD25
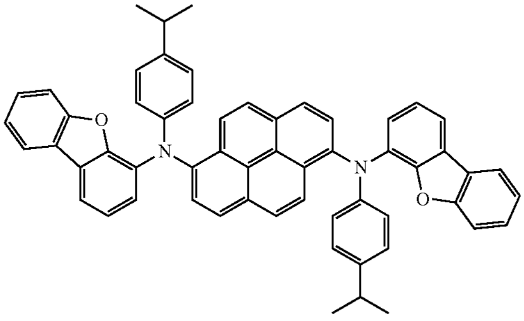
FD26
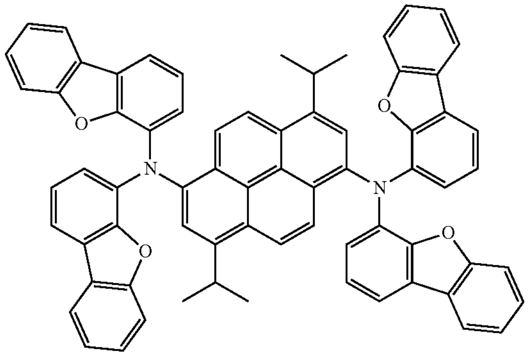
FD27
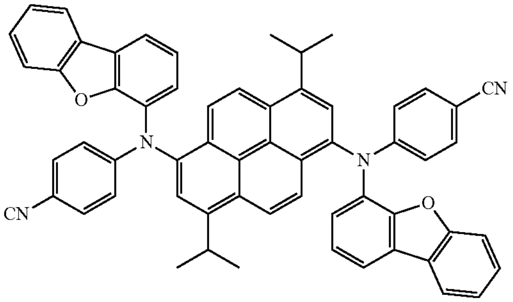
FD28
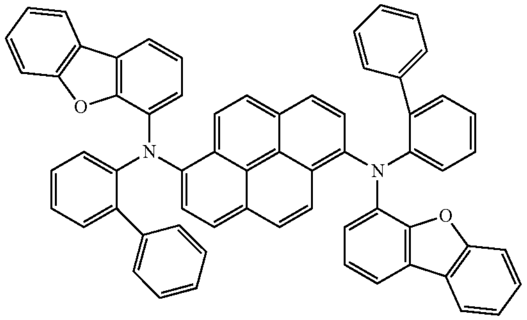
FD29
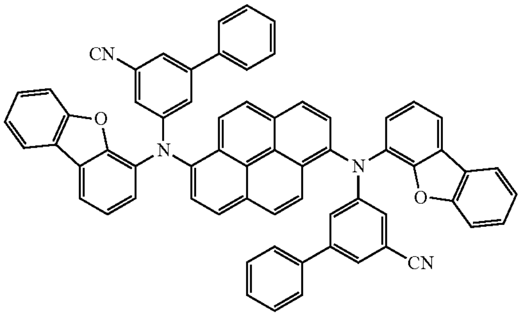
FD30
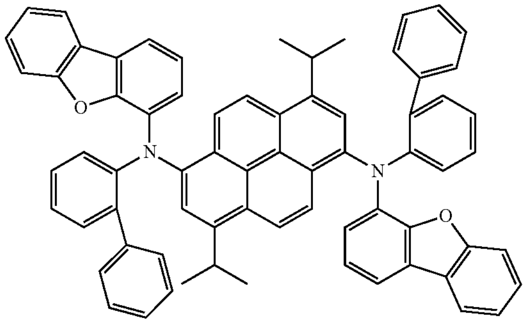
FD31
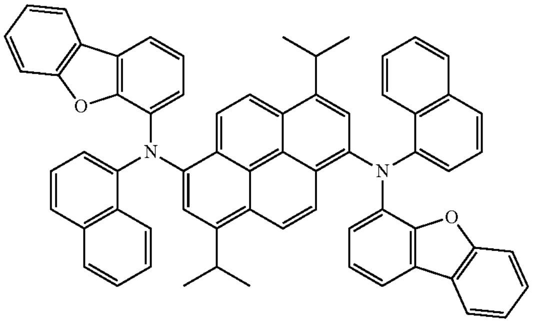
FD32
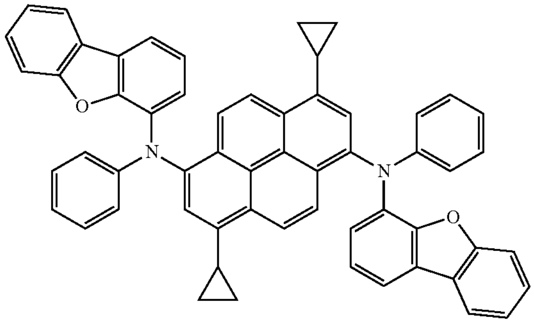

-continued

FD33

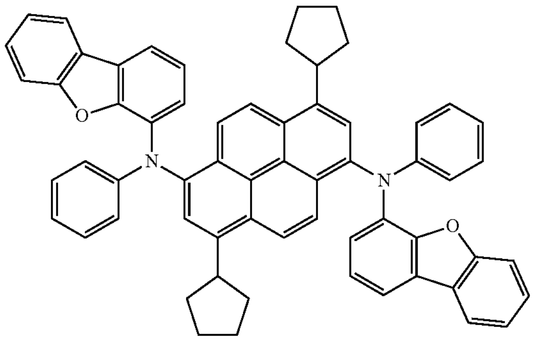

FD34

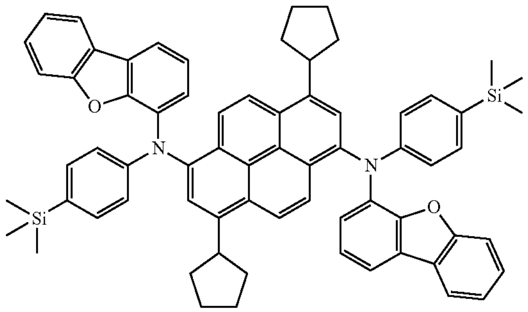

FD35

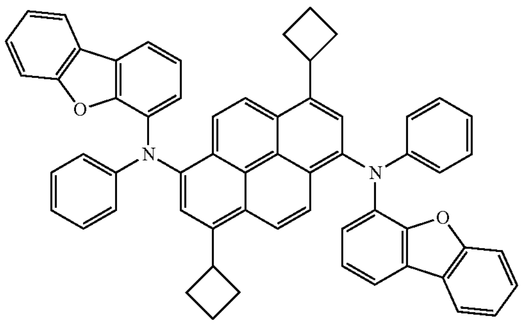

FD36

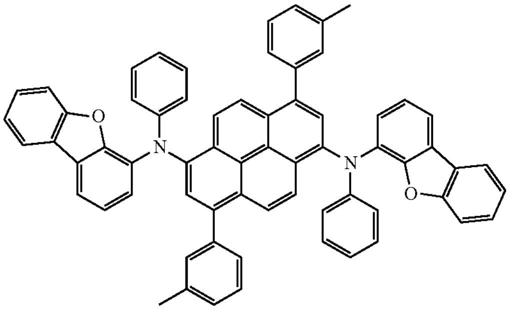

DPVBi

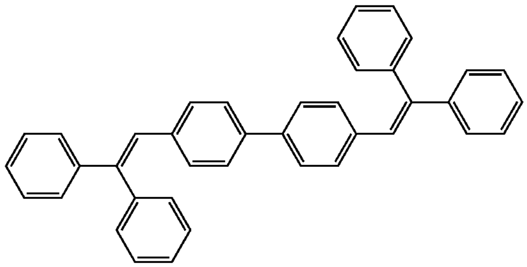

DPAVBi

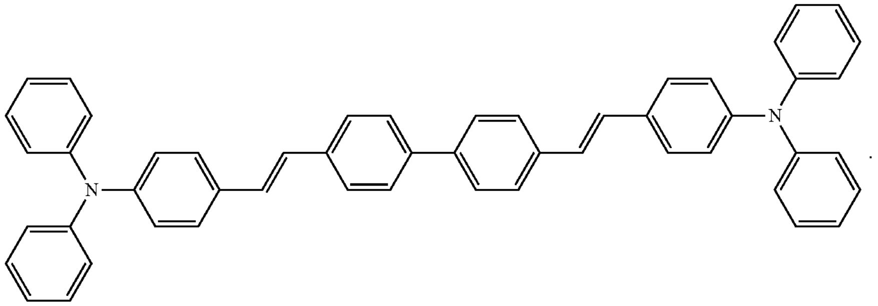

[Delayed Fluorescence Material]

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or a dopant, depending on types of other materials included in the emission layer.

In embodiments, a difference between a triplet energy level in electron volts (eV) of the delayed fluorescence material and a singlet energy level in electron volts (eV) of the delayed fluorescence material may be in a range of about 0 eV to about 0.5 eV. When the difference between a triplet energy level in electron volts (eV) of the delayed fluorescence material and a singlet energy level in electron volts (eV) of the delayed fluorescence material is within this range, up-conversion from a triplet state to a singlet state in the delayed fluorescence material may effectively occur, thus improving luminescence efficiency and the like of the light-emitting device 10.

In embodiments, the delayed fluorescence material may include: a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like), a material including a $C_8$-$C_{60}$ polycyclic group including at least two cyclic groups condensed to each other and sharing boron (B), and the like.

Examples of the delayed fluorescence material may include at least one of Compounds DF1 to DF9:

DF1

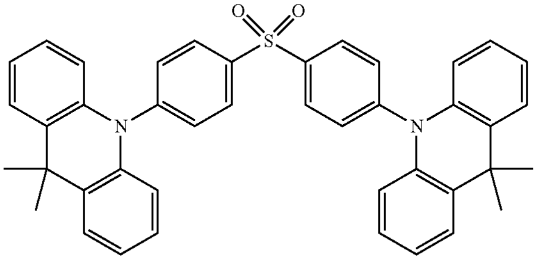

(DMAC-DPS)

DF2

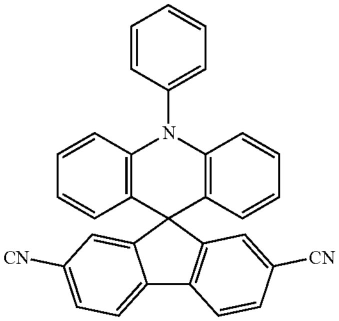

(ACRFLCN)

DF3

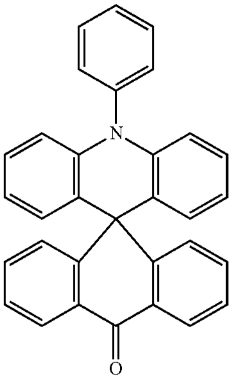

(ACRSA)

-continued

DF4

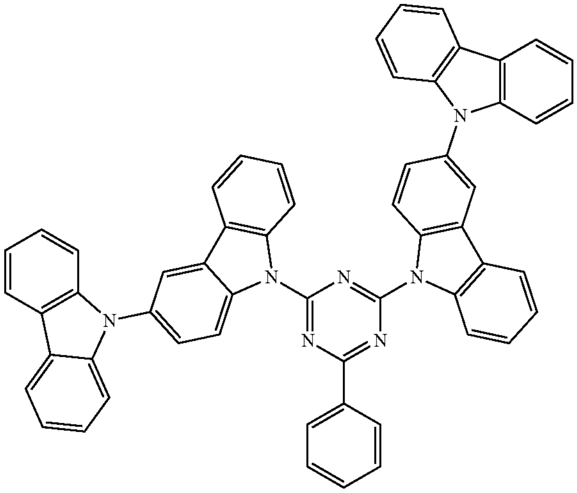

(CC2TA)

DF5

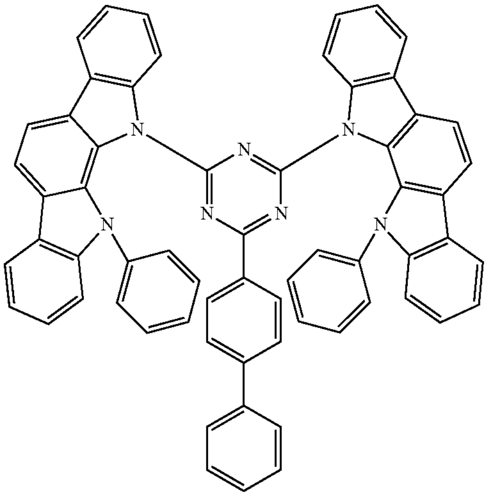

(PIC-TRZ)

DF6

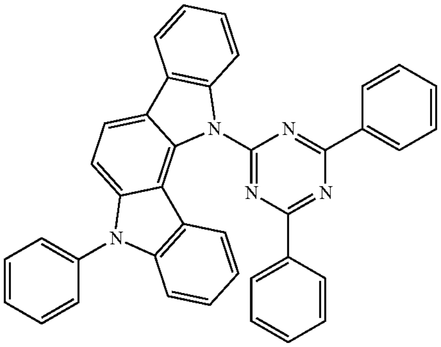

(PIC-TRZ2)

-continued

DF7

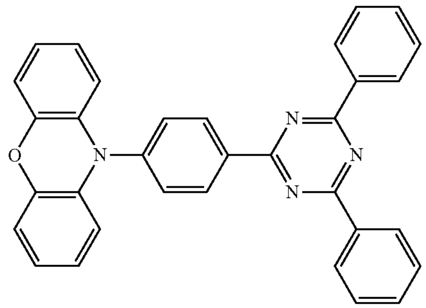

(PXZ-TRZ)

DF8

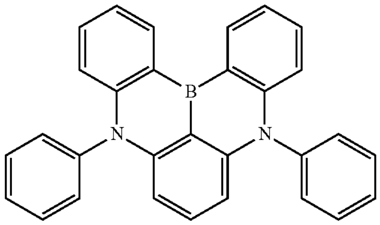

(DABNA-1

DF9

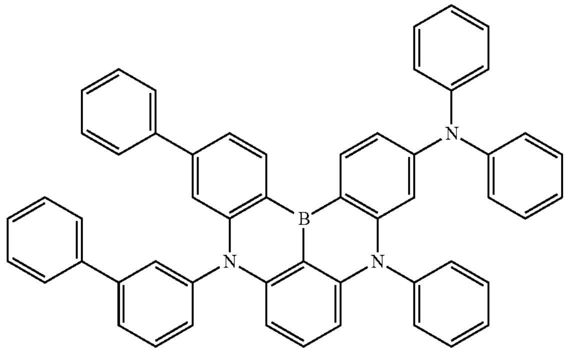

(DABNA-2)

[Quantum Dots]

The emission layer may include quantum dots.

The term "quantum dot" as used herein may be a crystal of a semiconductor compound and may include any suitable material capable of emitting emission wavelengths of various lengths according to the size of the crystal.

A diameter of the quantum dot may be, for example, in a range of about 1 nm to about 10 nm.

Quantum dots may be synthesized by a wet chemical process, a metal organic chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier to perform than the vapor deposition process such a metal organic chemical vapor deposition (MOCVD) or a molecular beam epitaxy (MBE) process. Further, the growth of quantum dot particles may be controlled with a lower manufacturing cost.

The quantum dot may include a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In embodiments, the Group III-V semiconductor compound may further include a Group II element. Examples of the Group III-V semiconductor compound further including a Group II element may include InZnP, InGaZnP, InAlZnP, and the like.

Examples of the Group III-VI semiconductor compound may include a binary compound such as GaS, GaSe, $Ga_2Se_3$, GaTe, InS, InSe, $In_2S_3$, $In_2Se_3$, InTe, and the like; a ternary compound such as $InGaS_3$, InGaSes, and the like; or any combination thereof.

Examples of the Group I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

Examples of the Group IV-VI semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof.

The Group IV element or compound may be a single element material such as Si or Ge; a binary compound such as SiC or SiGe; or any combination thereof.

Individual elements included in the multi-element compound, such as a binary compound, a ternary compound, and a quaternary compound, may be present in a particle thereof at a uniform or at a non-uniform concentration.

The quantum dot may have a single structure in which the concentration of each element included in the quantum dot is uniform or a core-shell double structure. In embodiments, materials included in the core may be different from materials included in the shell.

The shell of the quantum dot may be a protective layer that prevents chemical denaturation of the core to maintain semiconductor characteristics and/or may be a charging layer that imparts electrophoretic characteristics to the quantum dot. The shell may be a monolayer or a multilayer. An interface between a core and a shell may have a concentration gradient where a concentration of elements present in the shell decreases toward the core.

Examples of the shell of the quantum dot may include a metal oxide, a metalloid oxide, a nonmetal oxide, a semiconductor compound, or a combination thereof. Examples of the metal oxide, the metalloid oxide, or the nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; or any combination thereof. Examples of the semiconductor compound may include a Group II-VI semiconductor compound; a Group III-V semiconductor compound; a Group III-VI semiconductor compound; a Group I-III-VI semiconductor compound; a Group IV-VI semiconductor compound; or any combination thereof. In embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength equal to or less than about 45 nm. For example, the quantum dot may have a FWHM of a spectrum of an emission wavelength equal to or less than about 40 nm. For example, the quantum dot may have a FWHM of a spectrum of an emission wavelength equal to or less than about 30 nm. When the FWHM of the quantum dot is within any of the above ranges, color purity or color reproducibility may be improved.

Light emitted through the quantum dots may be emitted in all directions, and an optical viewing angle may be improved.

The quantum dot may be a spherical particle, a pyramidal particle, a multi-arm particle, a cubic nanoparticle, a nanotube, a nanowire, a nanofiber, or a nanoplate.

By adjusting the size of the quantum dot, the energy band gap may also be adjusted, thereby obtaining light of various wavelengths in the quantum dot emission layer.

By using quantum dots of various sizes, a light-emitting device that may emit light of various wavelengths may be realized. In embodiments, the size of the quantum dot may be selected such that the quantum dot may emit red, green, and/or blue light. The size of the quantum dot may be selected such that the quantum dot may emit white light by combining various light colors.

[Electron Transport Region in Interlayer 130]

The electron transport region may have a structure consisting of a layer consisting of a single material, a structure consisting of a layer including different materials, or a multi-layered structure having layers including different materials.

The electron transport region may include a buffer layer, a hole blocking layer, an electron control layer, an electron transport layer, or an electron injection layer.

In embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure may be stacked on the emission layer in its respective stated order, but embodiments are not limited thereto.

The electron transport region (e.g., a buffer layer, a hole blocking layer, an electron control layer, or an electron transport layer in the electron transport region) may include a metal-free compound including at least one π electron-deficient nitrogen-containing $C_1$-$C_{60}$ cyclic group.

In embodiments, the electron transport region may include a compound represented by Formula 601:

$$[Ar_{601}]_{xe11}\text{-}[(L_{601})_{xe1}\text{-}R_{601}]_{xe21}$$ [Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be understood by referring to the description of $Q_1$ provided herein, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$, and $R_{10a}$ may be understood by referring to the description of $R_{10a}$ provided herein.

In embodiments, when xe11 in Formula 601 is 2 or greater, at least two $Ar_{601}$(s) may be bound via a single bond.

In embodiments, in Formula 601, $Ar_{601}$ may be a substituted or unsubstituted anthracene group.

In embodiments, the electron transport region may include a compound represented by Formula 601-1:

[Formula 601-1]

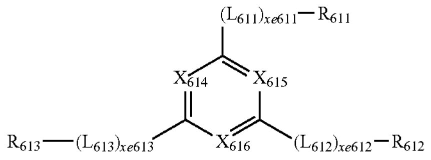

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be understood by referring to the description of $L_{601}$ provided herein, xe611 to xe613 may each independently be understood by referring to the description of xe1 provided herein, $R_{611}$ to $R_{613}$ may each independently be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and $R_{10a}$ may be understood by referring to the description of $R_{10a}$ provided herein.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1
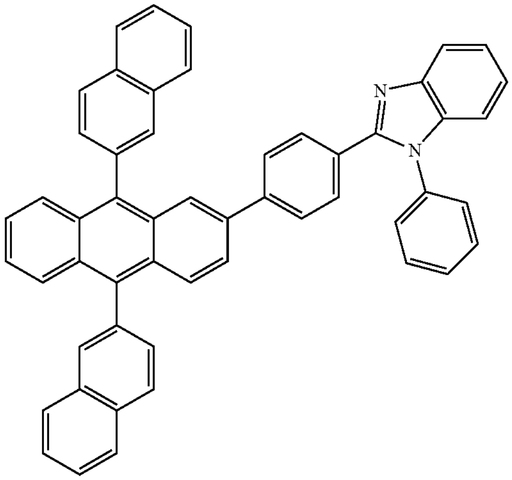
ET2
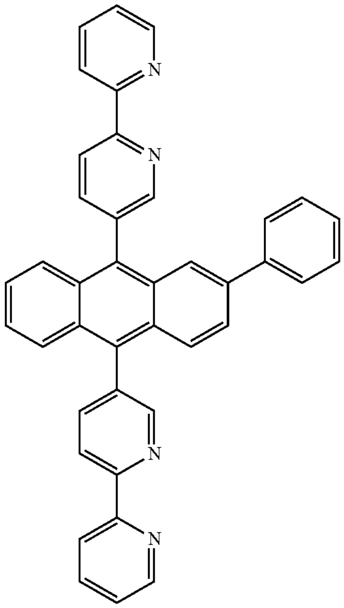
ET3
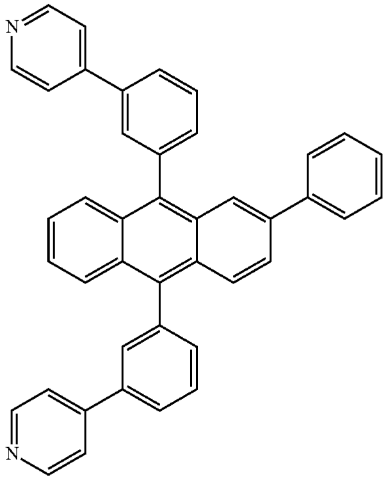
-continued
ET4
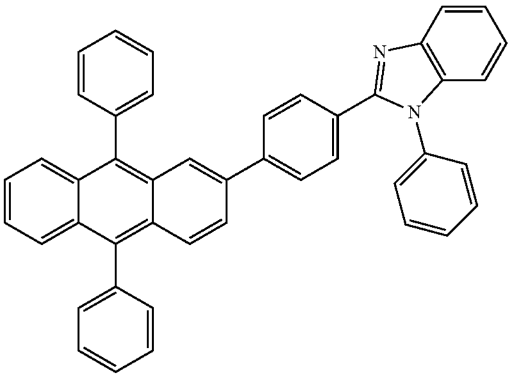
ET5
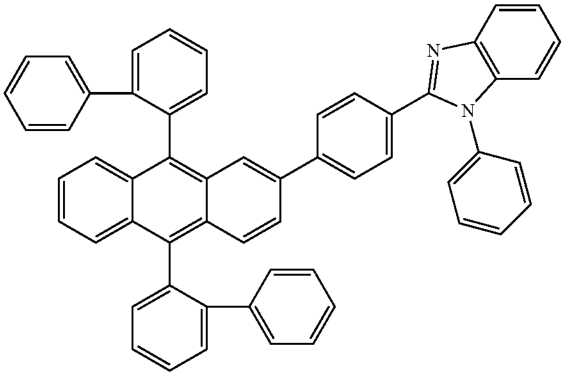
ET6
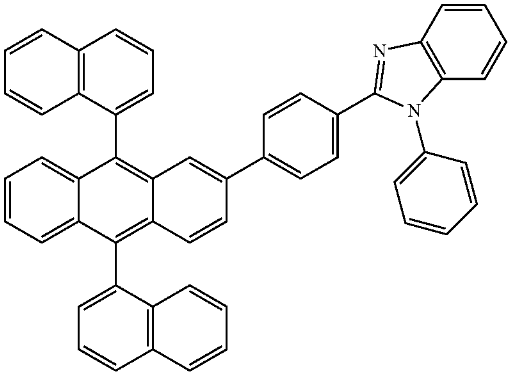

-continued
ET7
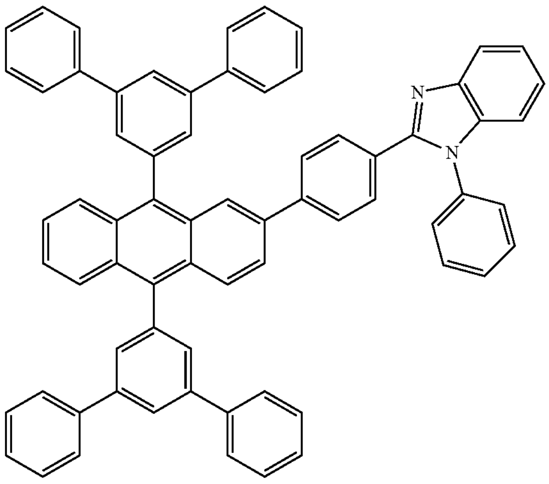
ET8
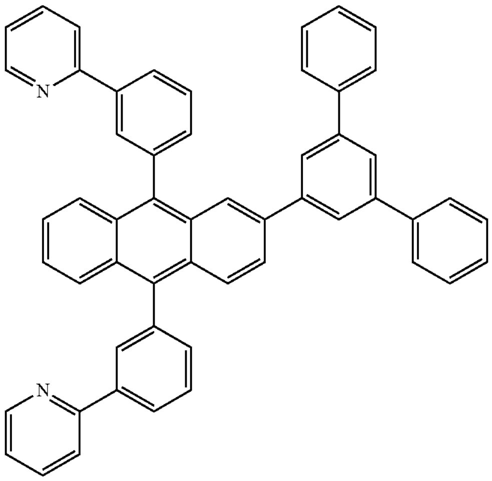
ET9
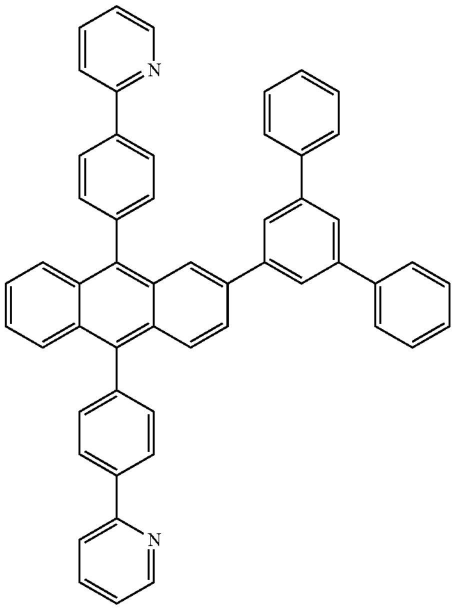
-continued
ET10
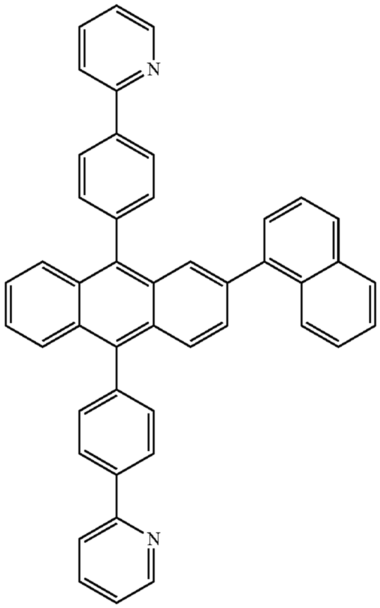
ET11
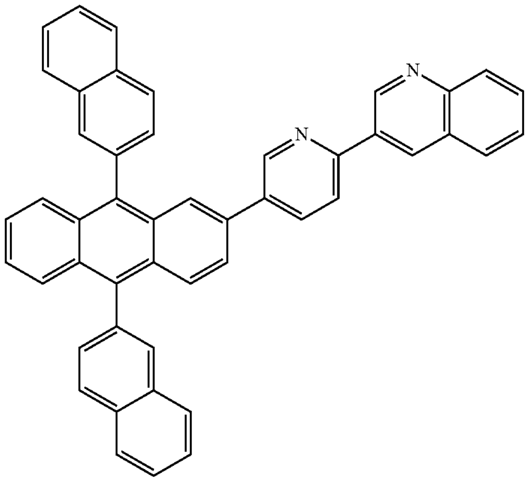
ET12
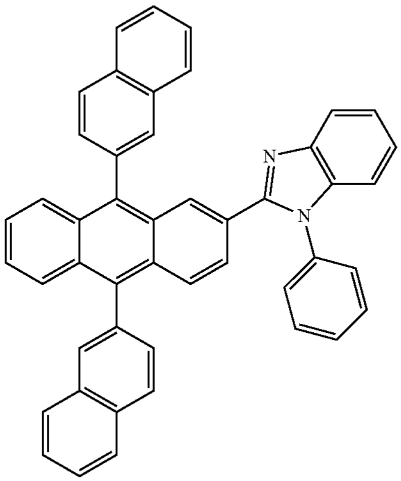

ET13
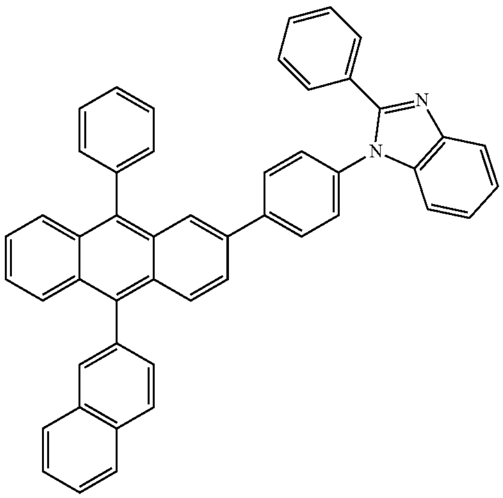
ET14
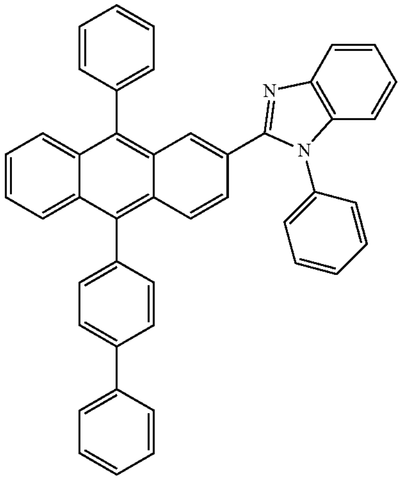
ET15
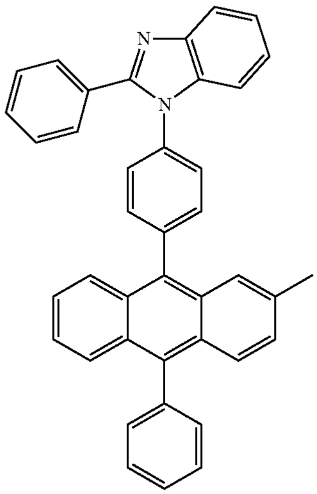
ET16
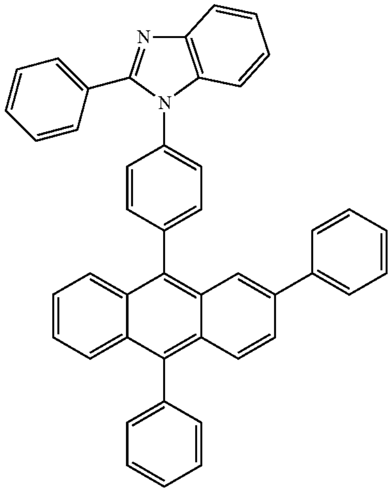
ET17
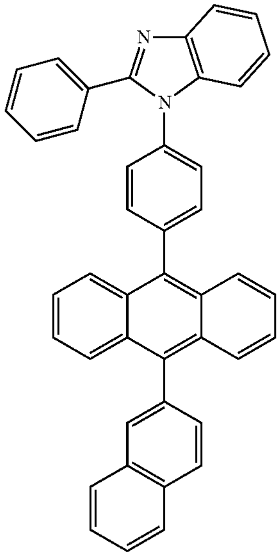
ET18
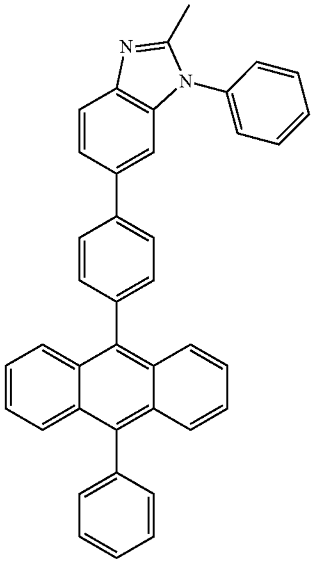

-continued
ET19
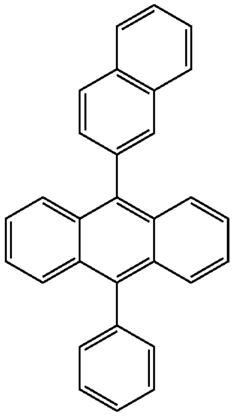
ET20
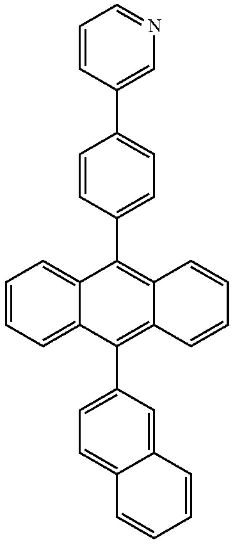
ET21
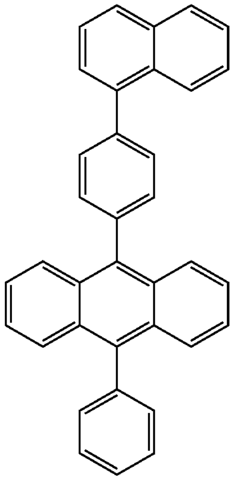
-continued
ET22
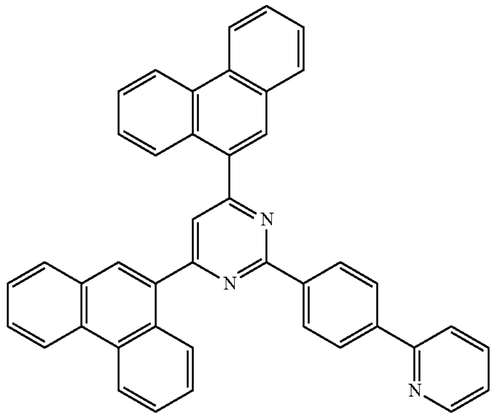
ET23
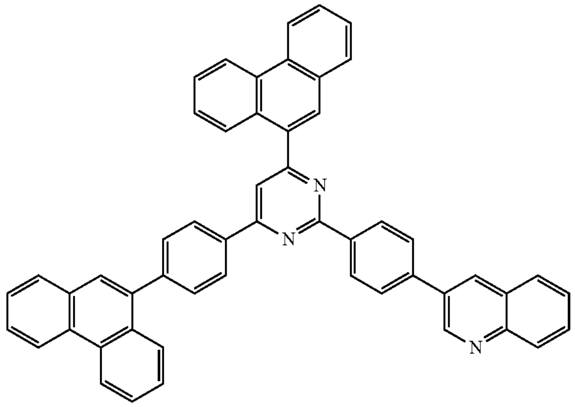
ET24
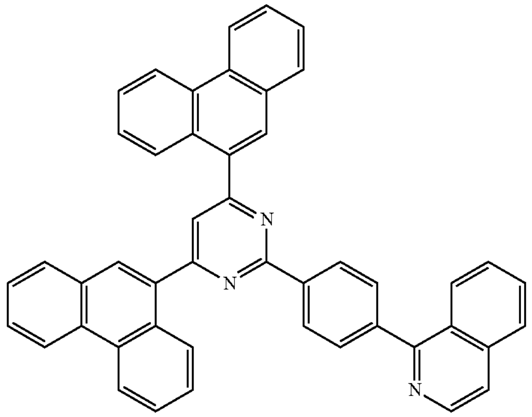

-continued
ET25
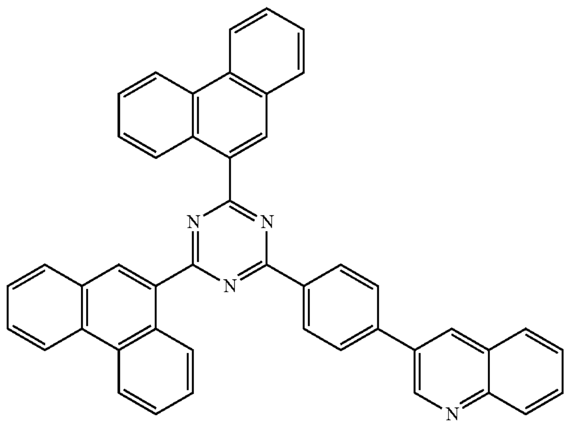
ET26
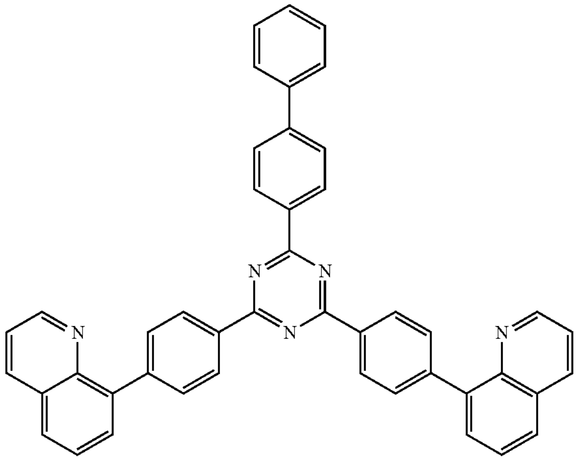
ET27
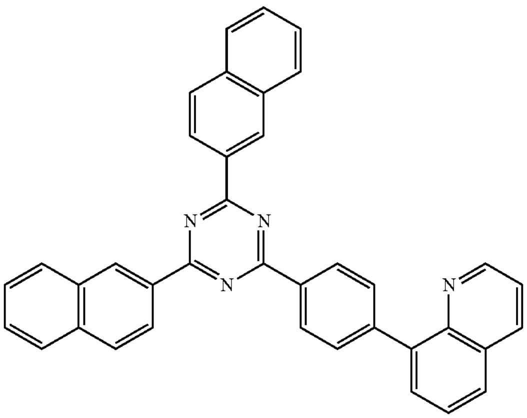
-continued
ET28
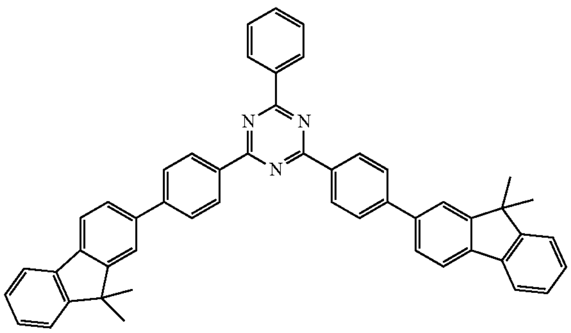
ET29
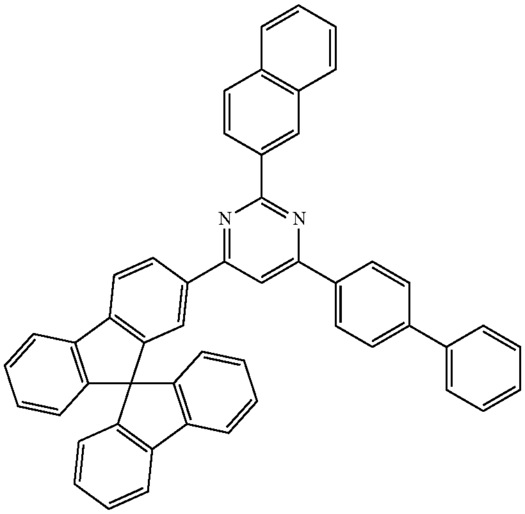
ET30
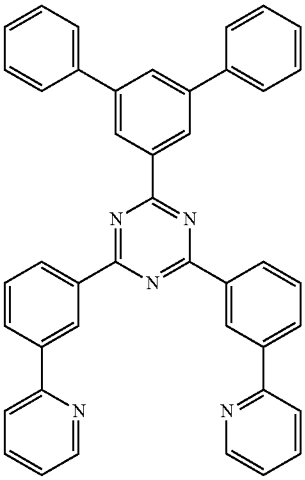

-continued
ET31
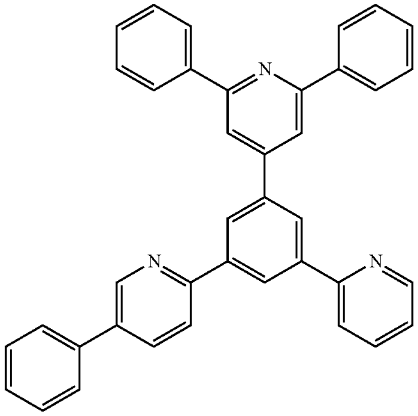
ET32
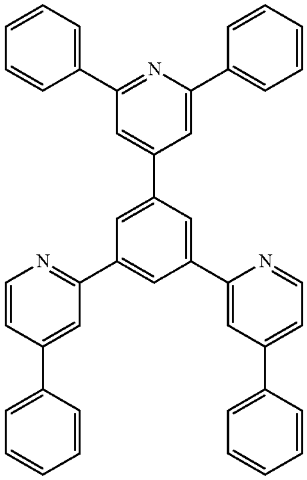
ET33
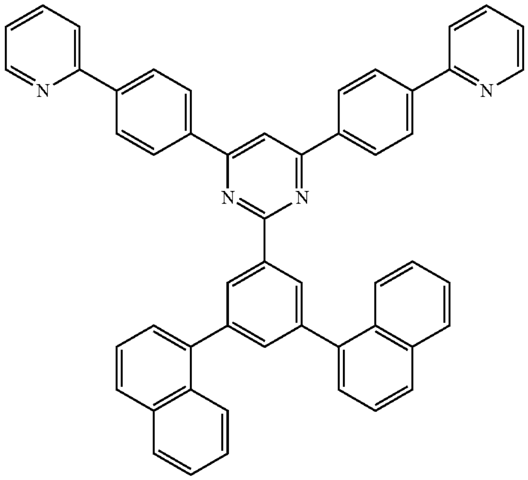
-continued
ET34
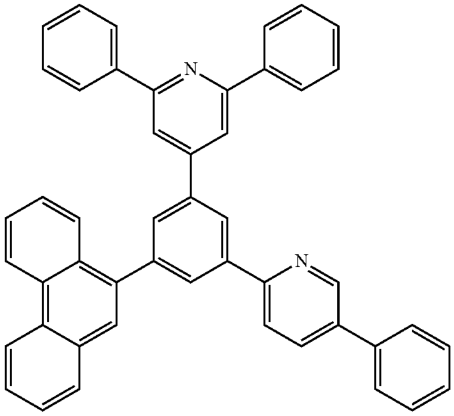
ET35
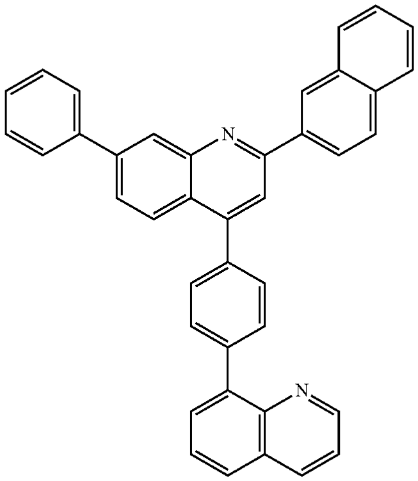
ET36
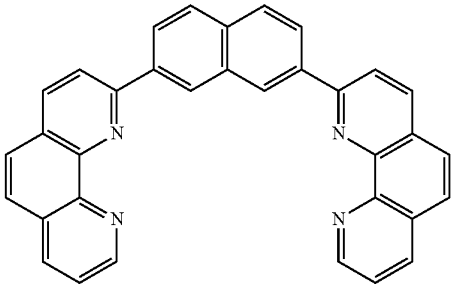
ET37
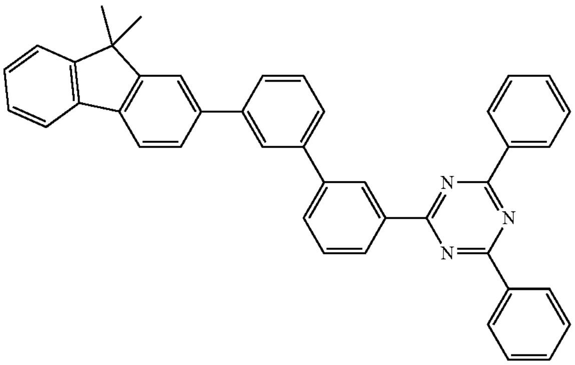

-continued
ET38
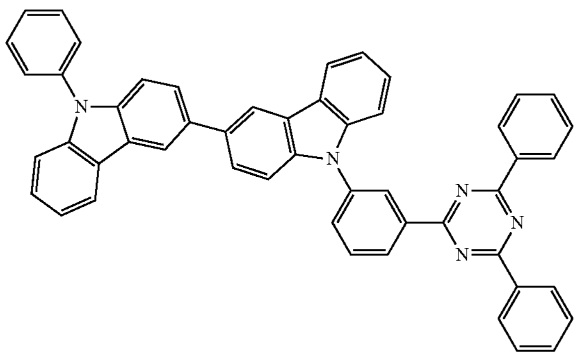
ET39
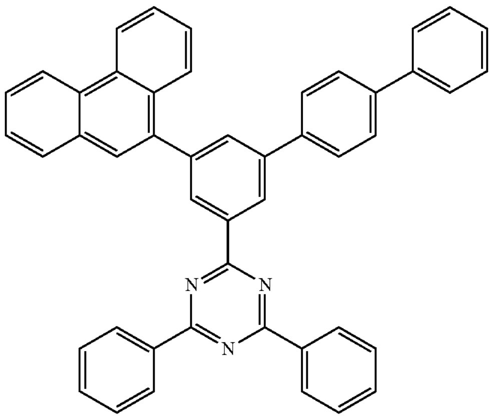
ET40
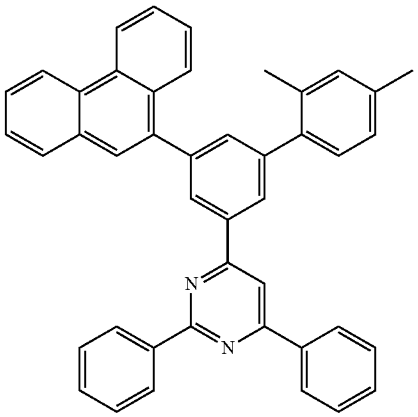
-continued
ET41
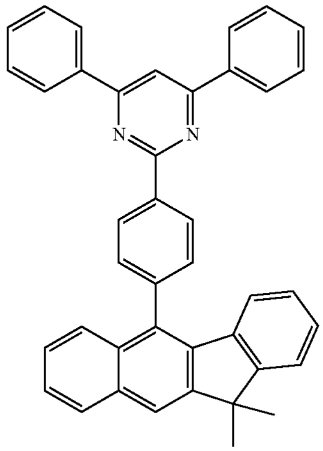
ET42
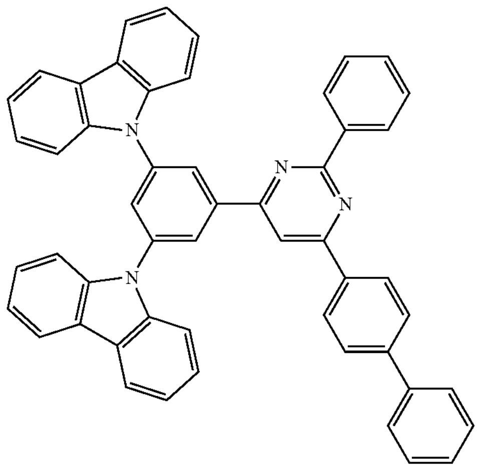
ET43
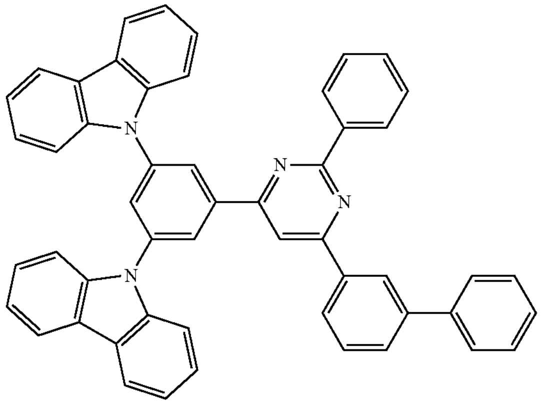

-continued

ET44

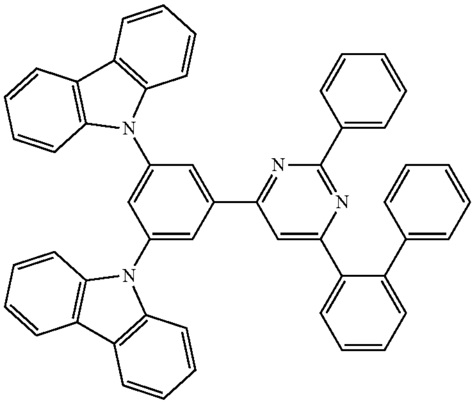

ET45

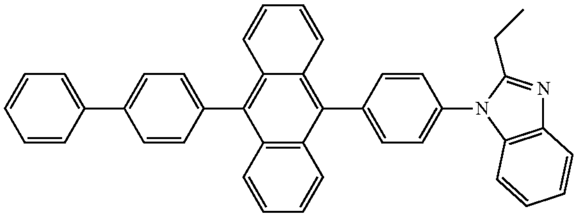

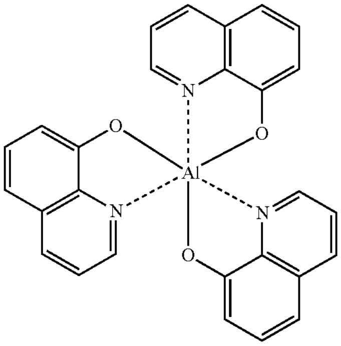

Alq3

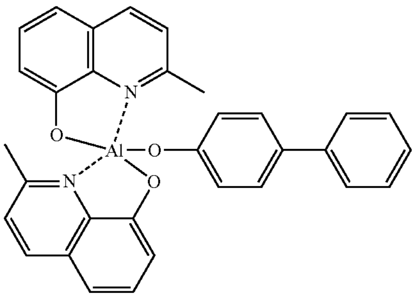

BAlq

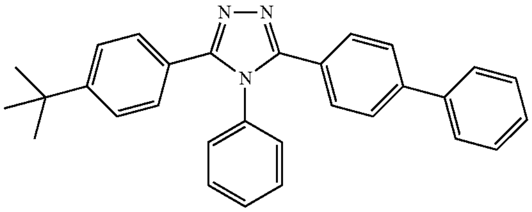

TAZ

-continued

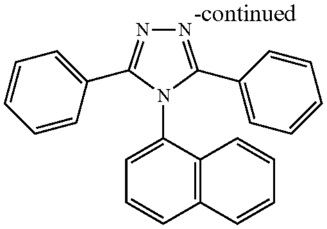

.

NTAZ

A thickness of the electron transport region may be in a range of about 100 Angstroms (Å) to about 5,000 Å. For example, the thickness of the electron transport region may be in a range of about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, and/or the electron transport layer are each within these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. A ligand coordinated with the metal ion of the alkali metal complex and the alkaline earth metal complex may each independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

ET-D1

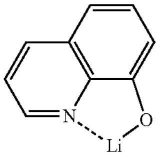

-continued

ET-D2

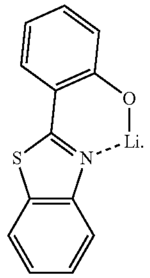

The electron transport region may include an electron injection layer that facilitates injection of electrons from the second electrode 150. The electron injection layer may directly contact the second electrode 150.

The electron injection layer may have a structure consisting of a layer consisting of a single material, a structure consisting of a layer including different materials, or a multi-layered structure having layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal oxides, such as BaO, SrO, CaO, $Ba_xSr_{1-x}O$ (wherein x is a real number satisfying $0<x<1$), or $Ba_xCa_{1-x}O$ (wherein x is a real number satisfying $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include one of ions of the alkali metal, ions of the alkaline earth metal, and ions of the rare earth metal described above, and a ligand bonded to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (e.g., a compound represented by Formula 601).

In embodiments, the electron injection layer may consist of an alkali metal-containing compound (e.g., alkali metal halide); or an alkali metal-containing compound (e.g., alkali metal halide), and an alkali metal, an alkaline earth metal, a rare earth metal, or any combination thereof. In embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within any of these ranges, excellent electron injection characteristics may be obtained without a substantial increase in driving voltage.

[Second Electrode 150]

The second electrode 150 may be on the interlayer 130. In an embodiment, the second electrode 150 may be a cathode that is an electron injection electrode, and a material for forming the second electrode 150 may be a material having a low work function, such as a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a transflective electrode, or a reflective electrode.

The second electrode 150 may have a single-layered structure, or a multi-layered structure including two or more layers.

[Capping Layer]

A first capping layer may be located outside the first electrode 110, and/or a second capping layer may be located outside the second electrode 150. In embodiments, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

In the light-emitting device 10, light emitted from the emission layer in the interlayer 130 may pass through the first electrode 110 (which may be a transflective electrode or a transmissive electrode) and through the first capping layer to the outside. In the light-emitting device 10, light emitted from the emission layer in the interlayer 130 may pass through the second electrode 150 (which may be a transflective electrode or a transmissive electrode) and through the second capping layer to the outside.

The first capping layer and the second capping layer may each improve the external luminescence efficiency based on the principle of constructive interference. Accordingly, the optical extraction efficiency of the light-emitting device 10 may be increased, thus improving the luminescence efficiency of the light-emitting device 10.

The first capping layer and the second capping layer may each include a material having a refractive index equal to or greater than about 1.6 (at a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may each independently be optionally substituted with a substituent including O, N, S, Se, Si, F, Cl, Br, I, or any combination thereof. In embodiments, at least one of the first capping layer and the second capping layer may each independently include an amine group-containing compound.

In embodiments, at least one of the first capping layer and the second capping layer may each independently include the compound represented by Formula 201, the compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

CP1

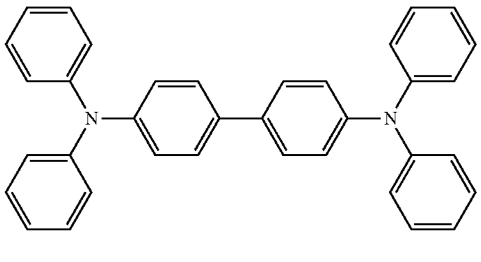

CP2

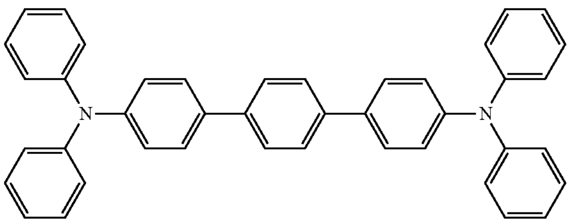

-continued

CP3

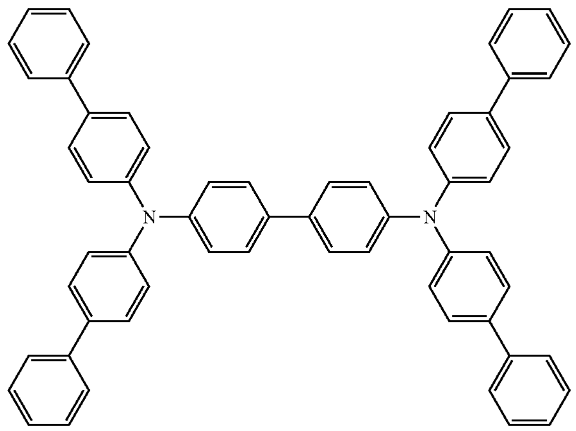

CP4

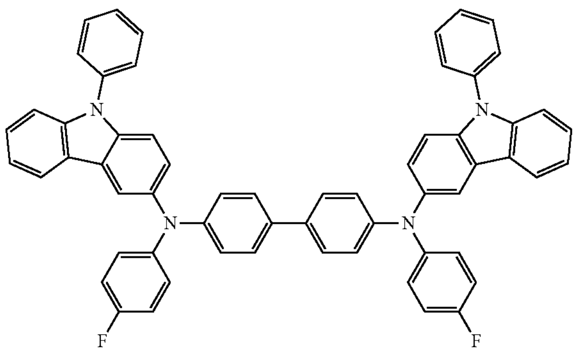

CP5

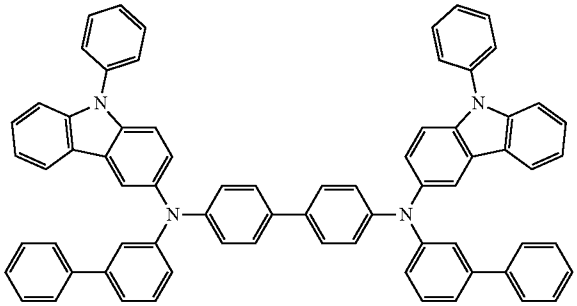

CP6

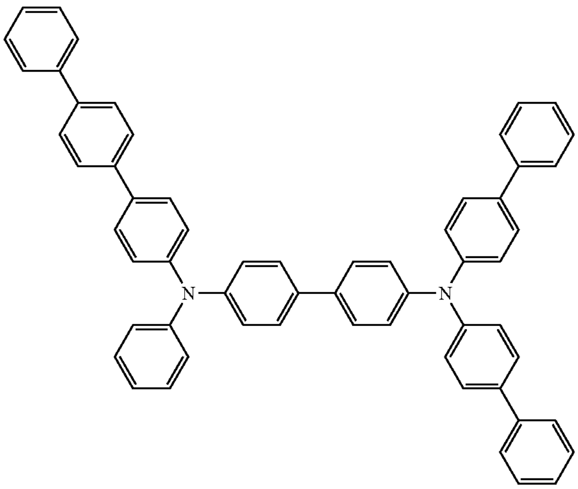

-continued

β-NPB

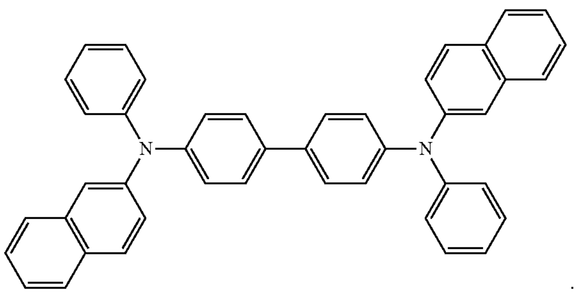

[Film]

The organometallic compound represented by Formula 1 may be included in various films. According to embodiments, a film including an organometallic compound represented by Formula 1 may be provided. The film may be, for example, an optical member (or a light-controlling member) (e.g., a color filter, a color-conversion member, a capping layer, a light extraction efficiency improvement layer, a selective light-absorbing layer, a polarization layer, a quantum dot-containing layer, or the like), a light-blocking member (e.g., a light reflection layer or a light-absorbing layer), or a protection member (e.g., an insulating layer or a dielectric material layer).

[Electronic Apparatus]

The light-emitting device may be included in various electronic apparatuses. In embodiments, an electronic apparatus including the light-emitting device may be an emission apparatus or an authentication apparatus.

The electronic apparatus (e.g., an emission apparatus) may further include, in addition to the light-emitting device, a color filter, a color-conversion layer, or a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In embodiments, the color-conversion layer may include quantum dots. The quantum dot may be, for example, the quantum dot described herein.

The electronic apparatus may include a first substrate. The first substrate may include subpixels, the color filter may include color filter areas respectively corresponding to the subpixels, and the color-conversion layer may include color-conversion areas respectively corresponding to the subpixels.

A pixel-defining film may be located between the subpixels to define each subpixel.

The color filter may further include color filter areas and light-blocking patterns between the color filter areas, and the color-conversion layer may further include color-conversion areas and light-blocking patterns between the color-conversion areas.

The color filter areas (or the color-conversion areas) may include a first area emitting first color light, a second area emitting second color light, and/or a third area emitting third color light, and the first color light, the second color light, and/or the third color light may have different maximum emission wavelengths from one another. In embodiments, the first color light may be red light, the second color light may be green light, and the third color light may be blue light. In embodiments, the color filter areas (or the color-conversion areas) may each include quantum dots. In embodiments, the first area may include red quantum dots, the second area may include green quantum dots, and the third area may not include a quantum dot. The quantum dot may be understood by referring to the description of the quantum dot provided herein. The first area, the second area, and/or the third area may each further include a scatterer.

In embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength from one another. In embodiments, the first light may be blue light, the 1-1 color light may be red light, the 2-1 color light may be green light, and the 3-1 color light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and may prevent air and/or moisture from permeating into the light-emitting device at the same time. The encapsulation unit may be a sealing substrate including transparent glass or a plastic substrate. The encapsulation unit may be a thin-film encapsulating layer including at least one of an organic layer and an inorganic layer. When the encapsulation unit is a thin-film encapsulating layer, the electronic apparatus may be flexible.

In addition to the color filter and/or the color-conversion layer, various functional layers may be disposed on the encapsulation unit depending on the use of an electronic apparatus. Examples of the functional layer may include a touch screen layer, a polarization layer, an authentication apparatus, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable to various displays, such as an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, various measurement devices, gauges (e.g., gauges of an automobile, an airplane, or a ship), and a projector.

Figure 2:
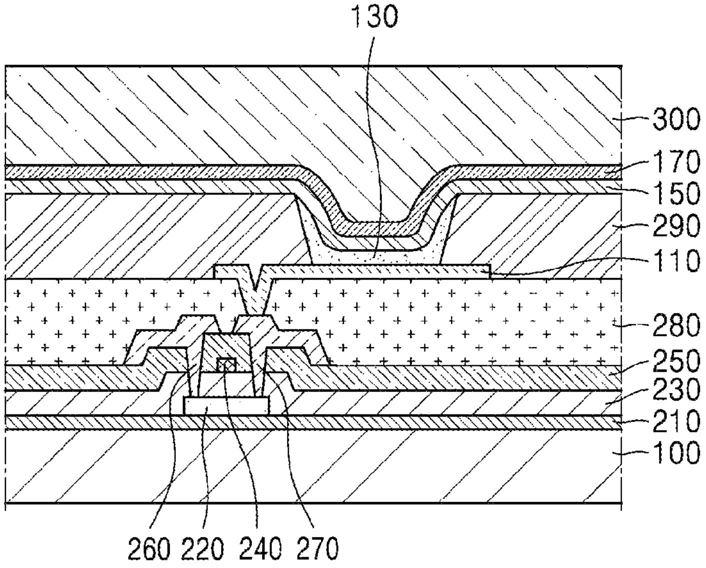
FIG. 2 is a schematic cross-sectional view of an electronic apparatus according to an embodiment.
Figure 3:
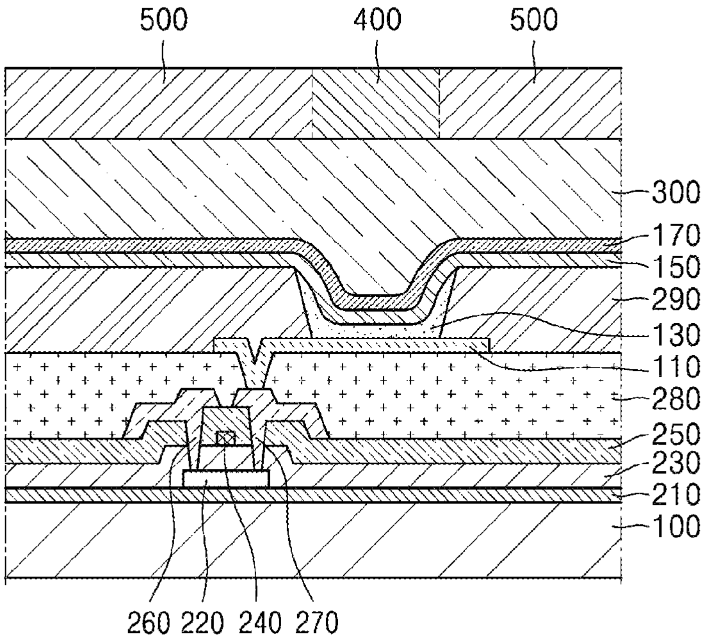
FIG. 3 is a schematic cross-sectional view of an electronic apparatus according to an embodiment.

[Descriptions of FIGS. 2 and 3]

FIG. 2 is a schematic cross-sectional view of an electronic apparatus according to an embodiment.

An electronic apparatus in FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or polysilicon, an organic semiconductor, or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and expose a specific area of the drain electrode 270, and the first electrode 110 may be disposed to electrically connect to the exposed area of the drain electrode 270.

A pixel-defining film 290 may be on the first electrode 110. The pixel-defining film 290 may expose a specific area of the first electrode 110, and the interlayer 130 may be formed in the exposed area. The pixel-defining film 290 may be a polyimide or polyacryl organic film. Although it is not shown in FIG. 2, some higher layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture and/or oxygen. The encapsulation unit 300 may include an inorganic film including silicon nitride ($SiN_x$), silicon oxide ($SiO_x$), indium tin oxide, indium zinc oxide, or any combination thereof; an organic film including PET, polyethylene naphthalate, polycarbonate, polyimide, polyethylene sulfonate, polyoxy methylene, polyaryllate, hexamethyl disiloxane, an acrylic based resin (e.g., polymethyl methacrylate, polyacrylic acid, and the like), an epoxy based resin (e.g., aliphatic glycidyl ether (AGE) and the like), or any combination thereof; or a combination of the inorganic film and the organic film.

FIG. 3 is a schematic cross-sectional view of an electronic apparatus according to an embodiment.

The electronic apparatus shown in FIG. 3 may be substantially identical to the electronic apparatus shown in FIG. 2, except that a light-blocking pattern 500 and a functional area 400 are additionally located on the encapsulation unit 300. The functional area 400 may be a color filter area, a color-conversion area, or a combination of a color filter area and a color-conversion area. In embodiments, the light-emitting device included in the electronic apparatus shown in FIG. 3 may be a tandem light-emitting device.

[Manufacturing Method]

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When layers constituting the hole transport region, an emission layer, and layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

Definitions of Terms

The term "$C_3$-$C_{60}$ carbocyclic group" as used herein may be a cyclic group consisting only of carbon atoms as ring-forming atoms and having 3 to 60 carbon atoms as ring-forming atoms. The term "$C_1$-$C_{60}$ heterocyclic group" as used herein may be a cyclic group having 1 to 60 carbon atoms in addition to at least one heteroatom as ring-forming atoms other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in a $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein may be a cyclic group having 3 to 60 carbon atoms and not including *—N=*' as a ring-forming moiety. The term "π electron-deficient nitrogen-containing $C_1$-$C_{60}$ cyclic group" as used herein may be a heterocyclic group having 1 to 60 carbon atoms and may include *—N=*' as a ring-forming moiety.

In embodiments, the $C_3$-$C_{60}$ carbocyclic group may be a T1 group or a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a group in which at least two T2 groups are condensed, or a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be a T1 group, a condensed group in which at least two T1 groups are condensed, a T3 group, a condensed group in which at least two T3 groups are condensed, or a condensed group in which at least one T3 group is condensed with at least one T1 group (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be a T4 group, a group in which at least two T4 groups are condensed, a group in which at least one T4 group is condensed with at least one T1 group, a group in which at least one T4 group is condensed with at least one T3 group, or a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a tetravalent group, or the like), depending on the structure of a formula to which the term is applied. For example, a "benzene group" may be a benzene ring, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein may be a linear or branched aliphatic hydrocarbon monovalent group having 1 to 60 carbon atoms. Examples of the $C_1$-$C_{60}$ alkyl group may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at the terminus of the $C_2$-$C_{60}$ alkyl group. Examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$-$C_{60}$ alkyl group. Examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —O($A_{101}$) (wherein $A_{101}$ is a $C_1$-$C_{60}$ alkyl group). Examples thereof may include a methoxy group, an ethoxy group, and an isopropyloxy group.

The term "$C_3$-$C_{10}$ cycloalkyl group" as used herein may be a monovalent saturated hydrocarbon monocyclic group including 3 to 10 carbon atoms. Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group including at least one heteroatom other than carbon atoms as a ring-forming atom and having 1 to 10 carbon atoms. Examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has 3 to 10 carbon atoms and at least one carbon-carbon double bond in its ring, and is not aromatic. Examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having 6 to 60 carbon atoms. The term "$C_6$-$C_{60}$ arylene group" as used herein may be a divalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein may be a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein may be a divalent group having a heterocyclic aromatic system further including at least one heteroatom other than carbon atoms as a ring-forming atom and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein may be a monovalent group that has two or more condensed rings and only carbon atoms (e.g., 8 to 60 carbon atoms) as ring forming atoms, wherein the molecular structure when considered as a whole is non-aromatic. Examples of the monovalent non-aromatic condensed polycyclic group may include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein may be a divalent group having substantially a same structure as the monovalent non-aromatic condensed polycyclic group.

The term "monovalent non-aromatic condensed heteropolycyclic group" as used herein may be a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having substantially a same structure as the monovalent non-aromatic condensed heteropolycyclic group.

The term "$C_6$-$C_{60}$ aryloxy group" as used herein indicates $-OA_{102}$ (wherein $A_{102}$ is a $C_6$-$C_{60}$ aryl group), and a $C_6$-$C_{60}$ arylthio group as used herein indicates $-SA_{103}$ (wherein $A_{103}$ is a $C_6$-$C_{60}$ aryl group).

The term "$C_7$-$C_{60}$ aryl alkyl group" used herein refers to $-A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to $-A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein may be any atom other than a carbon atom or a hydrogen atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), and gold (Au).

The term "Ph" as used herein represents a phenyl group, the term "Me" as used herein represents a methyl group, the term "Et" as used herein represents an ethyl group, the terms "tert-Bu" or "$Bu^t$" as used herein each represent a tert-butyl group, and the term "OMe" as used herein represents a methoxy group.

The term "biphenyl group" as used herein may be a phenyl group substituted with a phenyl group. For example, the "biphenyl group" may be a substituted phenyl group having a $C_6$-$C_{60}$ aryl group as a substituent.

The term "terphenyl group" as used herein may be a phenyl group substituted with a biphenyl group. For example, the "terphenyl group" may be "a substituted phenyl group" having a "$C_6$-$C_{60}$ aryl group substituted with a $C_6$-$C_{60}$ aryl group" as a substituent.

The symbols *, *', *", and *'" as used herein, unless defined otherwise, refer to a binding site to an adjacent atom in a corresponding formula or moiety.

Hereinafter, compounds and a light-emitting device according to embodiments will be described in more detail with reference to Synthesis Examples and Examples. The wording "B was used instead of A" used in describing Synthesis Examples means that an amount of B used was identical to an amount of A used in terms of molar equivalents.
EXAMPLES
Synthesis Example 1: Synthesis of Compound 1
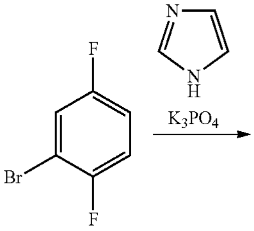
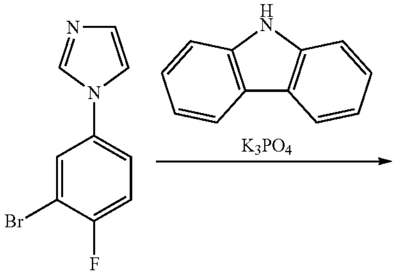
[1-A]
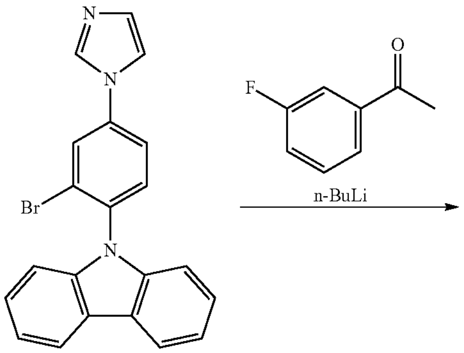
[1-B]
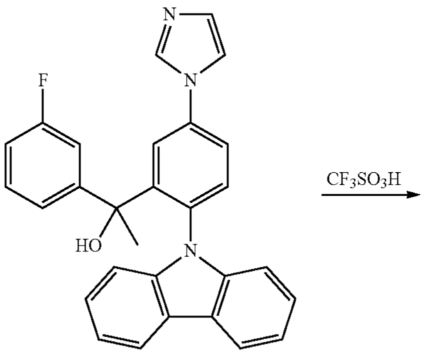
[1-C]
-continued
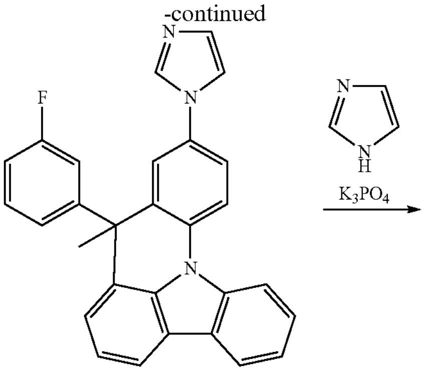
[1-D]
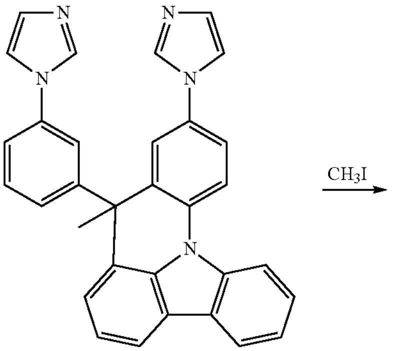
[1-E]
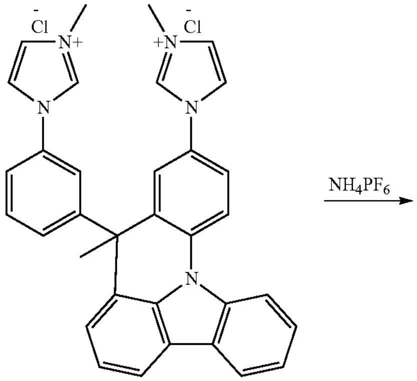
[1-F]
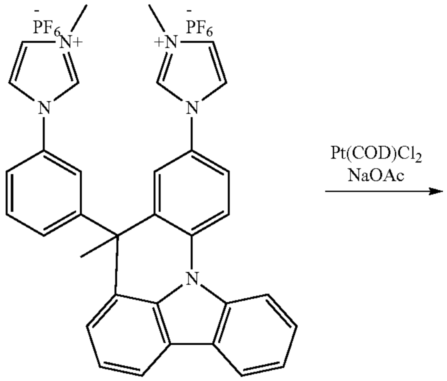
[1-G]

-continued

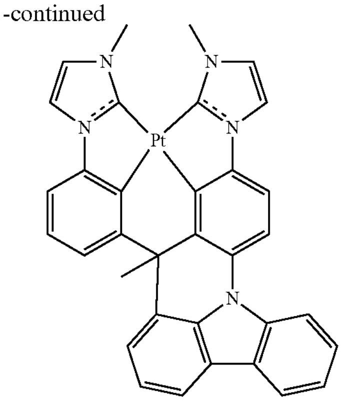

1

(1) Synthesis of Intermediate [1-A]

2-bromo-1,4-difluorobenzene (2.0 eq.), imidazole (1.0 eq.), and $K_3PO_4$ (2.0 eq.) were added to a reaction vessel, followed by suspension in dimethyl formamide (DMF, 0.25 molar (M)). The reaction mixture was heated to a temperature of 160° C. and stirred for 12 hours. Once the reaction was complete, the mixture was cooled to room temperature, and an extraction process was performed thereon by using distilled water and ethyl acetate. The extracted organic layer was washed using saturated NaCl aqueous solution and dried using magnesium sulfate. The residue from which the solvent was removed was separated by using column chromatography to thereby obtain Intermediate [1-A] (yield: 73%).

(2) Synthesis of Intermediate [1-B]

Intermediate [1-A] (1.0 eq.), carbazole (1.5 eq.), and $K_3PO_4$ (2.0 eq.) were added to a reaction vessel, followed by suspension in DMF (0.25 M). The reaction mixture was heated to a temperature of 160° C. and stirred for 12 hours. Once the reaction was complete, the mixture was cooled to room temperature, and an extraction process was performed thereon by using distilled water and ethyl acetate. The extracted organic layer was washed using saturated NaCl aqueous solution and dried using magnesium sulfate. The residue from which the solvent was removed was separated by using column chromatography to thereby obtain Intermediate [1-B] (yield: 80%).

(3) Synthesis of Intermediate [1-C]

3'-fluoroacetophenone (2.0 eq.), Mg (2.0 eq.), and iodine (0.01 eq.) were added to a reaction vessel, followed by suspension in anhydrous tetrahydrofuran (THF, 0.5 M) in argon atmosphere. The reaction mixture was heated to a temperature of 60° C. and stirred for 2 hours. Intermediate [1-B] (1.0 eq.) was added dropwise slowed to the stirred mixture. The reaction mixture was stirred at a temperature of 60° C. for 12 hours. Once the reaction was complete, the reaction mixture was cooled to room temperature, and an ammonium chloride solution was added thereto, followed by extraction using ethyl acetate. The extracted organic layer was dried using magnesium sulfate. The residue from which the solvent was removed was separated by using column chromatography to thereby obtain Intermediate [1-C] (yield: 72%).

(4) Synthesis of Intermediate [1-D]

Intermediate [1-C] (1.0 eq.) was added to a reaction vessel, followed by suspension in methylene chloride (0.5 M). At room temperature, triflic acid (1.5 eq) was slowly added thereto dropwise to the reaction mixture. The reaction mixture was stirred at a temperature of 25° C. for 12 hours. Once the reaction was complete, neutralization using NaOH and ammonium chloride was carried out, followed by extraction using methylene chloride. The extracted organic layer was washed using saturated NaCl aqueous solution and dried using magnesium sulfate. The residue from which the solvent was removed was separated by using column chromatography to thereby obtain Intermediate [1-D] (yield: 85%).

(5) Synthesis of Intermediate [1-E]

Intermediate [1-E] was synthesized in the same manner as in Synthesis of Intermediate [1-A], except that Intermediate [1-D] was used instead of 2-bromo-1,4-difluorobenzene (yield: 82%).

(6) Synthesis of Intermediate [1-F]

Intermediate [1-E] (1.0 eq.) and iodomethane (10.0 eq.) were added to a reaction vessel, followed by suspension in toluene (0.1 M). The reaction mixture was heated to a temperature of 110° C. and stirred for 12 hours. Once the reaction was complete, the mixture was cooled to room temperature, and an extraction process was performed thereon by using distilled water and ethyl acetate. The extracted organic layer was dried using magnesium sulfate, and the solvent was removed therefrom to thereby obtain Intermediate [1-F] (yield: 90%).

(7) Synthesis of Intermediate [1-G]

Intermediate [1-F] (1.0 eq.) was added to a reaction vessel, followed by suspension onto a mixed solution of methanol and distilled water at a ratio of 2:1. The reaction mixture was sufficiently dissolved, and ammonium hexafluorophosphate (2.2 eq.) was slowly added thereto, followed by stirring the reaction solution at room temperature for 12 hours. Once the reaction was complete, the thus produced solid was filtered and washed using diethyl ether. The washed solid was dried to obtain Intermediate [1-G] (yield: 93%).

(8) Synthesis of Compound 1

Intermediate [1-G] (1.0 eq.), dichloro(1,5-cyclooctadiene)platinum (1.1 eq.), and sodium acetate (3.0 eq.) were suspended in 1,4-dioxane (0.1 M). The reaction mixture was heated to a temperature of 120° C. and stirred for 72 hours. Once the reaction was complete, the reaction mixture was cooled to room temperature, and an extraction process was performed thereon by using distilled water and ethyl acetate. The extracted organic layer was washed using saturated NaCl aqueous solution and dried using magnesium sulfate. The residue from which the solvent was removed was separated by using column chromatography to thereby obtain Compound 1 (yield: 32%).
Synthesis Example 2: Synthesis of Compound 11
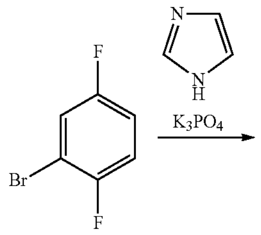
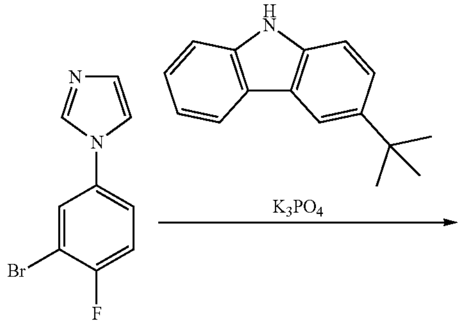
[1-A]
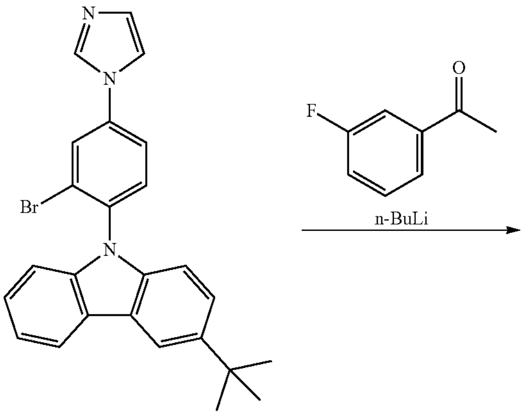
[11-B]
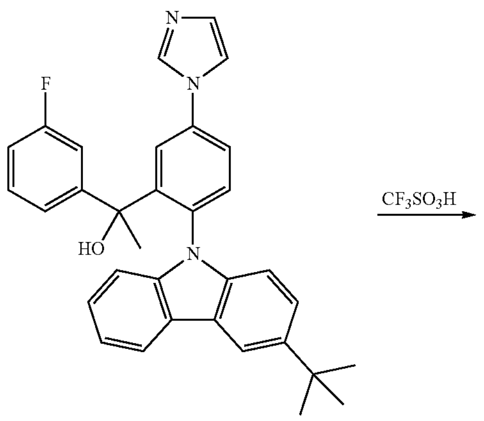
[11-C]
-continued
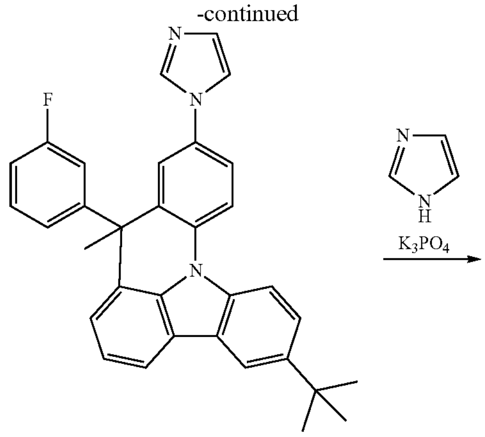
[11-D]
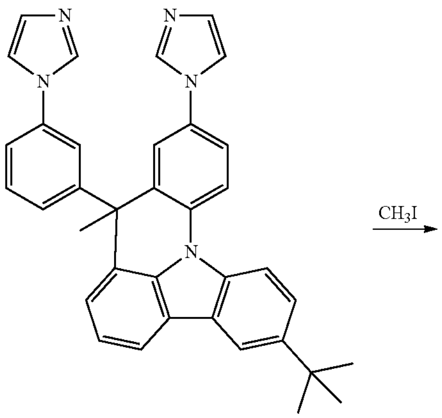
[11-E]
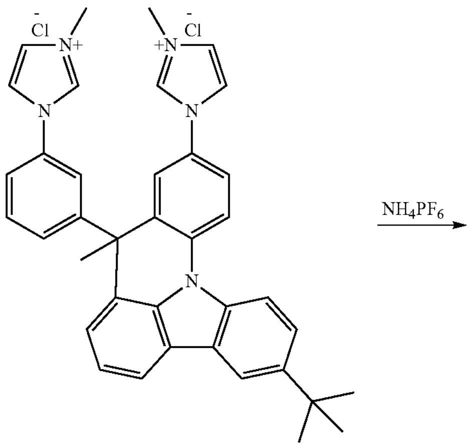
[11-F]

-continued

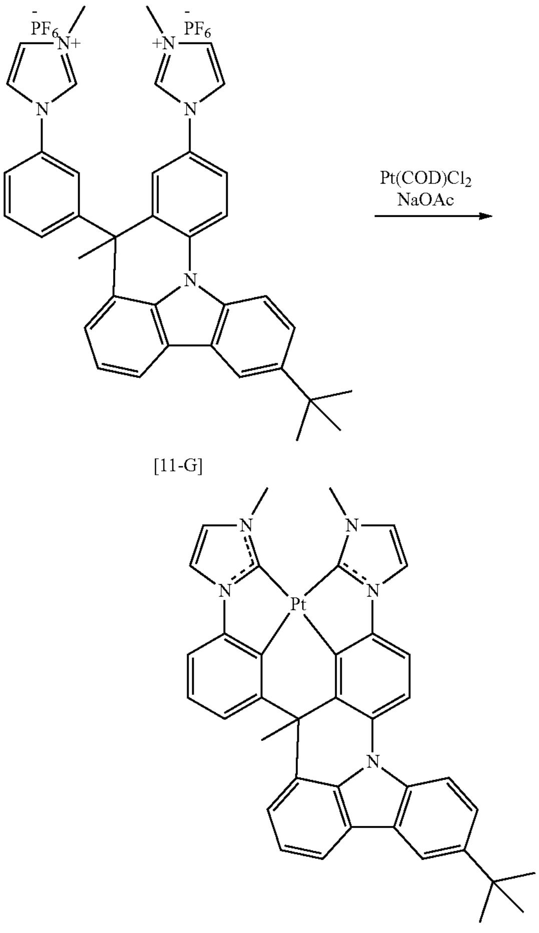

[11-G]

11

(1) Synthesis of Intermediate [11-B]

Intermediate [11-B] was synthesized in the same manner as in Synthesis of Intermediate [1-B], except that 3-tert-Butyl-9H-carbazole was used instead of carbazole (yield: 78%).

(2) Synthesis of Intermediate [11-C]

Intermediate [11-C] was synthesized in the same manner as in Synthesis of Intermediate [1-C], except that Intermediate [11-B] was used instead of Intermediate [1-B] (yield: 76%).

(3) Synthesis of Intermediate [11-D]

Intermediate [11-D] was synthesized in the same manner as in Synthesis of Intermediate [1-D], except that Intermediate [11-C] was used instead of Intermediate [1-C] (yield: 80%).

(4) Synthesis of Intermediate [11-E]

Intermediate [11-E] was synthesized in the same manner as in Synthesis of Intermediate [1-E], except that Intermediate [11-D] was used instead of Intermediate [1-D] (yield: 73%).

(5) Synthesis of Intermediate [11-F]

Intermediate [11-F] was synthesized in the same manner as in Synthesis of Intermediate [1-F], except that Intermediate [11-E] was used instead of Intermediate [1-E] (yield: 85%).

(6) Synthesis of Intermediate [11-G]

Intermediate [11-G] was synthesized in the same manner as in Synthesis of Intermediate [1-G], except that Intermediate [11-F] was used instead of Intermediate [1-F] (yield: 92%).

(7) Synthesis of Compound 11

Compound 11 was synthesized in the same manner as in Synthesis of Compound 1, except that Intermediate [11-G] was used instead of Intermediate [1-G] (yield: 36%).

Synthesis Example 3: Synthesis of Compound 71

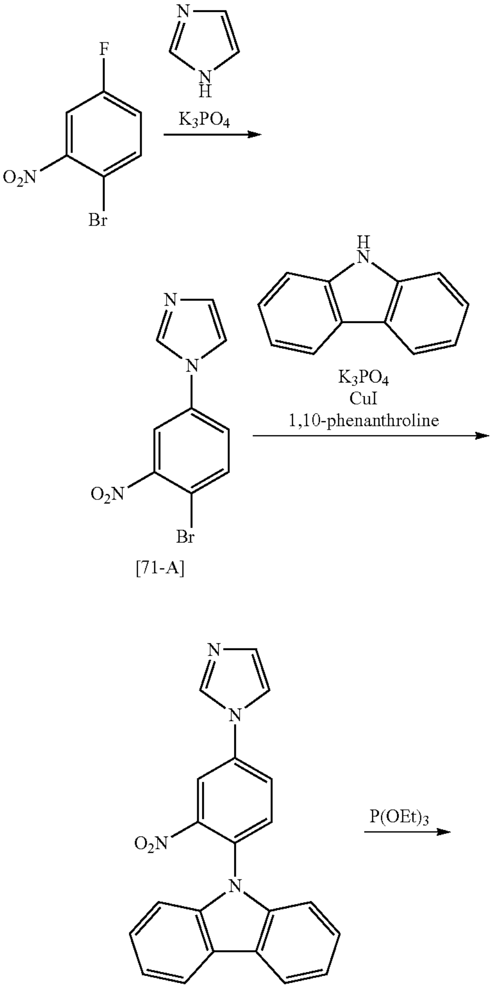

[71-A]

[71-B]

-continued

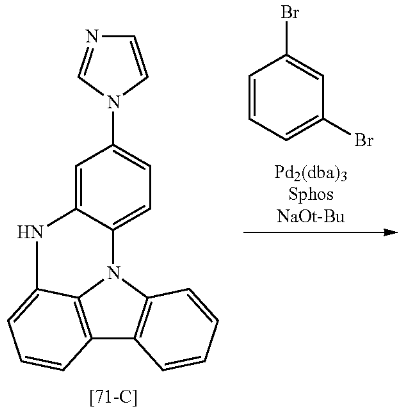

[71-C]

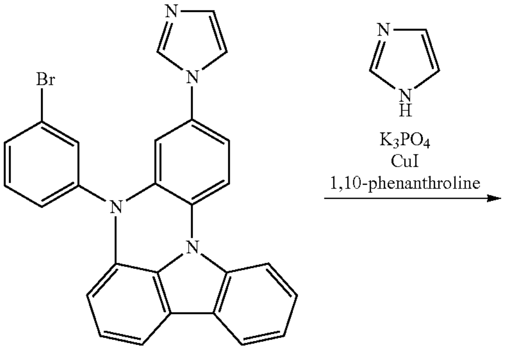

[71-D]

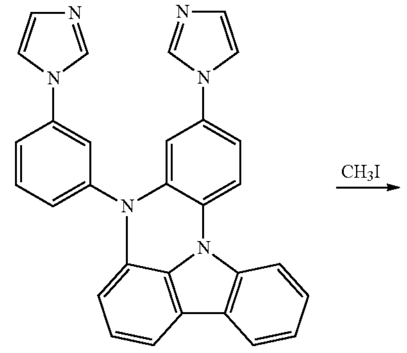

[71-E]

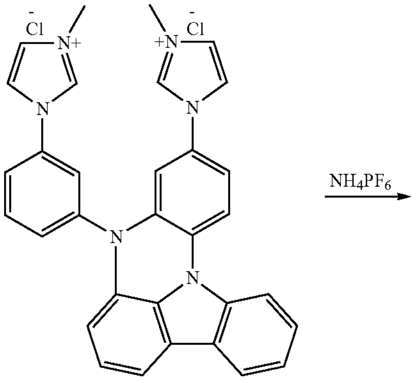

[71-F]

-continued

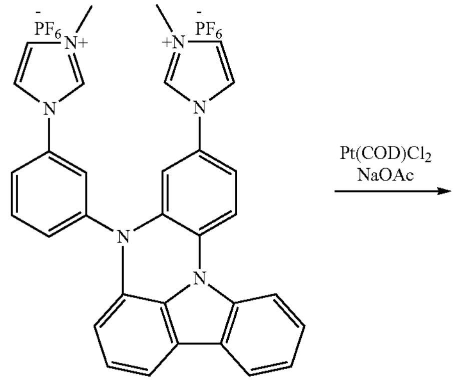

[71-G]

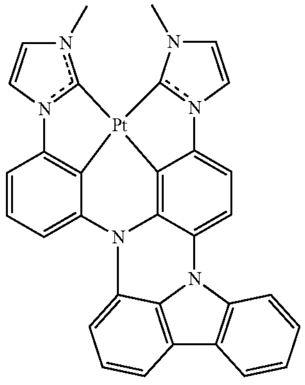

71

(1) Synthesis of Intermediate [71-A]

1-bromo-4-fluoro-2-nitrobenzene (1.0 eq.), imidazole (1.2 eq.), and $K_3PO_4$ (2.0 eq.) were added to a reaction vessel, followed by suspension in DMF (0.25 M). The reaction mixture was heated to a temperature of 160° C. and stirred for 24 hours. Once the reaction was complete, the mixture was cooled to room temperature, and an extraction process was performed thereon by using distilled water and ethyl acetate. The extracted organic layer was washed using saturated NaCl aqueous solution and dried using magnesium sulfate. The residue from which the solvent was removed was separated by using column chromatography to thereby obtain Intermediate [71-A] (yield: 92%).

(2) Synthesis of Intermediate [71-B]

Intermediate [71-A] (1.0 eq.), carbazole (1.2 eq.), $K_2CO_3$ (2.0 eq.), CuI (0.1 eq.), and 1,10-phenanthroline (0.1 eq.) were added to a reaction vessel, followed by suspension in DMF (0.25 M). The reaction mixture was heated to a temperature of 160° C. and stirred for 24 hours. Once the reaction was complete, the mixture was cooled to room temperature, and an extraction process was performed thereon by using distilled water and ethyl acetate. The extracted organic layer was washed using saturated NaCl aqueous solution and dried using magnesium sulfate. The residue from which the solvent was removed was separated by using column chromatography to thereby obtain Intermediate [71-B] (yield: 73%).

(3) Synthesis of Intermediate [71-C]

Intermediate [71-B] (1.0 eq.) and triethylphosphite (6.0 eq.) were added to a reaction vessel, followed by suspension.

The reaction mixture was heated to a temperature of 120° C. and stirred for 12 hours. Once the reaction was complete, the mixture was cooled to room temperature, and the solvent was removed therefrom under reduced pressure. The residue was extracted using distilled water and ethyl acetate. The extracted organic layer was washed using saturated NaCl aqueous solution and dried using magnesium sulfate. The residue from which the solvent was removed was separated by using column chromatography to thereby obtain Intermediate [71-C] (yield: 60%).

(4) Synthesis of Intermediate [71-D]

Intermediate [71-C] (1.0 eq.), 1,3-dibromobenzene (2.0 eq.), $Pd_2(dba)_3$ (0.05 eq.), Sphos (0.075 eq.), and sodium tert-butoxide (2.0 eq.) were added to a reaction vessel, followed by suspension in toluene (0.1 M). The reaction mixture was heated to a temperature of 110° C. and stirred for 4 hours. Once the reaction was complete, the mixture was cooled to room temperature, and an extraction process was performed thereon by using distilled water and ethyl acetate. The extracted organic layer was washed using saturated NaCl aqueous solution and dried using magnesium sulfate. The residue from which the solvent was removed was separated by using column chromatography to thereby obtain Intermediate [71-D] (yield: 65%).

(5) Synthesis of Intermediate [71-E]

Intermediate [71-D] (1.0 eq.), imidazole (1.2 eq.), $K_2CO_3$ (2.0 eq.), CuI (0.1 eq.), and 1,10-phenanthroline (0.1 eq.) were added to a reaction vessel, followed by suspension in DMF (0.25 M). The reaction mixture was heated to a temperature of 160° C. and stirred for 24 hours. Once the reaction was complete, the mixture was cooled to room temperature, and an extraction process was performed thereon by using distilled water and ethyl acetate. The extracted organic layer was washed using saturated NaCl aqueous solution and dried using magnesium sulfate. The residue from which the solvent was removed was separated by using column chromatography to thereby obtain Intermediate [71-E] (yield: 76%).

(6) Synthesis of Intermediate [71-F]

Intermediate [71-F] was synthesized in the same manner as in Synthesis of Intermediate [1-F], except that Intermediate [71-E] was used instead of Intermediate [1-E] (yield: 93%).

(7) Synthesis of Intermediate [71-G]

Intermediate [71-G] was synthesized in the same manner as in Synthesis of Intermediate [1-G], except that Intermediate [71-F] was used instead of Intermediate [1-F] (yield: 90%).

8) Synthesis of Compound 71

Compound 71 was synthesized in the same manner as in Synthesis of Compound 1, except that Intermediate [71-G] was used instead of Intermediate [1-G] (yield: 34%).

The $^1H$ nuclear magnetic resonance (NMR) and mass spectroscopy/fast atom bombardment (MS/FAB) results are shown in Table 1.

TABLE 1

| Compound | $^1H$ NMR ($CDCl_3$, 400 MHz) | MS/FAB found | MS/FAB Calc. |
|---|---|---|---|
| 1 | 2.28(s, 3H), 3.72(s, 6H), 7.07(t, 1H), 7.16-7.18(m, 2H), 7.27(m, 2H), 7.34-7.35(m, 2H), 7.44-7.45(m, 3H), 7.5l(d, 1H), 7.65(d, 1H), 7.72(d, 1H), 7.93(d, 1H), 8.09(d, 1H), 8.56(d, 1H) | 698.18 | 698.69 |
| 11 | 1.42(s, 9H), 2.27(s, 3H), 3.71(s, 6H), 7.08(t, 1H), 7.11(d, 1H), 7.18(d, 1H), 7.28(d, 2H), 7.34(t, 1H), 7.44-7.45(m, 3H), 7.5l(d, 1H), 7.66(d, 1H), 7.72(d, 1H), 7.86 (d, 1H), 8.09(d, 1H), 8.96(s, 1H) | 754.24 | 754.80 |
| 71 | 3.72(s, 6H), 7.16-7.19(m, 2H), 7.24-7.27(m, 4H), 7.32-7.35(m, 3H), 7.41(d, 1H), 7.44(d, 2H), 7.69(d, 1H), 7.86(d, 1H), 7.94(d, 1H), 8.55(d, 1H) | 685.16 | 685.65 |

Methods of synthesizing compounds other than the compounds synthesized in Synthesis Examples 1 to 3 may be easily understood to those skilled in the art by referring to the synthesis pathways and raw materials described above.

Example 1-1

As an anode, a 15 Ohms per square centimeter ($\Omega/cm^2$) (1,200 Å) ITO glass substrate (available from Corning Co., Ltd) was cut to a size of 50 millimeters (mm)×50 mm×0.7 mm, sonicated in isopropyl alcohol and pure water for 5 minutes in each solvent, cleaned with ultraviolet rays for 30 minutes, and with ozone, and was mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred as "NPB") was vacuum-deposited on the hole injection layer to form a hole transport layer having a thickness of 300 Å.

Compound 1 (the first compound), Compound ETH68 (the second compound), and Compound HTH29 (the third compound) were vacuum-deposited on the hole transport layer to form an emission layer having a thickness of 400 Å. Here, the content of Compound 1 was 10 wt %, based on 100 wt % of the total weight of the emission layer, and the weight ratio of Compound ETH68 to Compound HTH29 was 3:7.

Compound ETH2 was deposited on the emission layer to form a hole blocking layer having a thickness of 50 Å, $Alq_3$ was deposited on the hole blocking layer to form an electron transport layer having a thickness of 300 Å, LiF was vacuum-deposited on the electron transport layer to form an electron injection layer having a thickness of 10 Å, and Al was vacuum-deposited on the electron injection layer to form a cathode having a thickness of 3,000 Å, thereby completing the manufacture of an organic light-emitting device.

2-TNATA

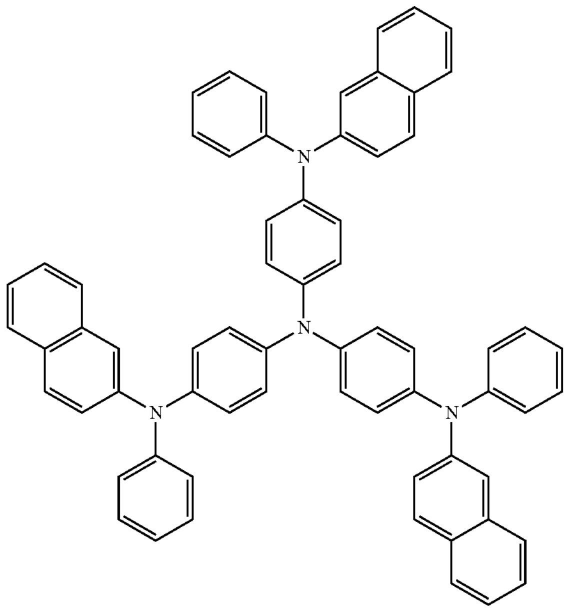

NPB

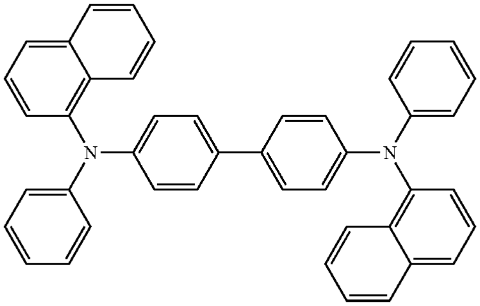

ETH68

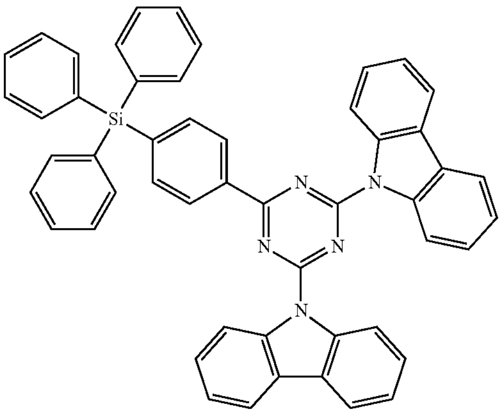

-continued

HTH29

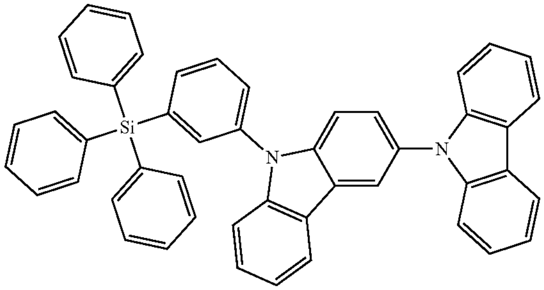

ETH2

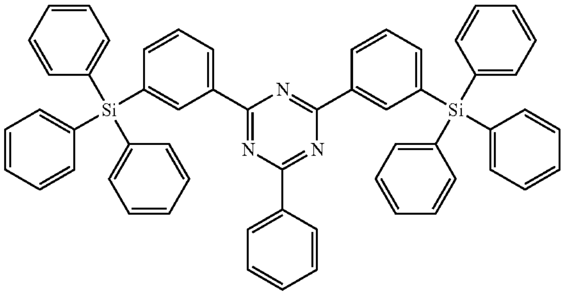

Examples 1-2 and 1-3 and Comparative Examples 1-1 to 1-3

Organic light-emitting devices were manufactured in the same manner as in Example 1-1, except that the first compound, the second compound, and the third compound as shown in Table 2 were used in the formation of the emission layer.

Evaluation Example 1

The driving voltage (V), luminescence efficiency (cd/A), maximum emission wavelength (nm), and lifespan ($LT_{95}$) of the organic light-emitting devices of Examples 1-1 to 1-3 and Comparative Examples 1-1 to 1-3 at 1,000 cd/$m^2$ were measured by using Keithley source-measure unit (SMU) 236 and a luminance meter PR650. The results thereof are shown in Table 2. In Table 2, the lifespan ($LT_{95}$) indicates a time (hour) for the luminance of each light-emitting device to decline to 95% of its initial luminance.

TABLE 2
| | Dopant | Host | | | Driving | Luminescence | Maximum emission | Lifespan |
|---|---|---|---|---|---|---|---|---|
| | First compound | Second compound | Third compound | Luminance ($cd/m^2$) | voltage (V) | efficiency (cd/A) | wavelength (nm) | ($LT_{95}$) (hours) |
| Example 1-1 | 1 | ETH68 | HTH29 | 1000 | 4.3 | 20.1 | 457 | 87.0 |
| Example 1-2 | 11 | ETH68 | HTH29 | 1000 | 4.2 | 20.8 | 458 | 86.9 |
| Example 1-3 | 71 | ETH68 | HTH29 | 1000 | 4.2 | 22.1 | 464 | 90.2 |
| Comparative Example 1-1 | A | ETH68 | HTH29 | 1000 | 4.3 | 17.8 | 465 | 84.1 |
| Comparative Example 1-2 | B | ETH68 | HTH29 | 1000 | 4.7 | 15.1 | 464 | 57.9 |
| Comparative Example 1-3 | C | ETH68 | HTH29 | 1000 | 5.1 | 12.2 | 474 | 13.8 |
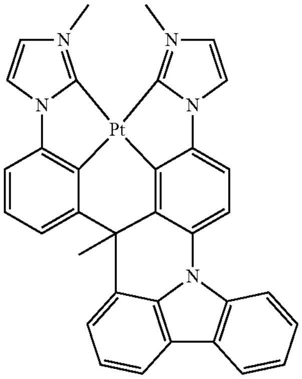
1
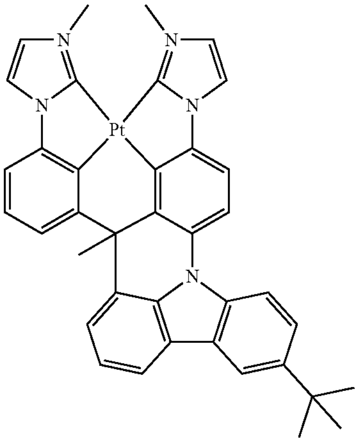
11

TABLE 2-continued
| Dopant | Host | | | Driving | Luminescence | Maximum emission | Lifespan |
|---|---|---|---|---|---|---|---|
| First compound | Second compound | Third compound | Luminance (cd/m$^2$) | voltage (V) | efficiency (cd/A) | wavelength (nm) | ($LT_{95}$) (hours) |
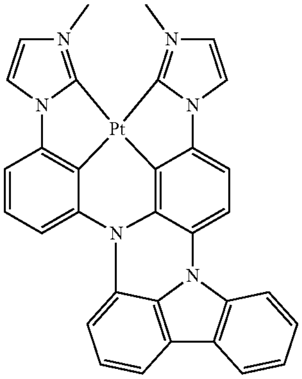
71
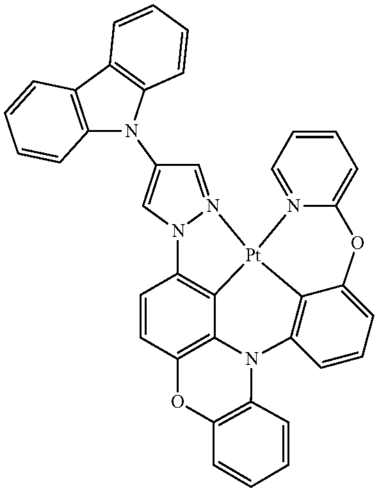
A
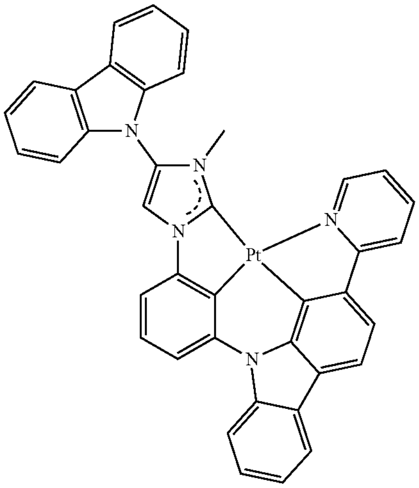
B TABLE 2-continued

| Dopant | Host | | | Driving | Luminescence | Maximum emission | Lifespan |
|---|---|---|---|---|---|---|---|
| First compound | Second compound | Third compound | Luminance ($cd/m^2$) | voltage (V) | efficiency (cd/A) | wavelength (nm) | ($LT_{95}$) (hours) |

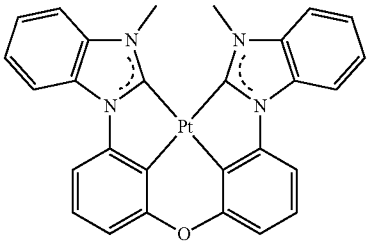

C

Referring to the results of Table 2, the organic light-emitting devices of Examples 1-1 to 1-3 were found to have a low driving voltage, excellent luminescence efficiency, and lifespan characteristics and emit dark blue light.

Examples 2-1 to 2-3 and Comparative Examples 2-1 to 2-3

Organic light-emitting devices were manufactured in the same manner as in Example 1-1, except that the first compound, the second compound, and the third compound as shown in Table 3 were used to form the emission layer, a fourth compound was additionally used, a content of the first compound was 10 wt % based on the total content of (100 wt %) of the emission layer, a content of the fourth compound was 0.5 wt % based on the total content of (100 wt %) of the emission layer, and the weight ratio of the second compound to third compound was adjusted to 3:7.

Evaluation Example 2

The driving voltage (V), luminescence efficiency (cd/A), maximum emission wavelength (nm), and lifespan ($LT_{95}$) of the organic light-emitting devices of Examples 2-1 to 2-3 and Comparative Examples 2-1 to 2-3 at 1,000 $cd/m^2$ were measured by using Keithley SMU 236 and a luminance meter PR650. The results thereof are shown in Table 3. In Table 3, the lifespan ($LT_{95}$) indicates a time (hour) for the luminance of each light-emitting device to decline to 95% of its initial luminance.

TABLE 3

| | Ancillary dopant | Host | | Dopant | | Driving | Luminescence | | Lifespan |
|---|---|---|---|---|---|---|---|---|---|
| | First compound | Second compound | Third compound | Fourth compound | Luminance ($cd/m^2$) | voltage (V) | efficiency (cd/A) | Emission wavelength (nm) | ($LT_{95}$) (hours) |
| Example 2-1 | 1 | ETH68 | HTH29 | DFD2 | 1000 | 4.4 | 18.9 | 461 | 56.3 |
| Example 2-2 | 11 | ETH68 | HTH29 | DFD2 | 1000 | 4.4 | 18.1 | 461 | 54.9 |
| Example 2-3 | 71 | ETH68 | HTH29 | DFD2 | 1000 | 4.3 | 19.3 | 461 | 58.1 |
| Comparative Example 2-1 | A | ETH68 | HTH29 | DFD2 | 1000 | 4.5 | 16.7 | 461 | 49.9 |
| Comparative Example 2-2 | B | ETH68 | HTH29 | DFD2 | 1000 | 4.7 | 13.5 | 462 | 34.1 |
| Comparative Example 2-3 | C | ETH68 | HTH29 | DFD2 | 1000 | 5.0 | 10.5. | 472 | 10.1 |

Referring to the results of Table 3, the organic light-emitting devices of Examples 2-1 to 2-3 were found to have a low driving voltage, excellent luminescence efficiency, and lifespan characteristics and emit dark blue light.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first electrode;

a second electrode facing the first electrode;

an interlayer disposed between the first electrode and the second electrode and comprising an emission layer; and an organometallic compound represented by Formula 1:

[Formula 1]

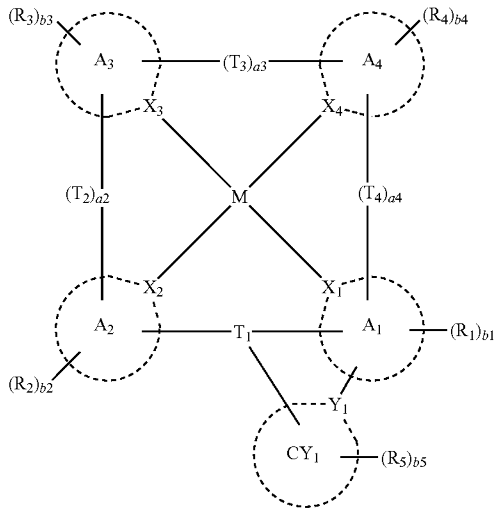

wherein in Formula 1,

M is platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$ are each independently carbon (C) or nitrogen (N), $Y_1$ is N, $A_1$ to $A_4$ are each independently a $C_3$-$C_{60}$ carbocyclic group or a $C_1$-$C_{60}$ heterocyclic group, $CY_1$ is a $C_1$-$C_{60}$ heterocyclic group, $T_1$ is N, B, P, $C(Z_{11})$, $Si(Z_{11})$, or $Ge(Z_{11})$, $T_2$ to $T_4$ are each independently a single bond, a double bond, *—N($Z_{21}$)—*', *—B($Z_{21}$)—*—P($Z_{21}$)—*', *—C($Z_{21}$)($Z_{22}$)—*', *—Si($Z_{21}$)($Z_{22}$)*', *—Ge($Z_{21}$)($Z_{22}$)—*', *—S—*', *—Se—*', *—O—*', *—C(═O)—*', *—S(═O)—*', *—S(═O)$_2$—*', *—C($Z_{21}$)═*', *═C($Z_{21}$)—*', *—C($Z_{21}$)═C($Z_{22}$)—*', *—C(═S)—*', or *—C≡C—*', a2 to a4 are each independently an integer from 0 to 3, $R_1$ to $R_5$, $Z_{11}$, $Z_{21}$, and $Z_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b1 to b5 are each independently an integer from 0 to 10, two $R_1$(s) of at least two $R_1$(s) when b1 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_2$(s) of at least two $R_2$(s) when b2 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_3$(s) of at least two $R_3$(s) when b3 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_4$(s) of at least two $R_4$(s) when b4 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_5$(s) of at least two $R_5$(s) when b5 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, and

* and *' each indicate a binding site to an adjacent atom.

2. The light-emitting device of claim 1, wherein the interlayer comprises:

a first compound that is the organometallic compound represented by Formula 1; and a second compound comprising at least one π electron-deficient nitrogen-containing $C_1$-$C_{60}$ cyclic group, a third compound comprising a group represented by Formula 3, a fourth compound capable of emitting delayed fluorescence, or a combination thereof, and the first compound, the second compound, the third compound, and the fourth compound are different from one another:

[Formula 3]

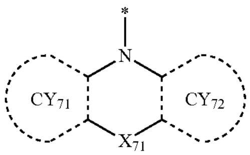

wherein in Formula 3, ring $CY_{71}$ and ring $CY_{72}$ are each independently a π electron-rich $C_3$-$C_{60}$ cyclic group or a pyridine group, $X_{71}$ is a single bond or a linking group comprising O, S, N, B, C, Si, or a combination thereof,

* indicates a binding site to an adjacent atom in the third compound, and the following compounds are excluded from the third compound:

CBP

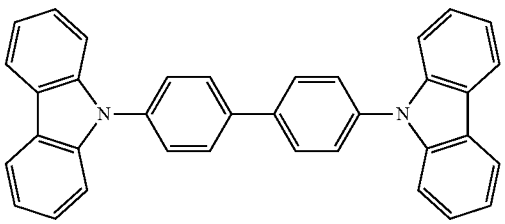

mCBP

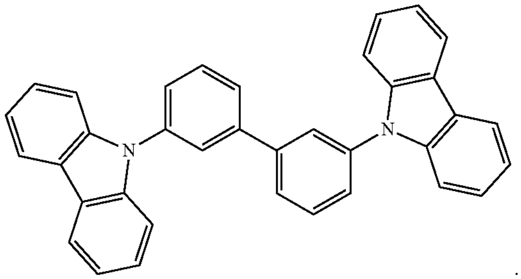

.

3. The light-emitting device of claim 2, wherein the emission layer comprises:

the first compound; and the second compound, the third compound, the fourth compound, or a combination thereof, and the emission layer emits phosphorescence or fluorescence emitted from the first compound.

4. The light-emitting device of claim 2, wherein the second compound comprises a pyridine group, a pyrimidine group, a pyrazine group, a pyridazine group, a triazine group, or a combination thereof.

5. The light-emitting device of claim 2, wherein the fourth compound is a compound comprising at least one cyclic group comprising boron (B) and nitrogen (N) as ring-forming atoms.

6. The light-emitting device of claim 2, wherein the second compound comprises a compound represented by Formula 2:

[Formula 2]

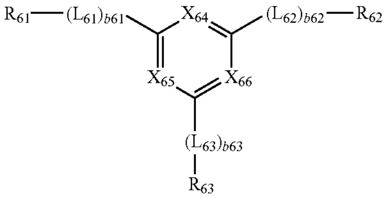

wherein in Formula 2, $L_{61}$ to $L_{63}$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b61 to b63 are each independently an integer from 1 to 5, $X_{64}$ is N or $C(R_{64})$, $X_{65}$ is N or $C(R_{65})$, $X_{66}$ is N or $C(R_{66})$, at least one of $X_{64}$ to $X_{66}$ is N, $R_{61}$ to $R_{66}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $R_{10a}$ and $Q_1$ to $Q_3$ are respectively the same as described in connection with $R_{10a}$ and $Q_1$ to $Q_3$ in Formula 1.

7. The light-emitting device of claim 2, wherein at least one of Conditions 1 to 4 is satisfied:

LUMO energy level in electron volts (eV) of the third compound>LUMO energy level in electron volts (eV) of the first compound [Condition 1]

LUMO energy level in electron volts (eV) of the first compound>LUMO energy level in electron volts (eV) of the second compound [Condition 2]

HOMO energy level in electron volts (eV) of the first compound>HOMO energy level in electron volts (eV) of the third compound [Condition 3]

HOMO energy level in electron volts (eV) of the third compound>HOMO energy level in electron volts (eV) of the second compound. [Condition 4]

8. An electronic apparatus comprising:

the light-emitting device of claim 1; and a thin-film transistor, wherein the thin-film transistor comprises a source electrode and a drain electrode, and the first electrode of the light-emitting device is electrically connected to at least one of the source electrode and the drain electrode of the thin-film transistor.

9. The electronic apparatus of claim 8, further comprising a color filter, a color-conversion layer, a touchscreen layer, a polarization layer, or a combination thereof.

10. An organometallic compound represented by Formula 1:

[Formula 1]

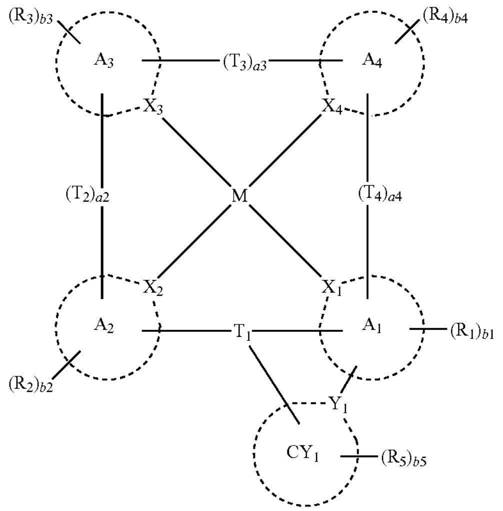

wherein in Formula 1,

M is platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$ are each independently carbon (C) or nitrogen (N), $Y_1$ is N, $A_1$ to $A_4$ are each independently a $C_3$-$C_{60}$ carbocyclic group or a $C_1$-$C_{60}$ heterocyclic group, $CY_1$ is a $C_1$-$C_{60}$ heterocyclic group, $T_1$ is N, B, P, $C(Z_{11})$, $Si(Z_{11})$, or $Ge(Z_{11})$, $T_2$ to $T_4$ are each independently a single bond, a double bond, *—N($Z_{21}$)—*', *—B($Z_{21}$)—*', *—P($Z_{21}$)—*', *—C($Z_{21}$)($Z_{22}$)—*', *—Si($Z_{21}$)($Z_{22}$)*', *—Ge($Z_{21}$)($Z_{22}$)—*', *—S—*', *—Se—*', *—O—*', *—C(═O)—*', *—S(═O)—*', *—S(═O)$_2$—*', *—C($Z_{21}$)═*', *═C($Z_{21}$)—*', *—C($Z_{21}$)═C($Z_{22}$)—*', *—C(═S)—*', or *—C≡C—*', a2 to a4 are each independently an integer from 0 to 3, $R_1$ to $R_5$, $Z_{11}$, $Z_{21}$, and $Z_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b1 to b5 are each independently an integer from 0 to 10, two $R_1$(s) of at least two $R_1$(s) when b1 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_2$(s) of at least two $R_2$(s) when b2 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_3$(s) of at least two $R_3$(s) when b3 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_4$(s) of at least two $R_4$(s) when b4 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_5$(s) of at least two $R_5$(s) when b5 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_1$), —S(═O)$_2$($Q_{11}$), —P(═O)($Q_1$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, and

* and *' each indicate a binding site to an adjacent atom.

11. The organometallic compound of claim 10, wherein a bond between $X_1$ and M is a covalent bond, a bond between $X_2$ and M is a covalent bond, a bond between $X_3$ and M is a coordinate bond, and a bond between $X_4$ and M is a covalent bond or a coordinate bond.

12. The organometallic compound of claim 10, wherein $A_3$ is an $X_3$-containing 5-membered ring or an $X_3$-containing 5-membered ring to which at least one 6-membered ring is condensed, and $A_4$ is an $X_4$-containing 5-membered ring, an $X_4$-containing 5-membered ring to which at least one 6-membered ring is condensed, or an $X_4$-containing 6-membered ring.

13. The organometallic compound of claim 10, wherein a group represented by

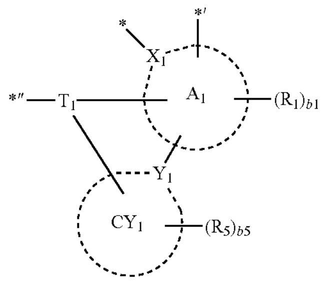

in Formula 1 is a group represented by one of Formulae A1(1) to A1 (32):

A1(1)

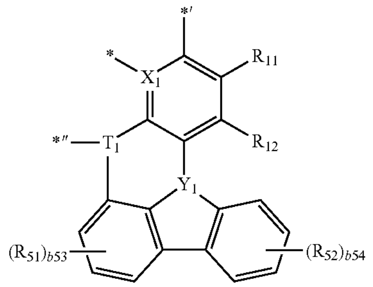

A1(2)

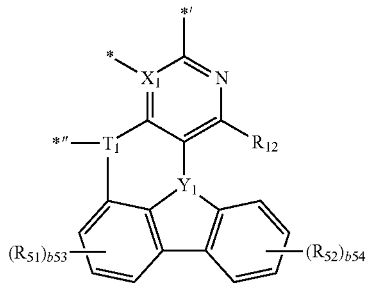

A1(3)

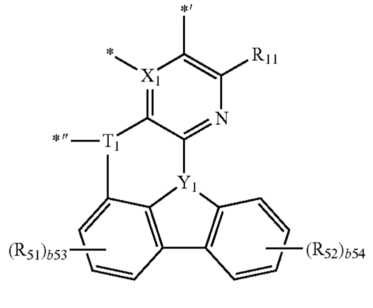

-continued

A1(4)

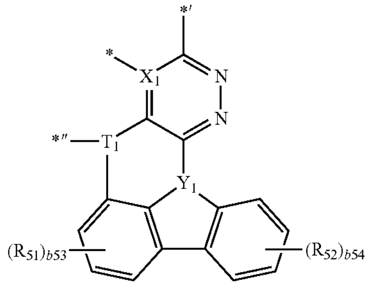

A1(5)

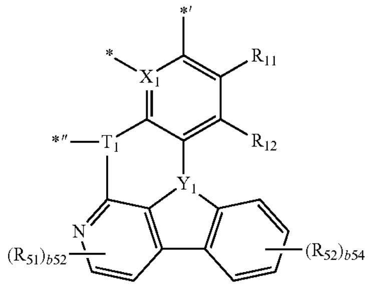

A1(6)

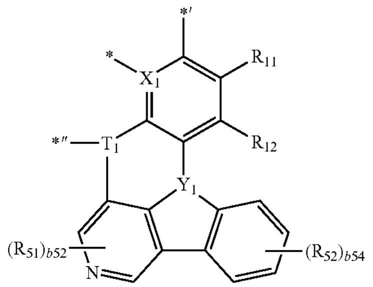

A1(7)

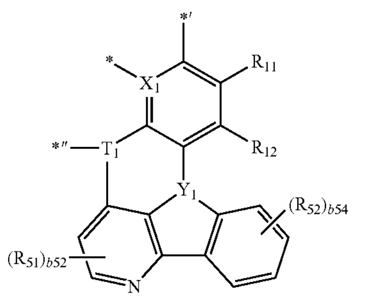

A1(8)

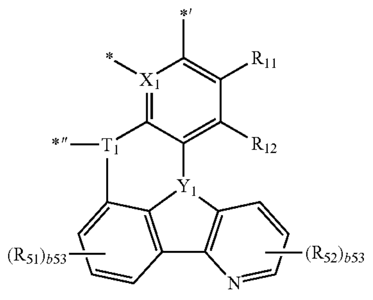

-continued
A1(9)
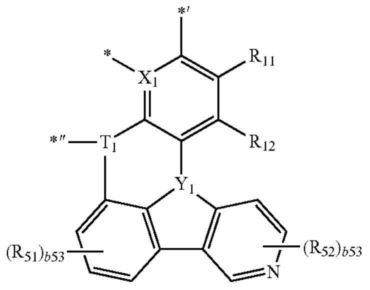
A1(10)
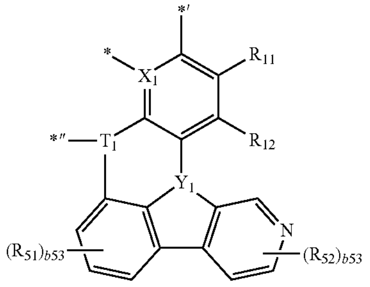
A1(11)
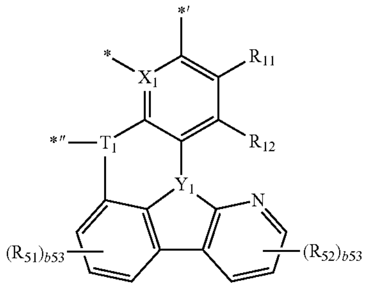
A1(12)
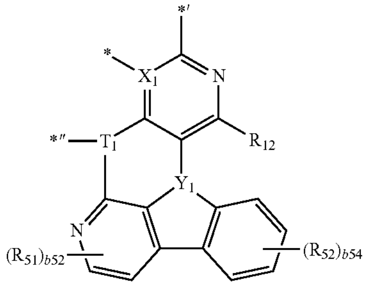
A1(13)
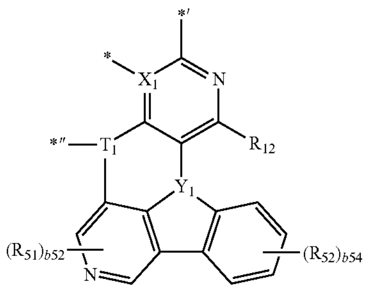
-continued
A1(14)
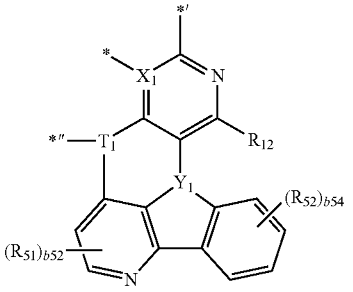
A1(15)
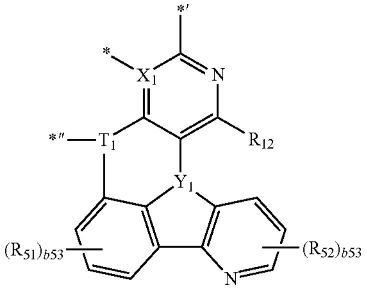
A1(16)
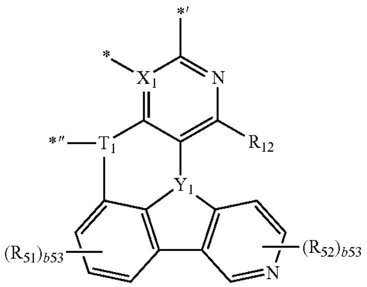
A1(17)
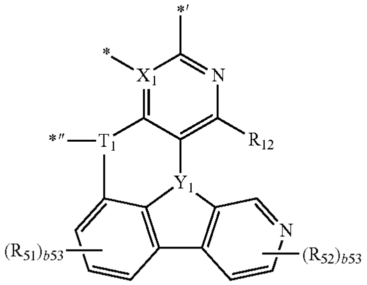
A1(18)
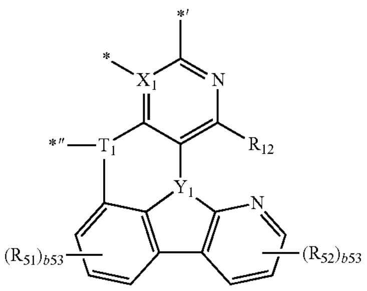

-continued
A1(19)
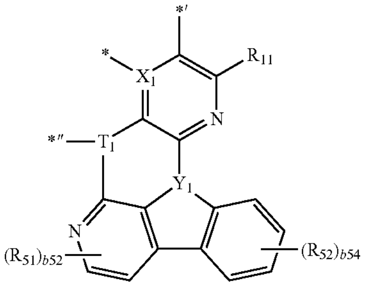
A1(20)
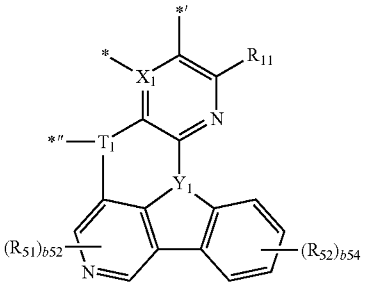
A1(21)
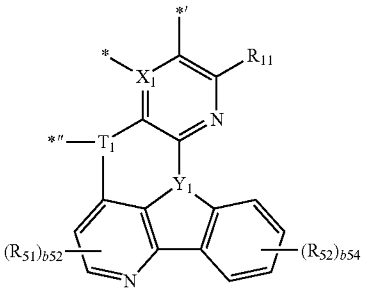
A1(22)
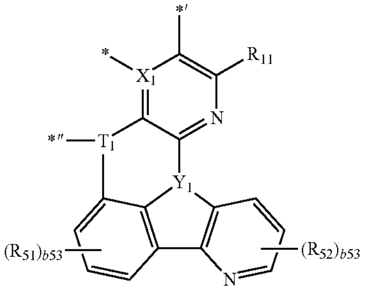
A1(23)
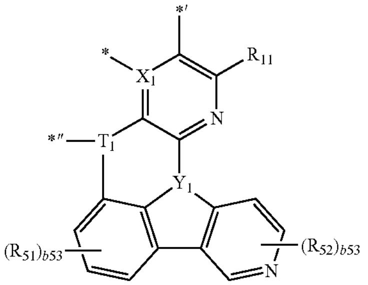
-continued
A1(24)
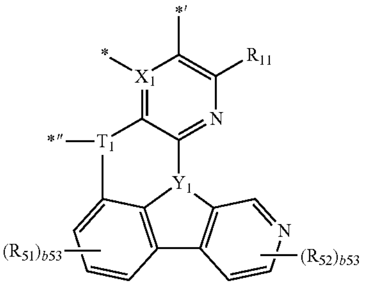
A1(25)
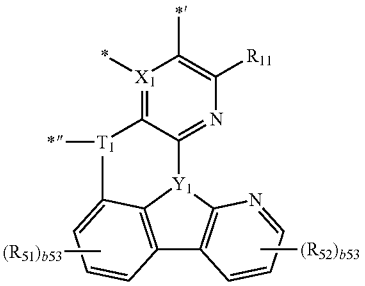
A1(26)
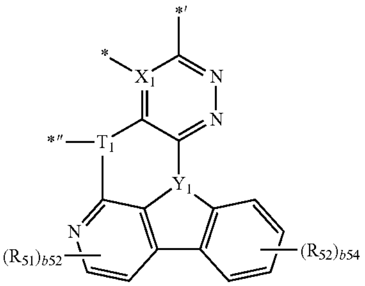
A1(27)
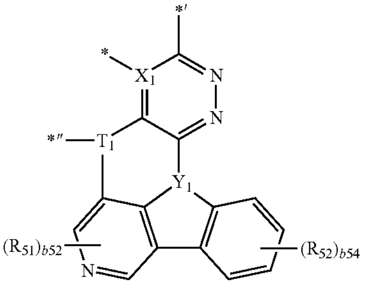
A1(28)
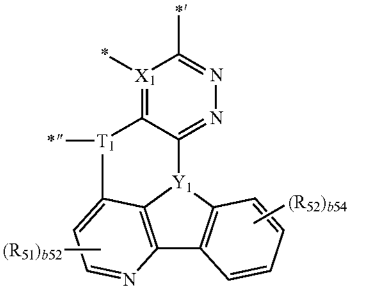

-continued

A1(29)

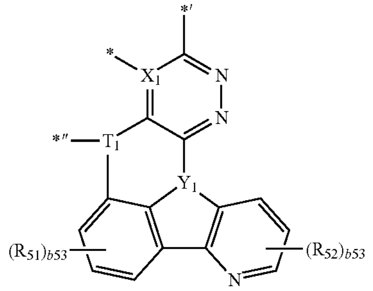

A1(30)

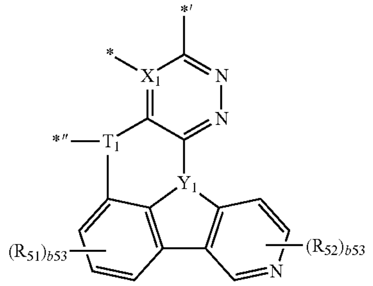

A1(31)

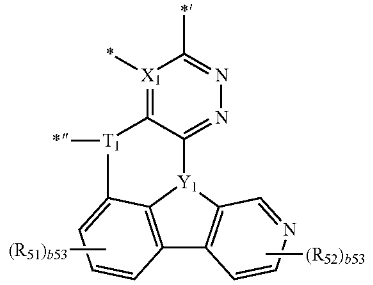

A1(32)

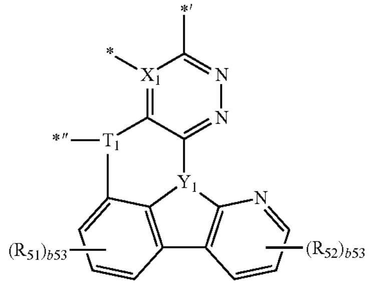

wherein in Formulae A1(1) to A1(32), $X_1$, $T_1$, and $Y_{1a}$ re respectively the same as described in connection with $X_1$, $T_1$, and $Y_1$ in Formula 1, $R_{11}$ and $R_{12}$ are each independently the same as described in connection with $R_1$ in Formula 1, $R_{51}$ and $R_{52}$ are each independently the same as described in connection with $R_5$ in Formula 1, b52 is an integer from 0 to 2, b53 is an integer from 0 to 3, b54 is an integer from 0 to 4, $R_{11}$ and $R_{12}$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{51}$(s) of at least two $R_{51}$(s) when b53 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{51}$(s) when b52 is 2 are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{52}$(s) of at least two $R_{52}$(s) when b54 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{52}$(s) of at least two $R_{52}$(s) when b53 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is the same as described in connection with $R_{10a}$ in Formula 1,

* indicates a binding site to M in Formula 1,

*' indicates a binding site to $T_4$ in Formula 1, and

*" indicates a binding site to $A_2$ in Formula 1.

14. The organometallic compound of claim 10, wherein a group represented by

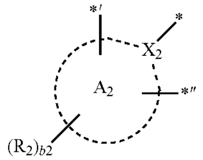

in Formula 1 is a group represented by one of Formulae A2-1 to A2-8:

A2-1

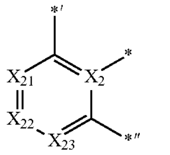

A2-2

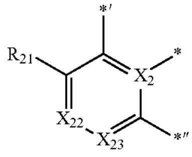

A2-3

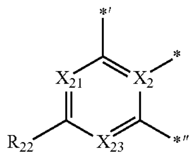

A2-4

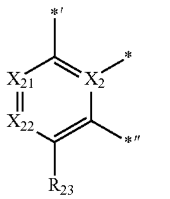

-continued

A2-5

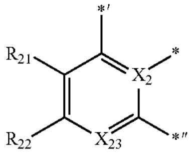

A2-6

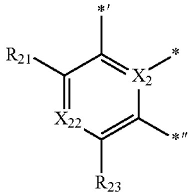

A2-7

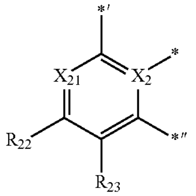

A2-8

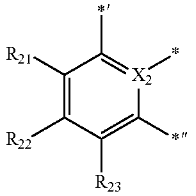

wherein in Formulae A2-1 to A2-8, $X_2$ is the same as described in connection with $X_2$ in Formula 1, $X_{21}$ to $X_{23}$ are each independently the same as described in connection with $X_2$ in Formula 1, $R_{21}$ to $R_{23}$ are each independently the same as described in connection with $R_2$ in Formula 1, and $R_{21}$ to $R_{23}$ are each not hydrogen, two of $R_{21}$ to $R_{23}$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is the same as described in connection with $R_{10a}$ in Formula 1,

* indicates a binding site to M in Formula 1,

*' indicates a binding site to $T_2$ in Formula 1, and

*" indicates a binding site to $T_1$ in Formula 1.

15. The organometallic compound of claim 10, wherein a group represented by

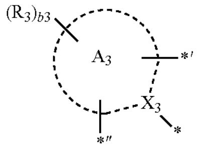

in Formula 1 is a group represented by one of Formulae A3-1 to A3-15:

A3-1

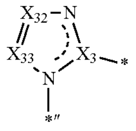

A3-2

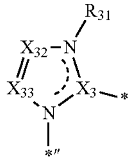

A3-3

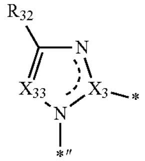

A3-4

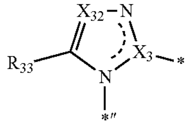

A3-5

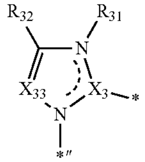

A3-6

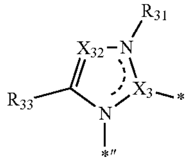

A3-7

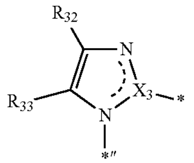

A3-8

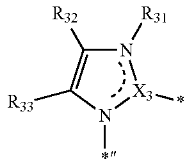

A3-9

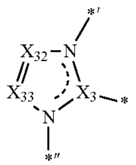

-continued

A3-10

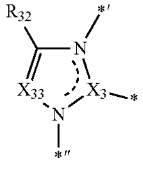

A3-11

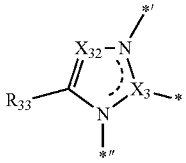

A3-12

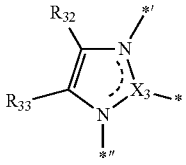

A3-13

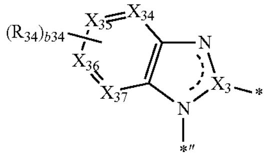

A3-14

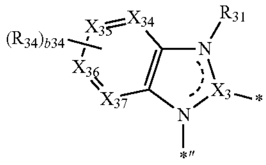

A3-15

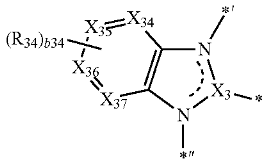

wherein in Formulae A3-1 to A3-15, $X_3$ is the same as described in connection with $X_3$ in Formula 1, $X_{32}$ to $X_{37}$ are each independently the same as described in connection with $X_3$ in Formula 1, $R_{31}$ to $R_{34}$ are each independently the same as described in connection with $R_3$ in Formula 1, and $R_{31}$ to $R_{33}$ are each not hydrogen, b34 is an integer from 0 to 4, two of $R_{31}$ to $R_{34}$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{34}$(s) of at least two $R_{34}$(s) when b34 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is the same as described in connection with $R_{10a}$ in Formula 1,

* indicates a binding site to M in Formula 1,

*" indicates a binding site to $T_2$ in Formula 1, and

*' in Formulae A3-9 to A3-12 and A3-15 is a binding site to $T_3$ in Formula 1.

16. The organometallic compound of claim 10, wherein a group represented by

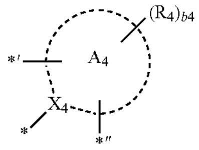

in Formula 1 is a group represented by one of Formulae A4-1 to A4-32:

A4-1

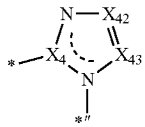

A4-2

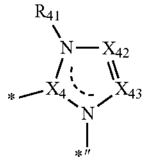

A4-3

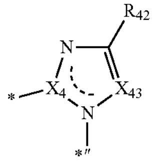

A4-4

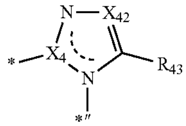

A4-5

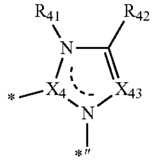

A4-6

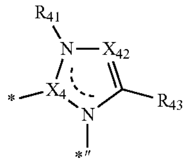

A4-7

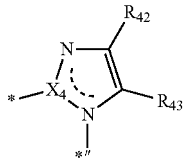

-continued
A4-8
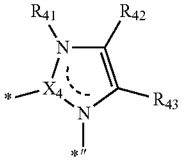
A4-9
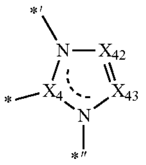
A4-10
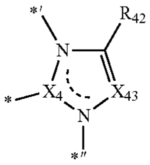
A4-11
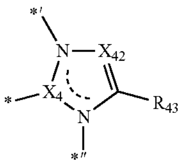
A4-12
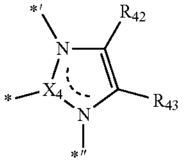
A4-13
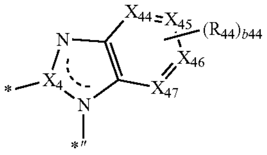
A4-14
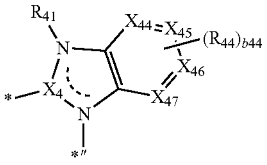
A4-15
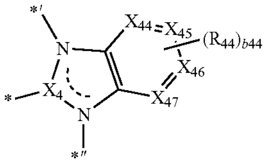
A4-16
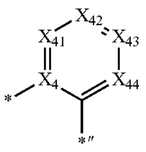
-continued
A4-17
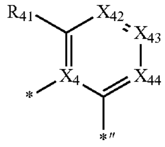
A4-18
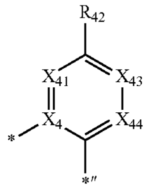
A4-19
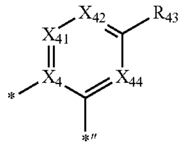
A4-20
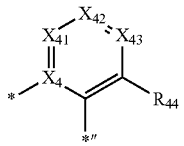
A4-21
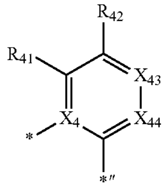
A4-22
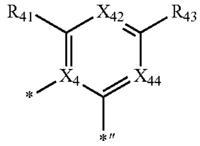
A4-23
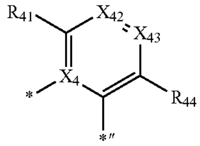
A4-24
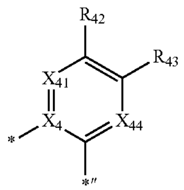
A4-25
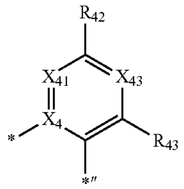

-continued

A4-26

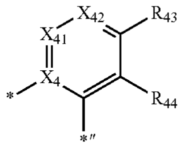

A4-27

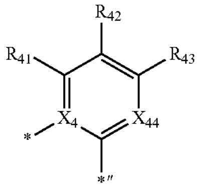

A4-28

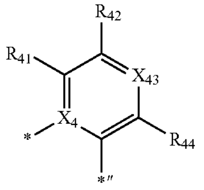

A4-29

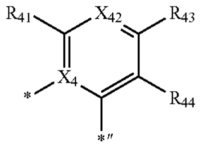

A4-30

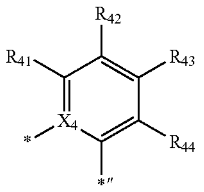

A4-31

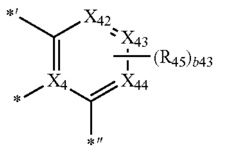

A4-32

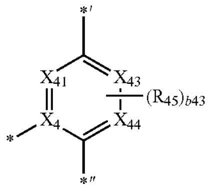

wherein in Formulae A4-1 to A4-32, $X_4$ is the same as described in connection with $X_4$ in Formula 1, $X_{41}$ to $X_{47}$ are each independently the same as described in connection with $X_4$ in Formula 1, $R_{41}$ to $R_{45}$ are each independently the same as described in connection with $R_4$ in Formula 1, and $R_{41}$ to $R_{43}$ are each not hydrogen, $R_{44}$ in Formulae A4-20, A4-25, A4-26, and A4-28 to A4-30 is not hydrogen, b43 is an integer from 0 to 3, b44 is an integer from 0 to 4, two of $R_{41}$ to $R_{45}$ are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{44}$(s) of at least two $R_{44}$(s) when b44 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{45}$(s) of at least two $R_{45}$(s) when b43 is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is the same as described in connection with $R_{10a}$ in Formula 1,

* indicates a binding site to M in Formula 1,

*" indicates a binding site to $T_4$ in Formula 1, and

*' in Formulae A4-9 to A4-12, A4-15, A4-31, and A4-32 is a binding site to $T_3$ in Formula 1.

17. The organometallic compound of claim 10, wherein $CY_1$ is a $Y_1$-containing 5-membered ring, a $Y_1$-containing 5-membered ring condensed to at least one 6-membered ring, or a $Y_1$-containing 6-membered ring.

18. The organometallic compound of claim 10, wherein a group represented by

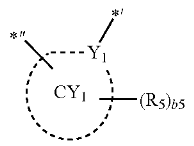

in Formula 1 is a group represented by Formula CY1(a):

CY1(a)

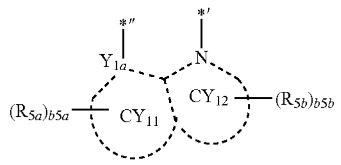

wherein in Formula CY1(a), $Y_{1a}$ is C or N, $CY_{11}$ is a $C_3$-$C_{60}$ carbocyclic group or a $C_1$-$C_{60}$ heterocyclic group, $CY_{12}$ is the same as described in connection with $CY_1$ in Formula 1, $R_{5a}$ and $R_{5b}$ are each independently the same as described in connection with $R_5$ in Formula 1, b5a and b5b are each independently the same as described in connection with b5 in Formula 1, two $R_{5a}$(s) of at least two $R_{5a}$(s) when b5a is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two $R_{5b}$(s) of at least two $R_{5b}$(s) when b5b is 2 or greater are optionally bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is the same as described in connection with $R_{10a}$ in Formula 1,

*' indicates a binding site to $A_1$ in Formula 1, and
*" indicates a binding site to $T_1$ in Formula 1.
19. The organometallic compound of claim 10, wherein the organometallic compound is selected from Compounds 1 to 105:
1
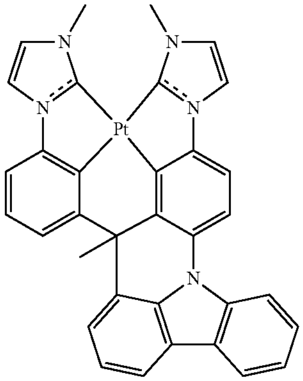
2
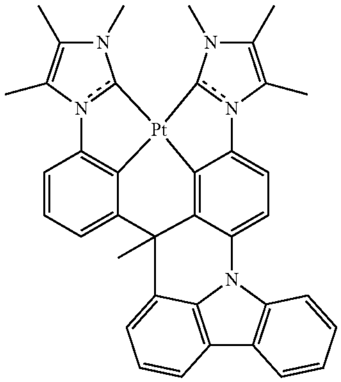
3
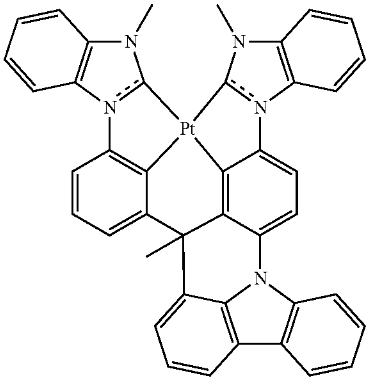
-continued
4
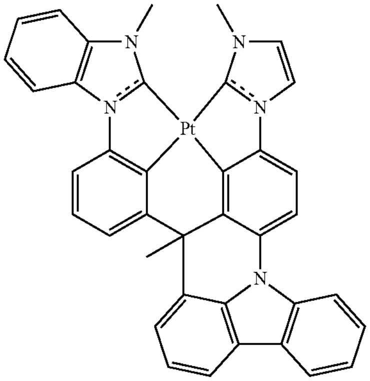
5
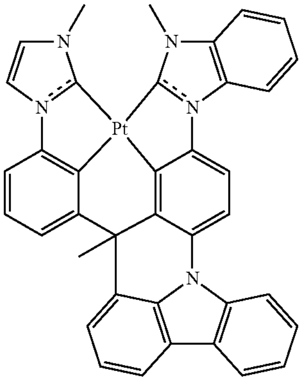
6
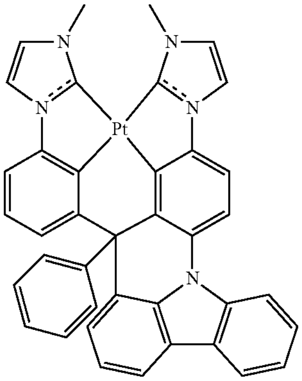
7
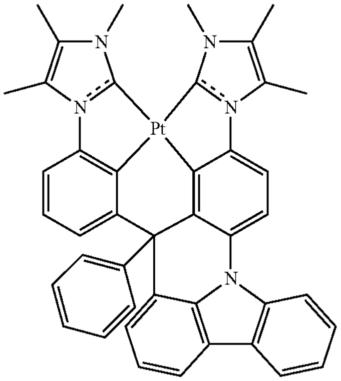

8
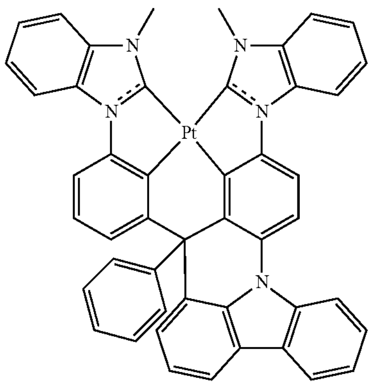
9
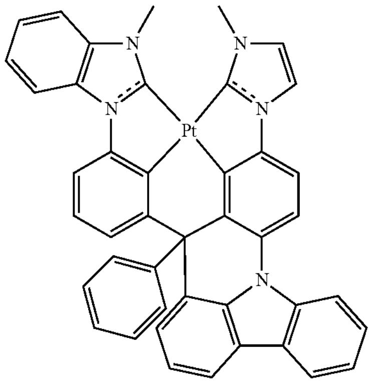
10
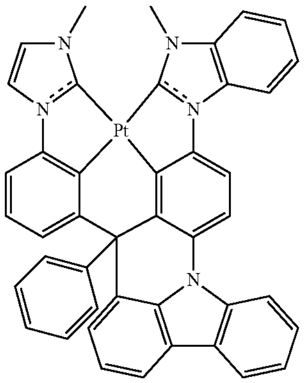
11
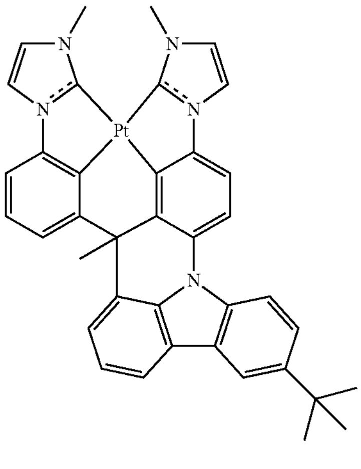
12
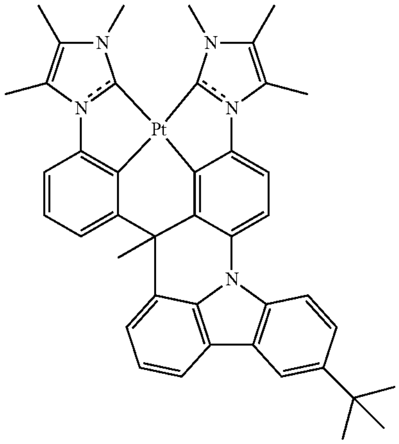
13
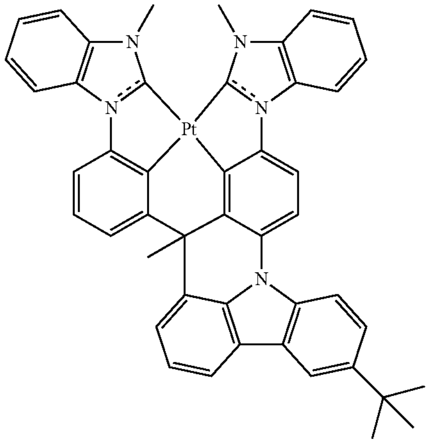
14
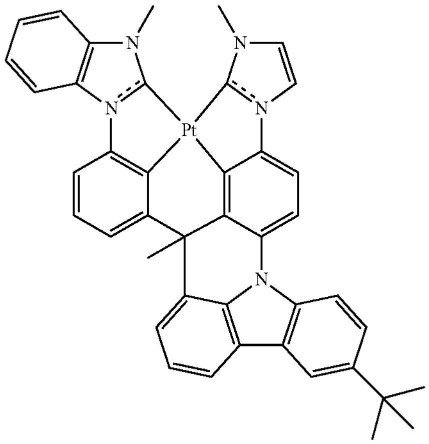

-continued
15
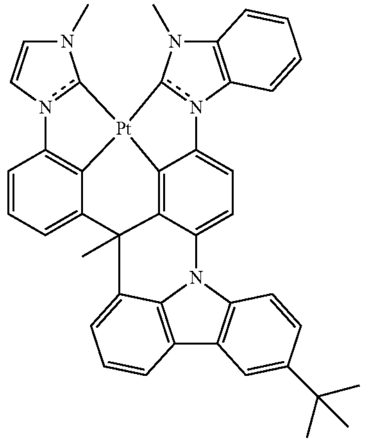
16
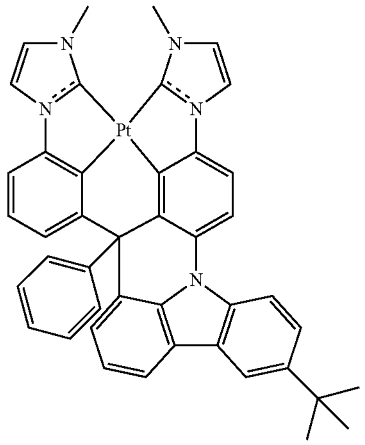
17
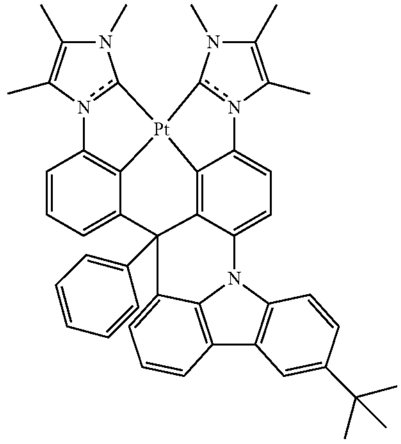
-continued
18
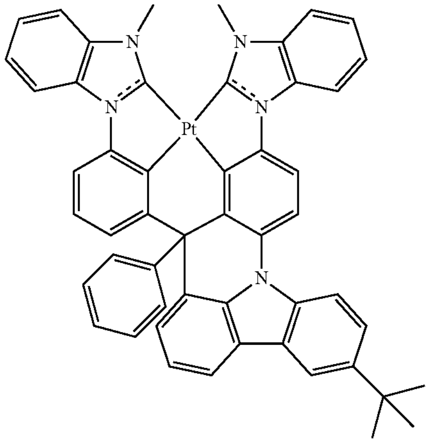
19
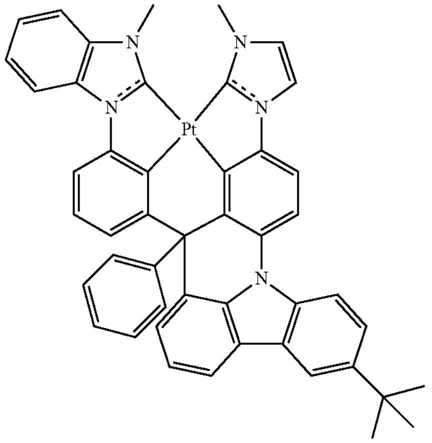
20
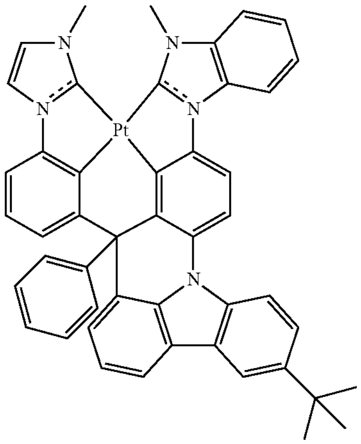

-continued
21
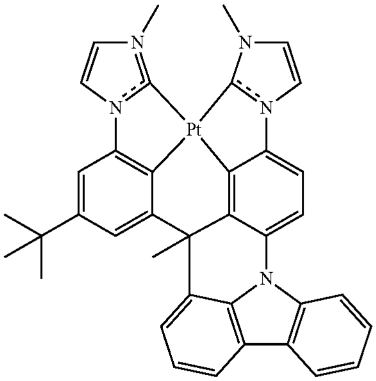
22
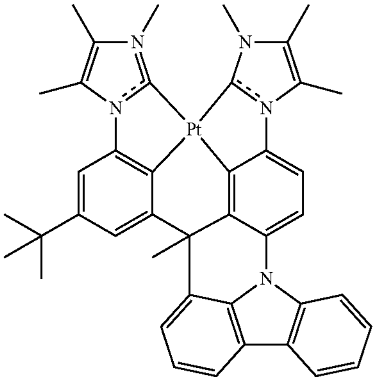
23
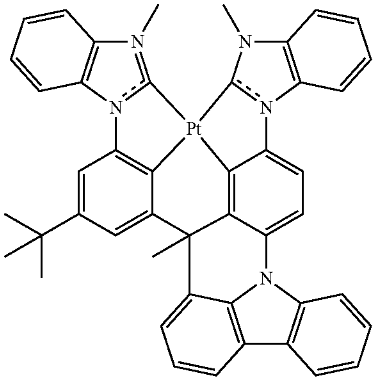
24
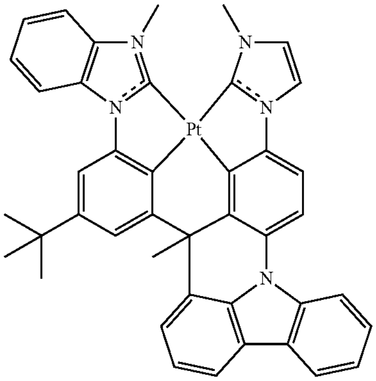
-continued
25
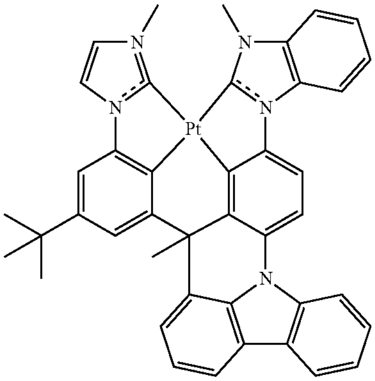
26
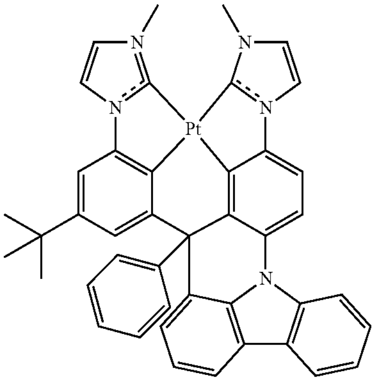
27
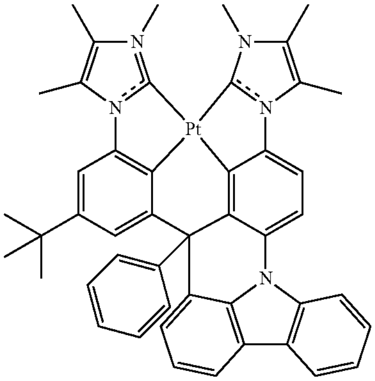
28
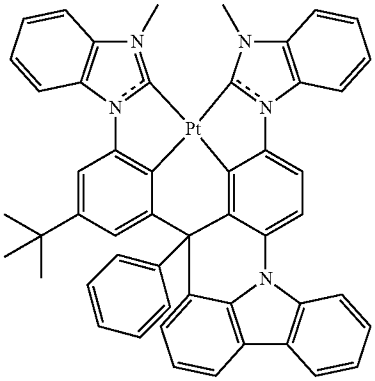

-continued
29
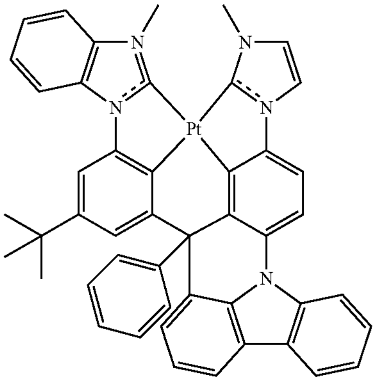
30
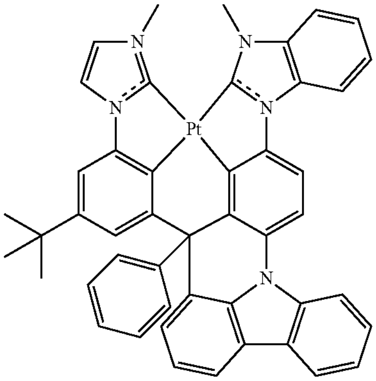
31
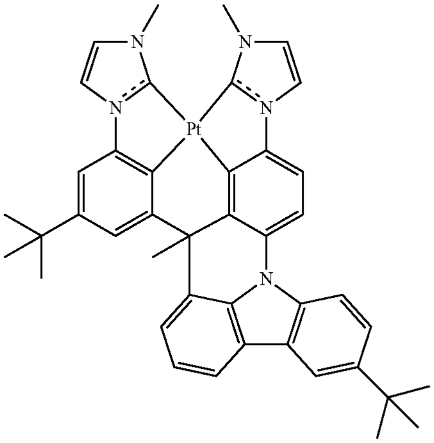
32
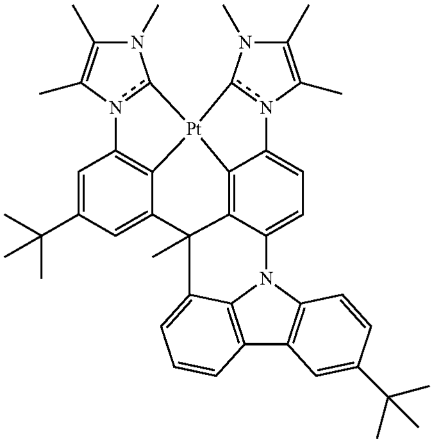
-continued
33
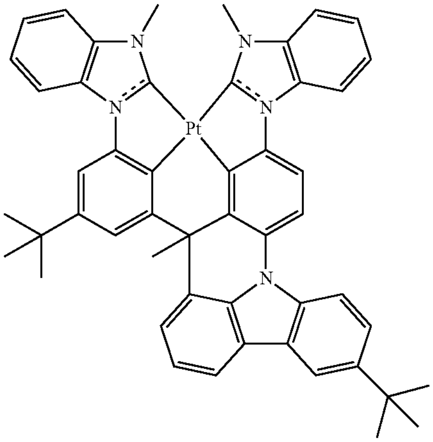
34
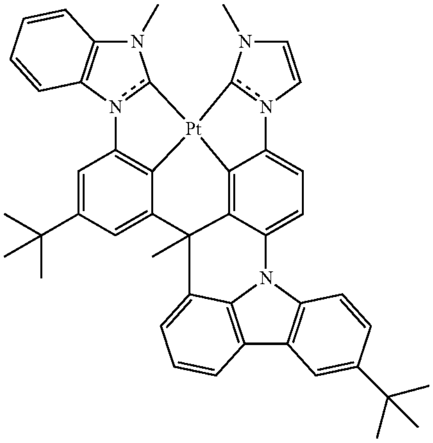
35
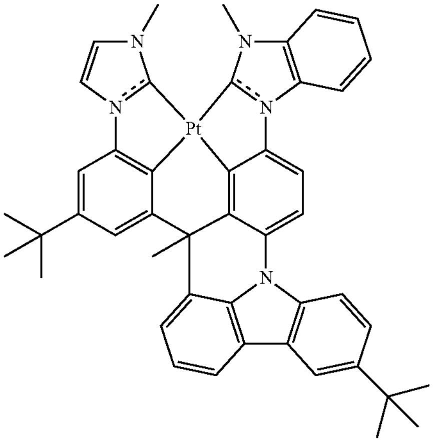

-continued
36
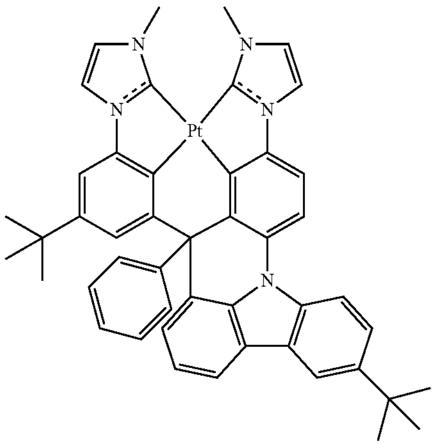
37
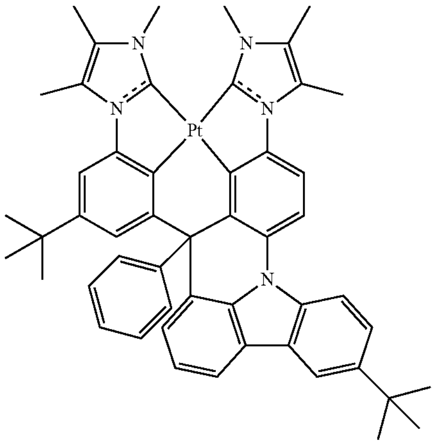
38
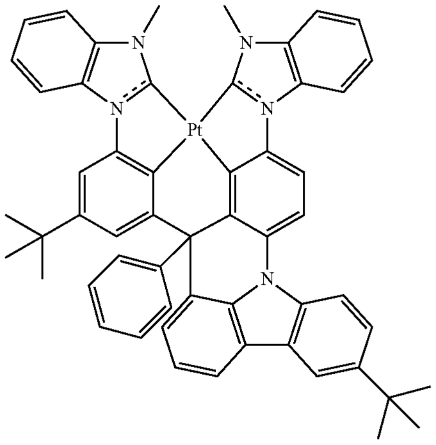
-continued
39
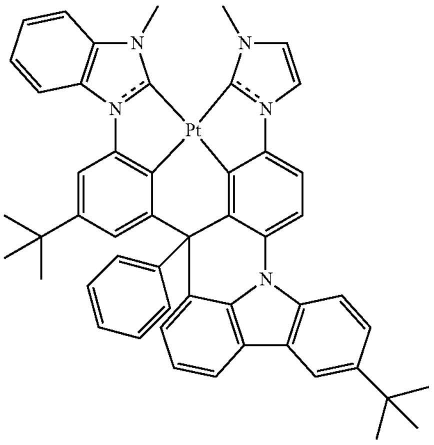
40
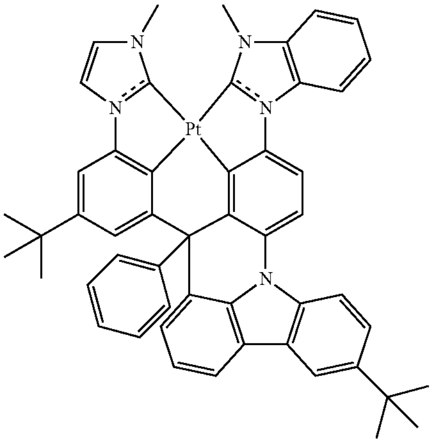
41
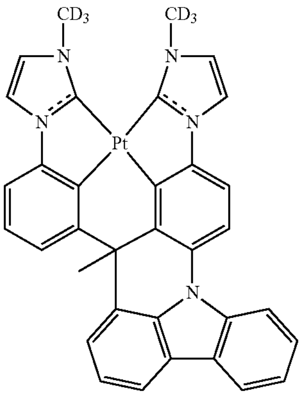

-continued
42
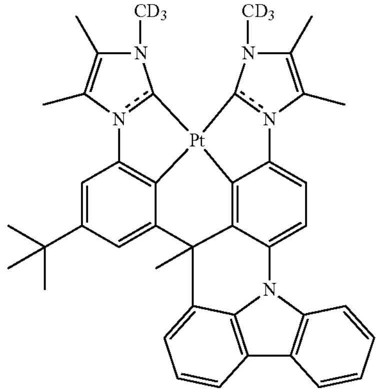
43
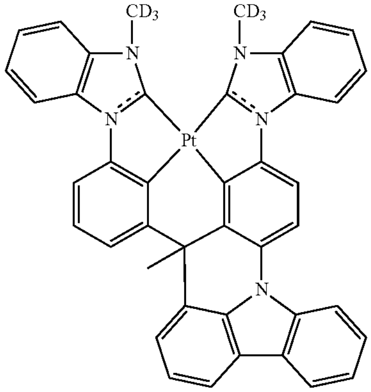
44
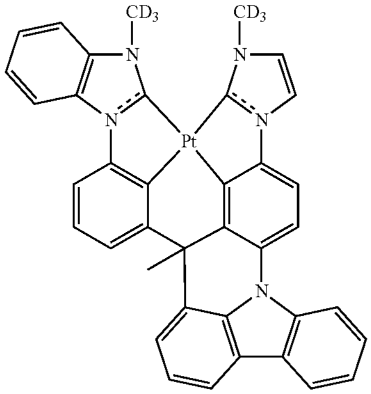
45
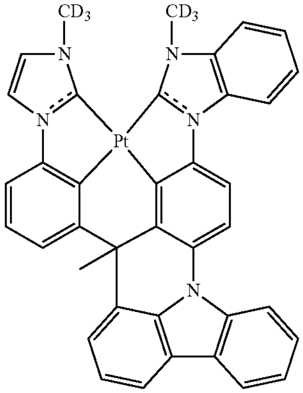
-continued
46
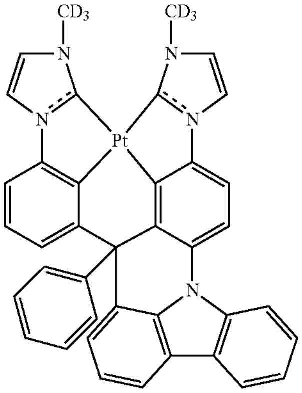
47
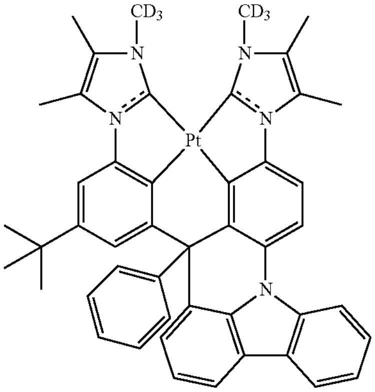
48
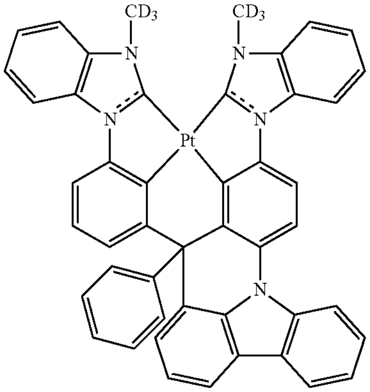
49
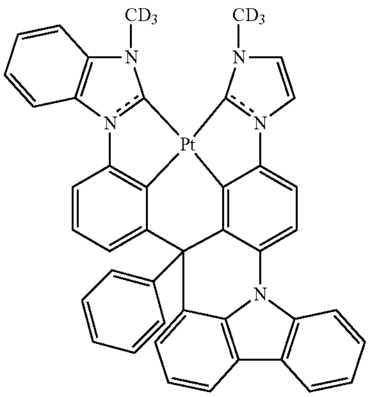

-continued
50
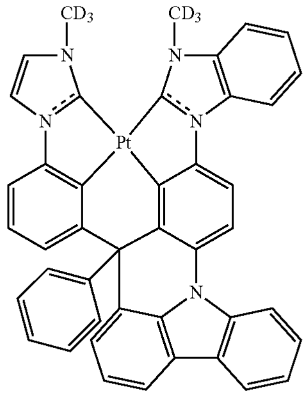
51
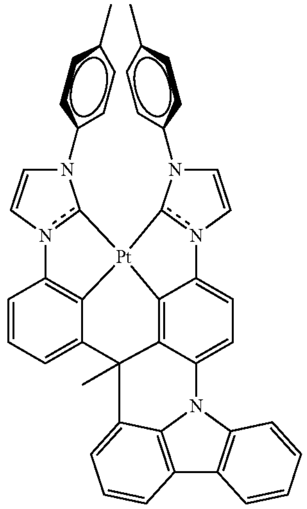
52
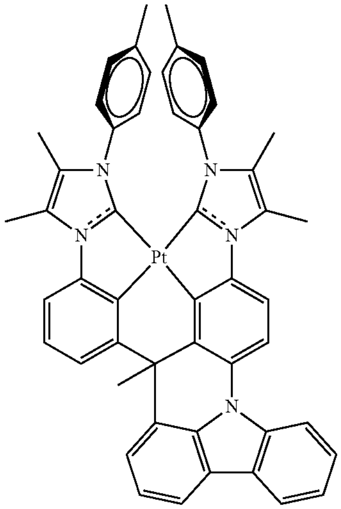
-continued
53
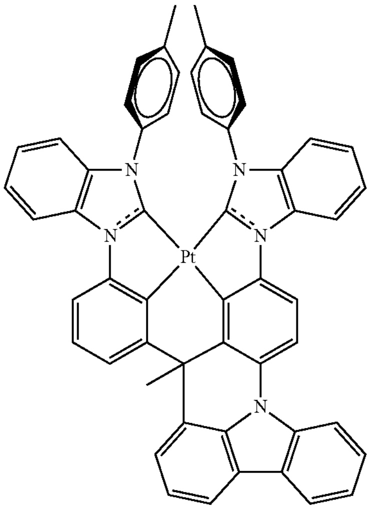
54
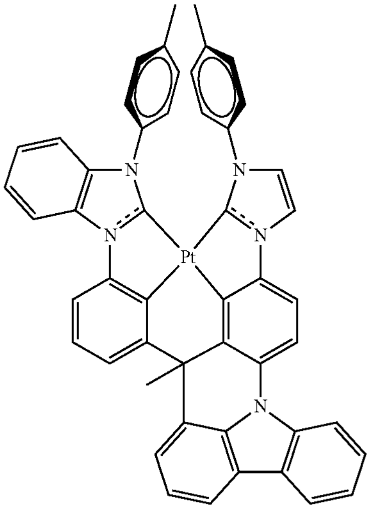
55
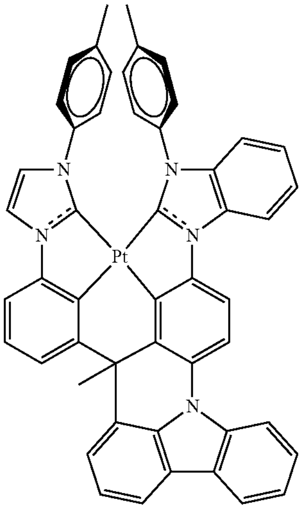

-continued
56
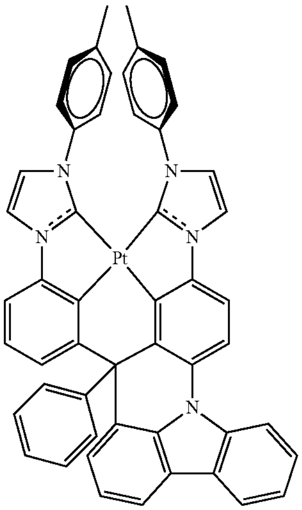
57
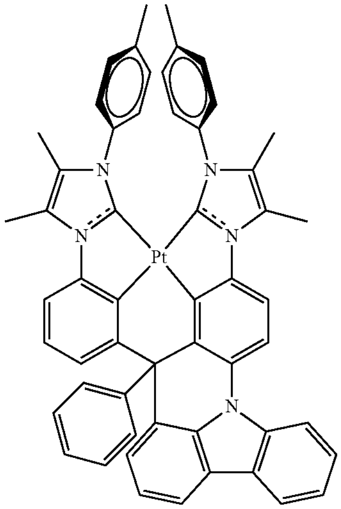
58
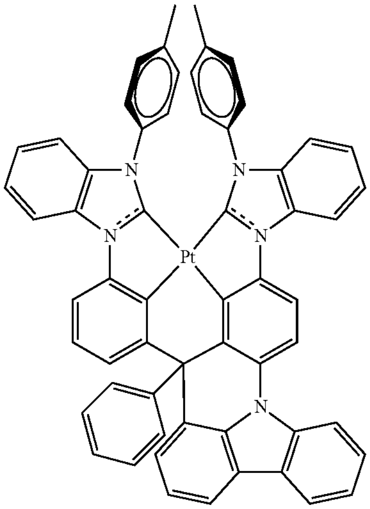
-continued
59
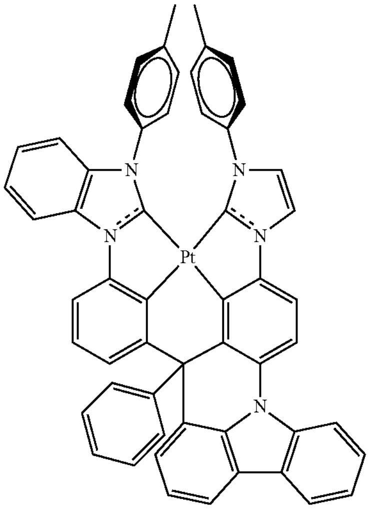
60
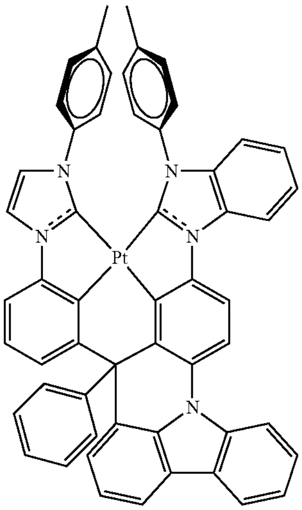
61
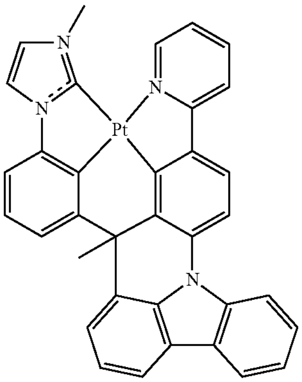

-continued
62
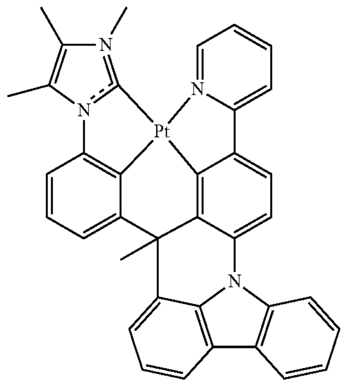
63
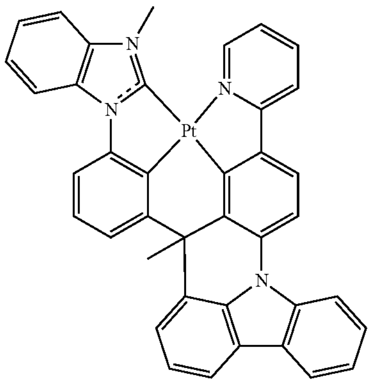
64
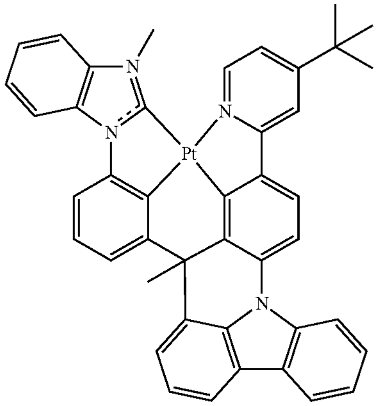
65
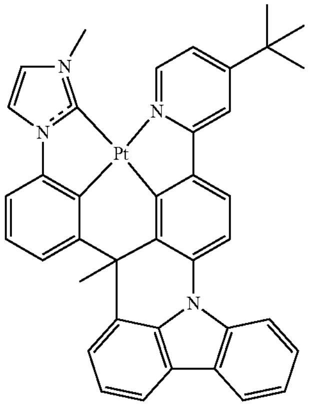
-continued
66
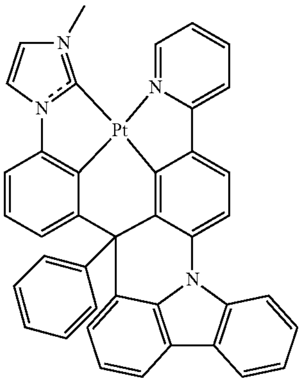
67
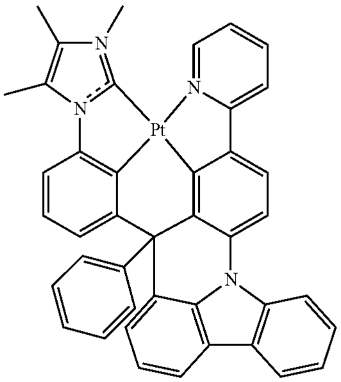
68
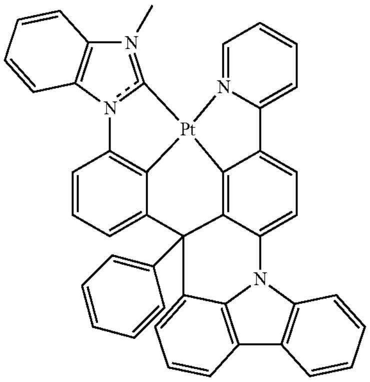
69
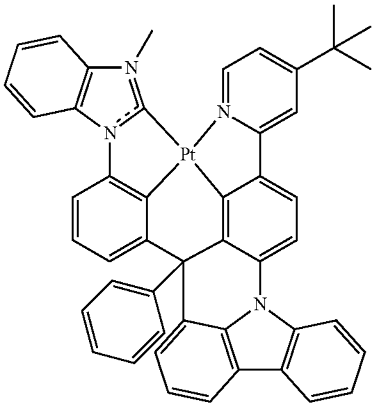

-continued
70
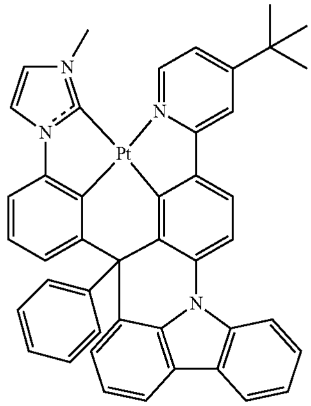
71
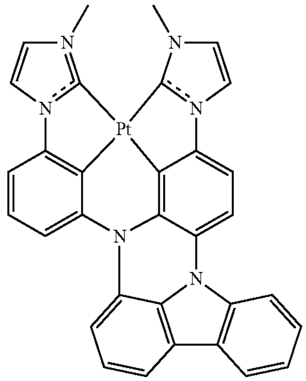
72
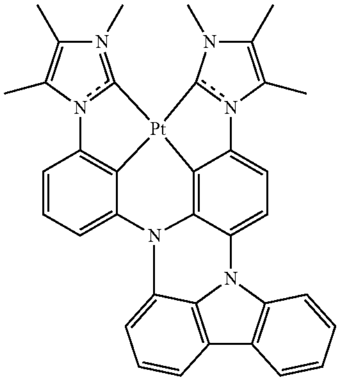
73
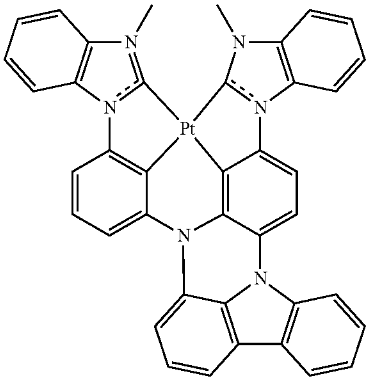
-continued
74
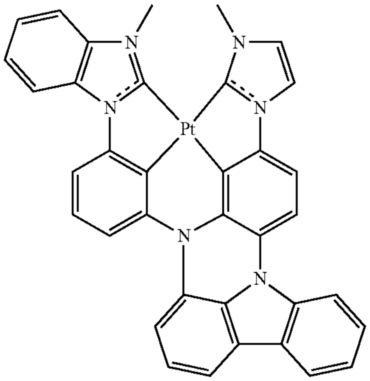
75
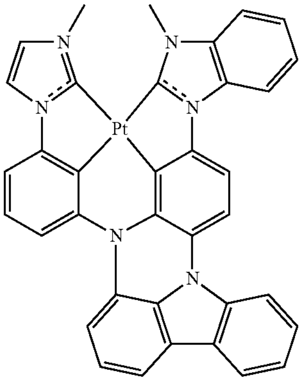
76
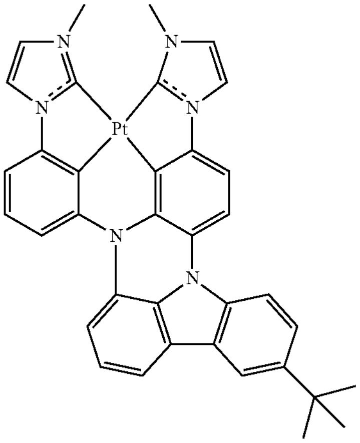
77
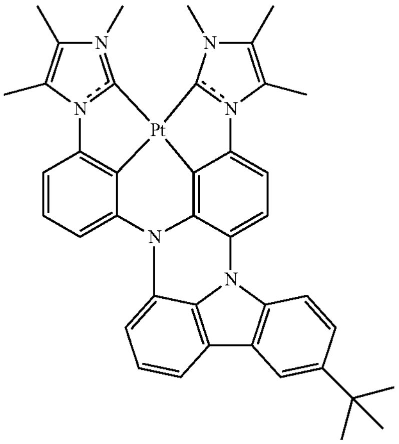

78
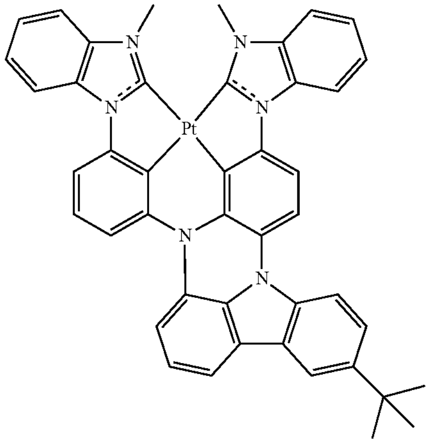
79
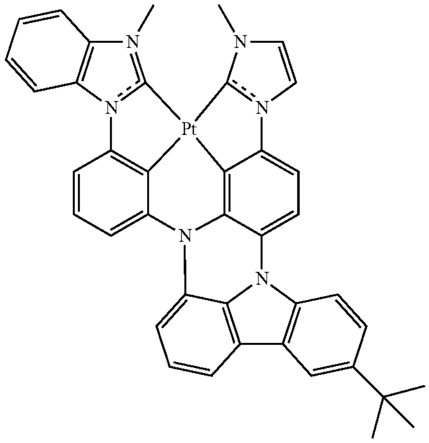
80
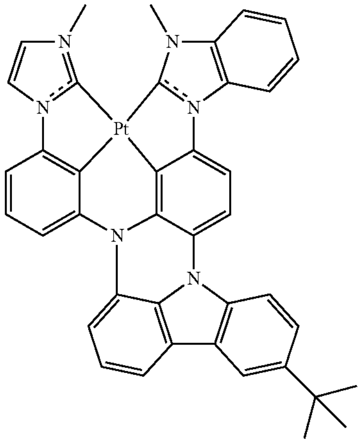
81
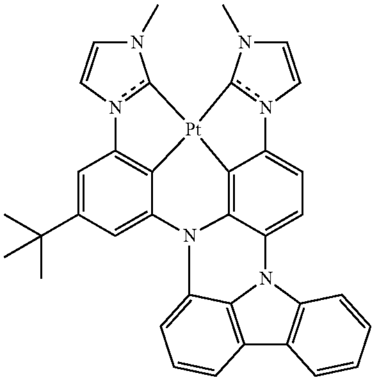
82
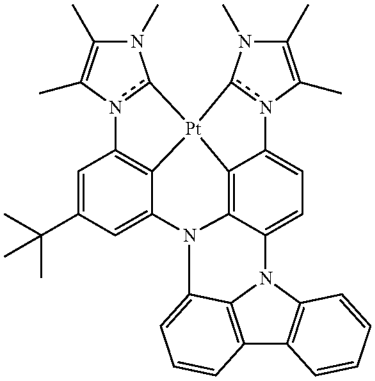
83
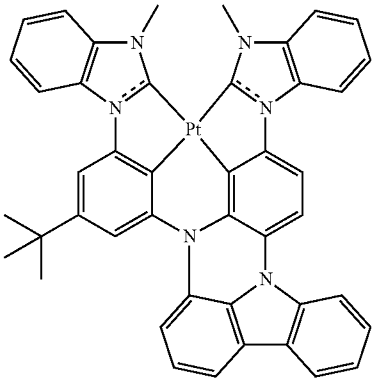
84
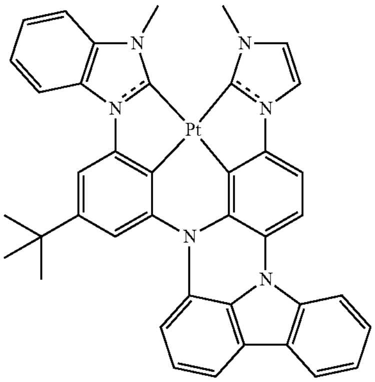

-continued
85
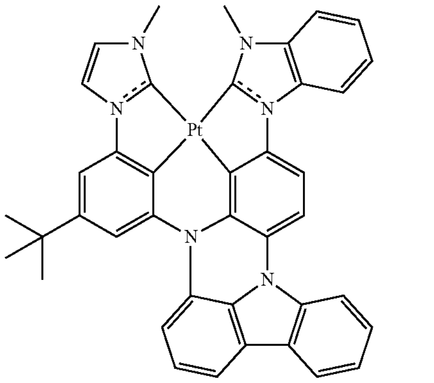
86
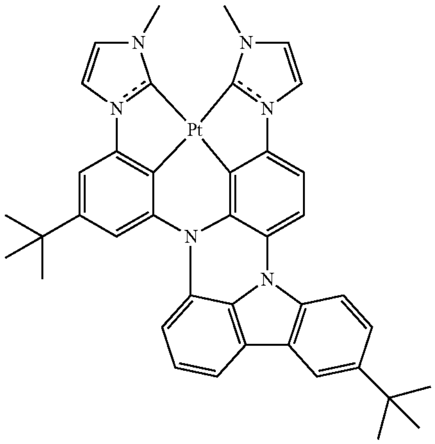
87
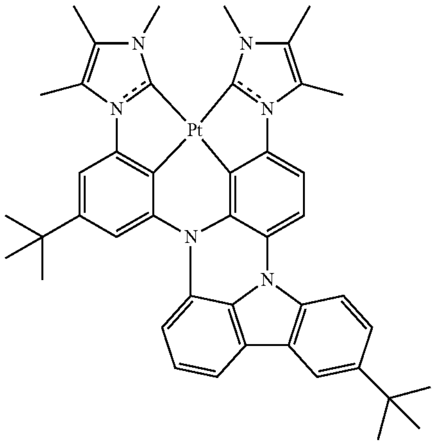
-continued
88
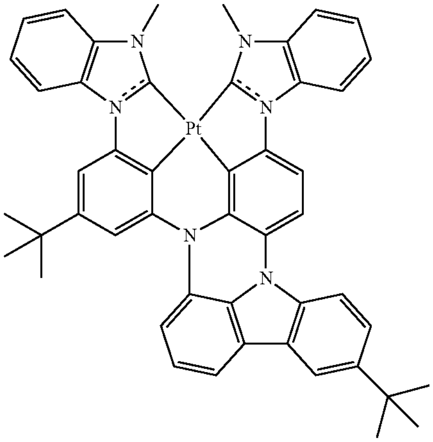
89
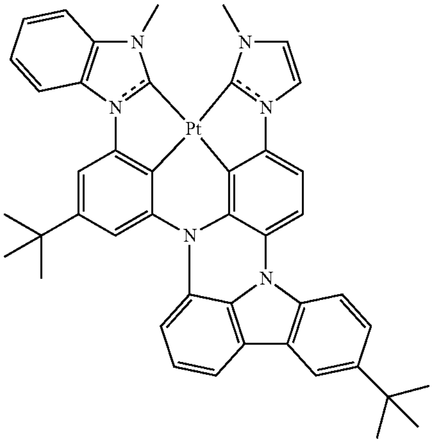
90
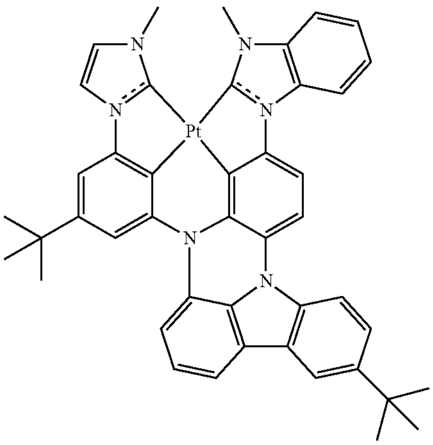

-continued
91
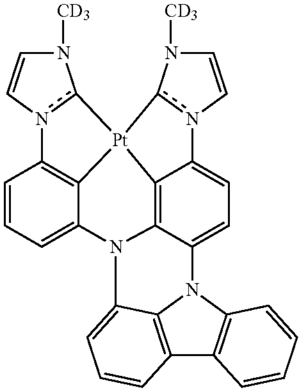
92
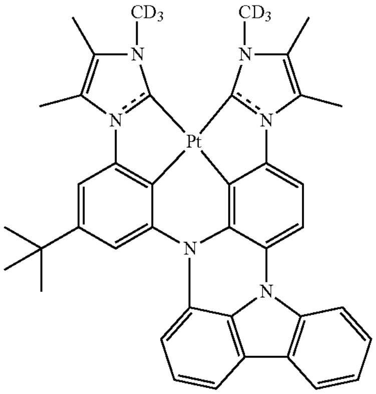
93
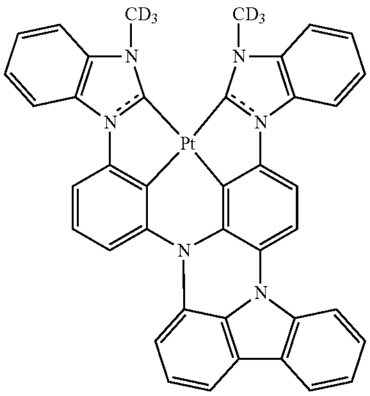
94
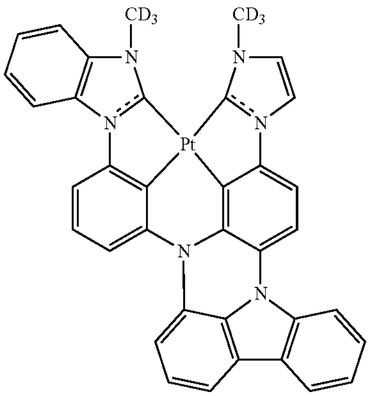
-continued
95
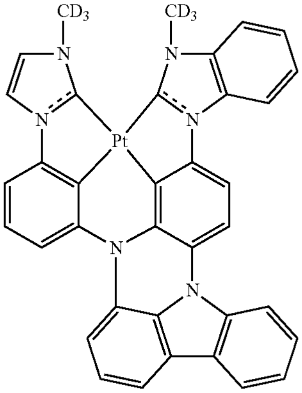
96
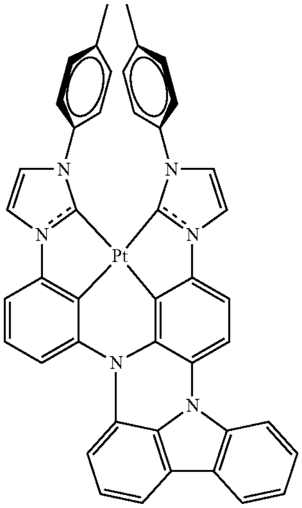
97
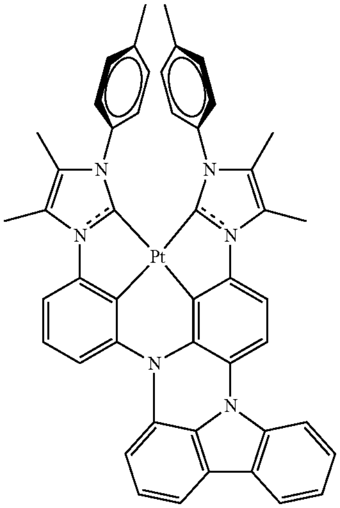

-continued
98
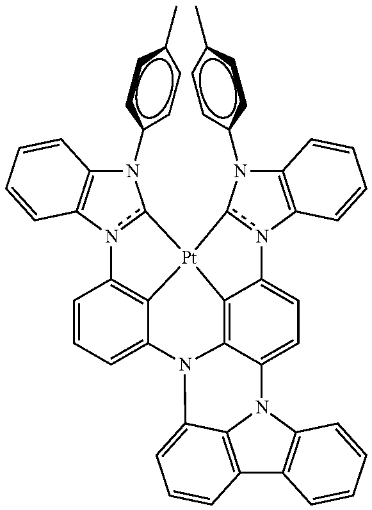
99
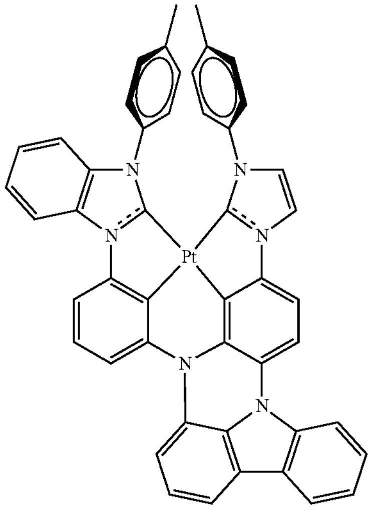
100
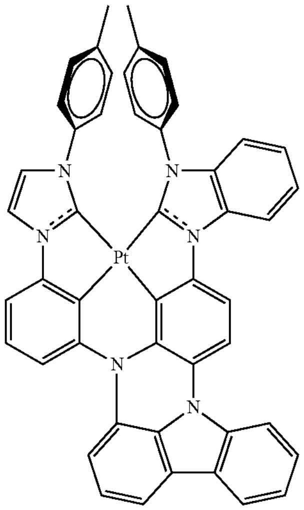
-continued
101
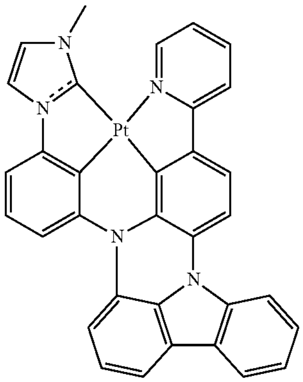
102
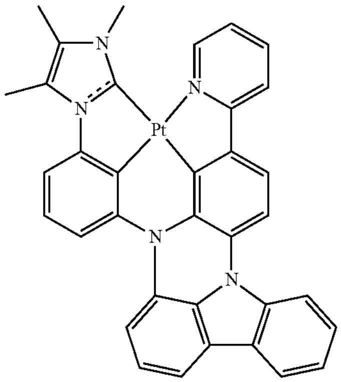
103
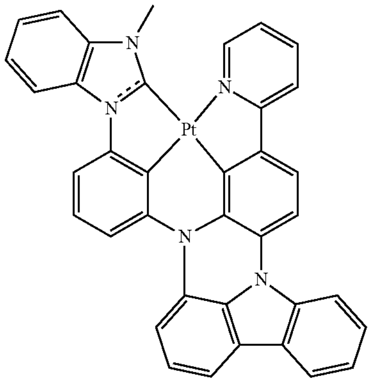
104
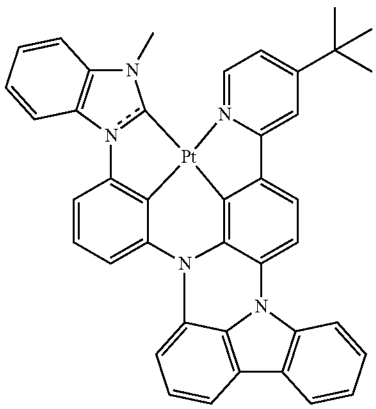

-continued
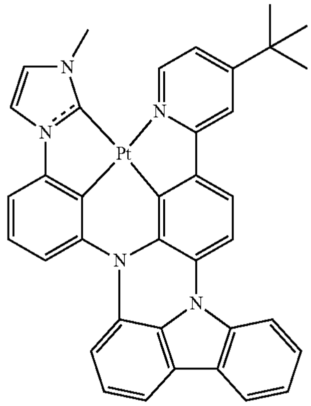
.
20. The organometallic compound of claim 10, wherein the organometallic compound emits blue light having a maximum emission wavelength in a range of about 430 nanometers (nm) to about 490 nm.
* * * * *